(12) United States Patent
Torii et al.

(10) Patent No.: US 10,249,637 B2
(45) Date of Patent: Apr. 2, 2019

US010249637B2

(54) MANUFACTURING METHOD OF SEMICONDUCTOR DEVICE

(71) Applicant: MIE FUJITSU SEMICONDUCTOR LIMITED, Kuwana-shi, Mie (JP)

(72) Inventors: Satoshi Torii, Kuwana (JP); Hideaki Matsumura, Kuwana (JP); Shu Ishihara, Kuwana (JP)

(73) Assignee: MIE FUJITSU SEMICONDUCTOR LIMITED, Kuwana (JP)

( * ) Notice: Subject to any disclaimer, the term of this patent is extended or adjusted under 35 U.S.C. 154(b) by 0 days.

(21) Appl. No.: 15/902,335

(22) Filed: Feb. 22, 2018

(65) Prior Publication Data

US 2018/0261617 A1 Sep. 13, 2018

(30) Foreign Application Priority Data

Mar. 13, 2017 (JP) ................................ 2017-047171

(51) Int. Cl.
*H01L 21/8234* (2006.01)
*H01L 27/11573* (2017.01)
(Continued)

(52) U.S. Cl.
CPC .... *H01L 27/11573* (2013.01); *H01L 27/1157* (2013.01); *H01L 21/02164* (2013.01);
(Continued)

(58) Field of Classification Search
USPC ........................................................ 438/275
See application file for complete search history.

(56) References Cited

U.S. PATENT DOCUMENTS 6,902,939 B2 * 6/2005 Moise ............... H01L 21/31116 257/E21.009
7,557,004 B2 * 7/2009 Ogawa ........... H01L 21/823462 257/E21.689
(Continued)

FOREIGN PATENT DOCUMENTS

JP 2004-47889 2/2004
JP 2012-4403 A 1/2012
(Continued)

*Primary Examiner* — Caleb E Henry
(74) *Attorney, Agent, or Firm* — Westerman, Hattori, Daniels & Adrian, LLP

(57) ABSTRACT

A manufacturing method of a semiconductor device includes: forming a tunnel oxide layer and a charge-storage layer in a region of a flash memory transistor; forming a first oxide film; removing the first oxide film in regions of a first transistor and a second transistor; forming a third oxide film by adding a first oxide layer between a first oxide film and a semiconductor substrate in a region of a third transistor while forming a second oxide film in the regions of the first transistor and the second transistor by oxidation; removing the second oxide film in the region of the first transistor; and forming a fifth oxide film by adding a second oxide layer between the second oxide film and the semiconductor substrate in the region of the second transistor while forming a fourth oxide film in the region of the first transistor by oxidation, and forming a sixth oxide film by adding a third oxide layer between the first oxide layer and the semiconductor substrate in the region of the third transistor.

11 Claims, 219 Drawing Sheets

(51) Int. Cl.

| | |
|---|---|
| ***H01L 27/1157*** | (2017.01) |
| *H01L 21/02* | (2006.01) |
| *H01L 21/265* | (2006.01) |
| *H01L 21/311* | (2006.01) |
| *H01L 21/225* | (2006.01) |
| *H01L 21/28* | (2006.01) |
| *H01L 21/266* | (2006.01) |

(52) U.S. Cl.
CPC .. *H01L 21/02238* (2013.01); *H01L 21/02255* (2013.01); *H01L 21/2253* (2013.01); *H01L 21/266* (2013.01); *H01L 21/26513* (2013.01); *H01L 21/26586* (2013.01); *H01L 21/28194* (2013.01); *H01L 21/28202* (2013.01); *H01L 21/31116* (2013.01); *H01L 21/31144* (2013.01)

(56) References Cited

U.S. PATENT DOCUMENTS 7,598,139 B2 * 10/2009 Park .................. H01L 21/76224 438/258
7,888,740 B2 * 2/2011 Tsutsumi ........ H01L 21/823814 257/358
2003/0042548 A1 * 3/2003 Maeda ............. H01L 21/26586 257/369
2003/0128584 A1 * 7/2003 Shiromoto ......... G11C 16/0416 365/185.05
2003/0155618 A1 * 8/2003 Boissonnet ......... H01L 21/8234 257/369
2004/0232494 A1 * 11/2004 Nagano ............ H01L 21/82385 257/382
2006/0071278 A1 * 4/2006 Takao ............ H01L 21/823807 257/365
2006/0208310 A1 * 9/2006 Prall ................ H01L 21/76895 257/316
2006/0246647 A1 * 11/2006 Visokay .......... H01L 21/823842 438/199
2006/0246651 A1 * 11/2006 Chambers ....... H01L 21/823842 438/216
2007/0138568 A1 * 6/2007 Nagano ............ H01L 21/82385 257/369
2007/0141772 A1 * 6/2007 Nagano ............ H01L 21/82385 438/199
2007/0241402 A1 * 10/2007 Hirano ............. H01L 21/76283 257/347
2008/0057645 A1 * 3/2008 Lin .................. H01L 27/11568 438/257
2008/0105923 A1 * 5/2008 Sakai ............. H01L 21/823462 257/336
2008/0179676 A1 * 7/2008 Hirano .................... H01L 21/84 257/350
2008/0252634 A1 * 10/2008 Sato ................ H03K 19/00315 345/211
2009/0108370 A1 * 4/2009 Tsukamoto ..... H01L 21/823842 257/369
2009/0230460 A1 * 9/2009 Yaegashi ........... H01L 21/82345 257/324
2009/0242994 A1 * 10/2009 Nallapati ........ H01L 21/823418 257/368
2010/0314686 A1 * 12/2010 Hirano ............. H01L 21/76283 257/351
2012/0243335 A1 9/2012 Torii
2013/0043543 A1 * 2/2013 Kim .................. H01L 27/11524 257/392
2013/0071990 A1 * 3/2013 Hashim ................ C23C 16/405 438/396
2015/0137211 A1 5/2015 Torii et al.
2016/0240543 A1 8/2016 Torii et al.
2017/0221917 A1 * 8/2017 Shinohara ......... H01L 27/11568

FOREIGN PATENT DOCUMENTS

JP 2012-198961 A 10/2012
JP 2015-99892 A 5/2015

* cited by examiner

MANUFACTURING METHOD OF SEMICONDUCTOR DEVICE

CROSS-REFERENCE TO RELATED APPLICATION

This application is based upon and claims the benefit of priority of the prior Japanese Patent Application No. 2017-047171, filed on Mar. 13, 2017, the entire contents of which are incorporated herein by reference.

FIELD

The present invention relates to a manufacturing method of a semiconductor device.

BACKGROUND

On a semiconductor substrate, generally, transistor elements having gate insulating films different in film thickness for coping with various operating voltages are formed.

Further, there is a known LSI mounting flash memory elements in addition to the transistor elements in a mixed manner for the purpose of higher function.

Patent Document 1: Japanese Laid-open Patent Publication No. 2015-99892

Patent Document 2: Japanese Laid-open Patent Publication No. 2012-4403

To cope with particularly high voltage by different operating voltages, it is necessary to use a gate insulating film having a larger film thickness from the viewpoint of ensuring withstand voltage. In the case of various operating voltages, it is necessary to prepare gate insulating films having different thicknesses for the various operating voltages, respectively.

Besides, for operation of the flash memory element, a high voltage of 5 V or higher is necessary. In the case where the gate insulating film for a high withstand voltage transistor is formed to cope with the high voltage, not only the number of steps is increased but also a step accompanied by high heat such as gate oxidation is further added. The step accompanied by heat may affect characteristics of other low-voltage transistor elements.

SUMMARY

The manufacturing method of the semiconductor device is a manufacturing method of a semiconductor device including a first transistor, a second transistor, a third transistor, and a flash memory transistor on a semiconductor substrate, the manufacturing method including: forming an element isolation that demarcates each of regions of the first transistor, the second transistor, the third transistor, and the flash memory transistor; forming a well and a channel in each of the regions of the first transistor, the second transistor, the third transistor, and the flash memory transistor; forming a tunnel oxide layer and a charge-storage layer in the region of the flash memory transistor; forming a first oxide film in each of the regions of the first transistor, the second transistor, the third transistor, and the flash memory transistor; removing the first oxide film in the regions of the first transistor and the second transistor; forming a third oxide film by adding a first oxide layer between the first oxide film and the semiconductor substrate in the region of the third transistor while forming a second oxide film in the regions of the first transistor and the second transistor by oxidizing the semiconductor substrate; removing the second oxide film in the region of the first transistor; forming a fifth oxide film by adding a second oxide layer between the second oxide film and the semiconductor substrate in the region of the second transistor while forming a fourth oxide film in the region of the first transistor by oxidizing the semiconductor substrate, and forming a sixth oxide film by adding a third oxide layer between the first oxide layer and the semiconductor substrate in the region of the third transistor; forming a gate electrode in each of the regions of the first transistor, the second transistor, the third transistor, and the flash memory transistor; forming a sidewall film on sidewalls on both sides of the gate electrode; and forming a source region and a drain region in the semiconductor substrate at side portions on both sides of the gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 120 is a cross-sectional view (part 120) explaining the manufacturing process of the semiconductor device in the first embodiment;

FIG. 121 is a cross-sectional view (part 121) explaining the manufacturing process of the semiconductor device in the first embodiment;

FIG. 122 is a cross-sectional view (part 122) explaining the manufacturing process of the semiconductor device in the first embodiment;

FIG. 123 is a cross-sectional view (part 123) explaining the manufacturing process of the semiconductor device in the first embodiment;

FIG. 124 is a cross-sectional view (part 124) explaining the manufacturing process of the semiconductor device in the first embodiment;

FIG. 125 is a cross-sectional view (part 125) explaining the manufacturing process of the semiconductor device in the first embodiment;

FIG. 126 is a cross-sectional view (part 126) explaining the manufacturing process of the semiconductor device in the first embodiment;

FIG. 127 is a cross-sectional view (part 127) explaining the manufacturing process of the semiconductor device in the first embodiment;

FIG. 128 is a cross-sectional view (part 128) explaining the manufacturing process of the semiconductor device in the first embodiment;

FIG. 129 is a cross-sectional view (part 129) explaining the manufacturing process of the semiconductor device in the first embodiment;

FIG. 130 is a cross-sectional view (part 130) explaining the manufacturing process of the semiconductor device in the first embodiment;

FIG. 131 is a cross-sectional view (part 131) explaining the manufacturing process of the semiconductor device in the first embodiment;

Figure 132:
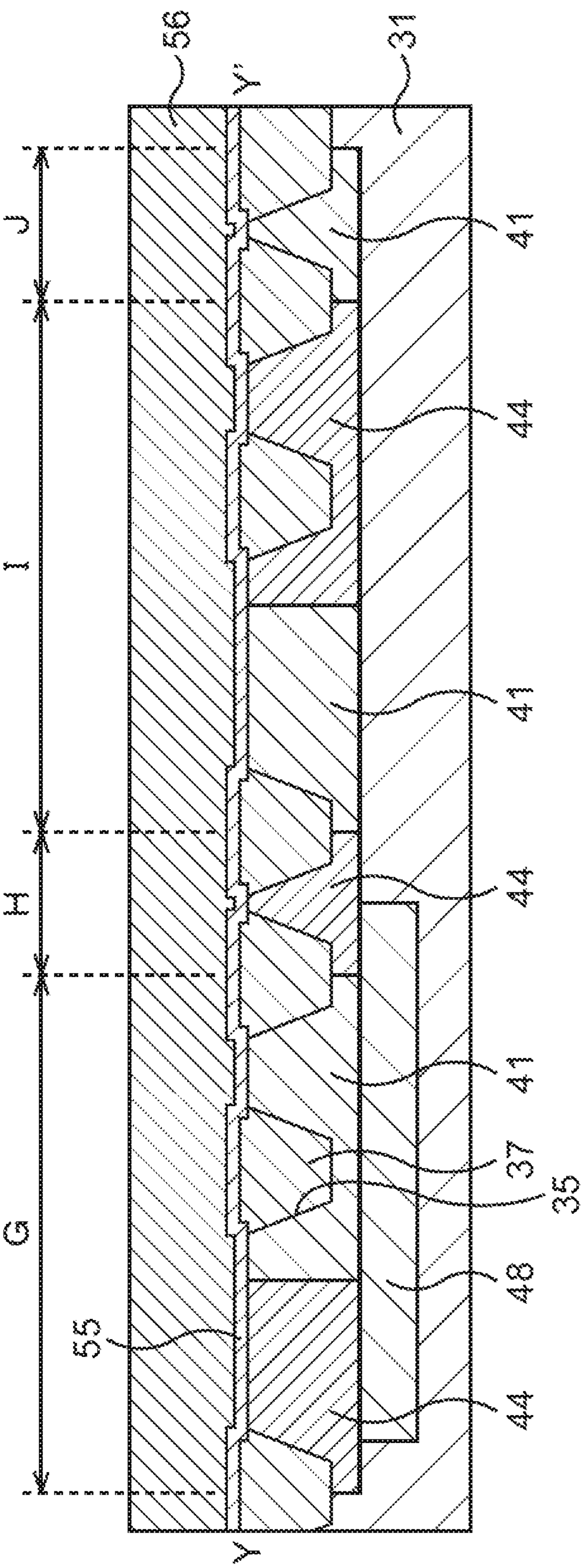
Figure 133:
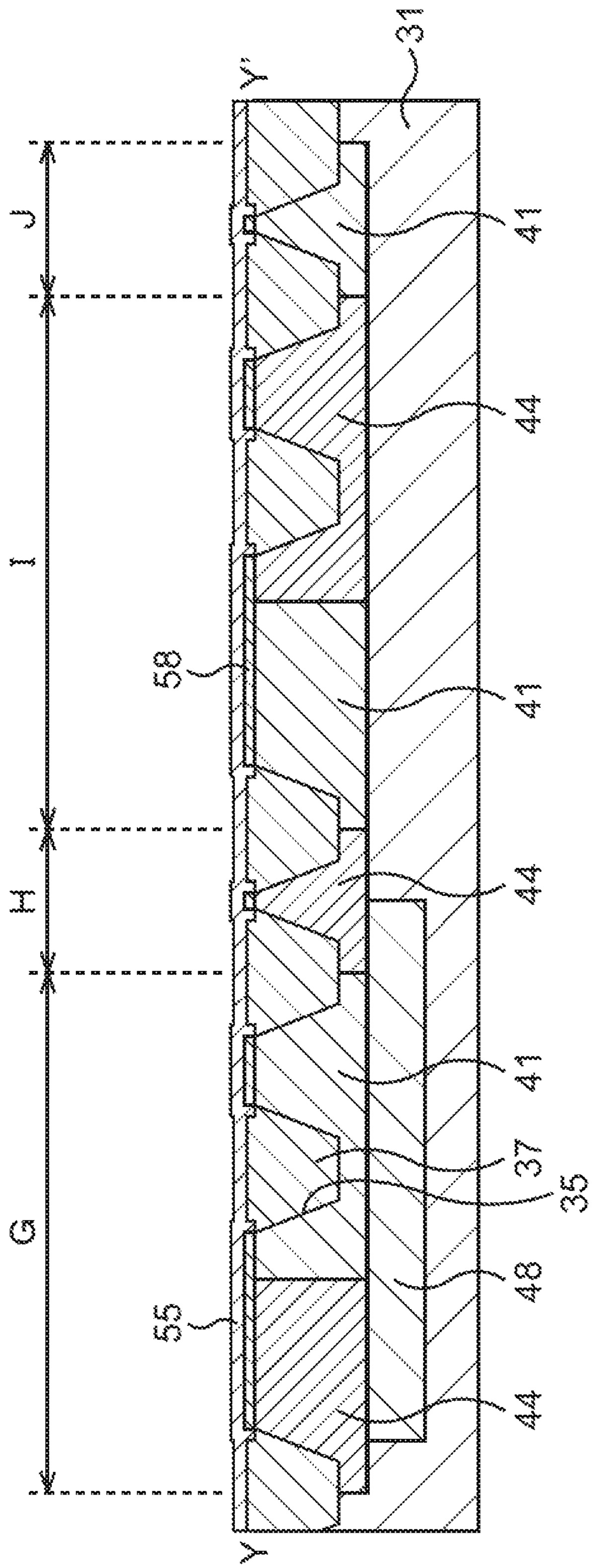
Figure 134:
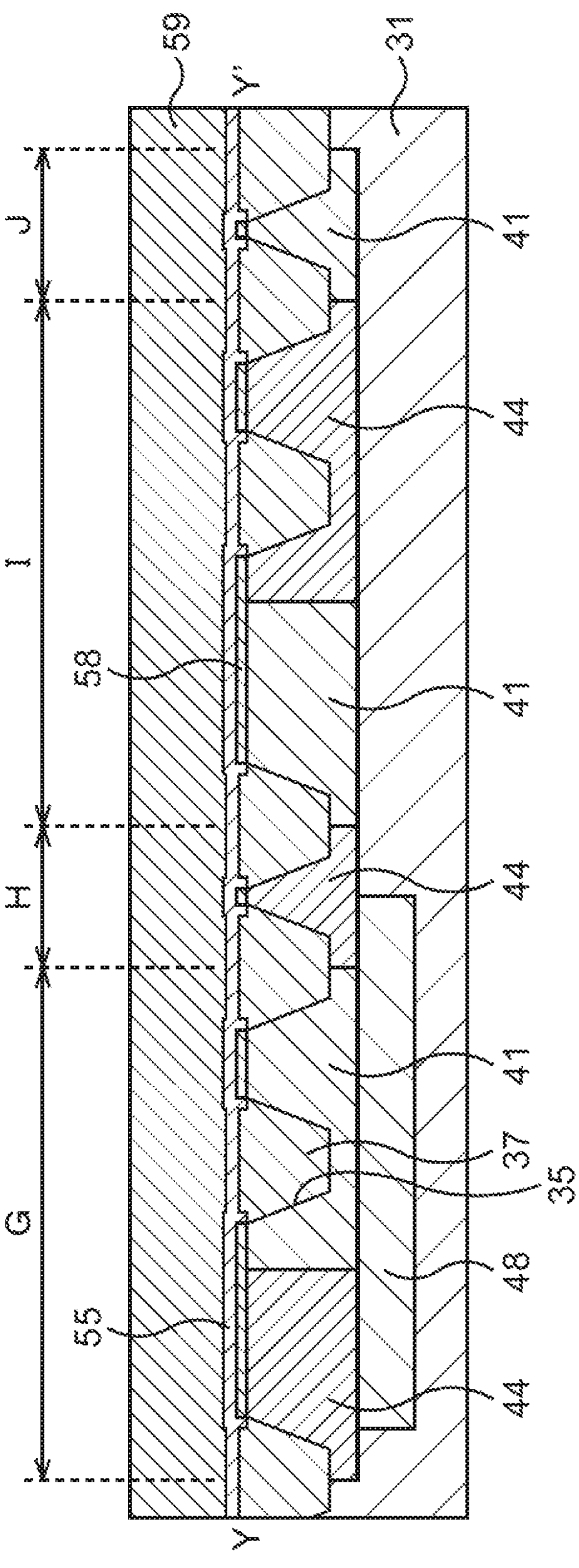
Figure 135:
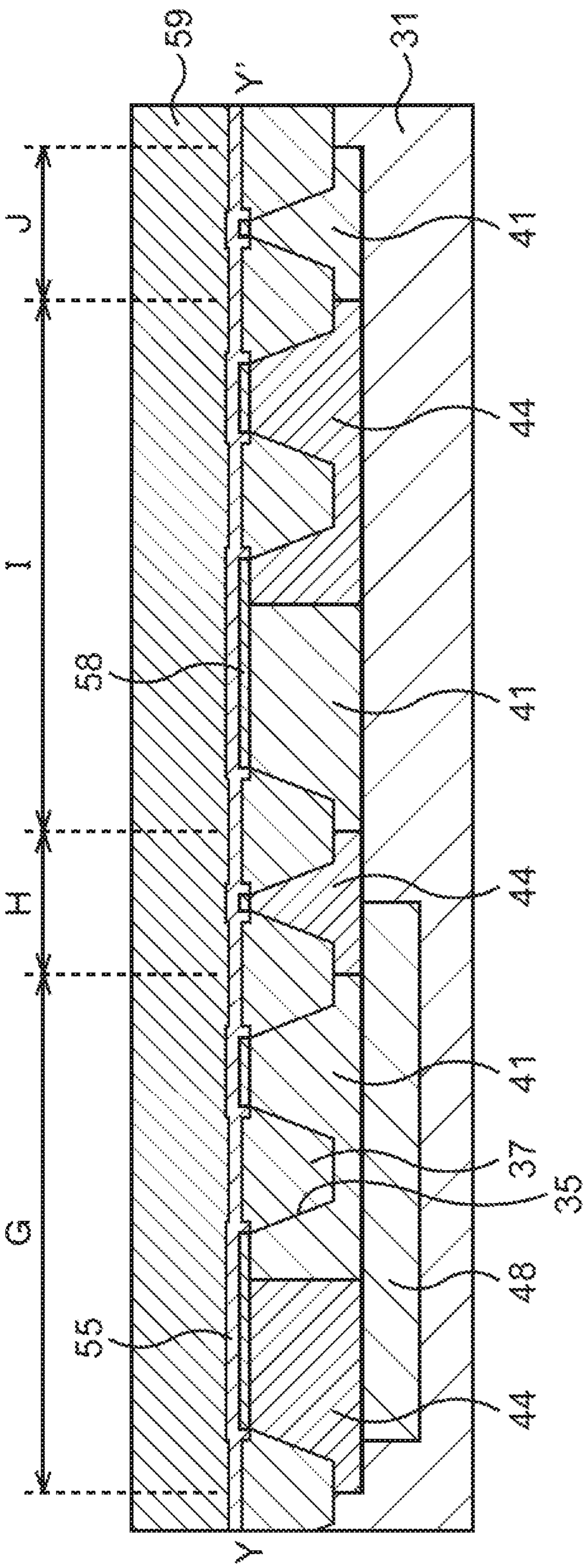
Figure 136:
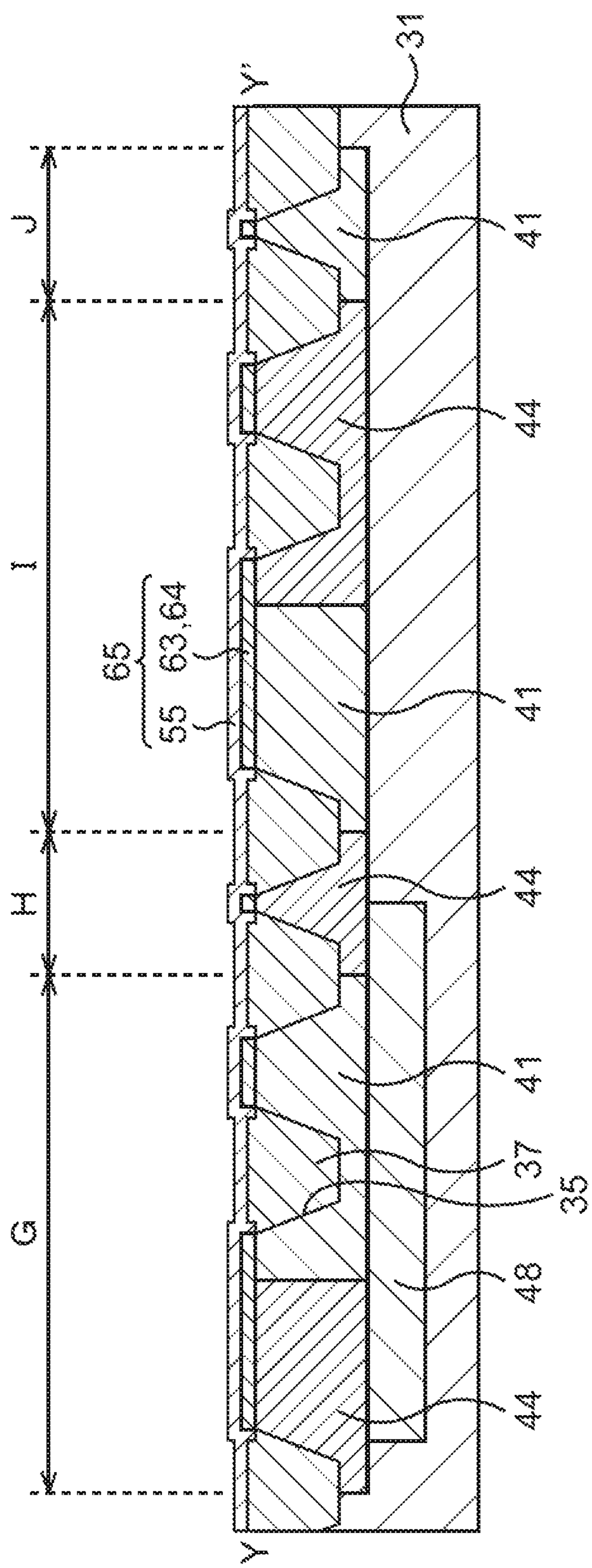
Figure 137:
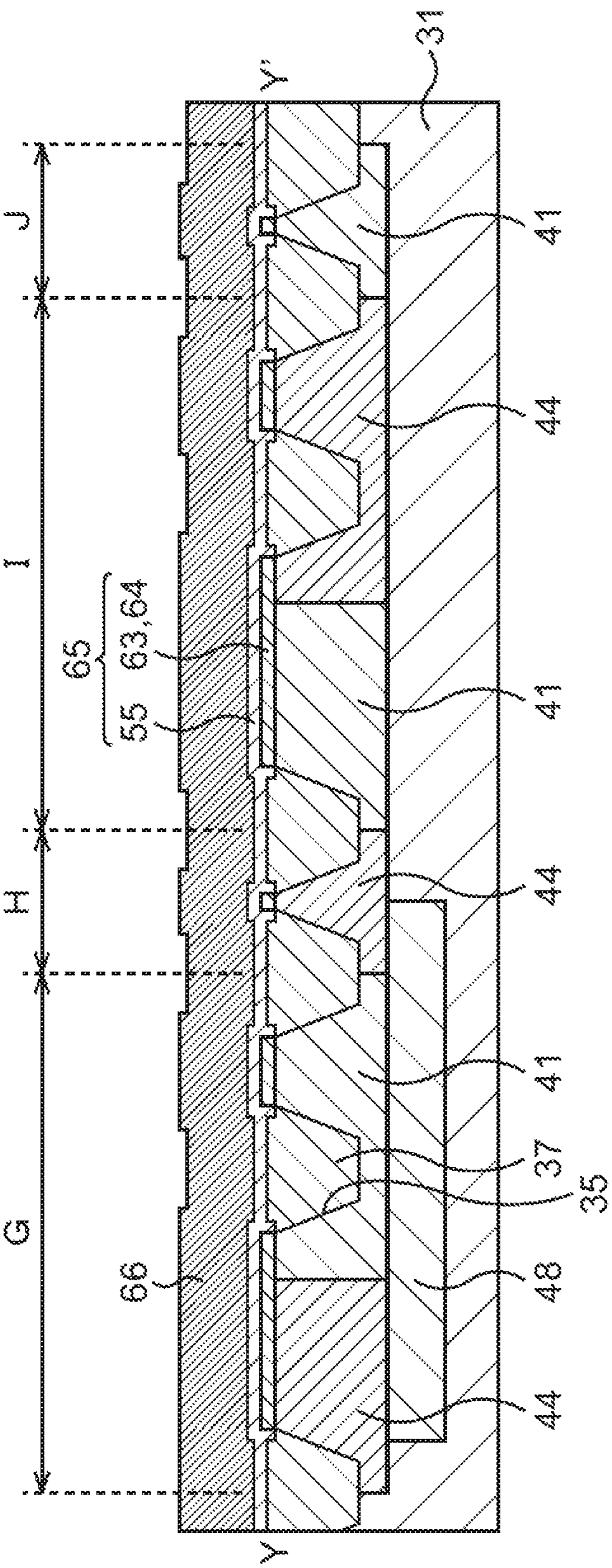
Figure 138:
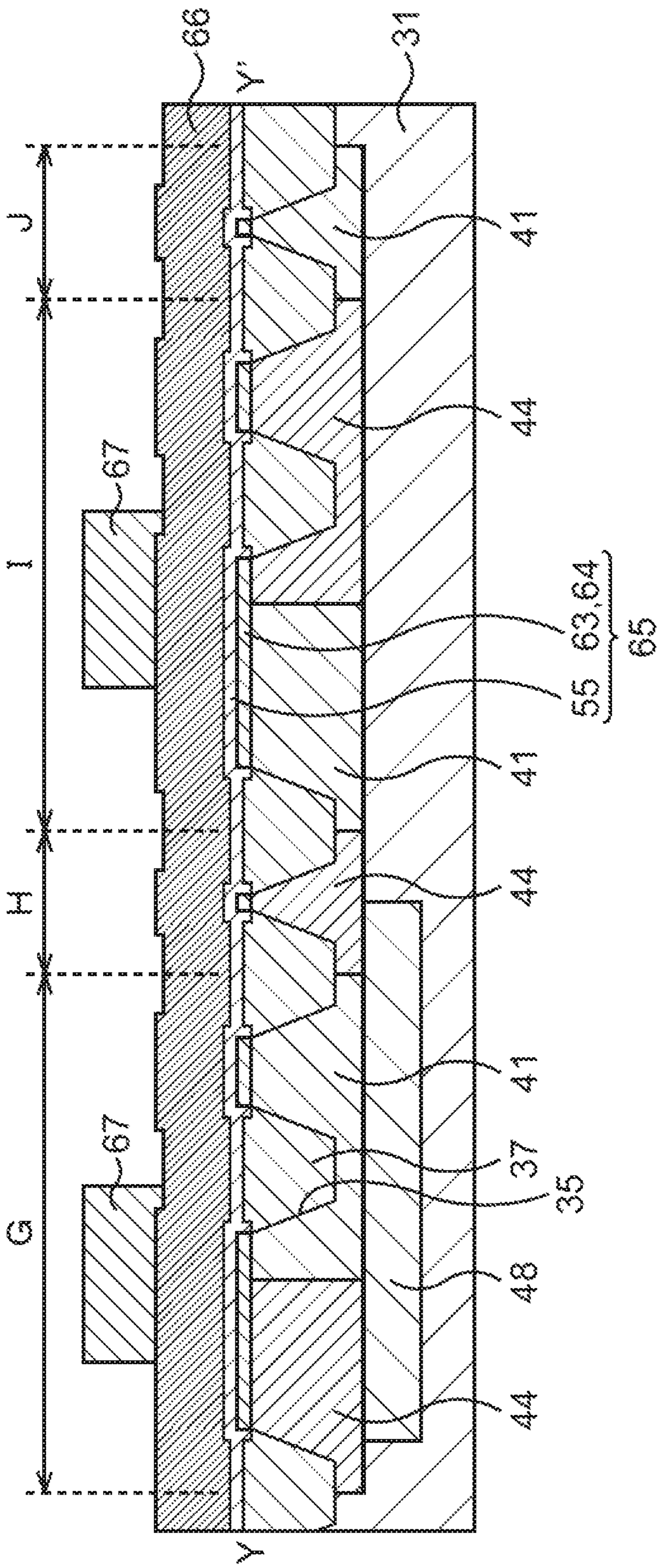
Figure 139:
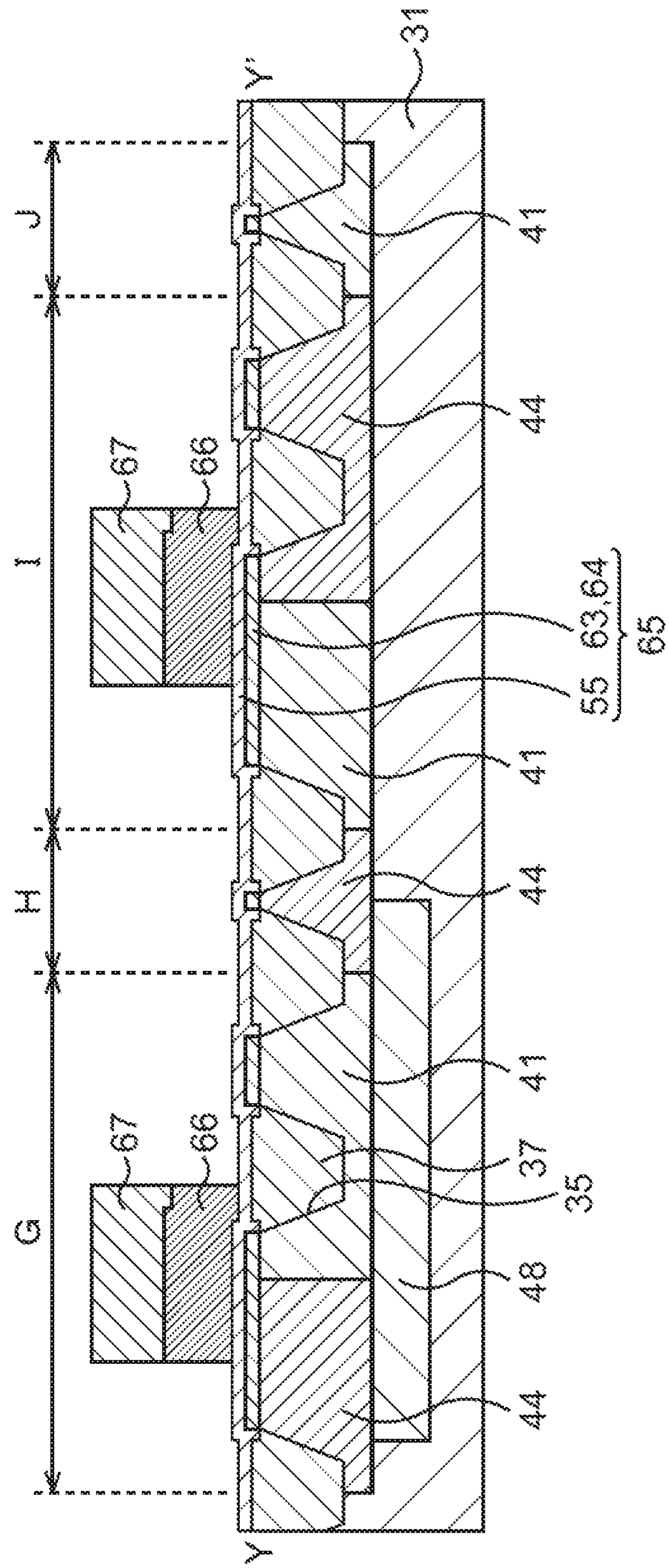
Figure 140:
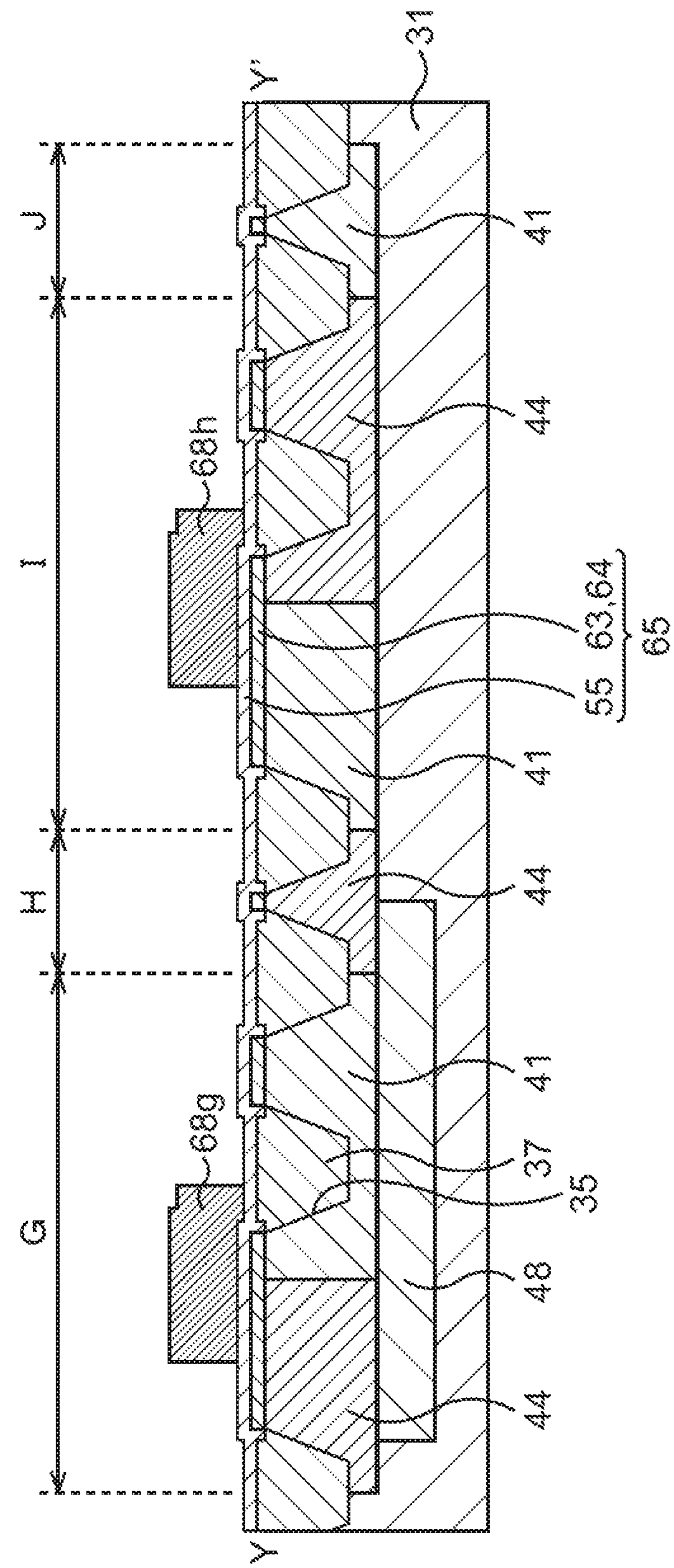
Figure 141:
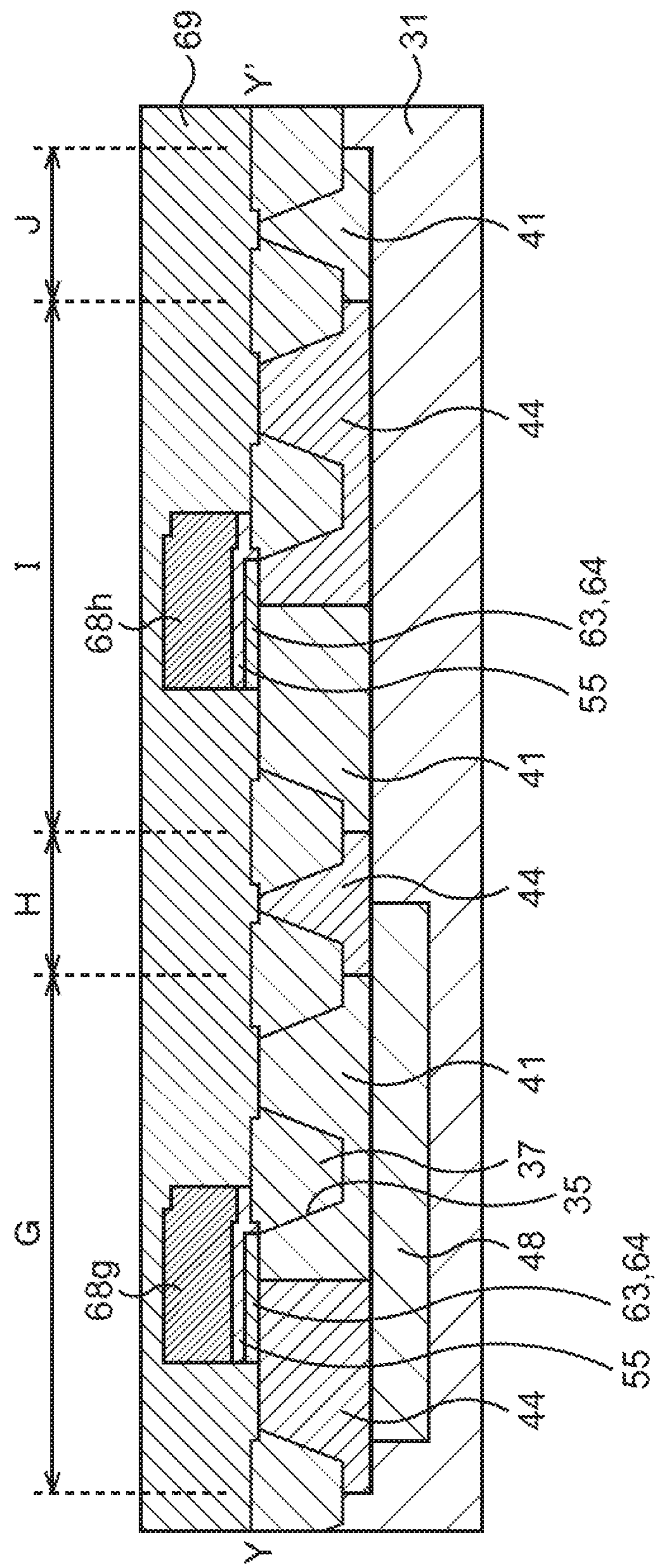
Figure 142:
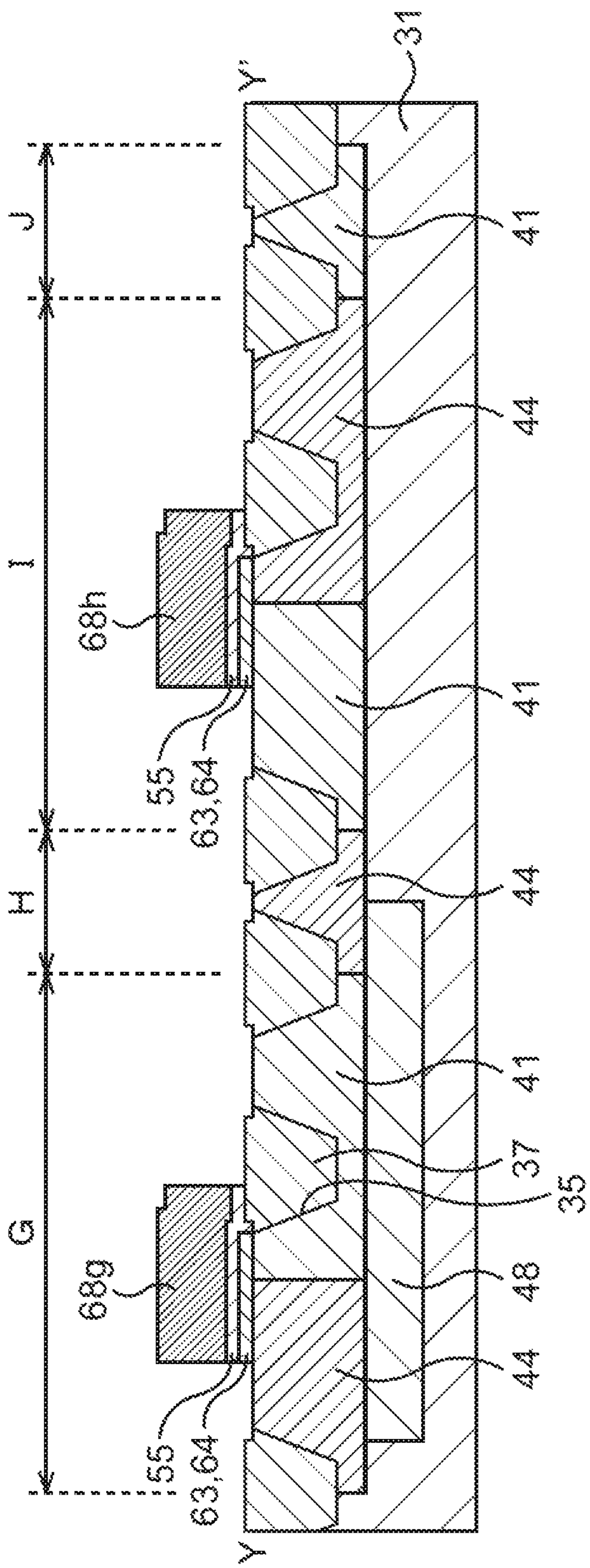
Figure 143:
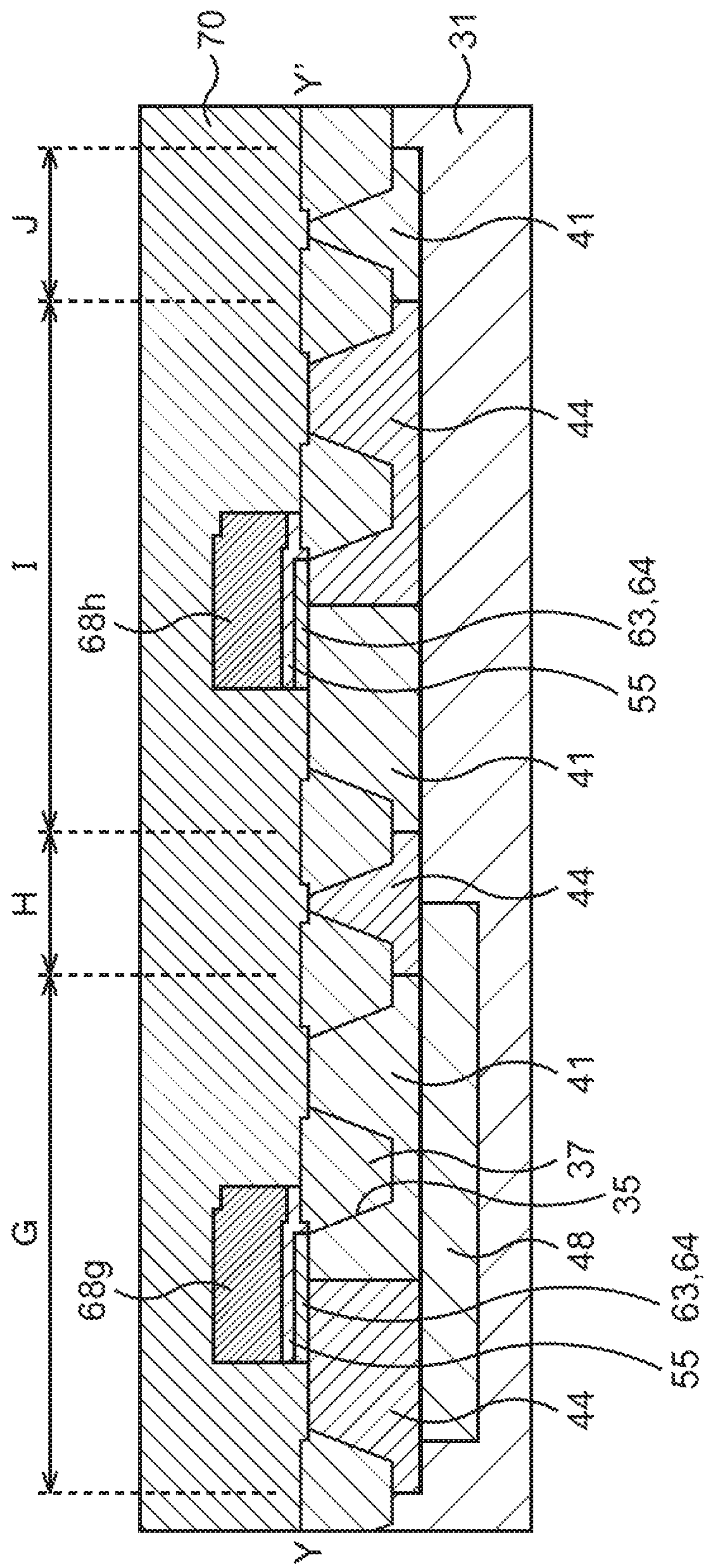
Figure 144:
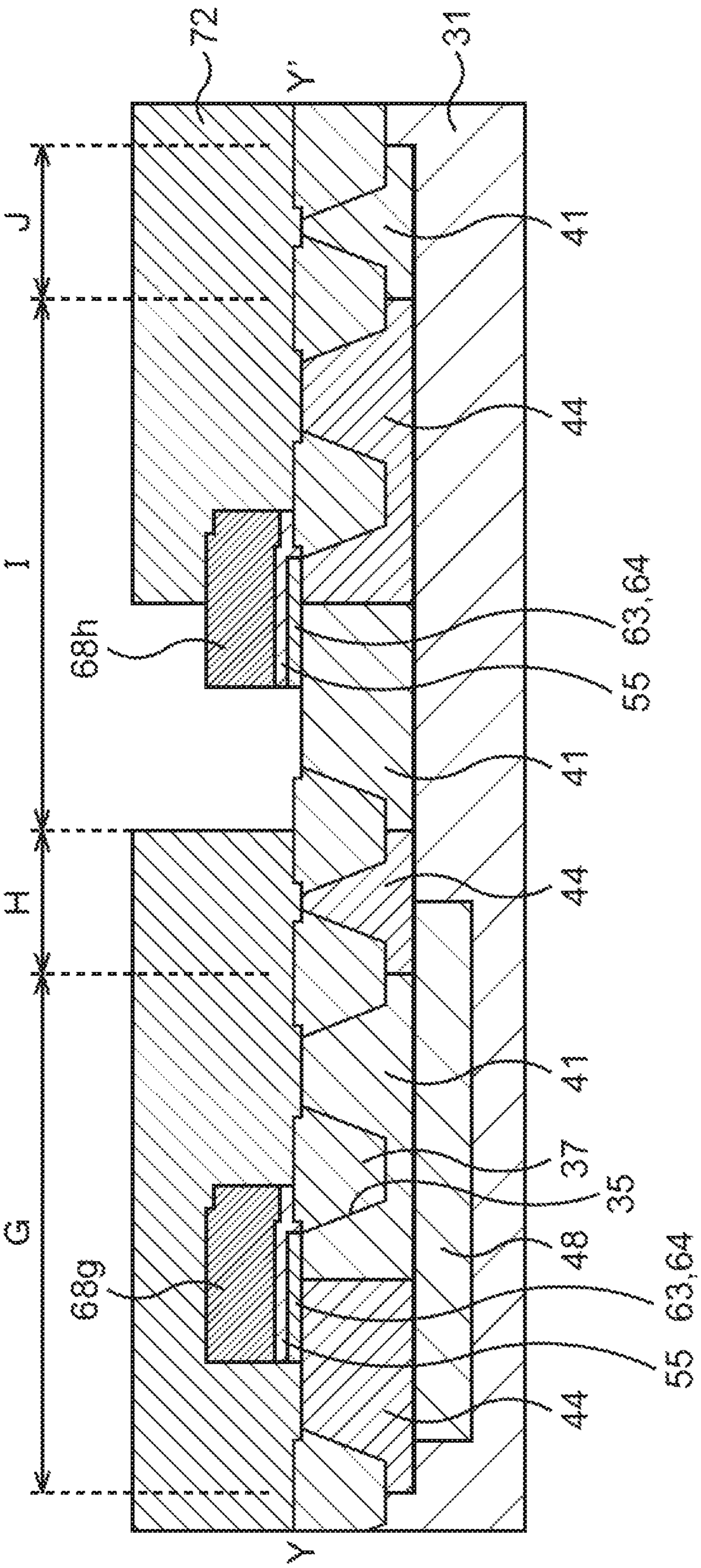
Figure 145:
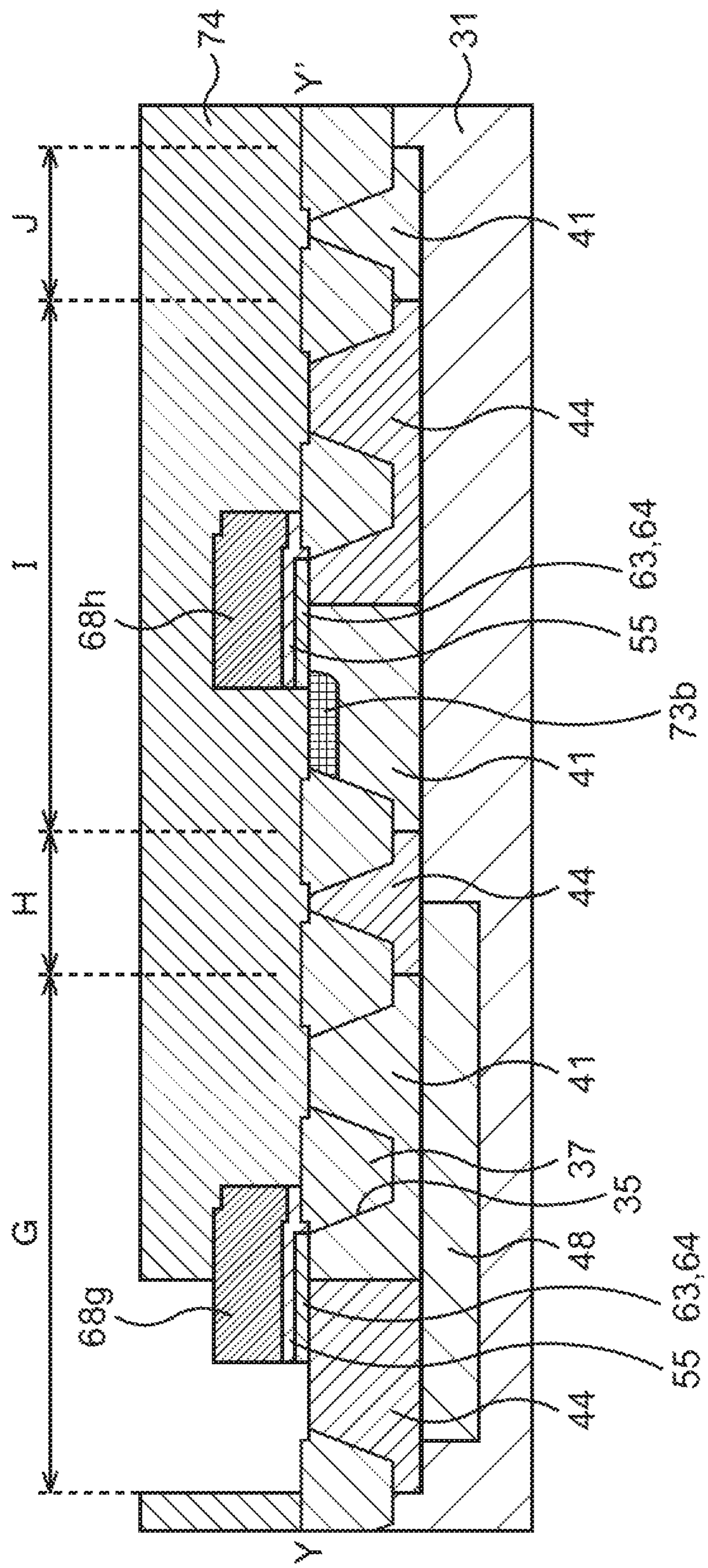
Figure 146:
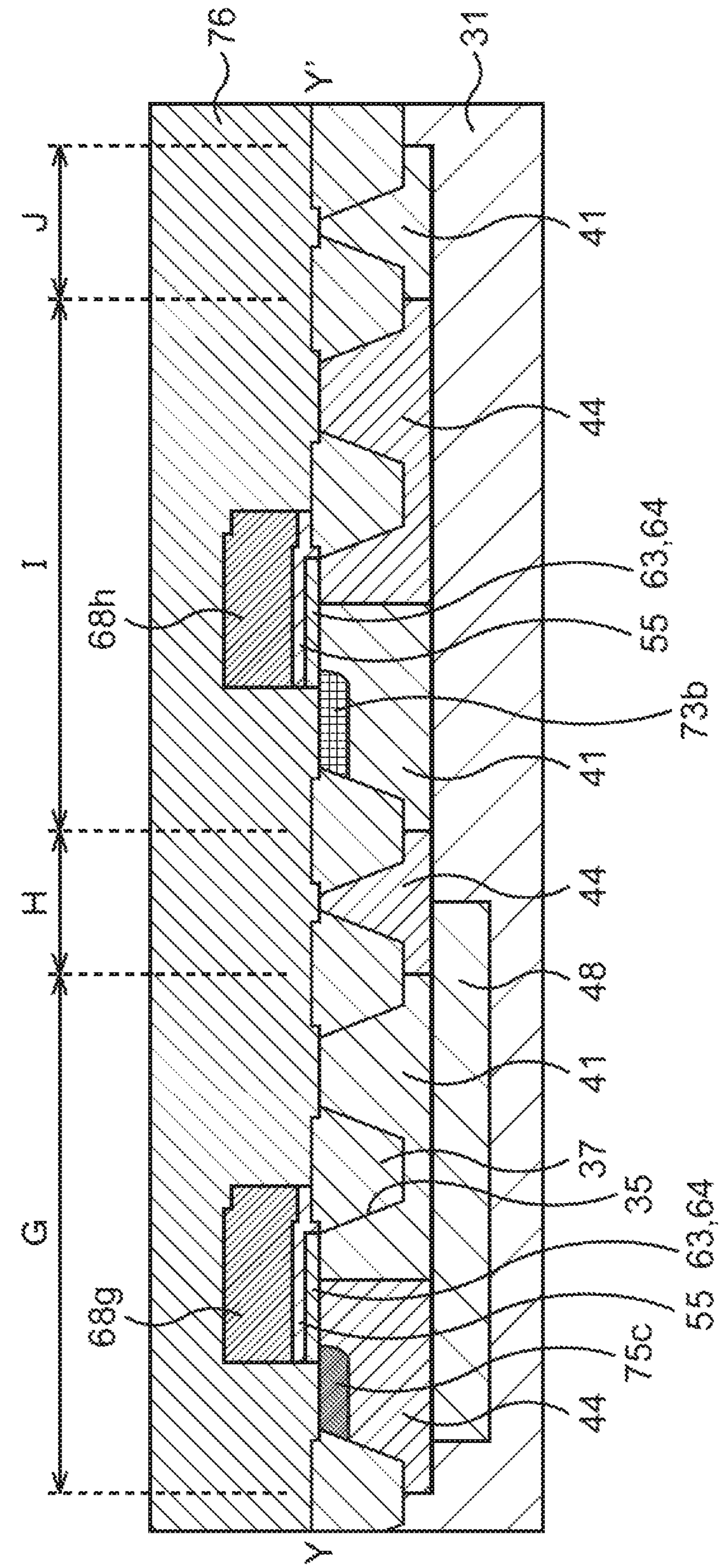
Figure 147:
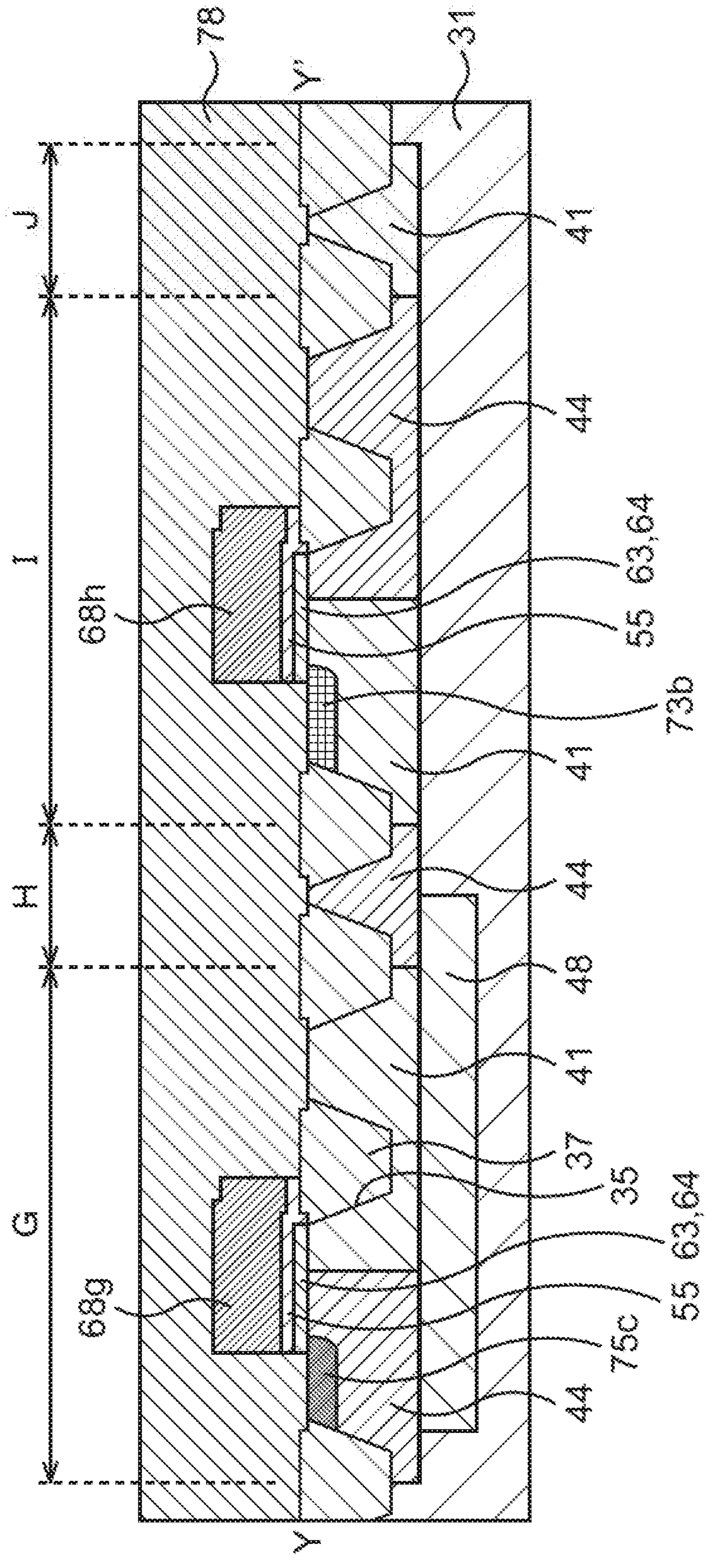
Figure 148:
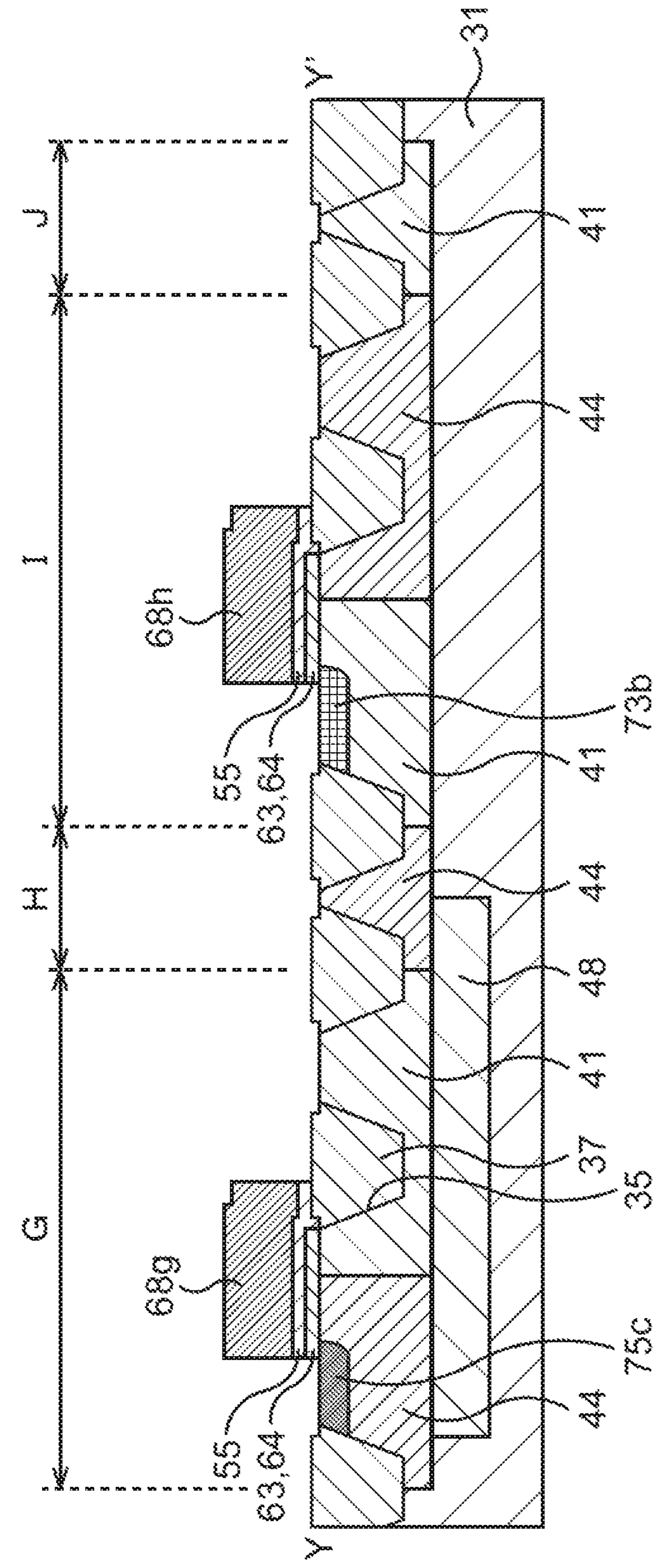
Figure 149:
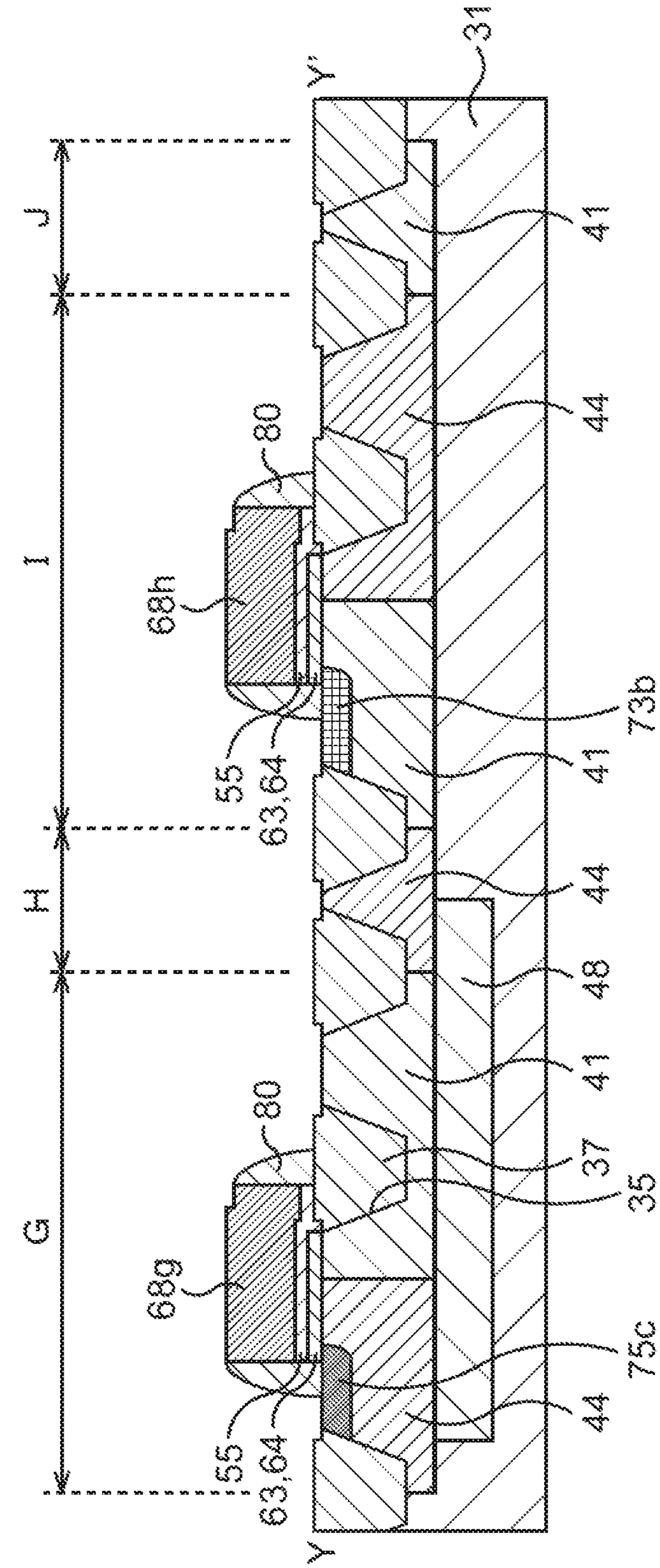
Figure 150:
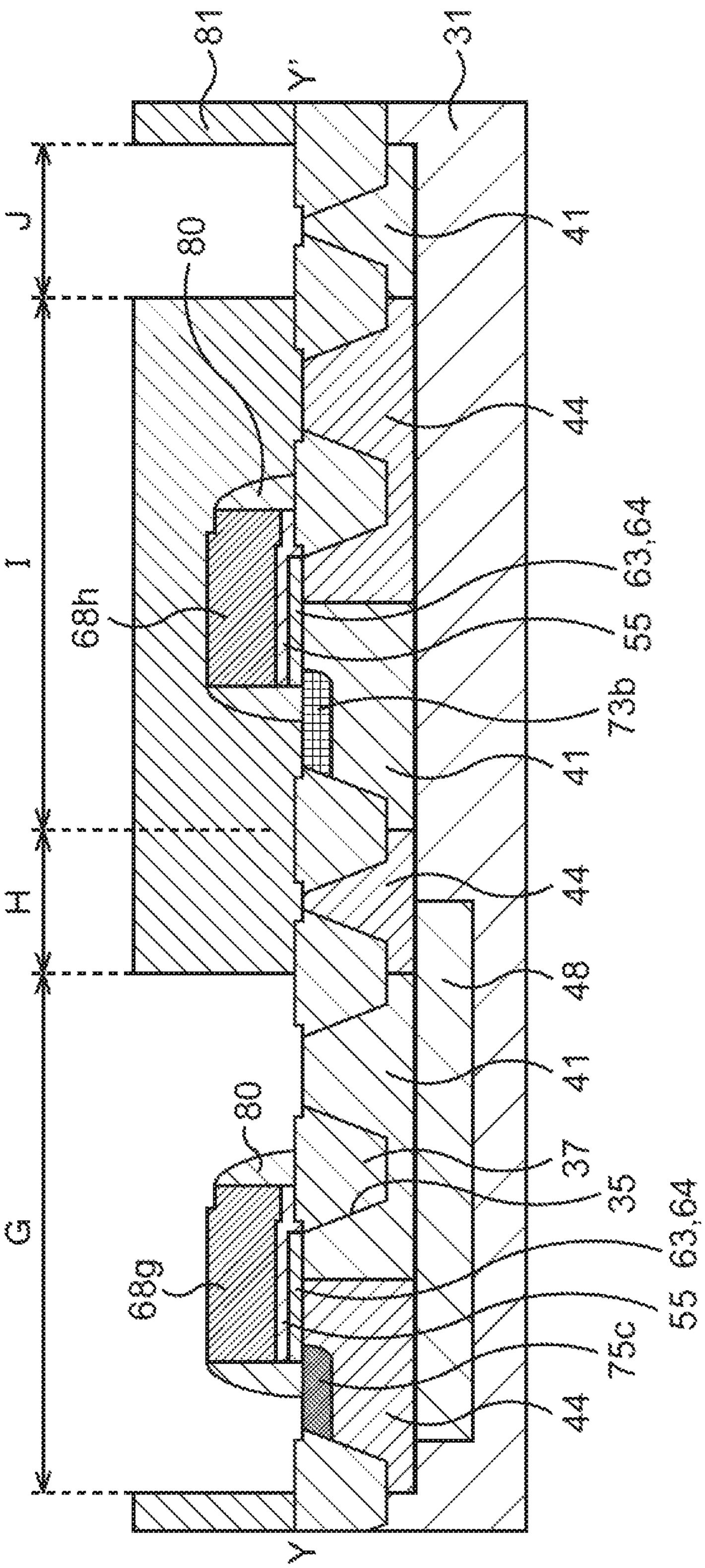
Figure 151:
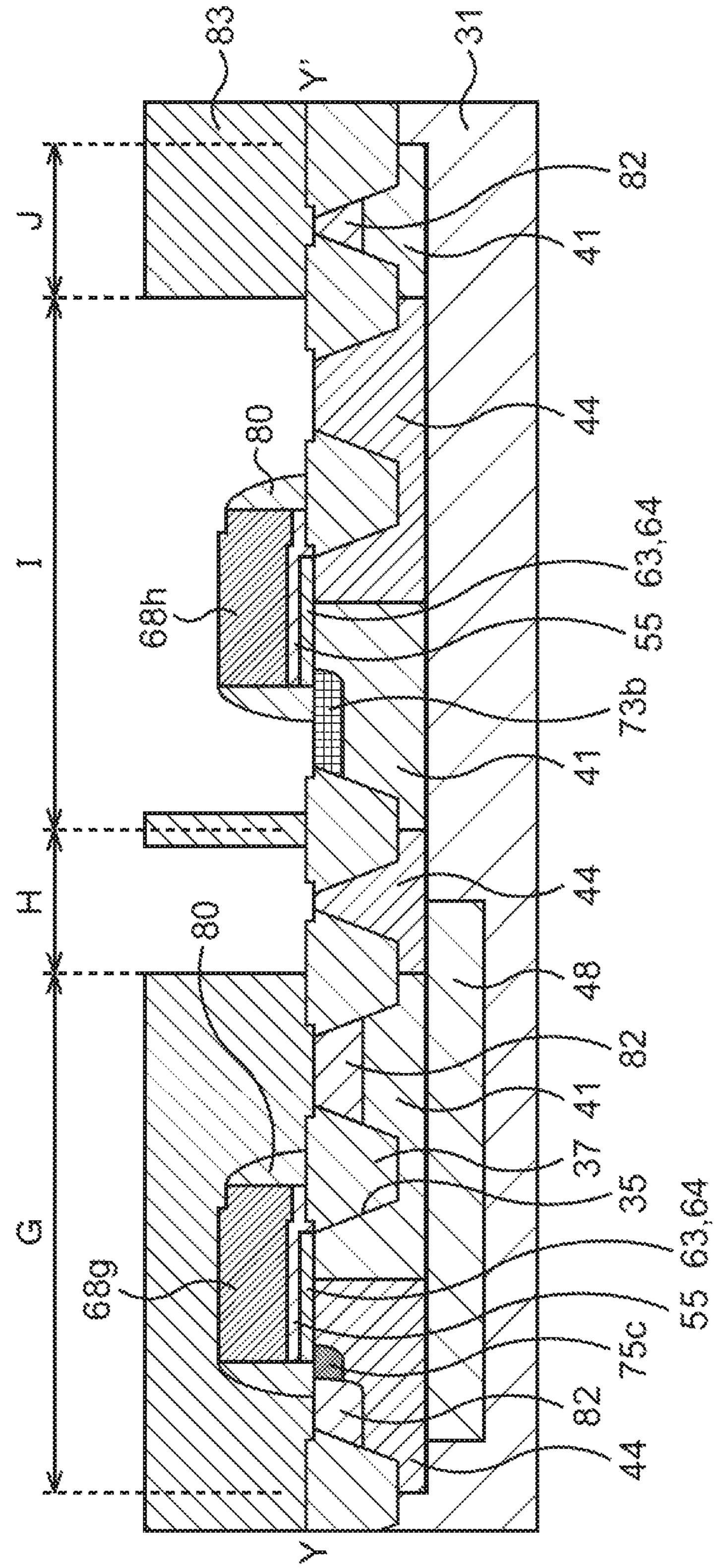
Figure 152:
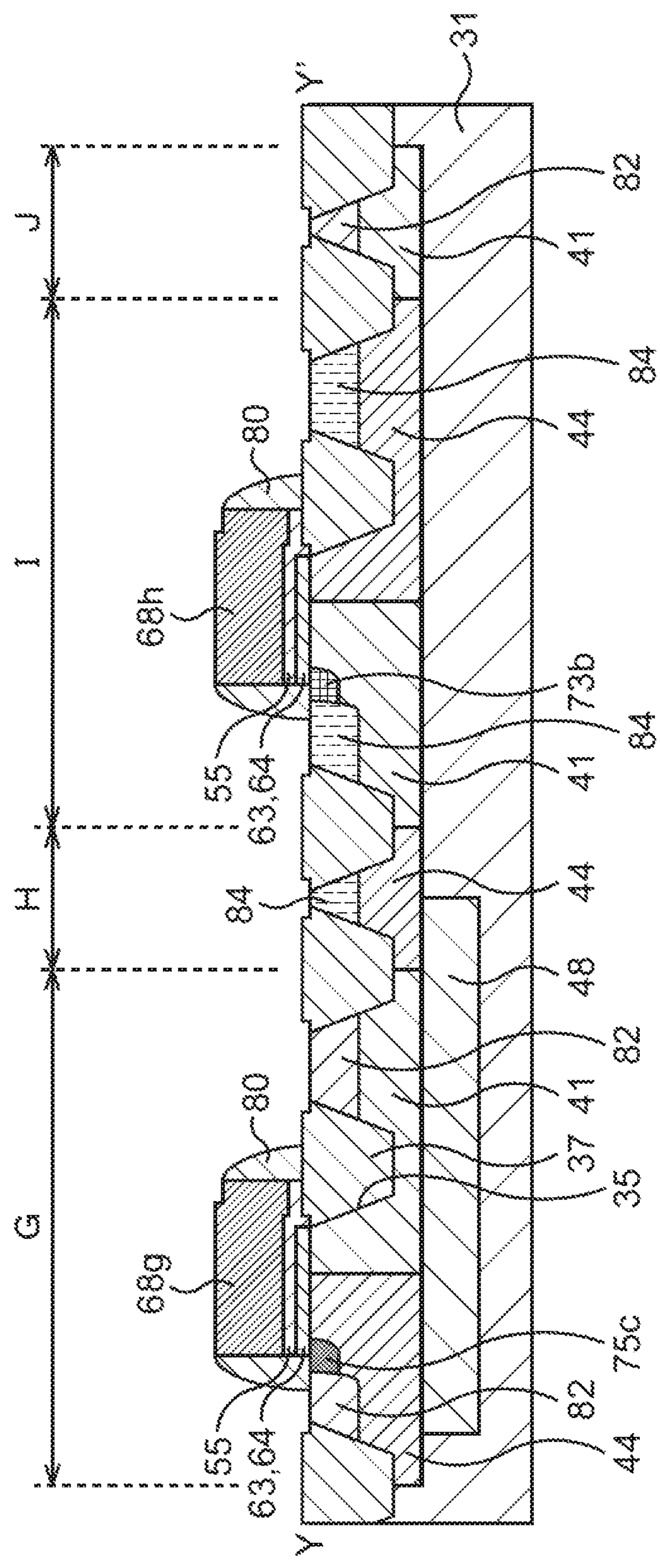
Figure 153:
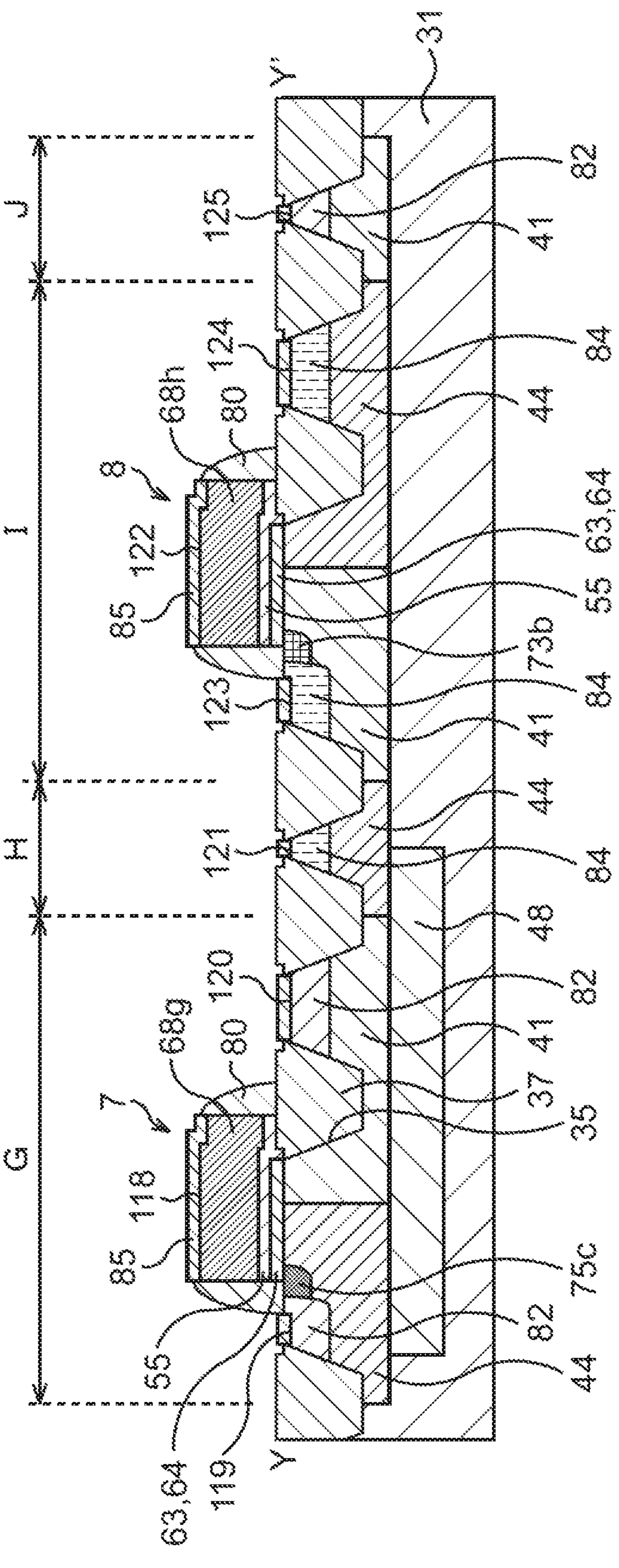
Figure 154:
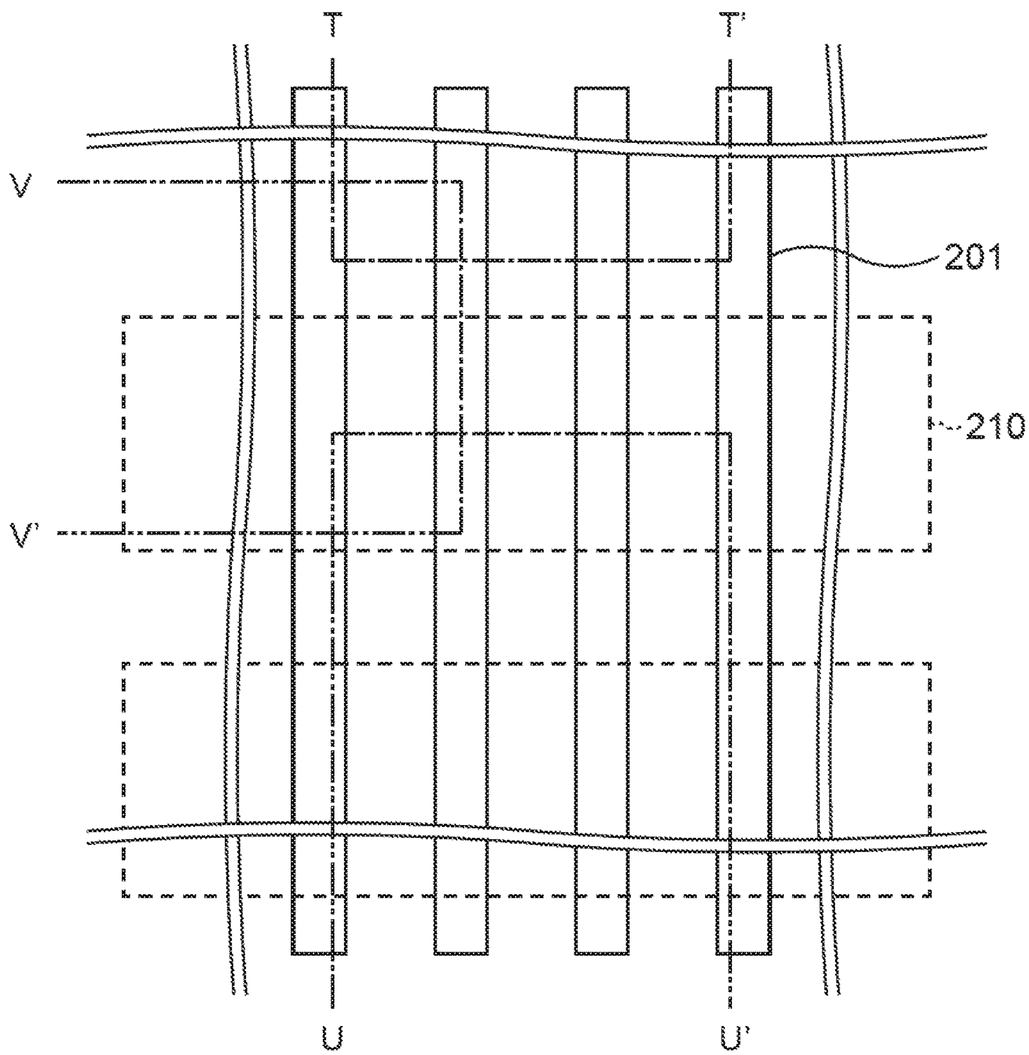
Figure 155:
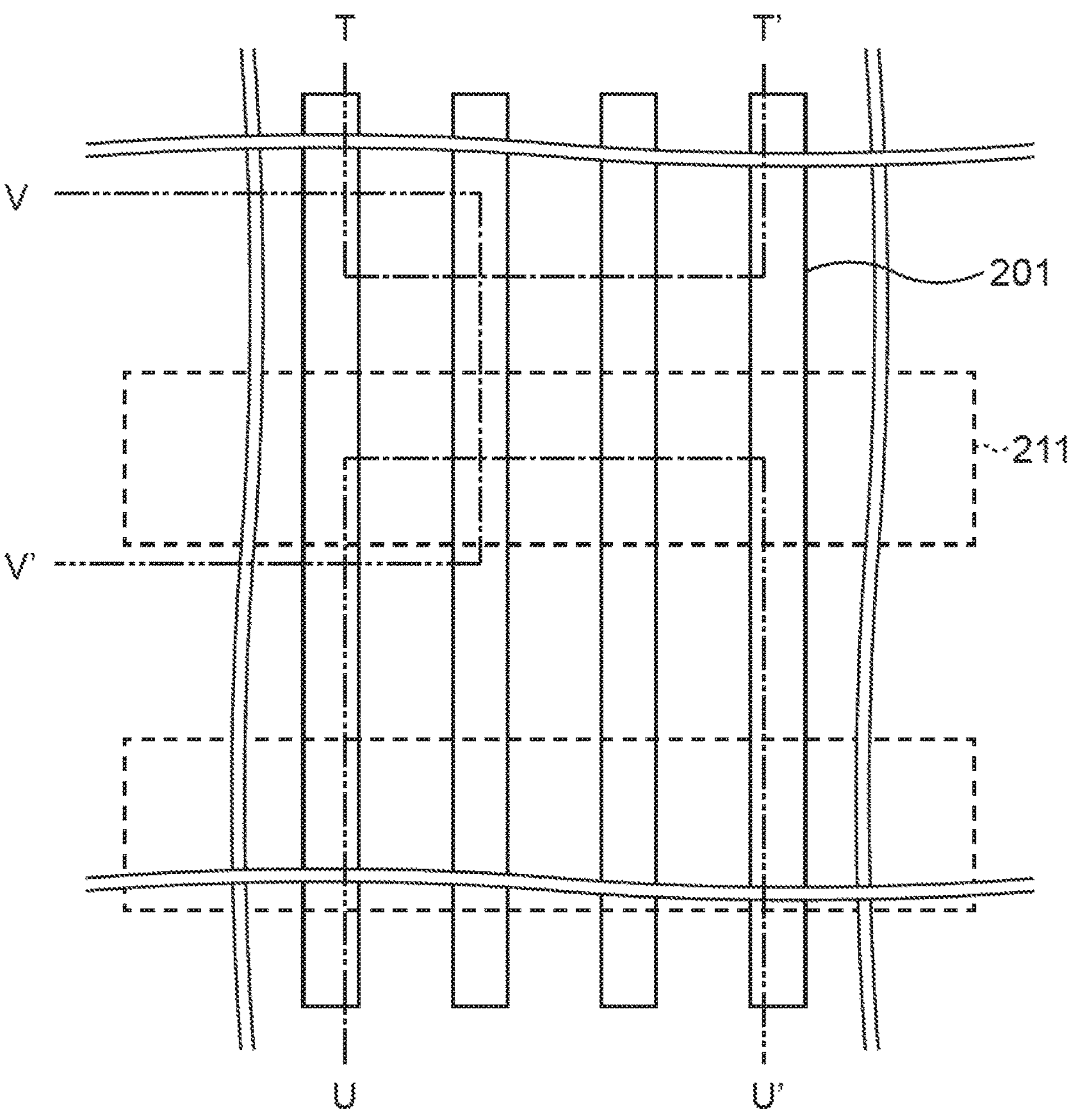
Figure 156:
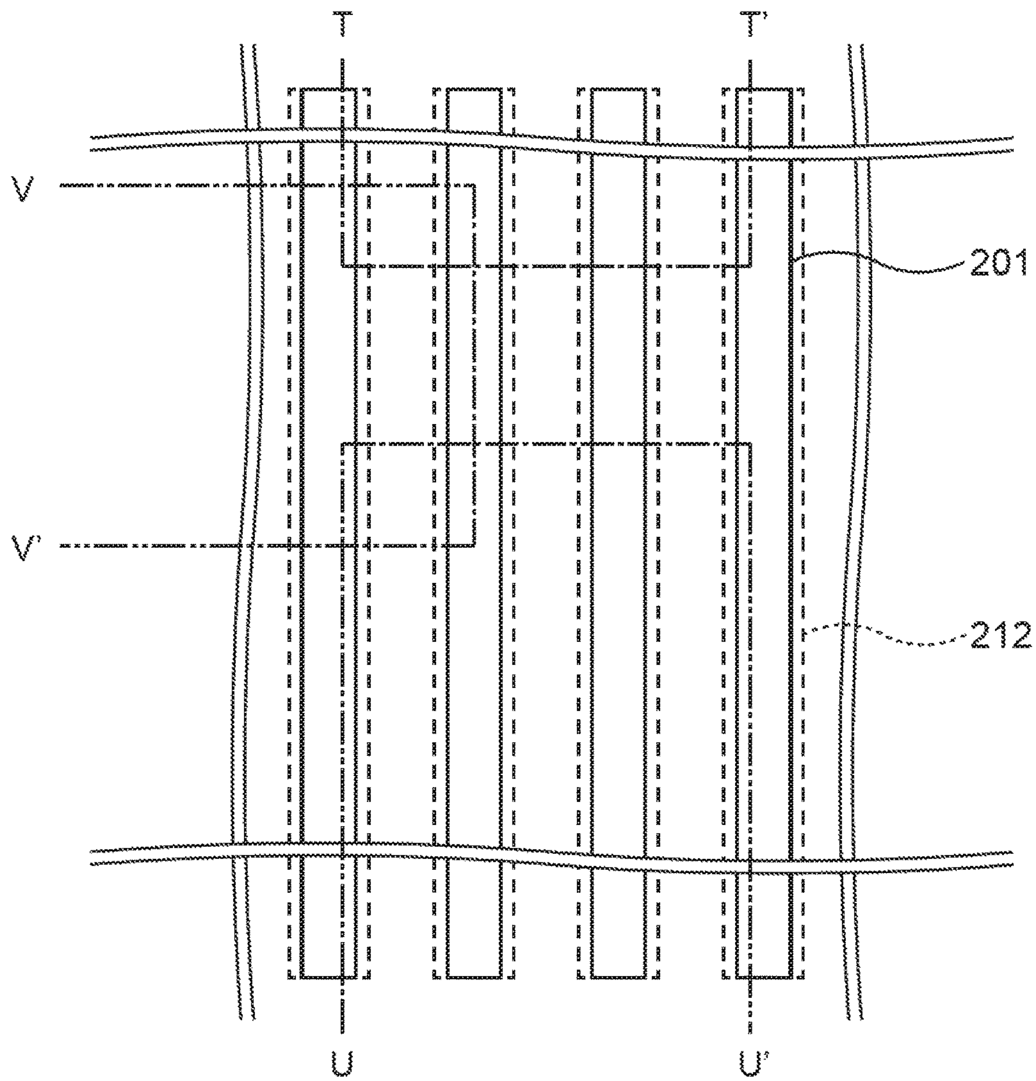
Figure 157:
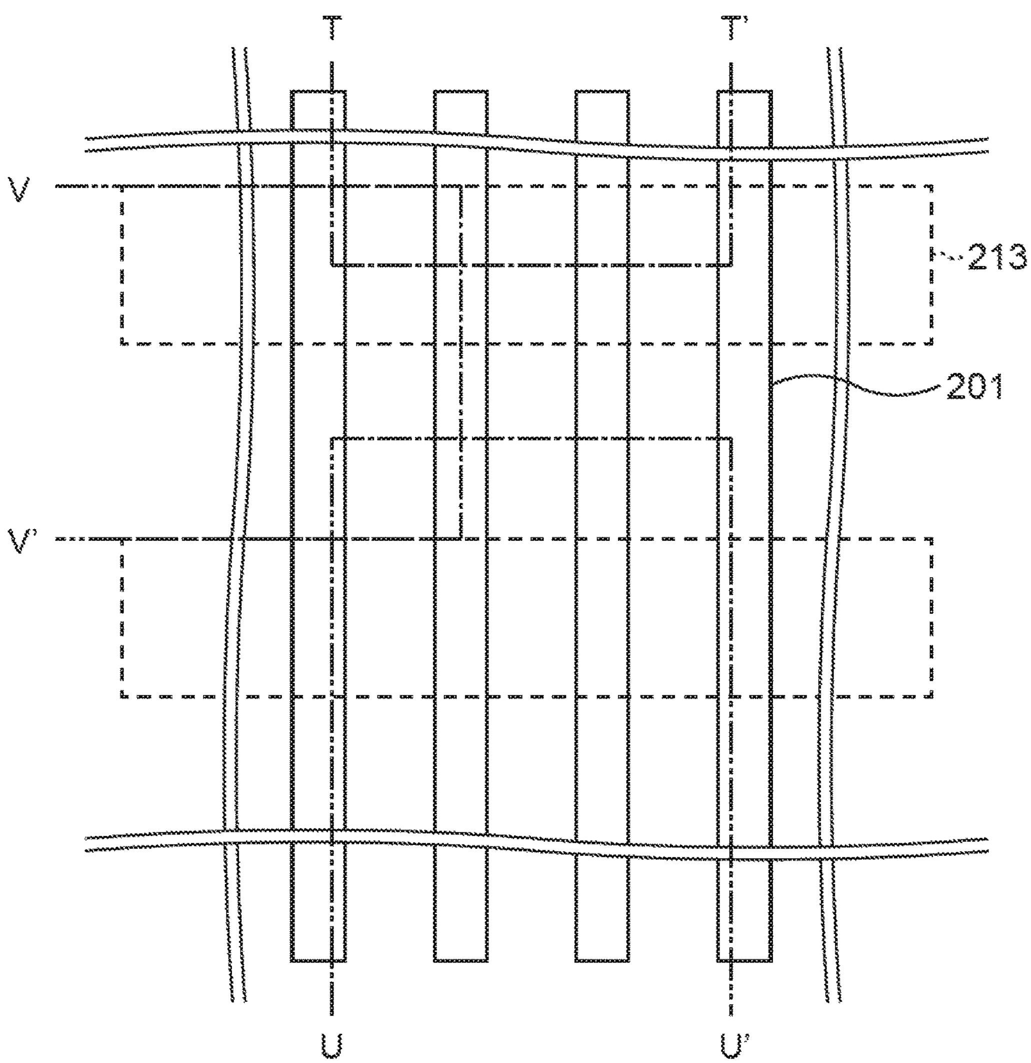
Figure 158:
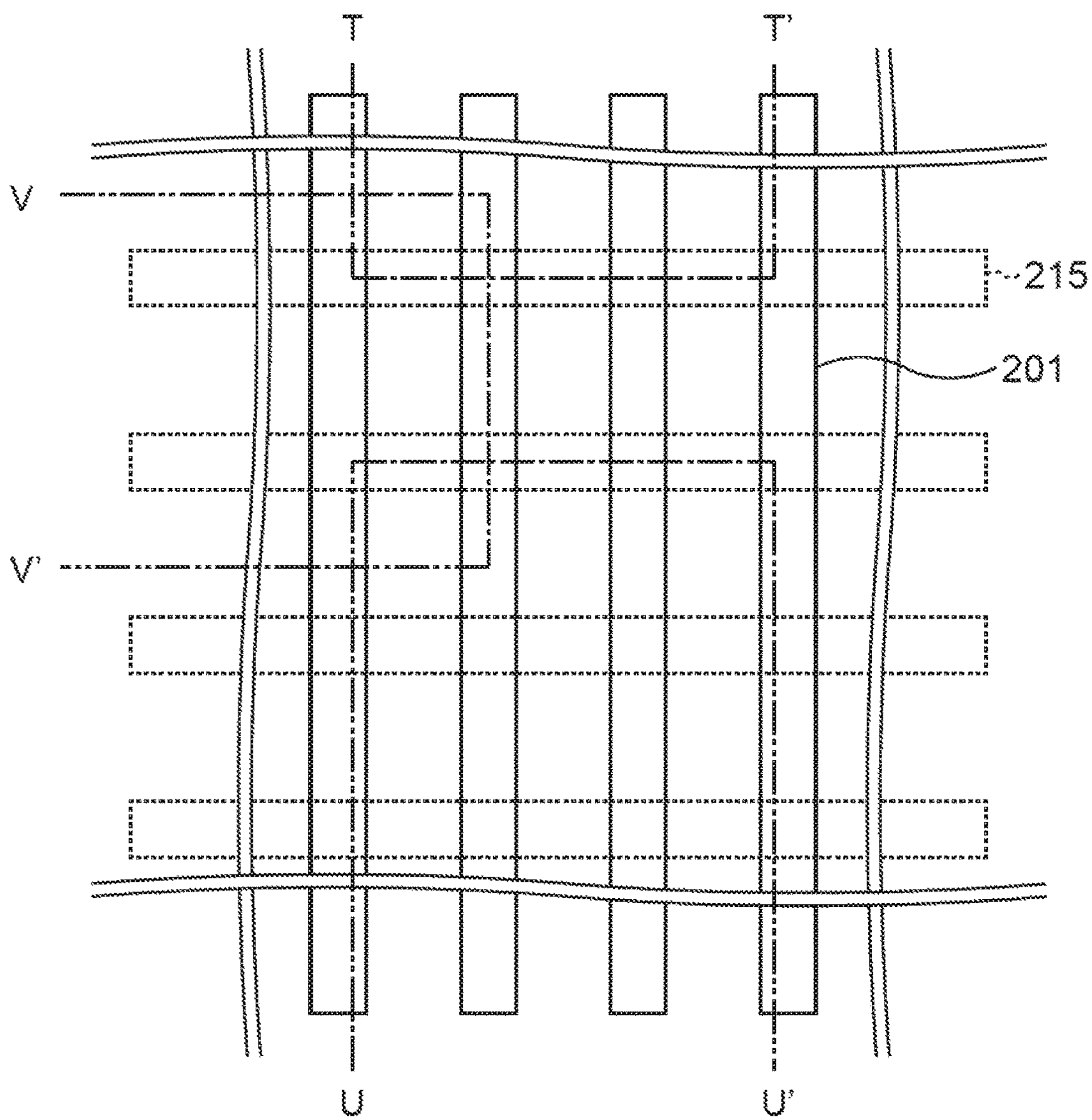
Figure 159:
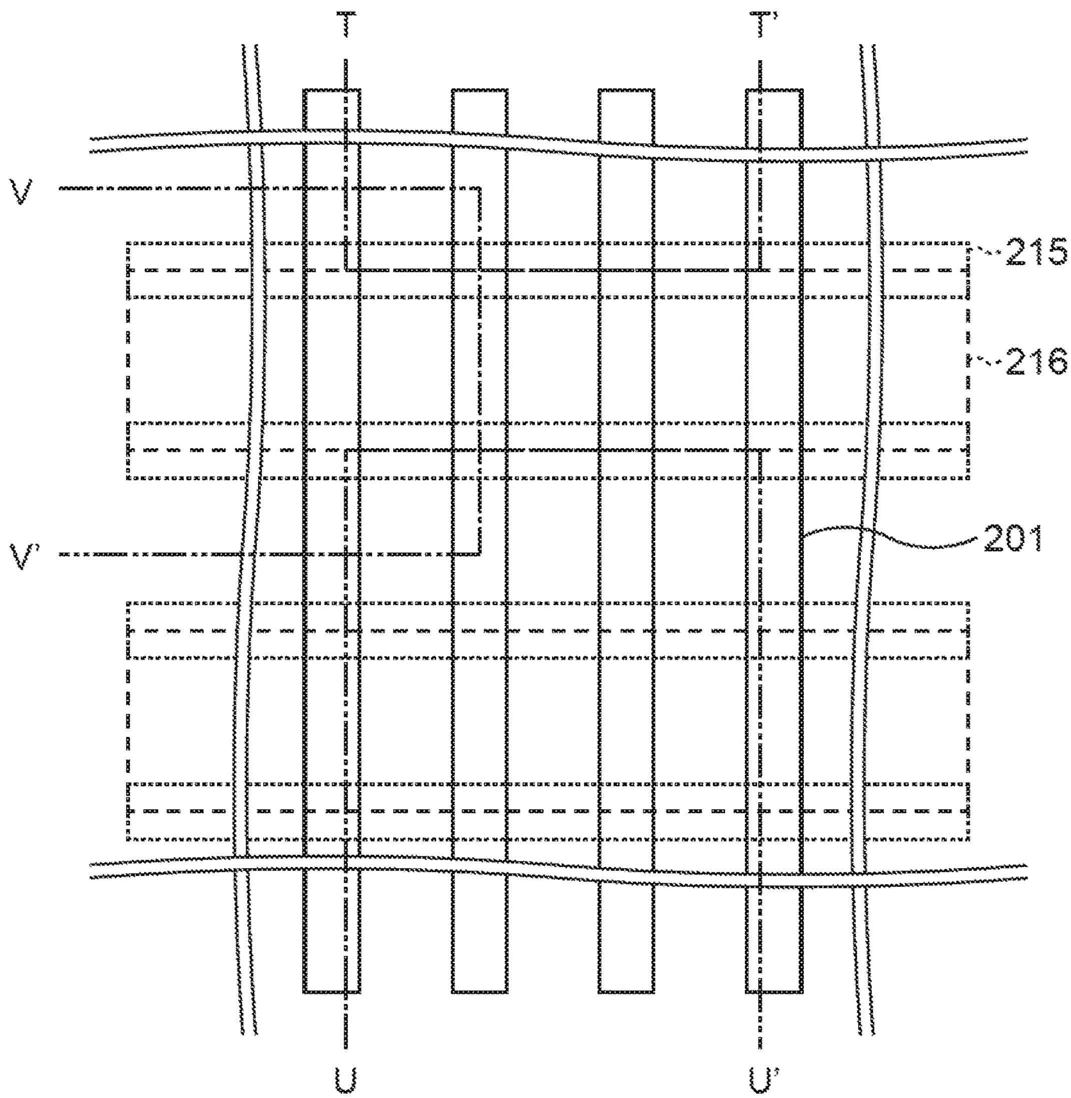
Figure 160:
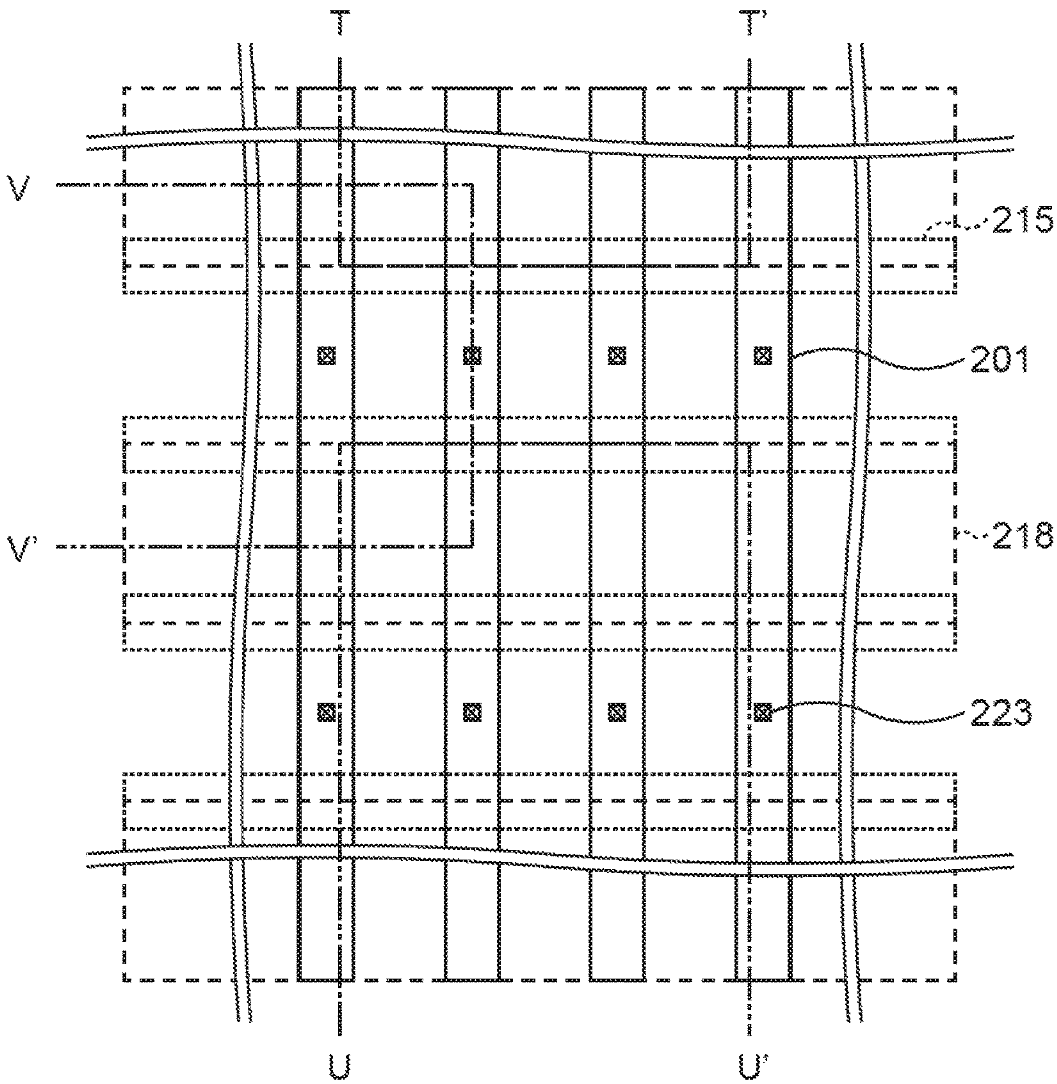
Figure 161A:
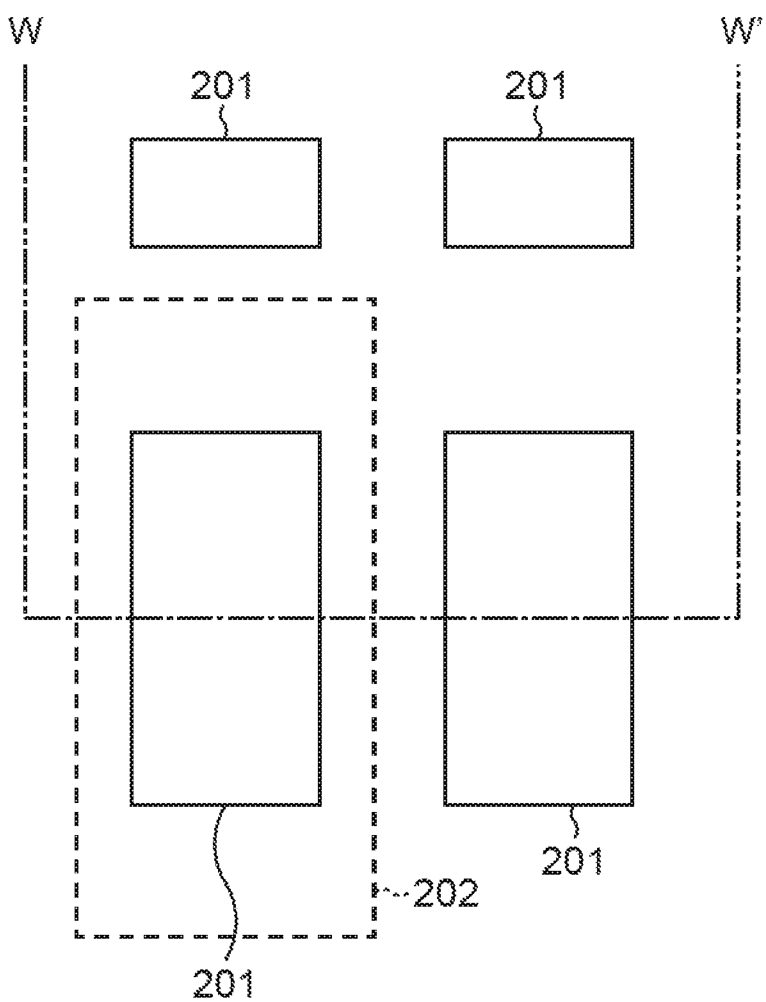
Figure 161B:
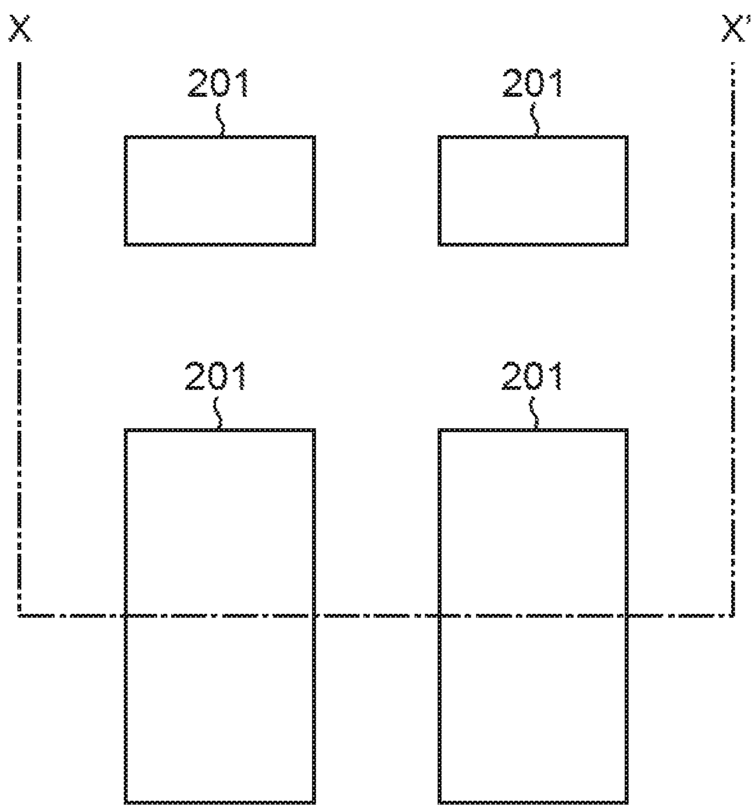
Figure 162A:
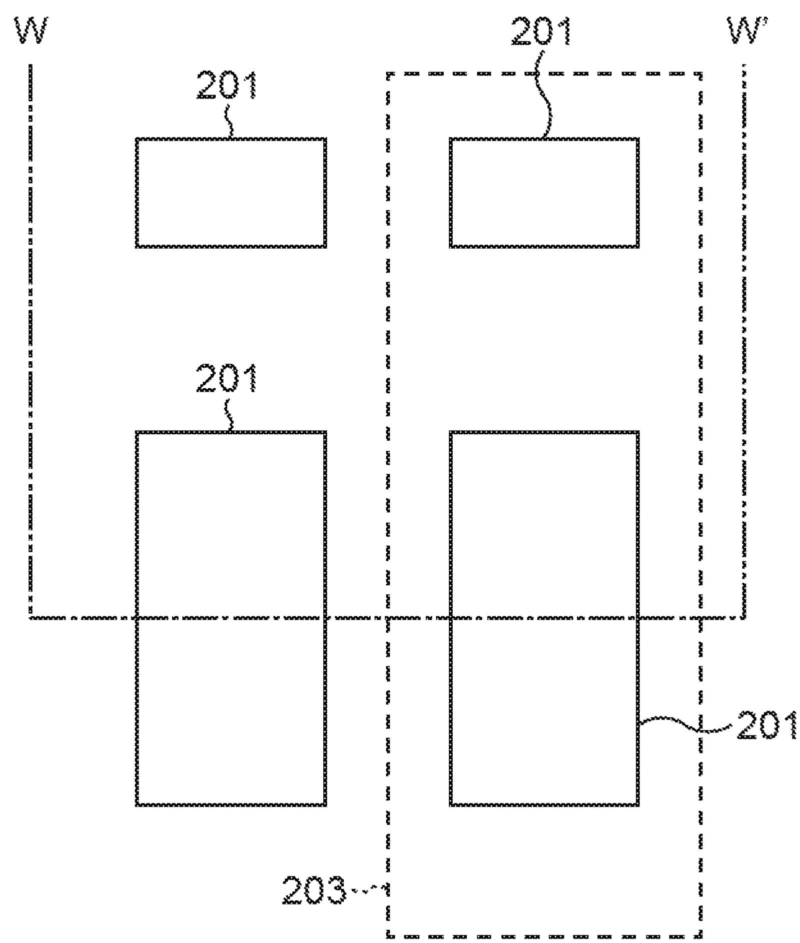
Figure 162B:
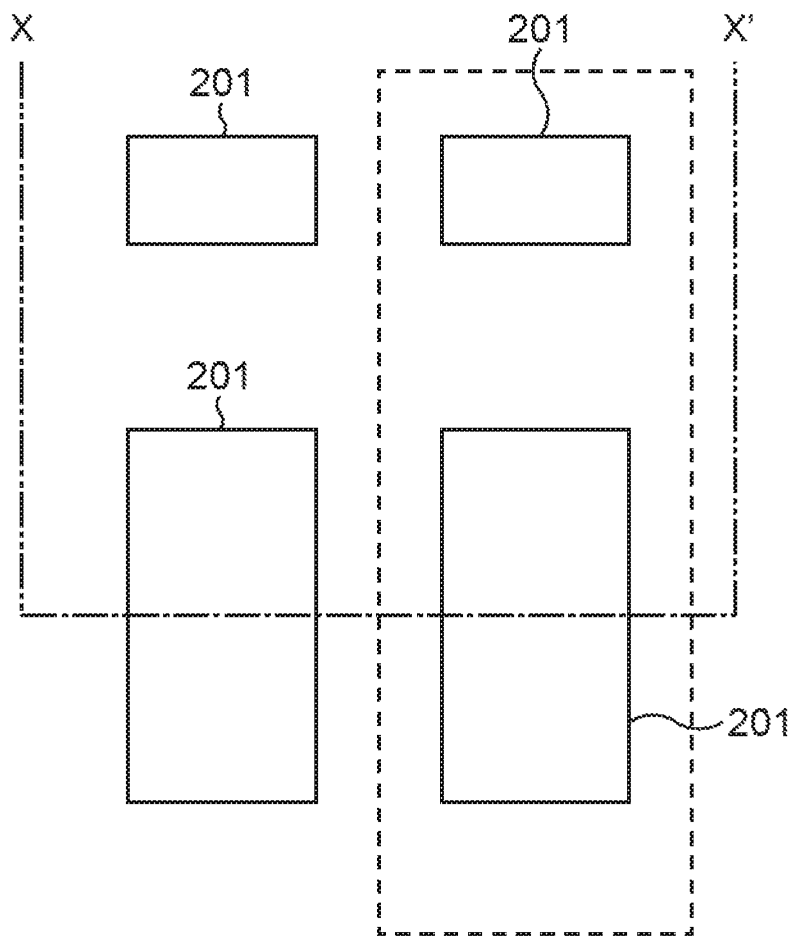
Figure 163A:
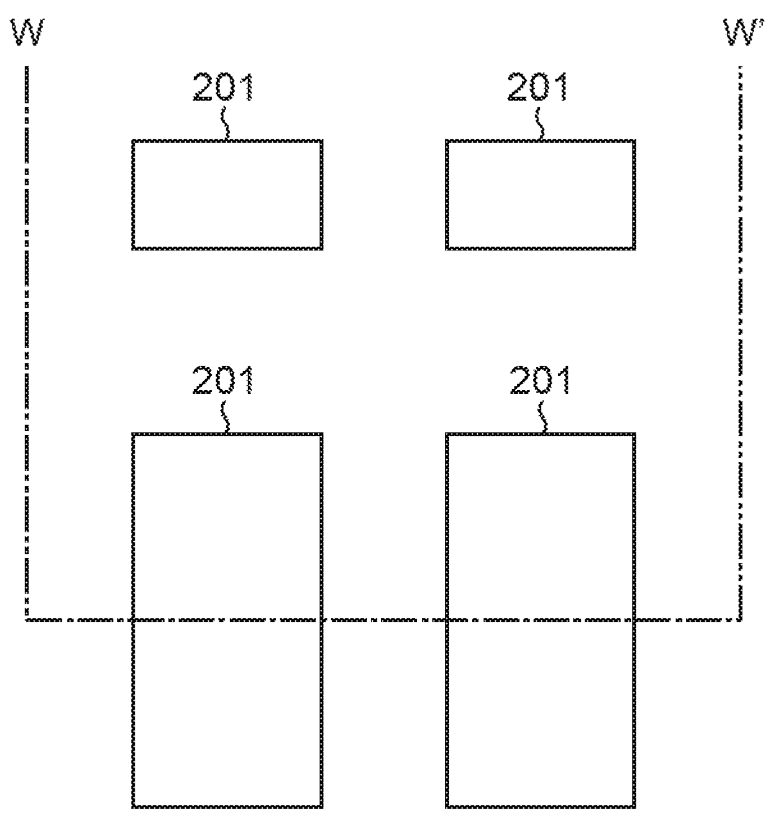
Figure 163B:
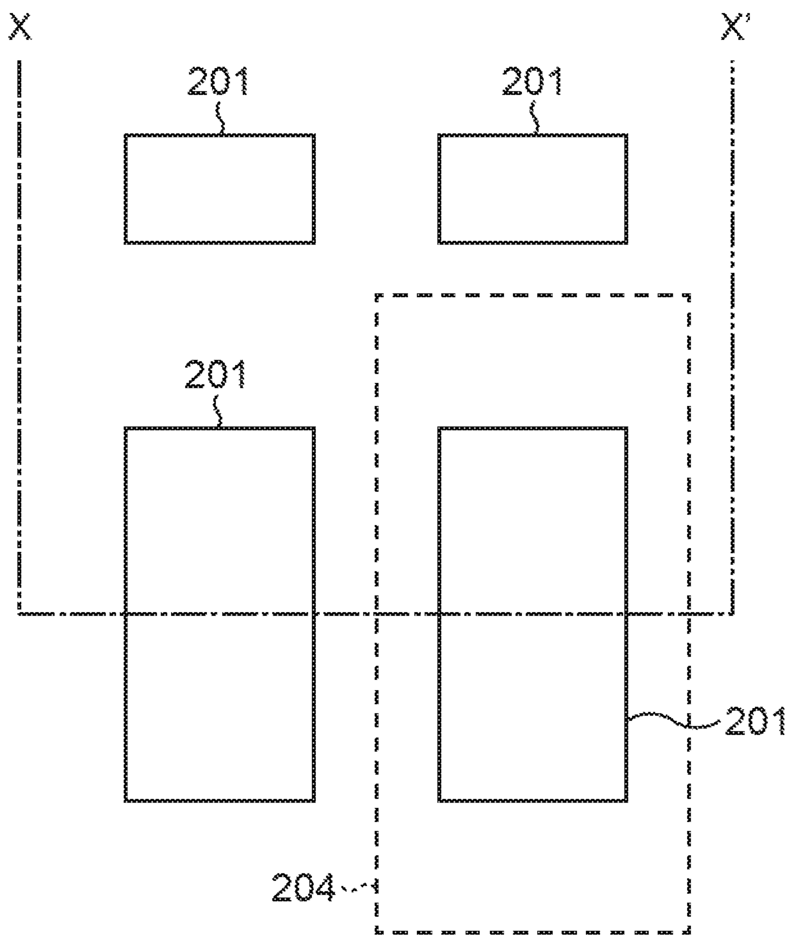
Figure 164A:
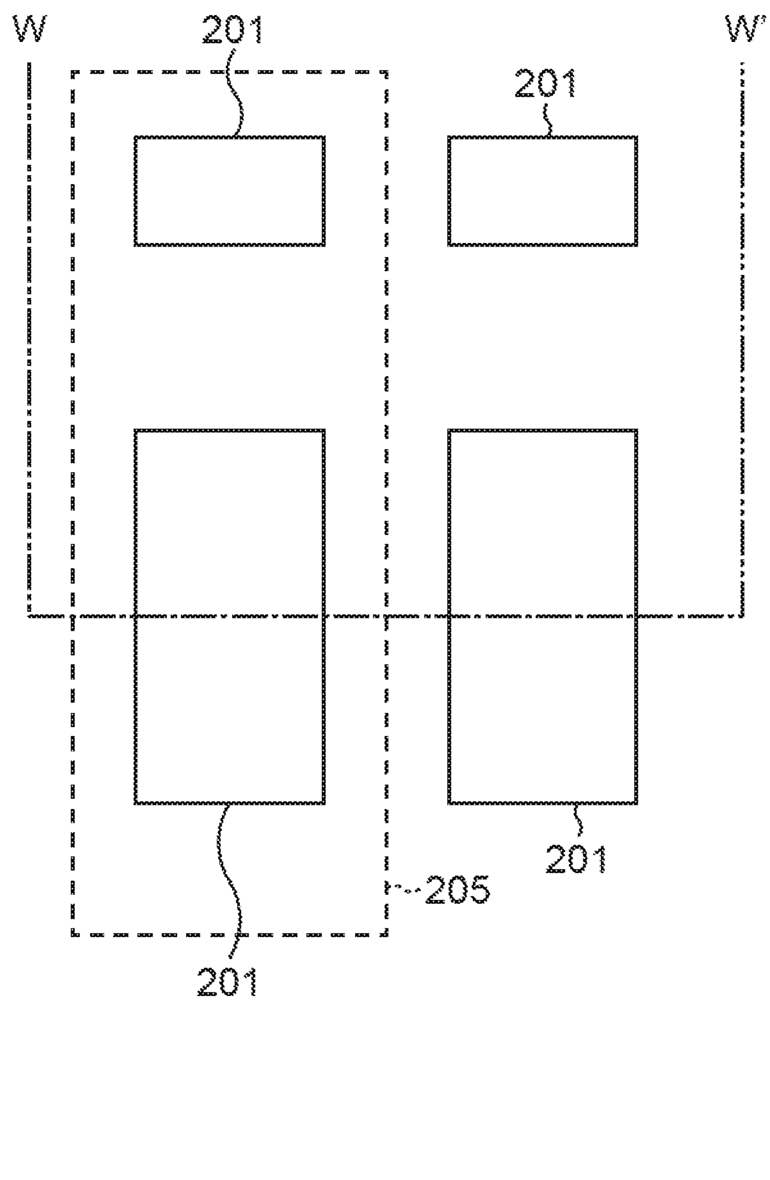
Figure 164B:
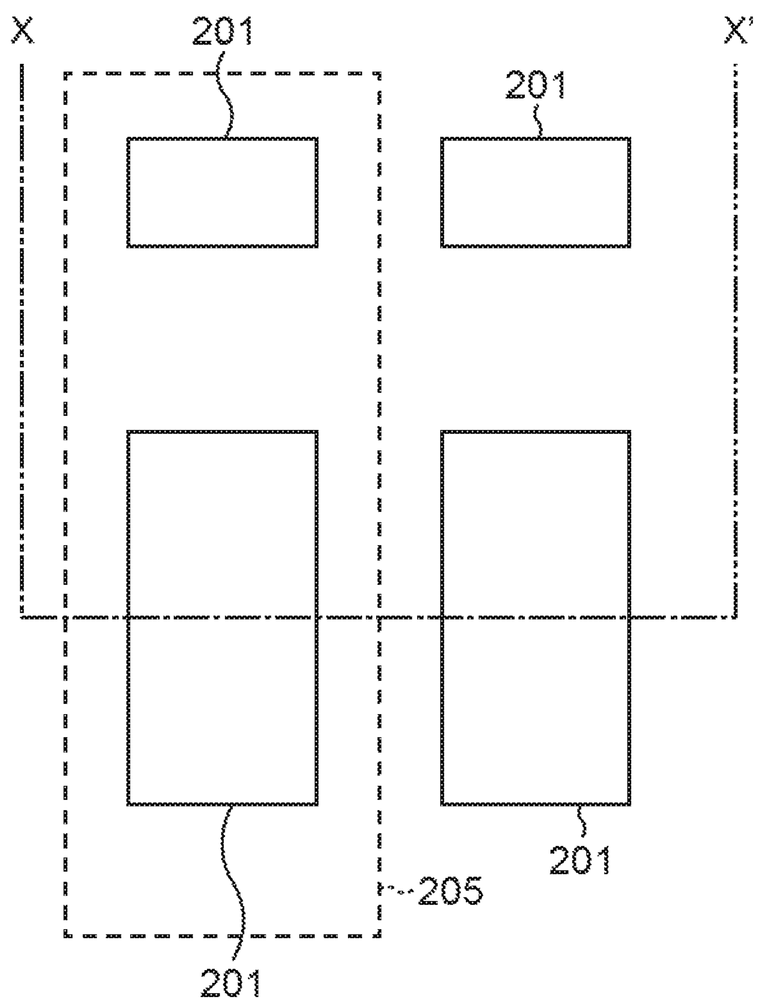
Figure 165A:
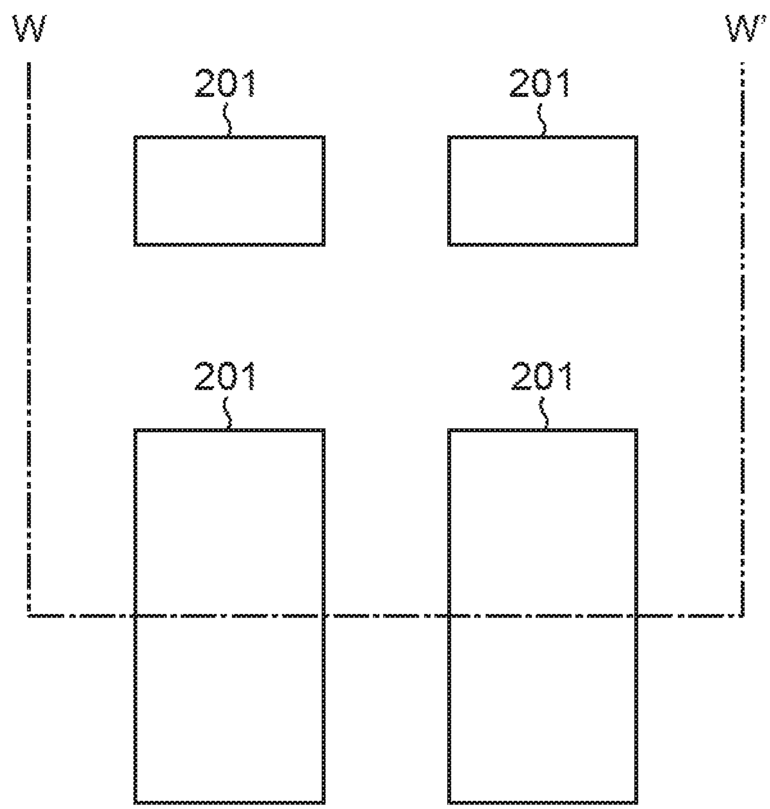
Figure 165B:
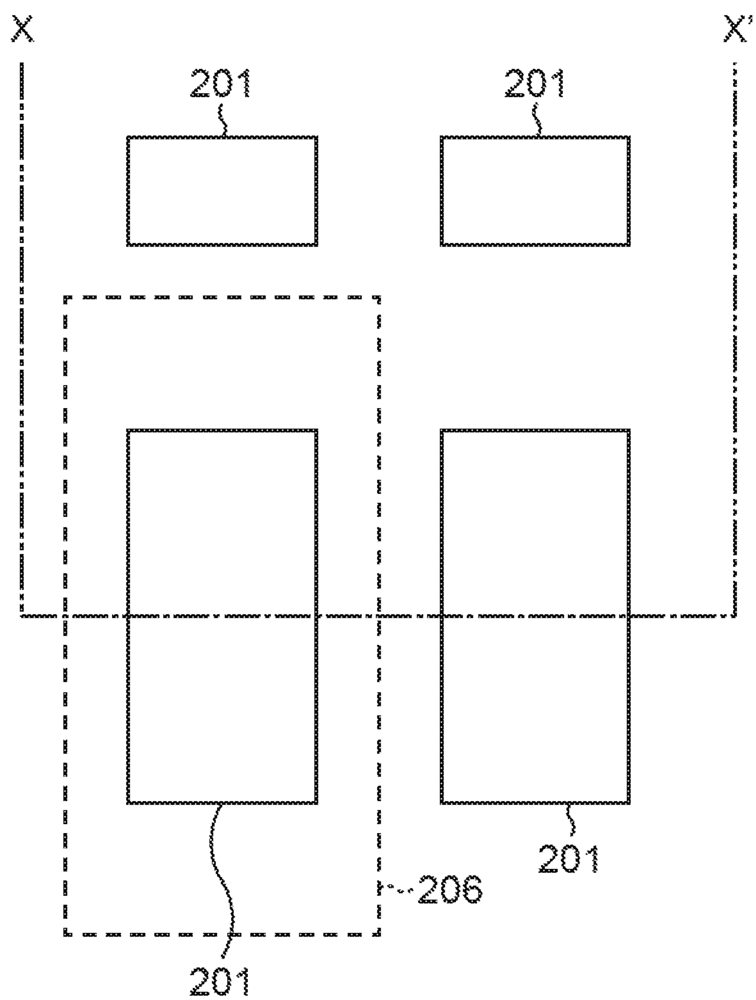
Figure 166A:
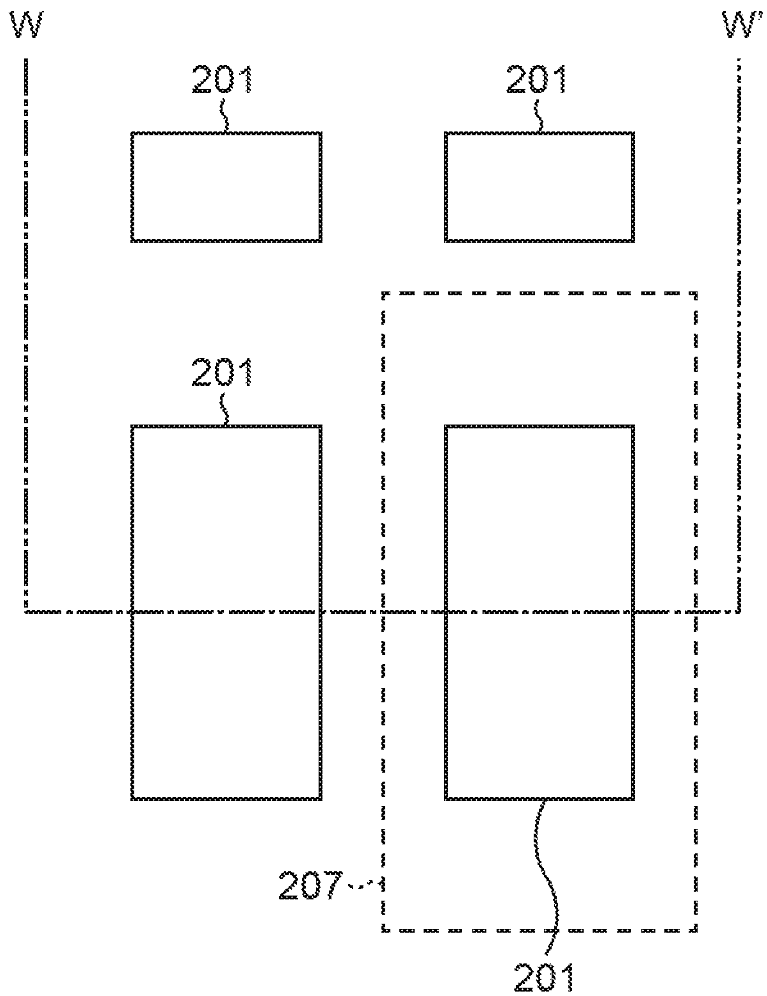
Figure 166B:
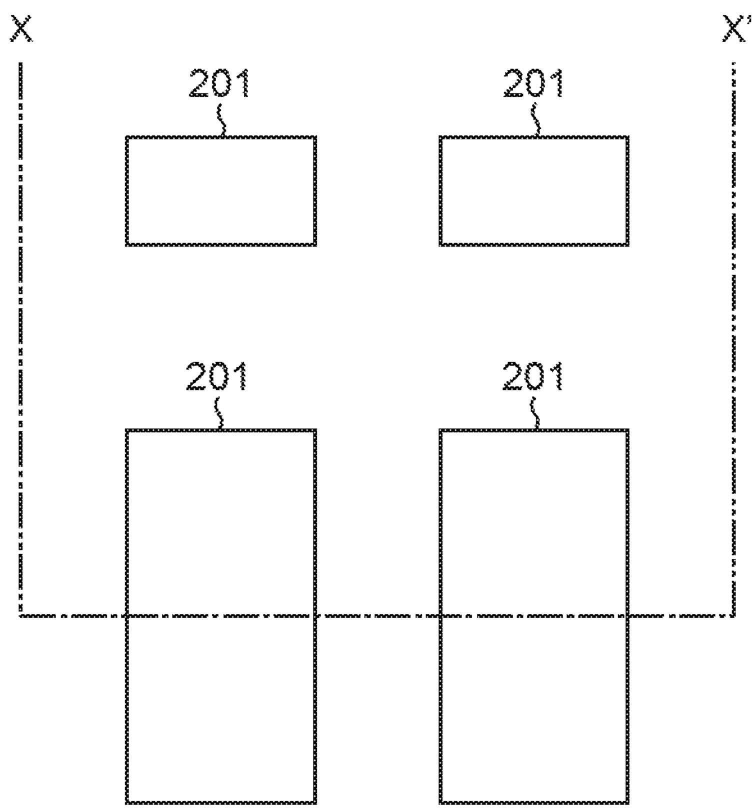
Figure 167A:
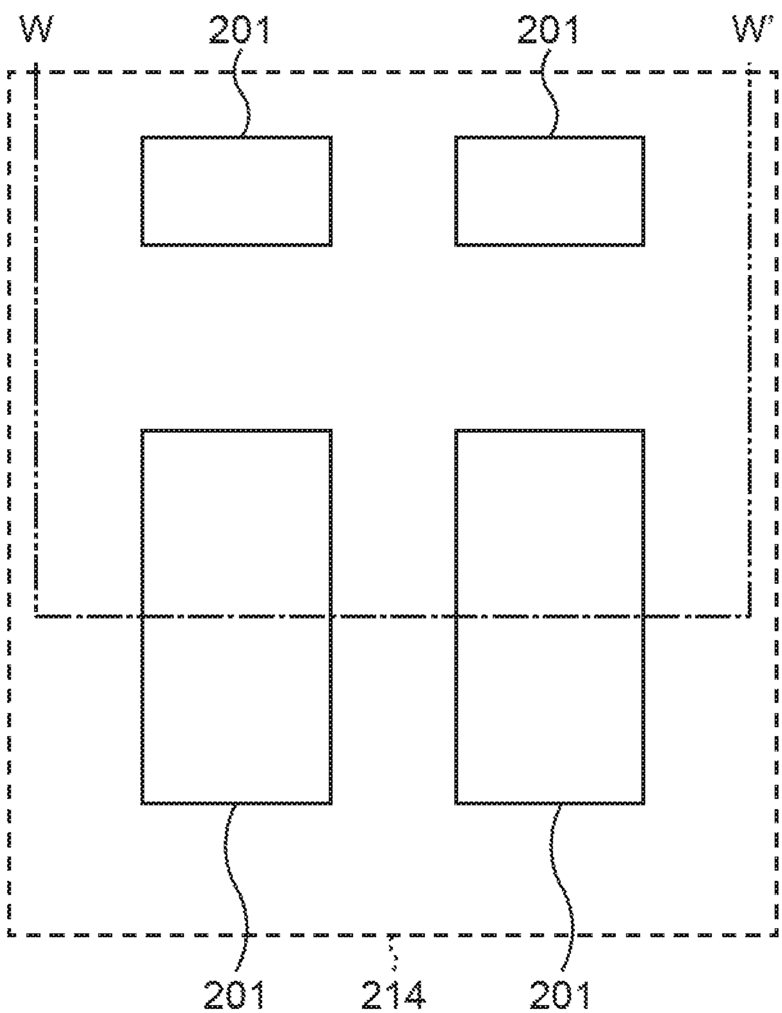
Figure 167B:
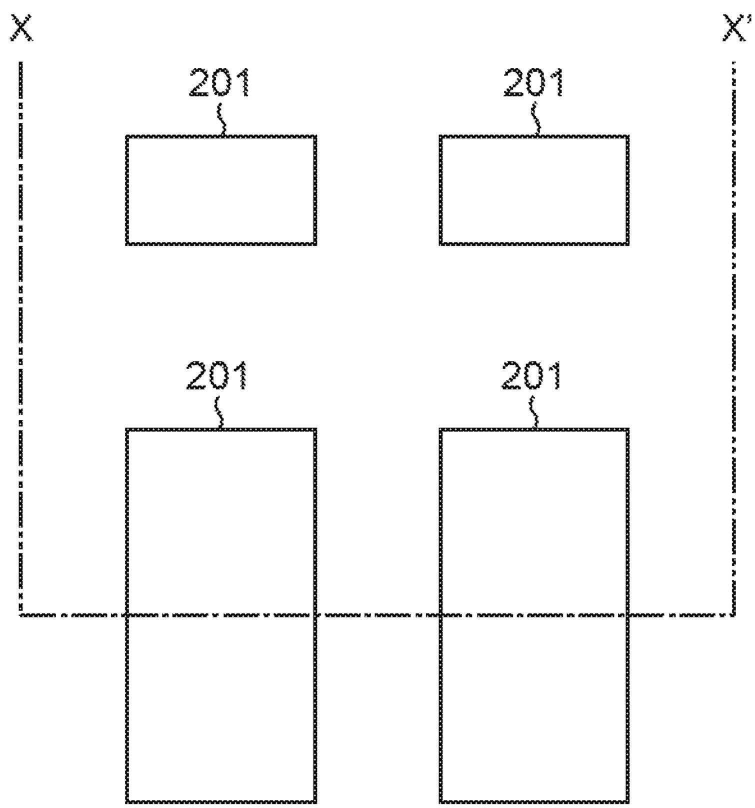
Figure 168A:
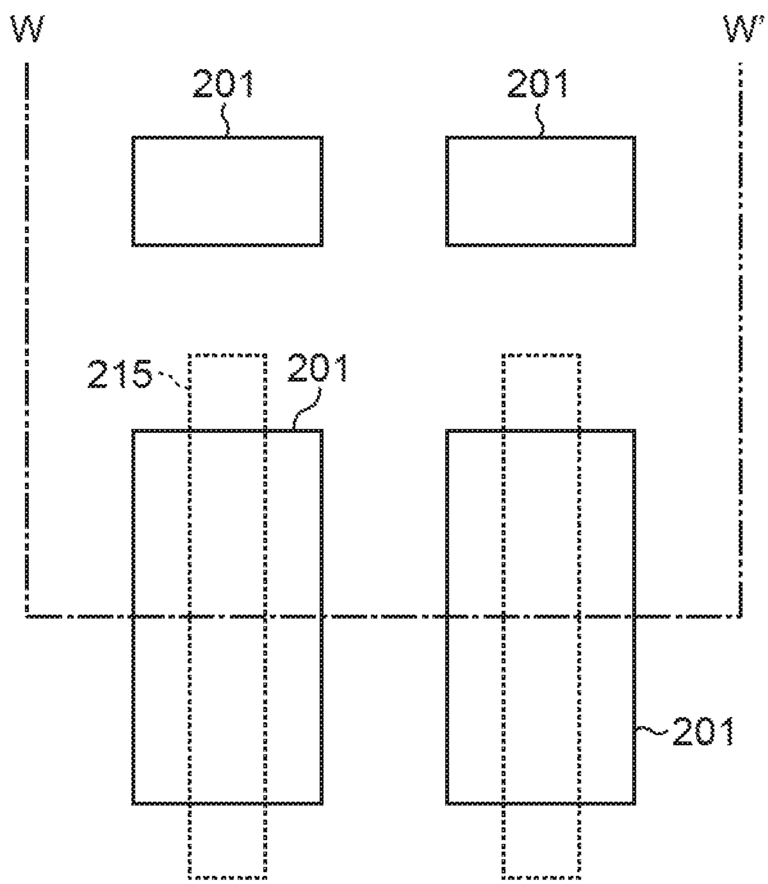
Figure 168B:
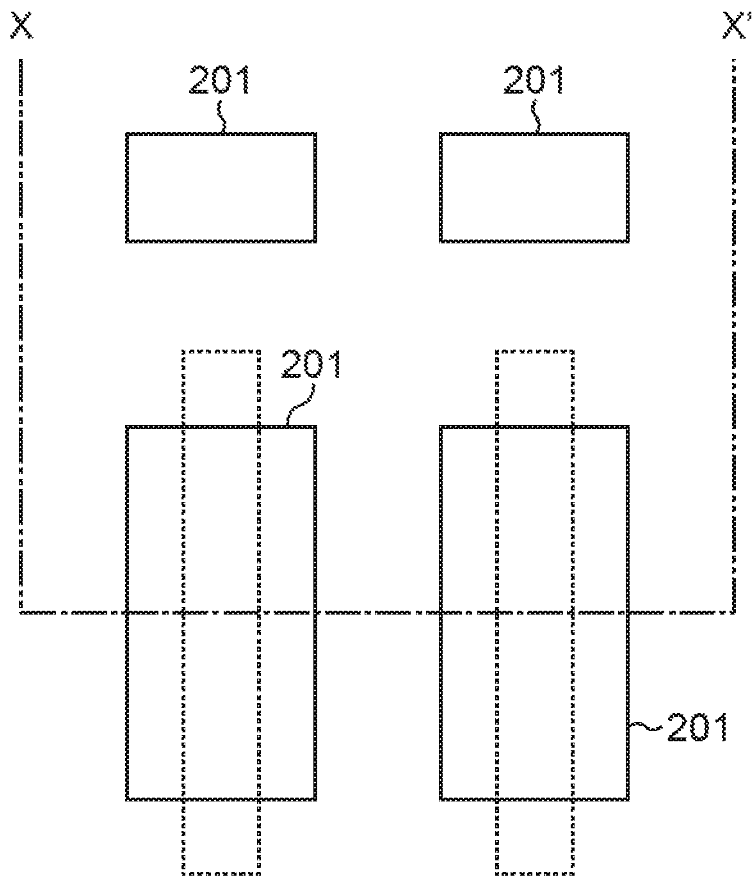
Figure 169A:
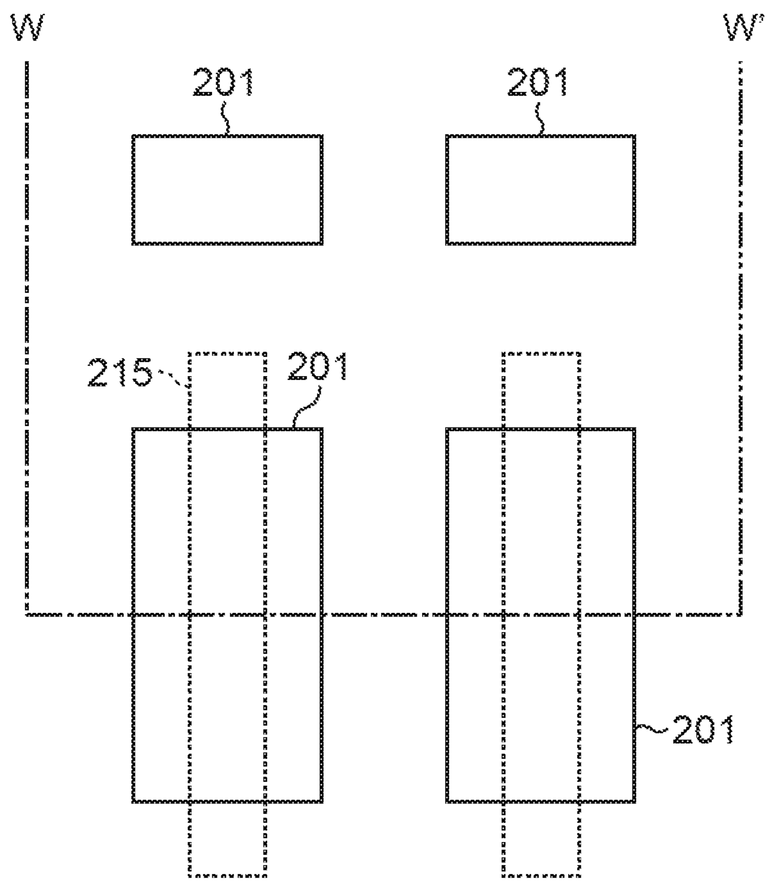
Figure 169B:
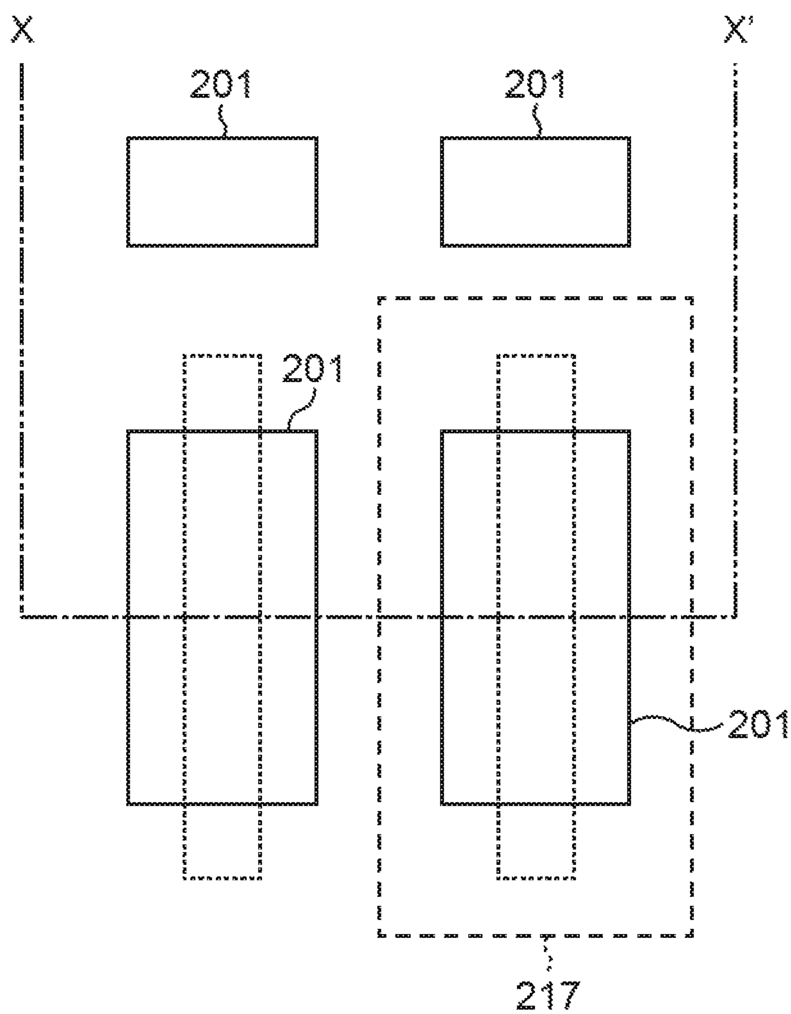
Figure 170A:
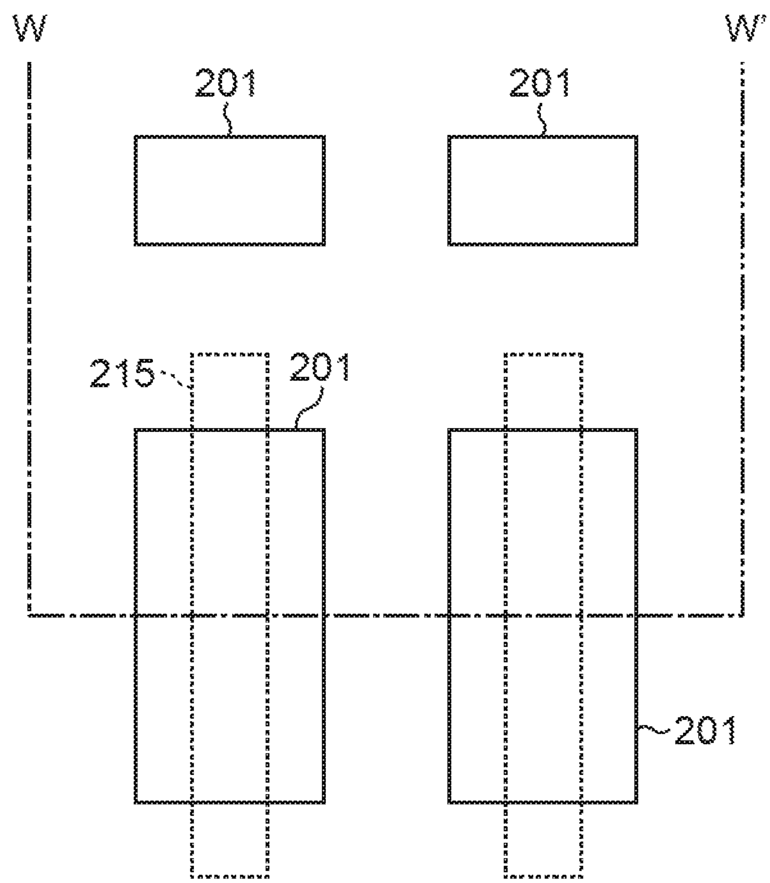
Figure 170B:
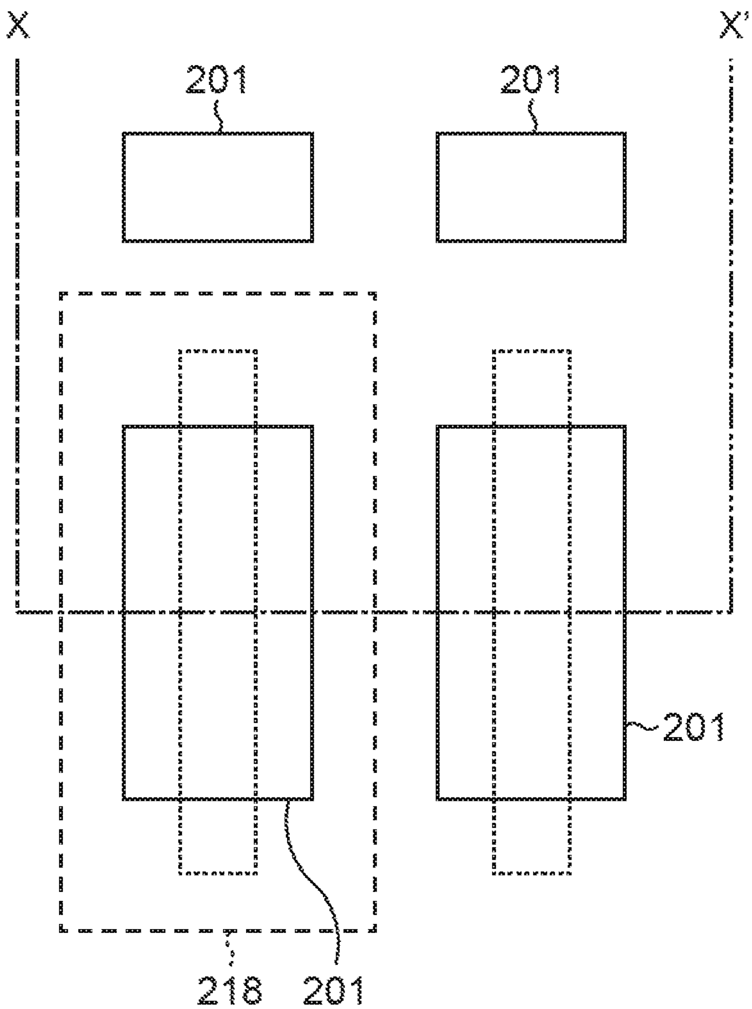
Figure 171A:
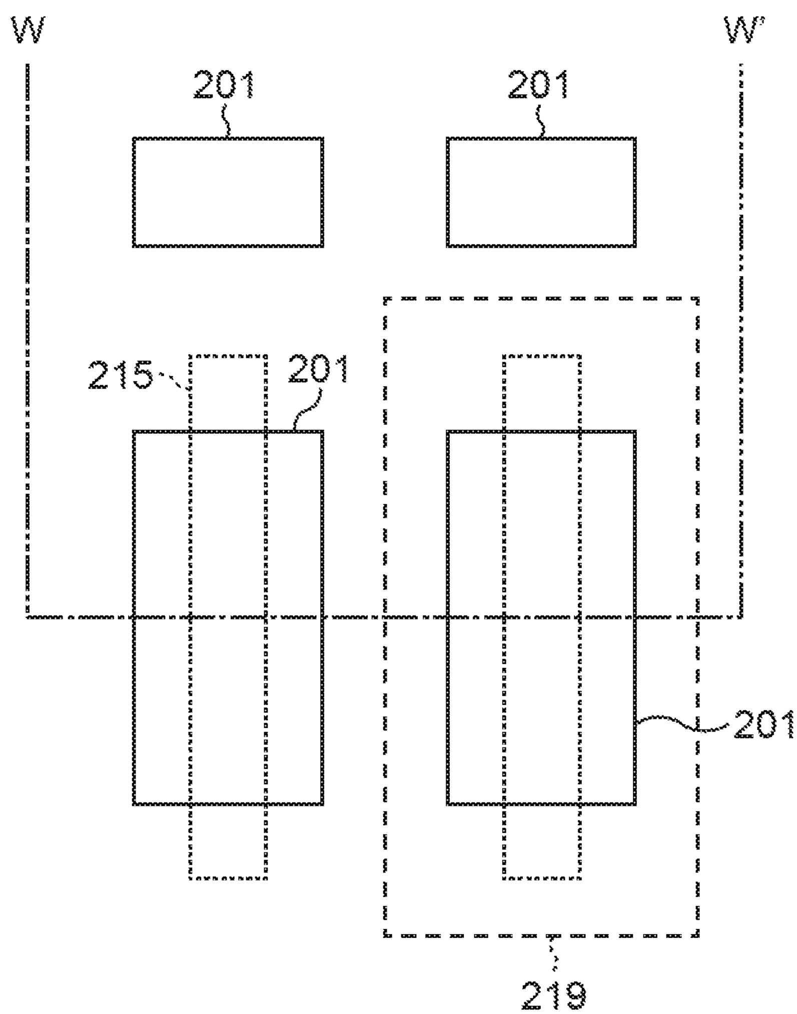
Figure 171B:
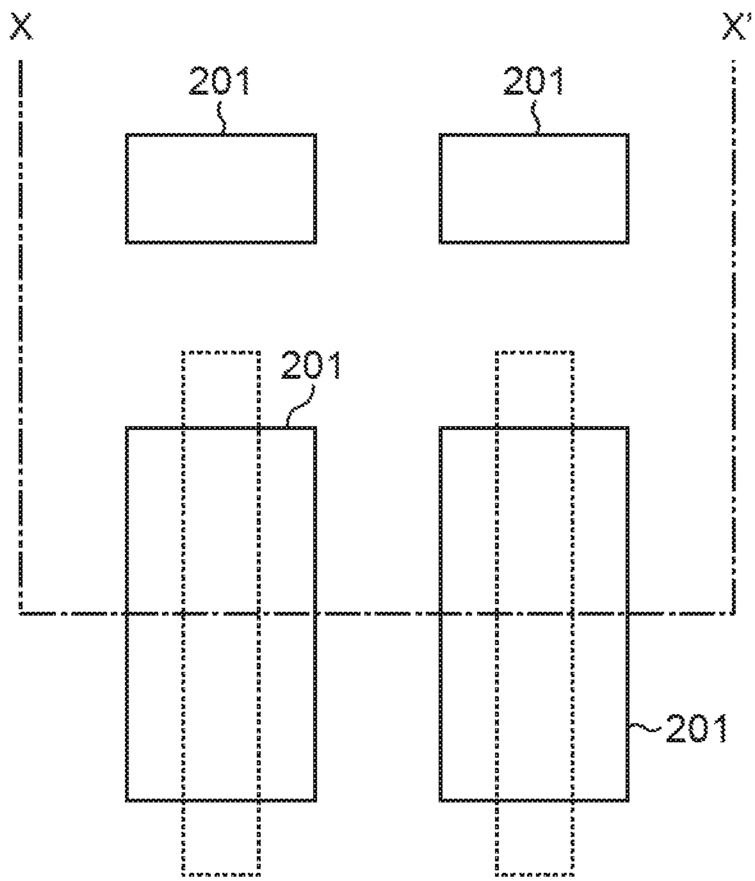
Figure 172A:
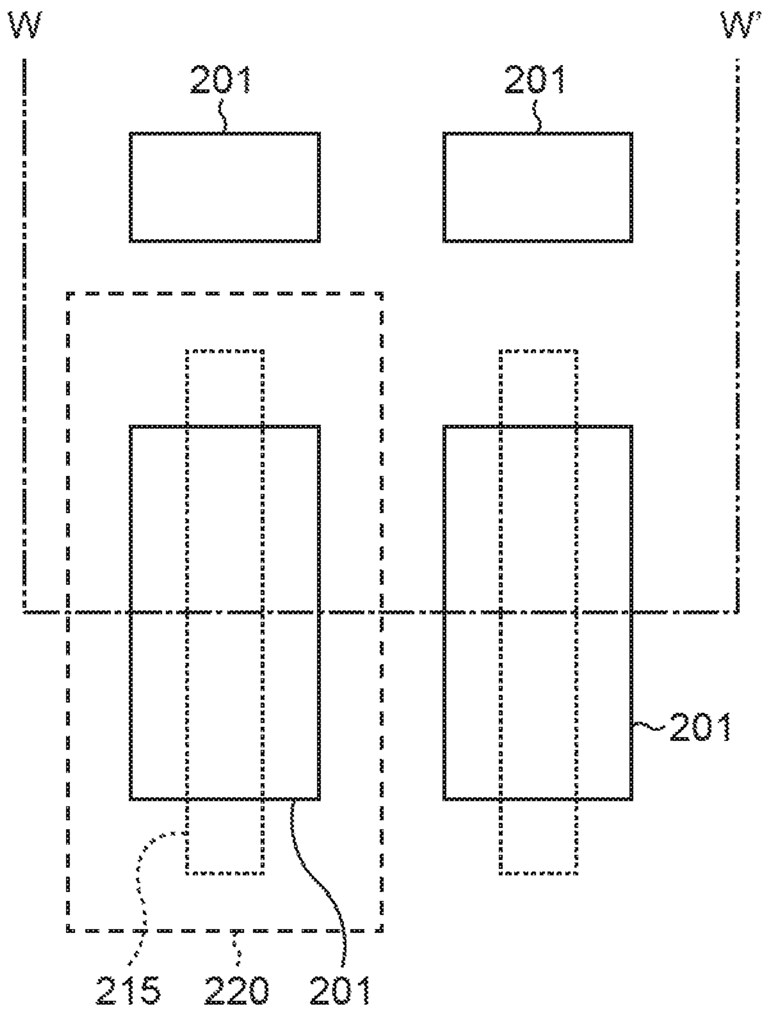
Figure 172B:
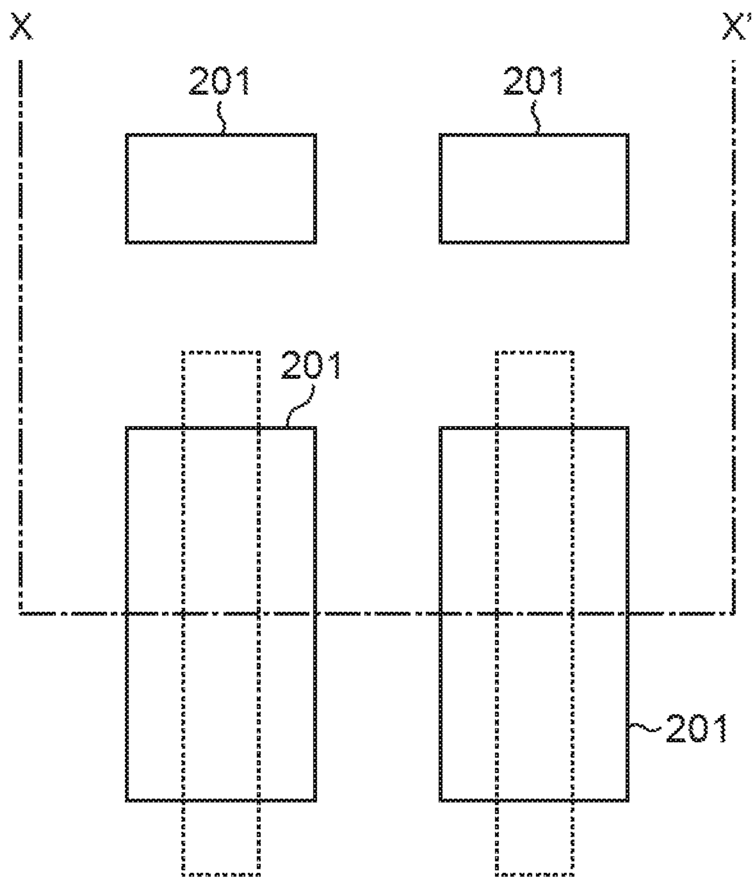
Figure 173A:
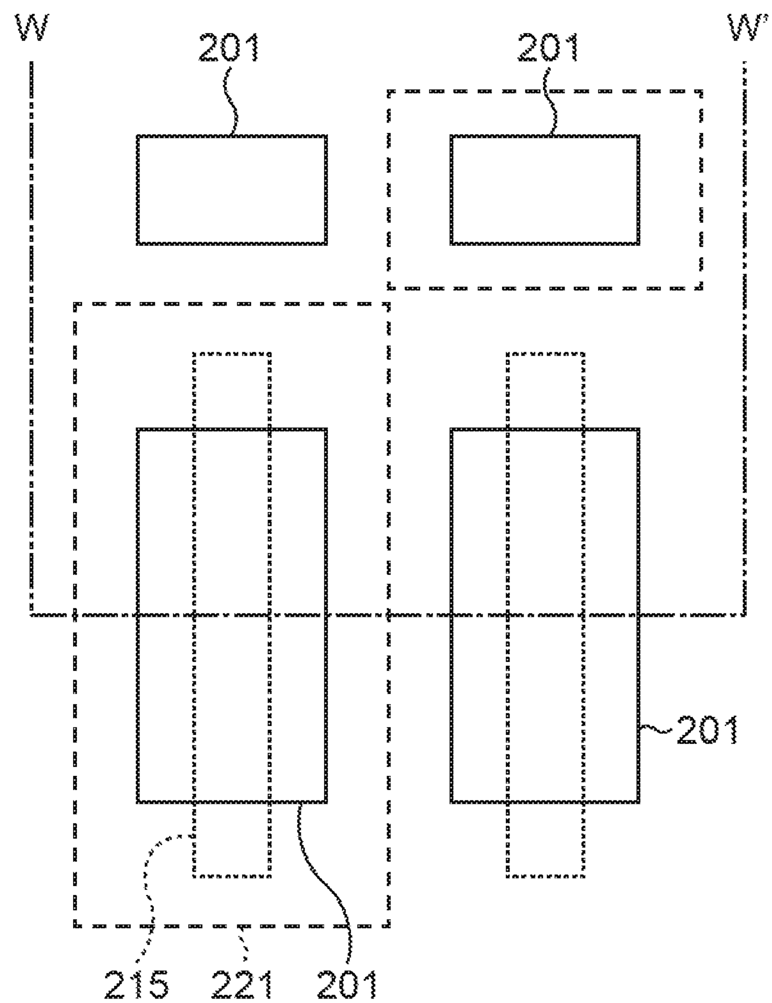
Figure 173B:
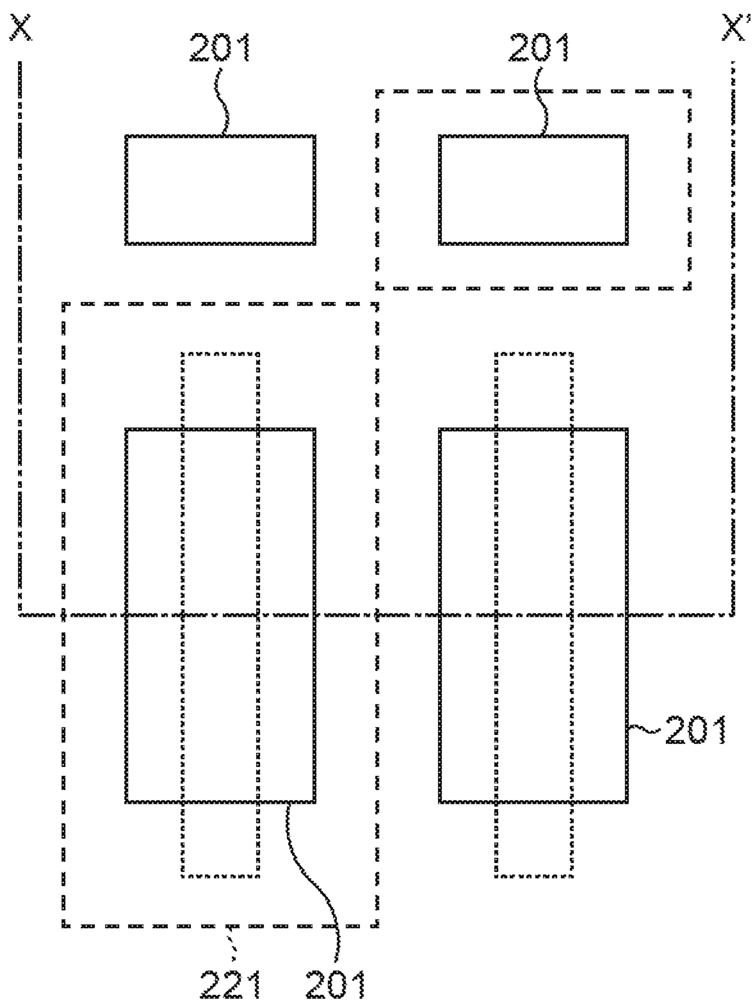
Figure 174A:
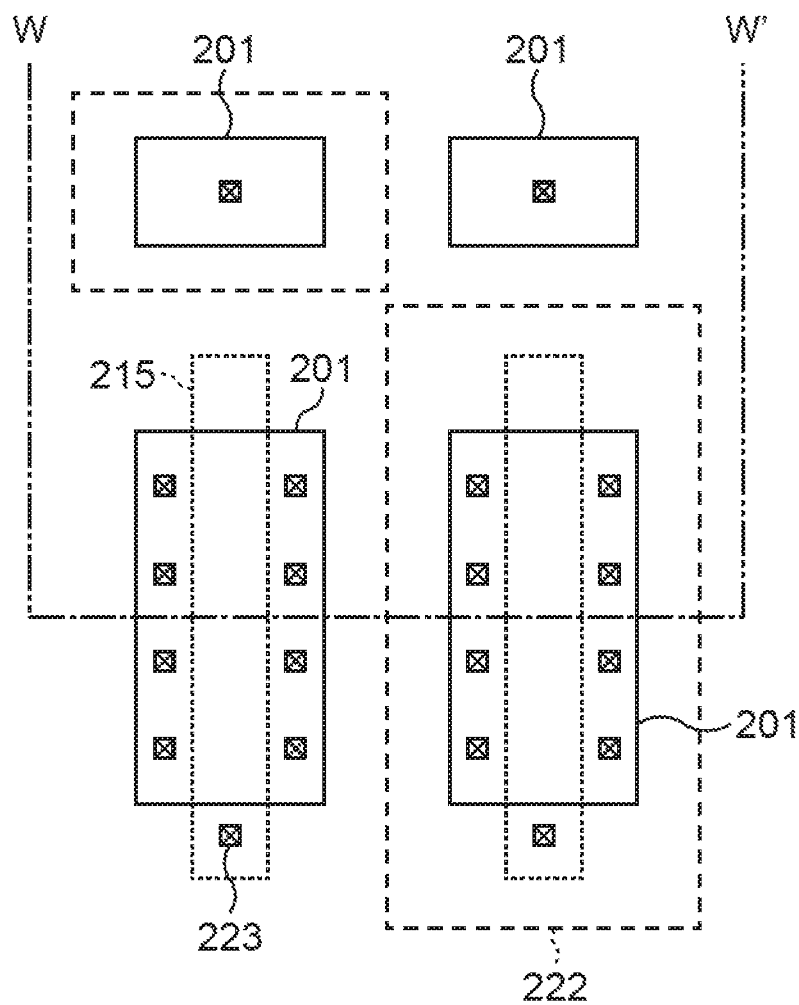
Figure 174B:
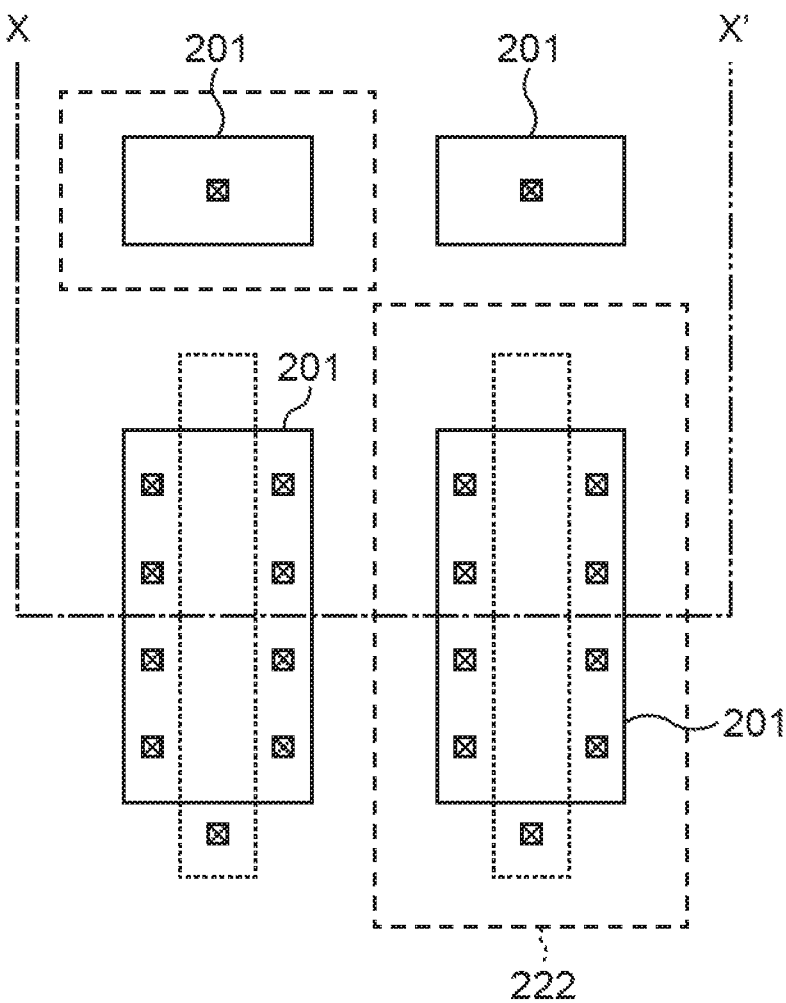
Figure 175:
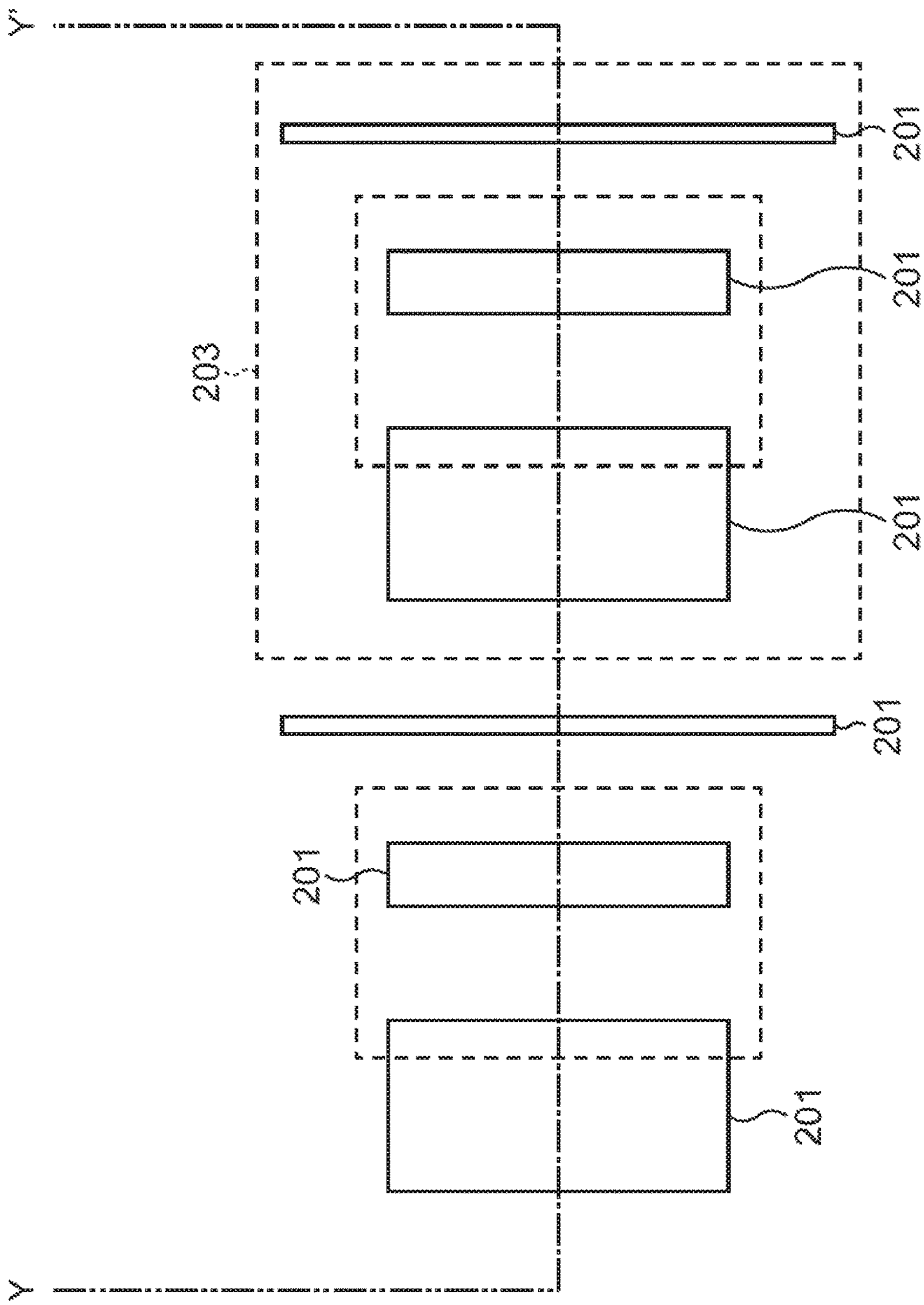
Figure 176:
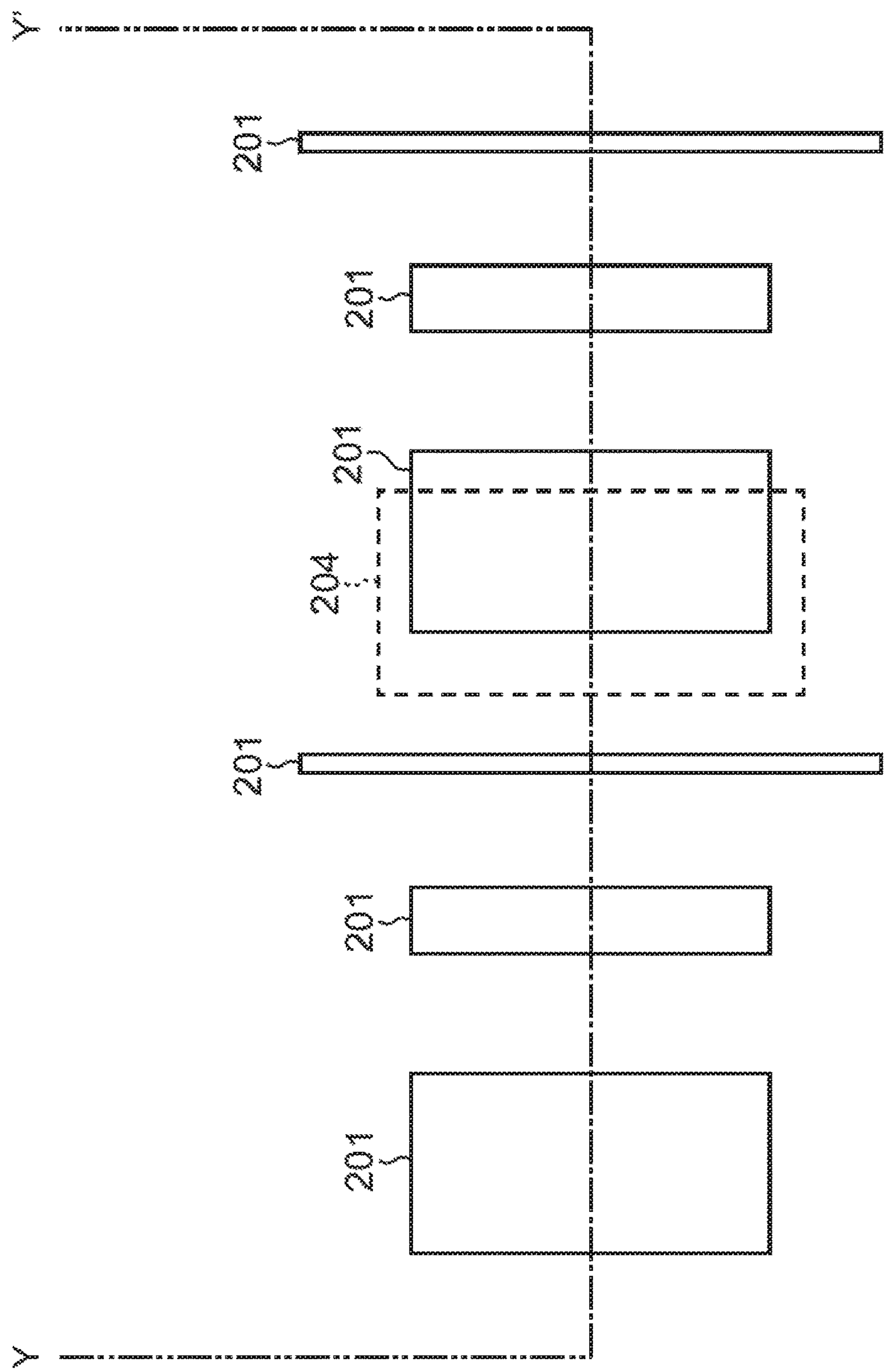
Figure 177:
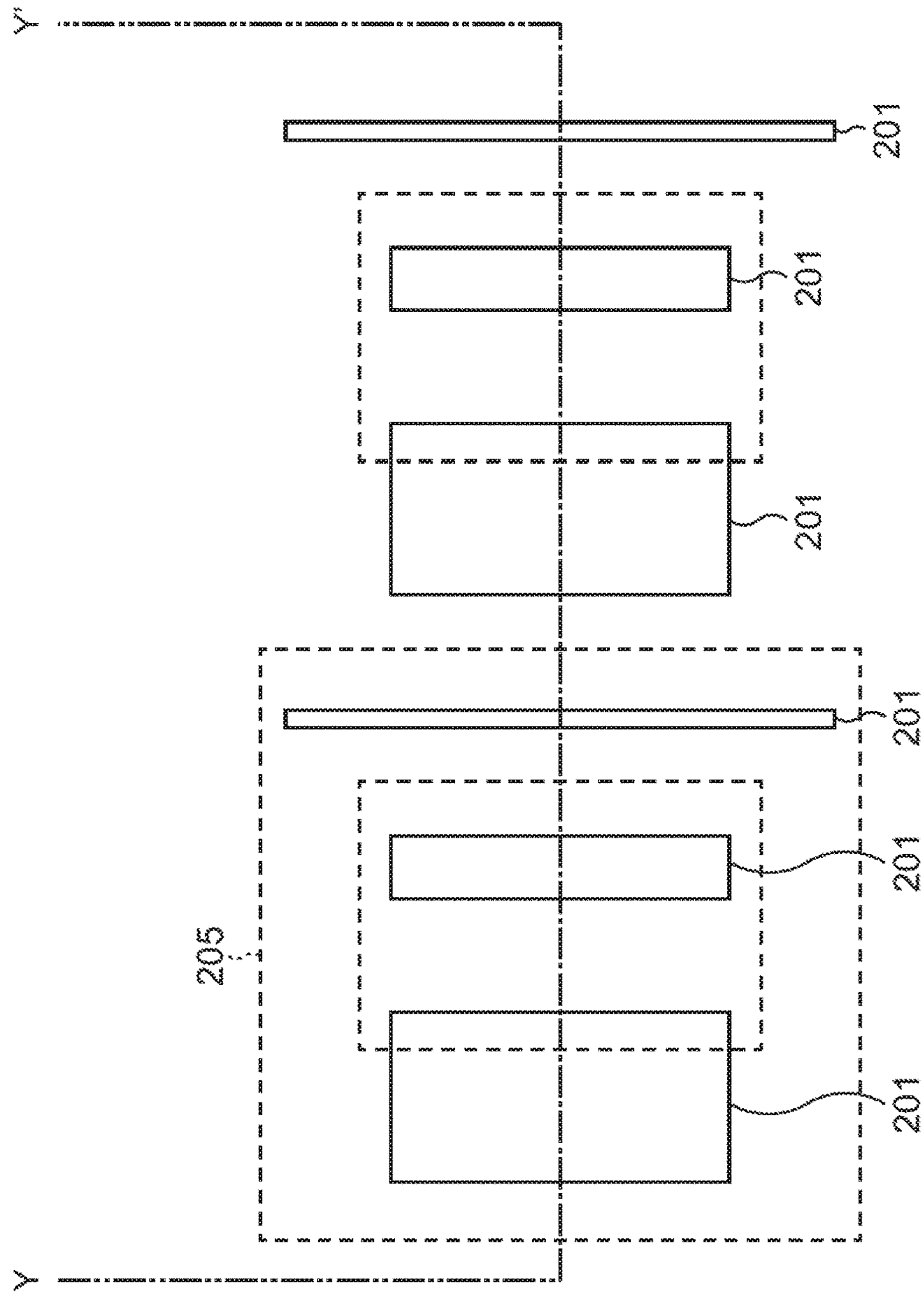
Figure 178:
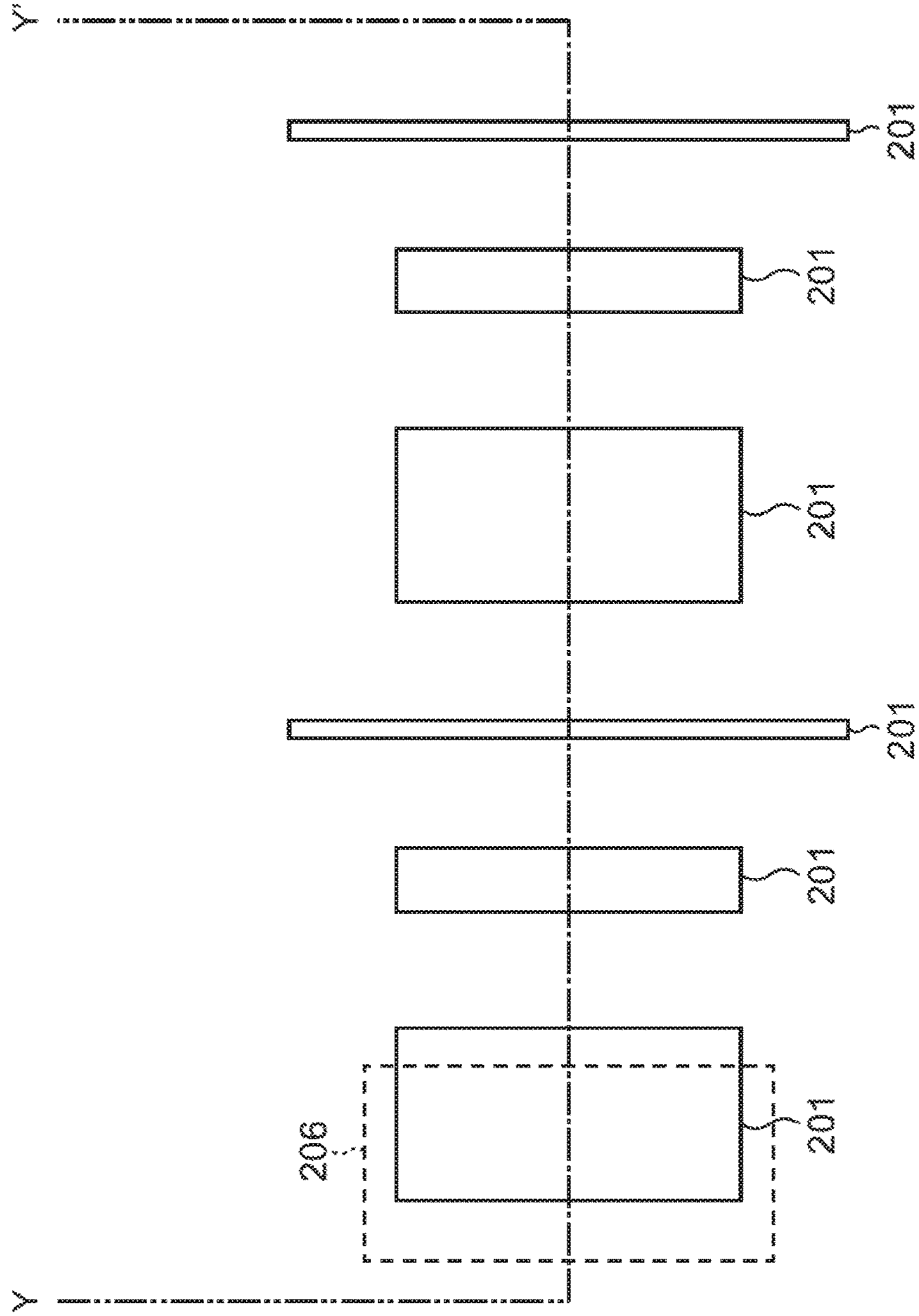
Figure 179:
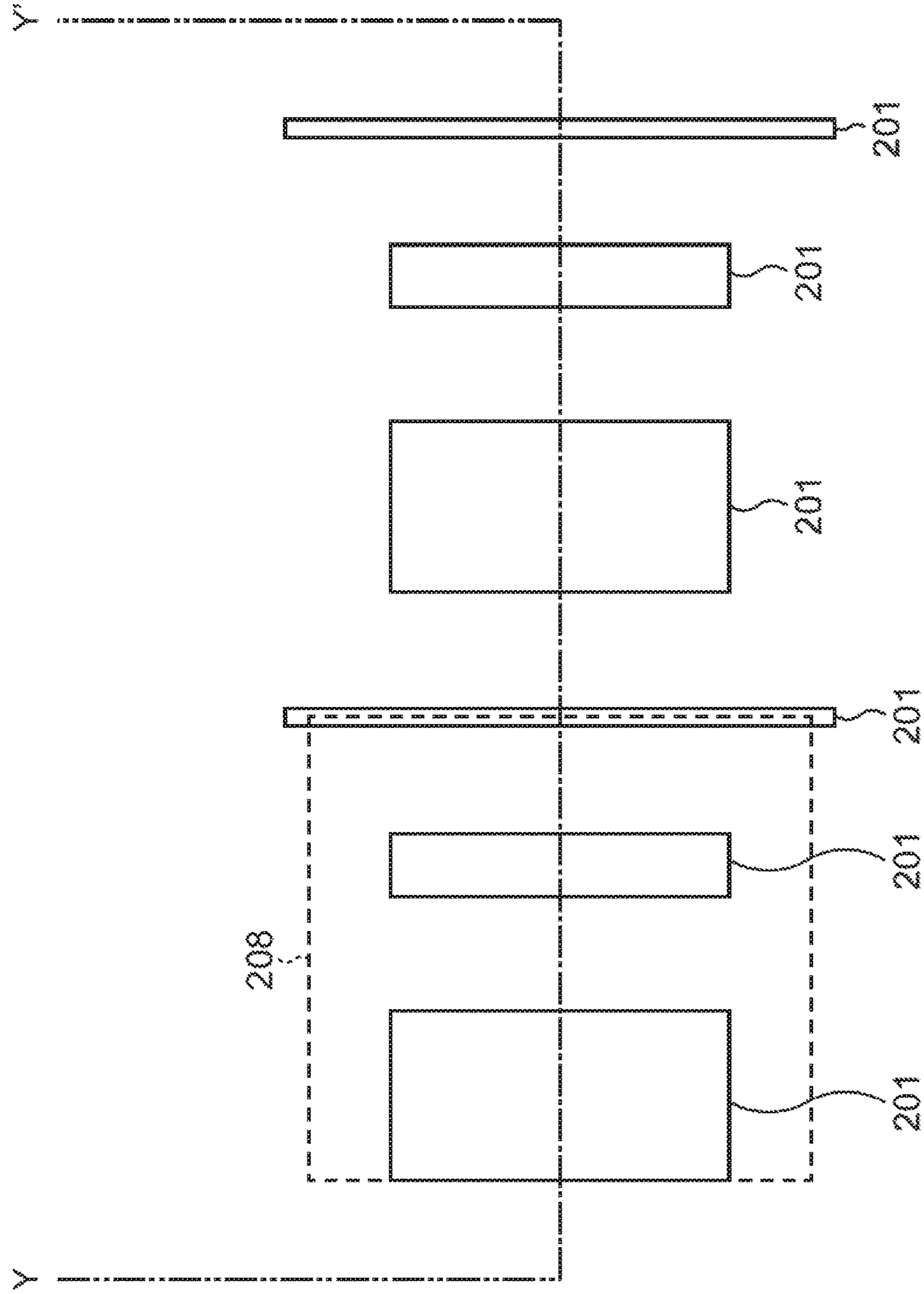
Figure 180:
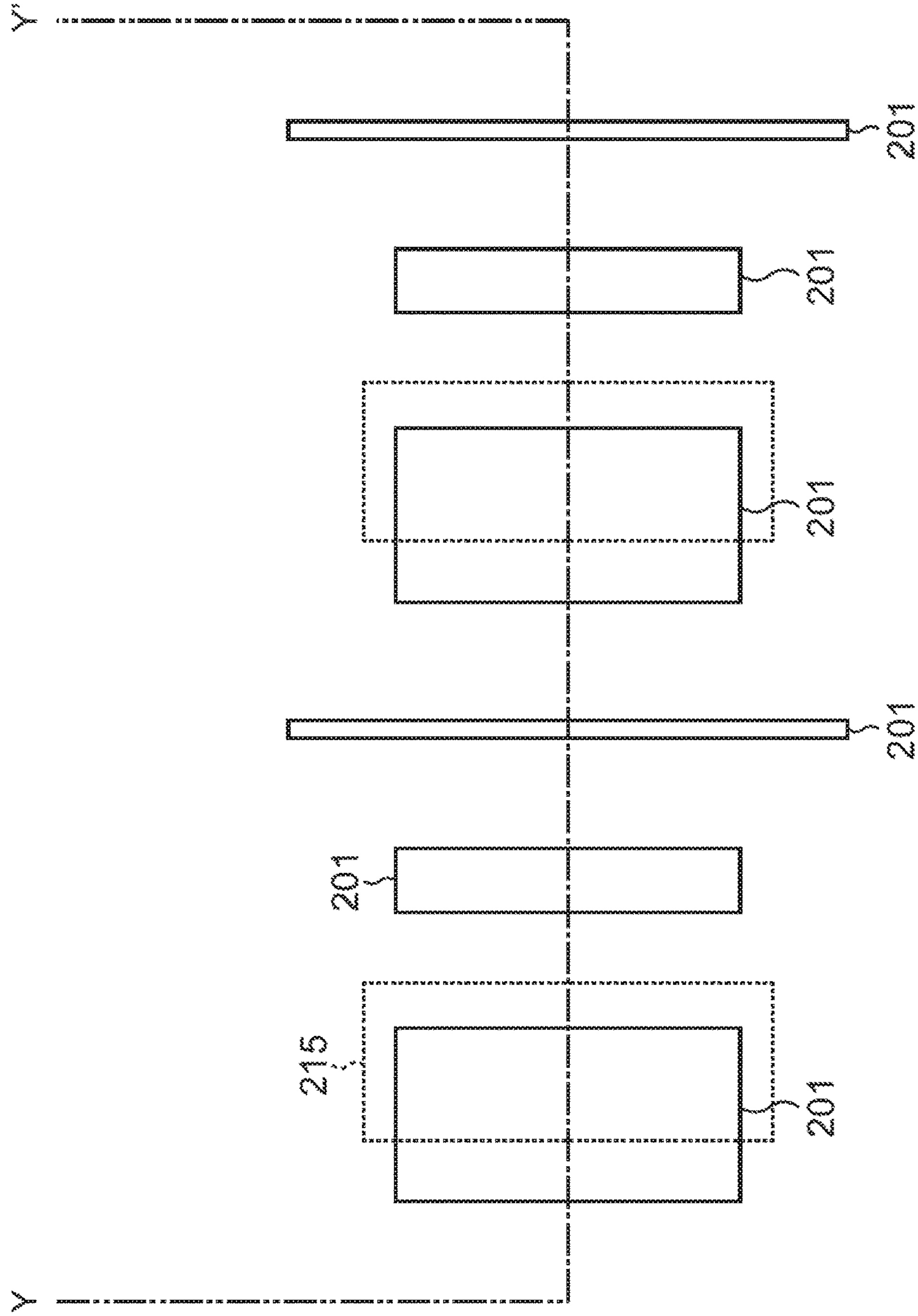
Figure 181:
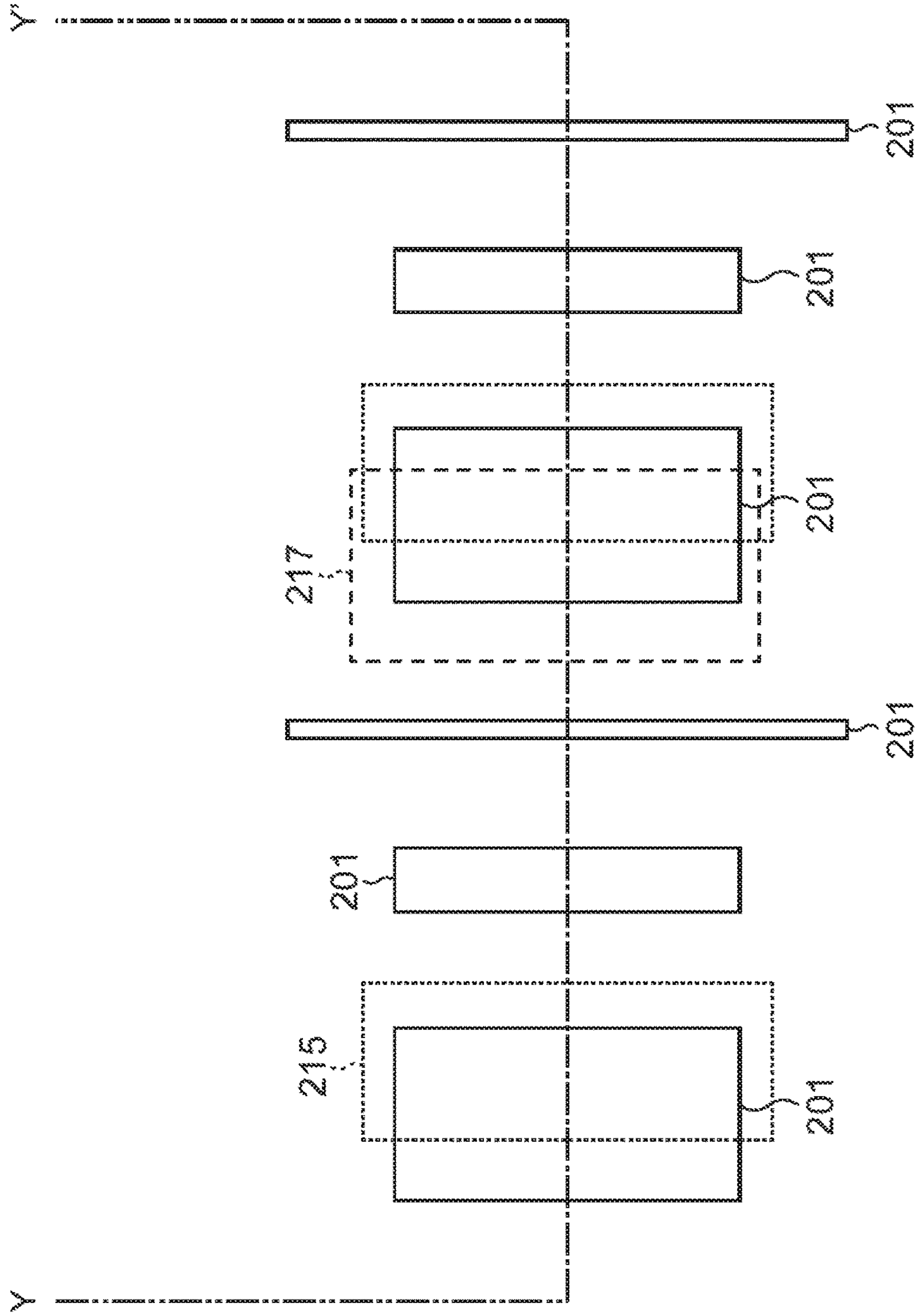
Figure 182:
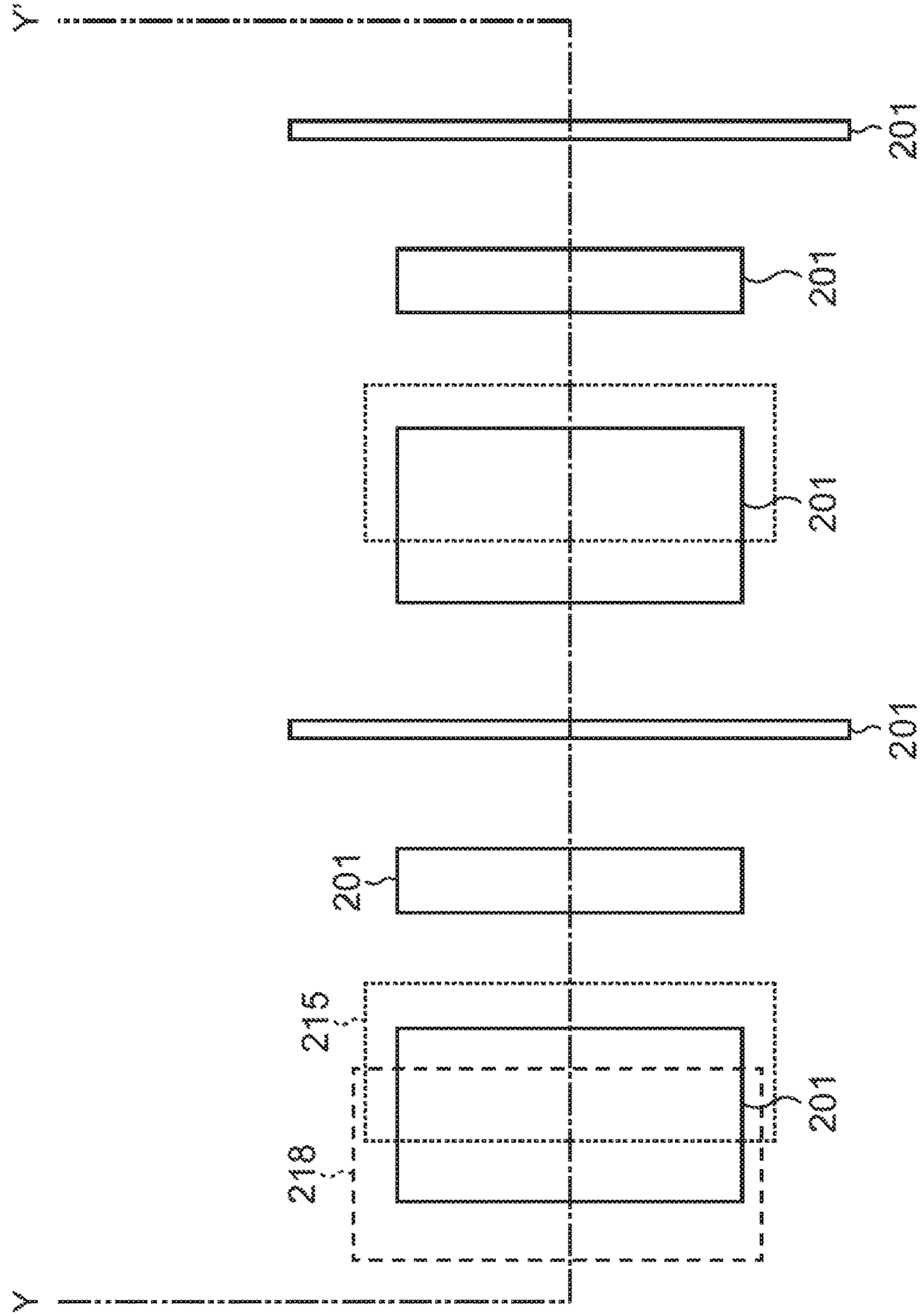
Figure 183:
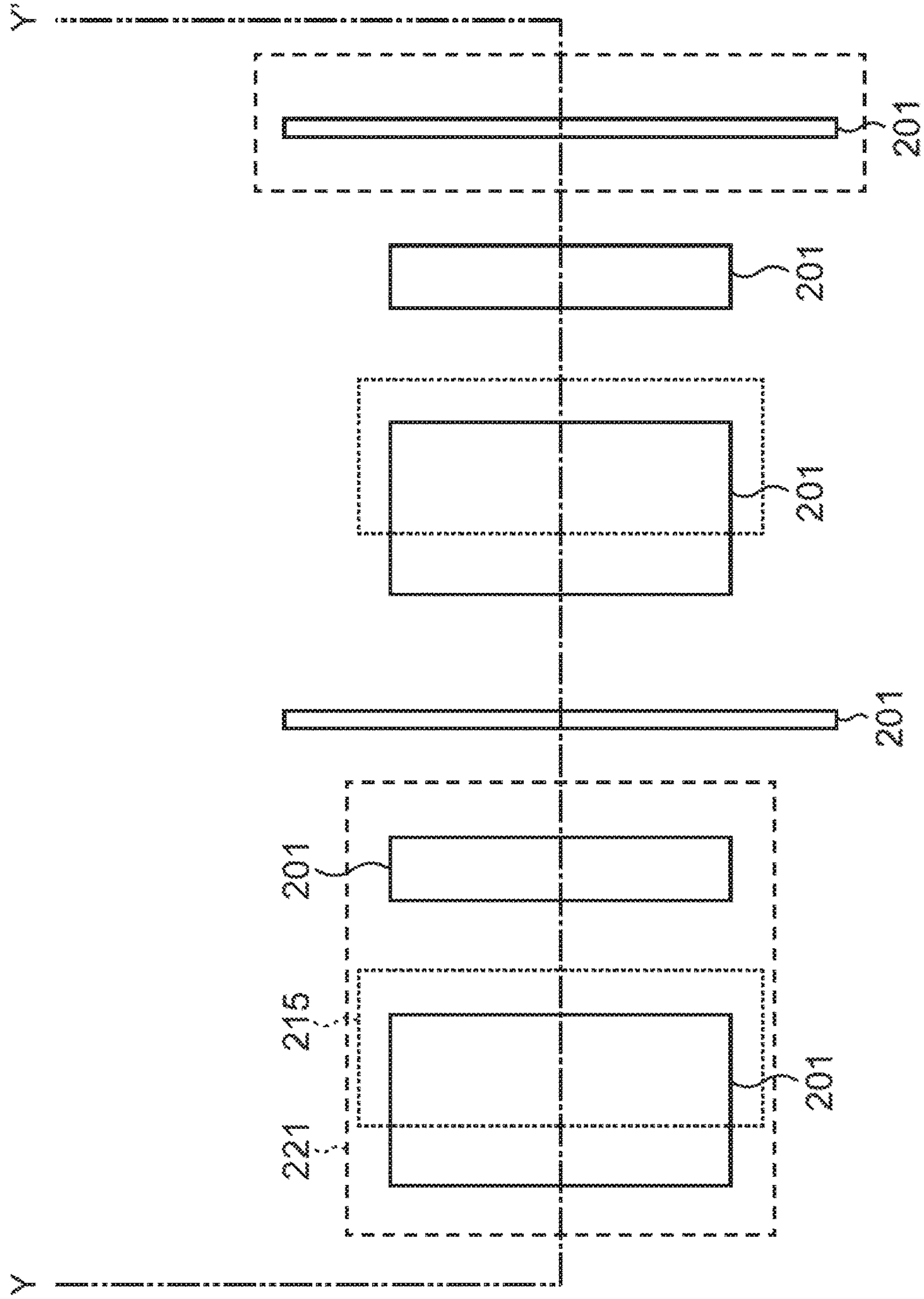
Figure 184:
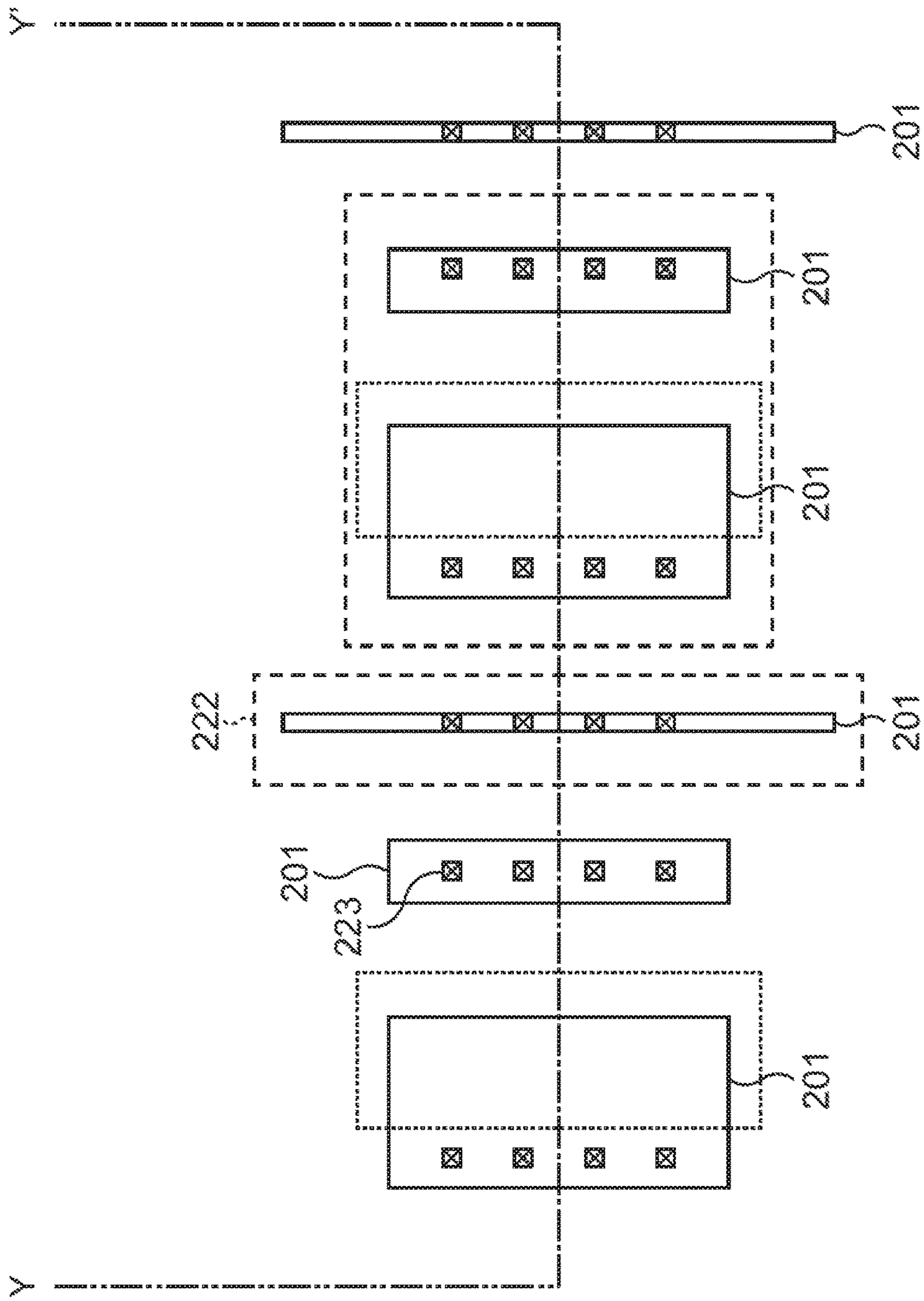
Figure 185A:
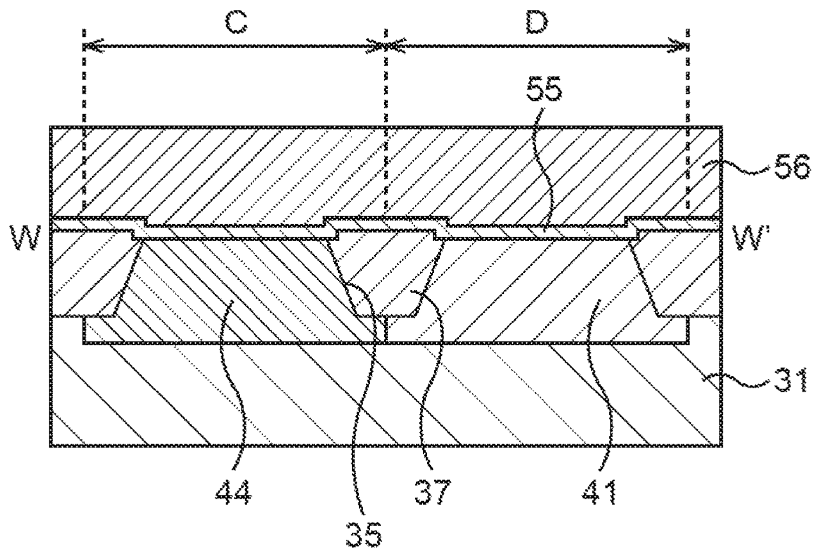
Figure 185B:
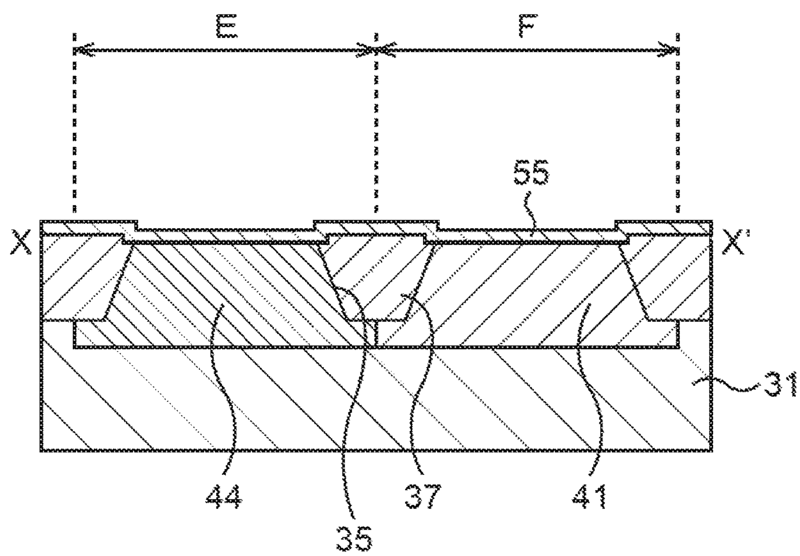
Figure 186A:
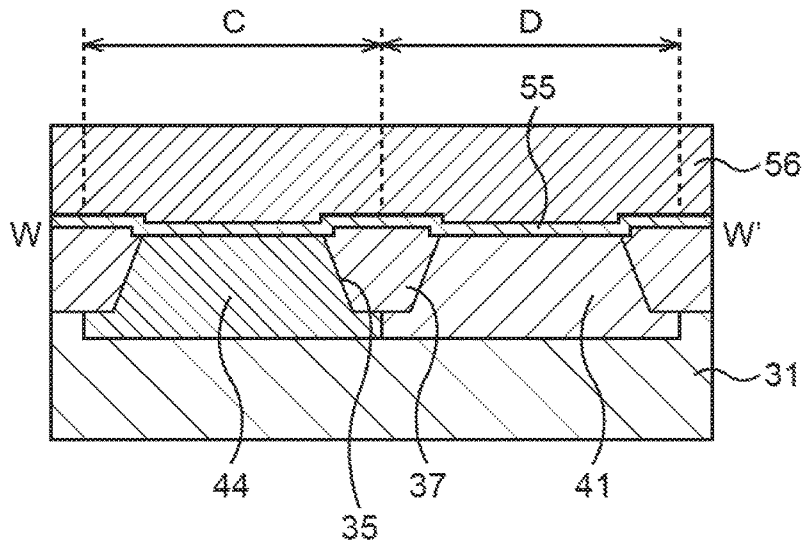
Figure 186B:
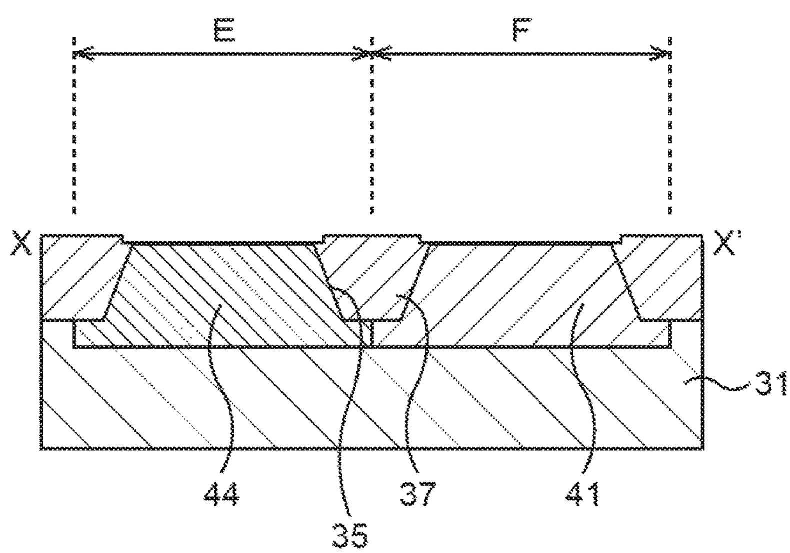
Figure 187A:
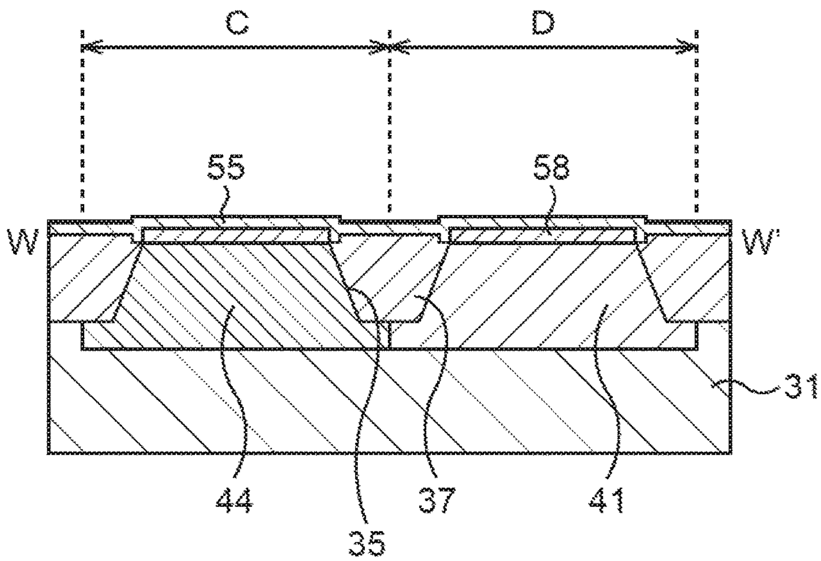
Figure 187B:
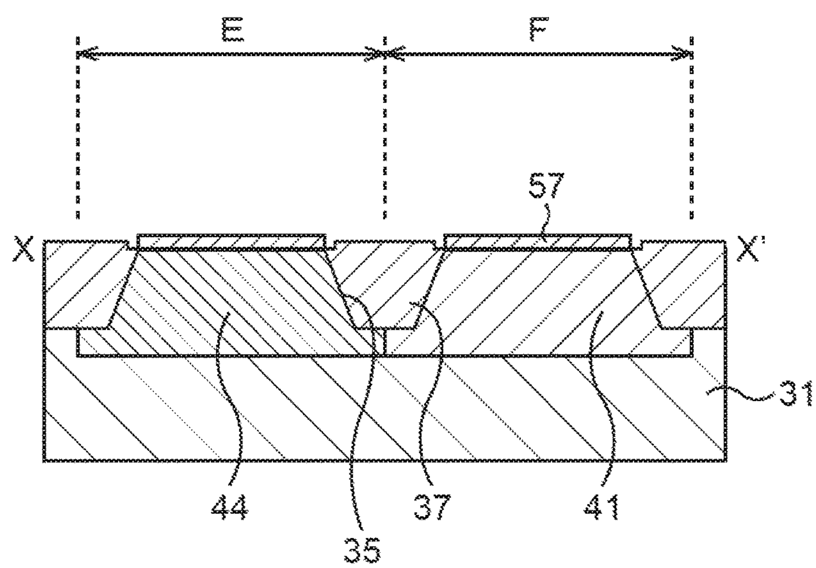
Figure 188A:
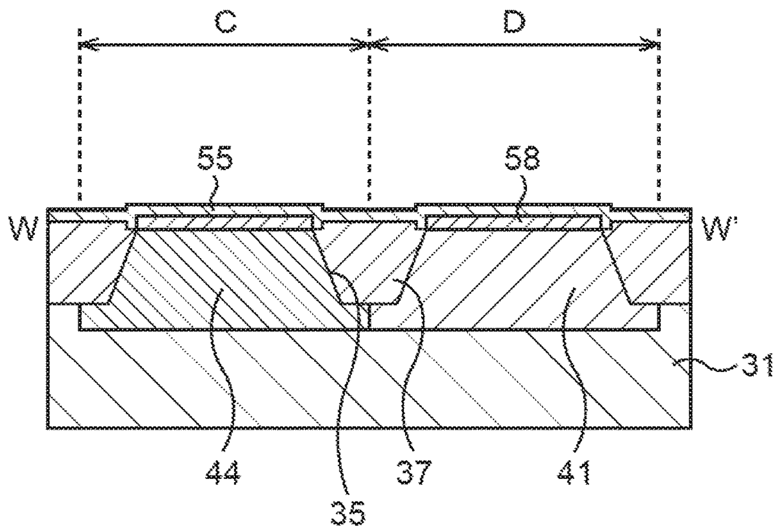
Figure 188B:
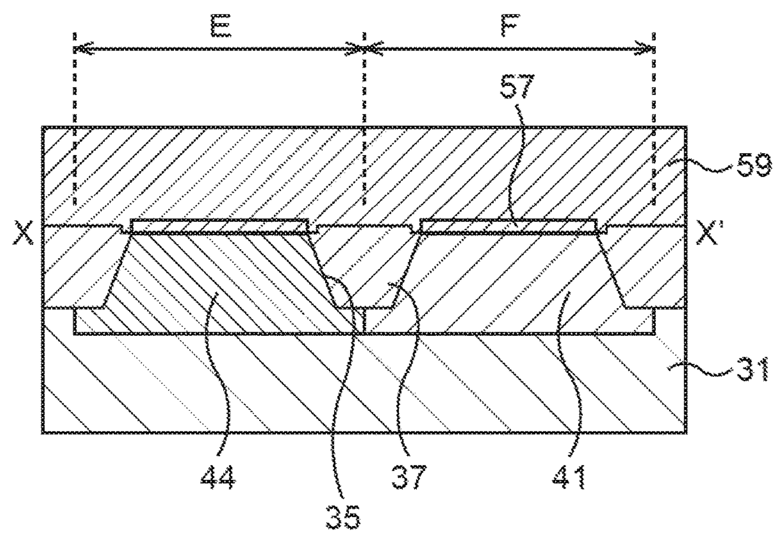
Figure 189A:
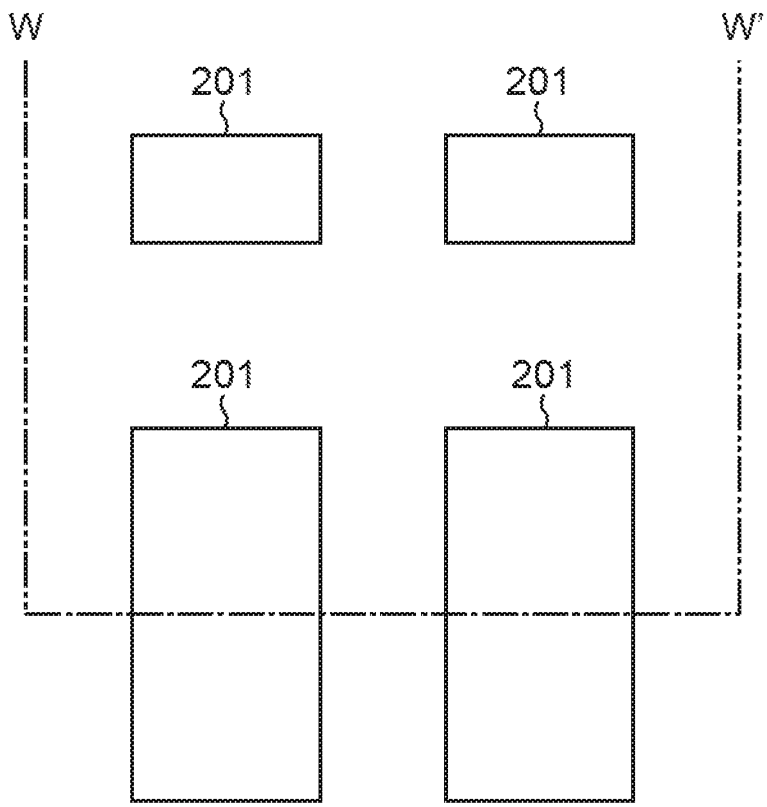
Figure 189B:
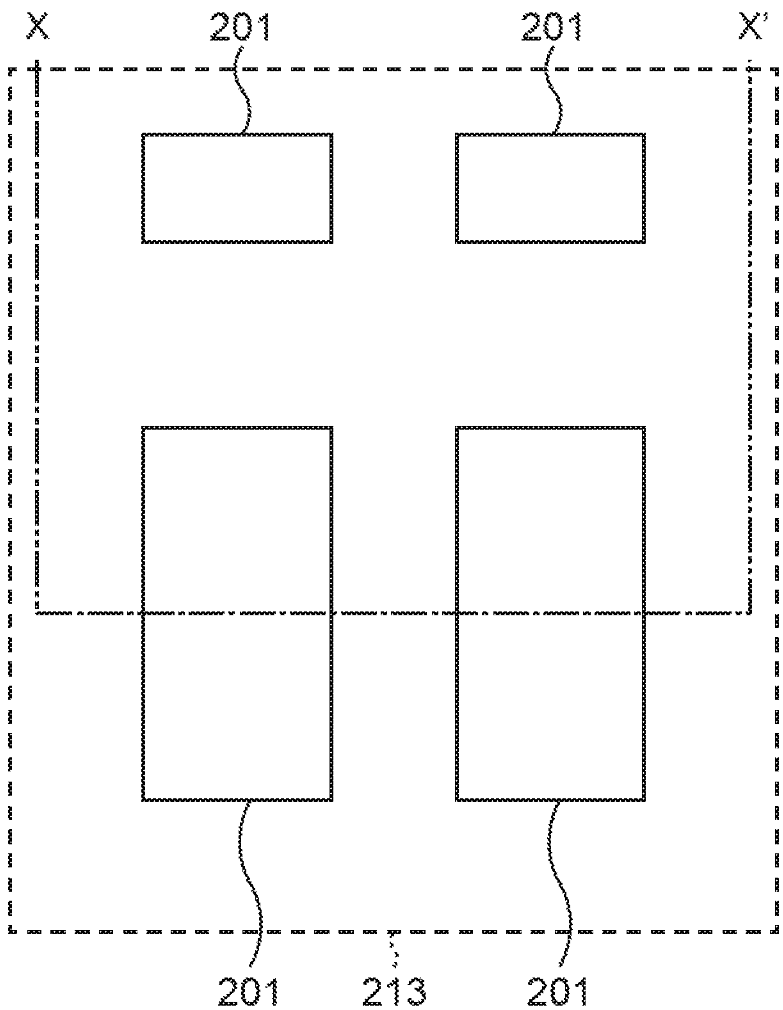
Figure 190:
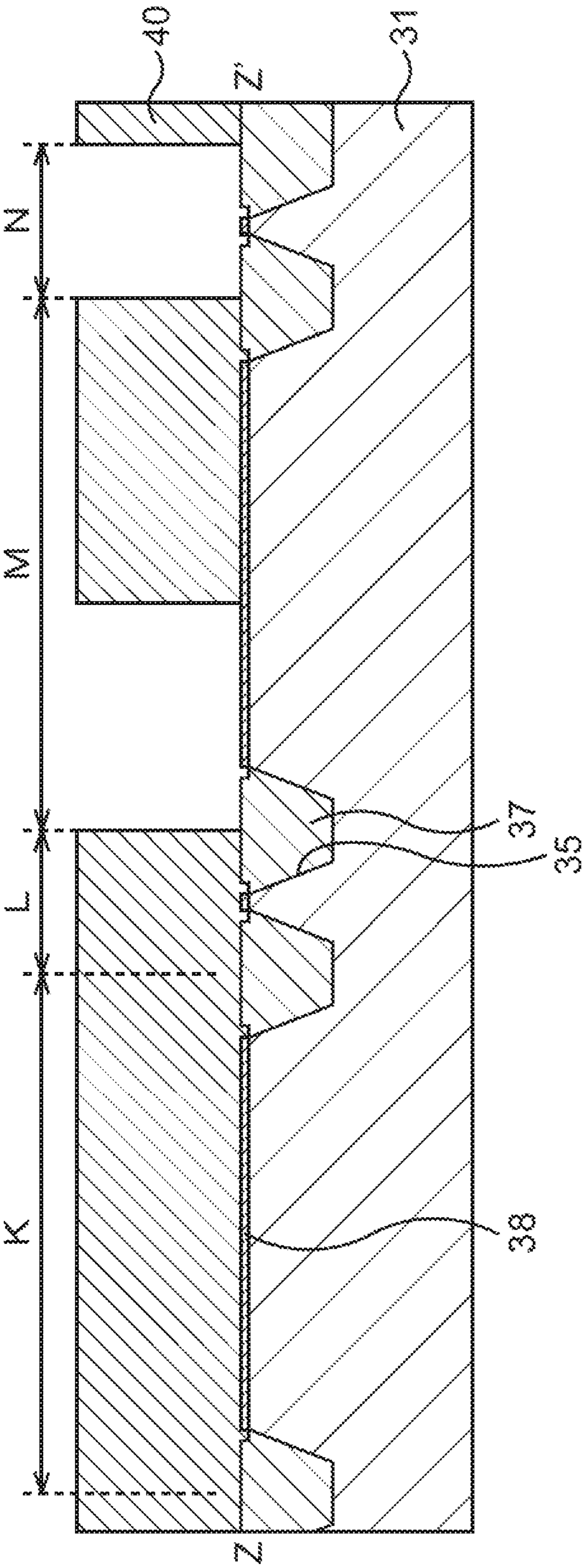
Figure 191:
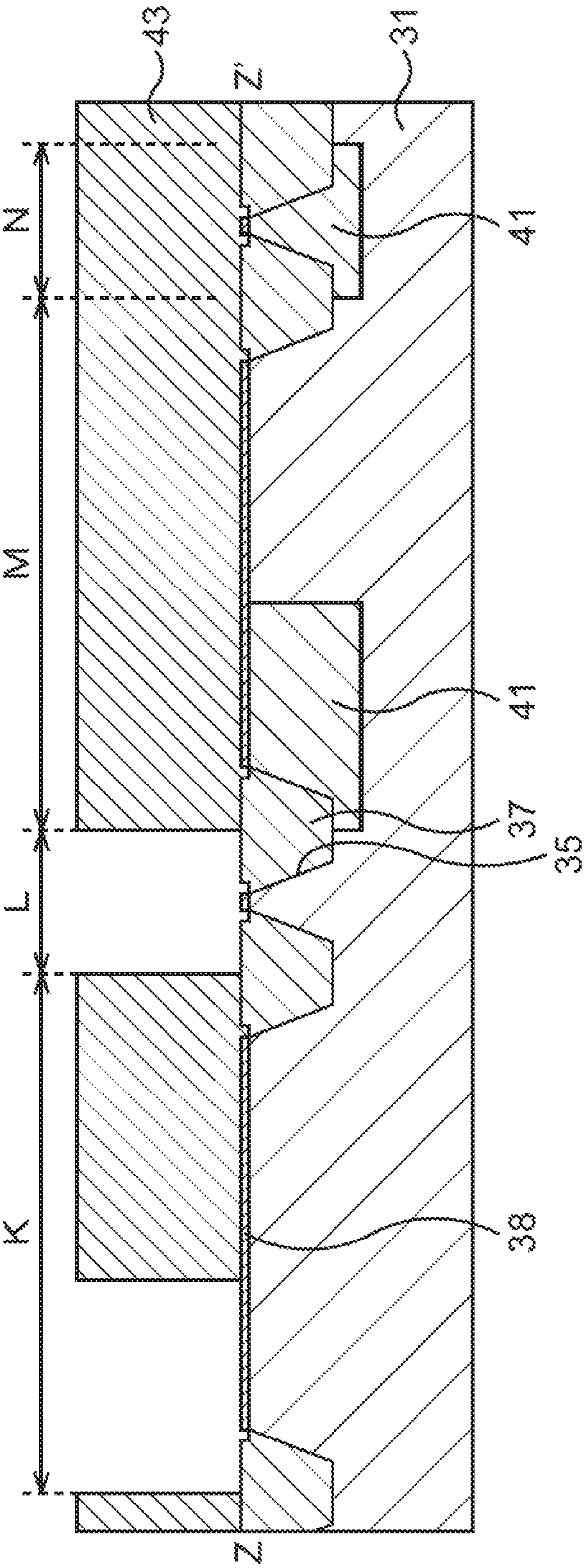
Figure 192:
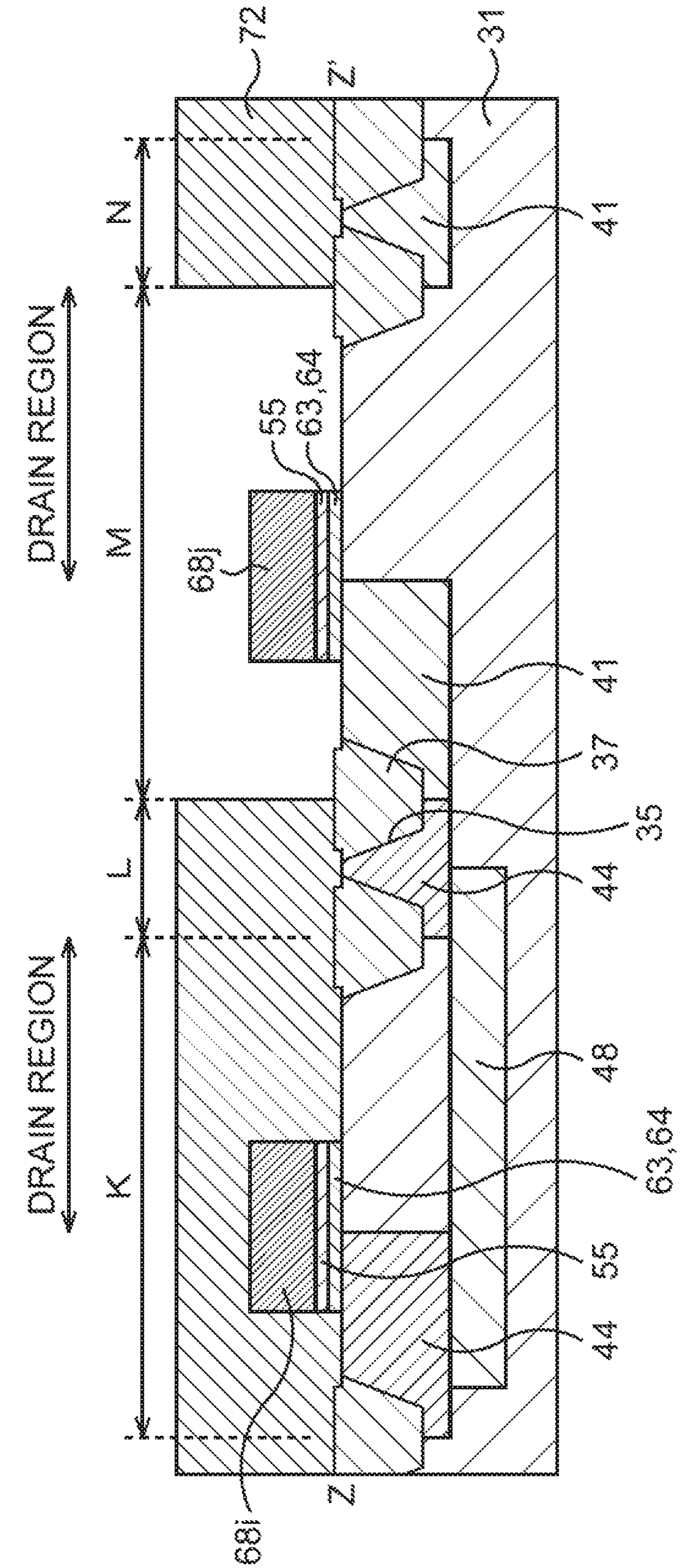
Figure 193:
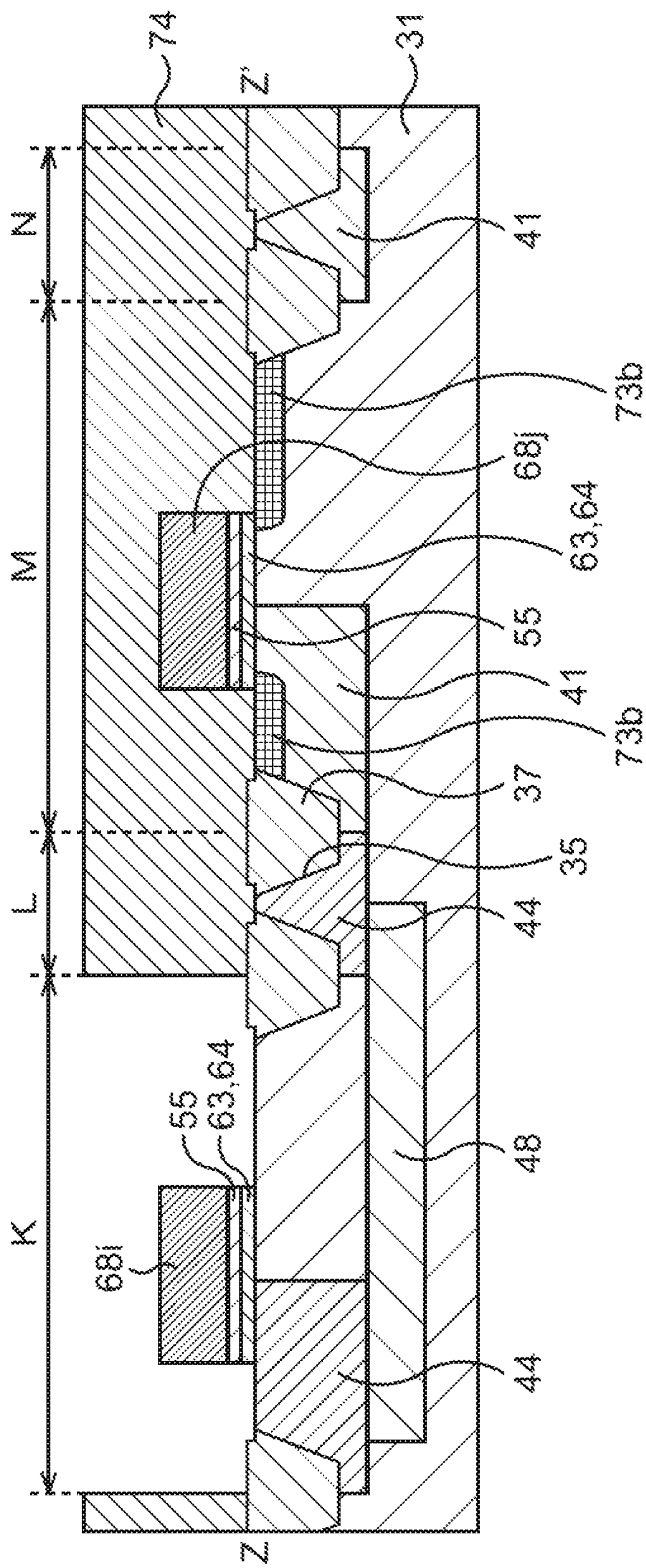
Figure 194:
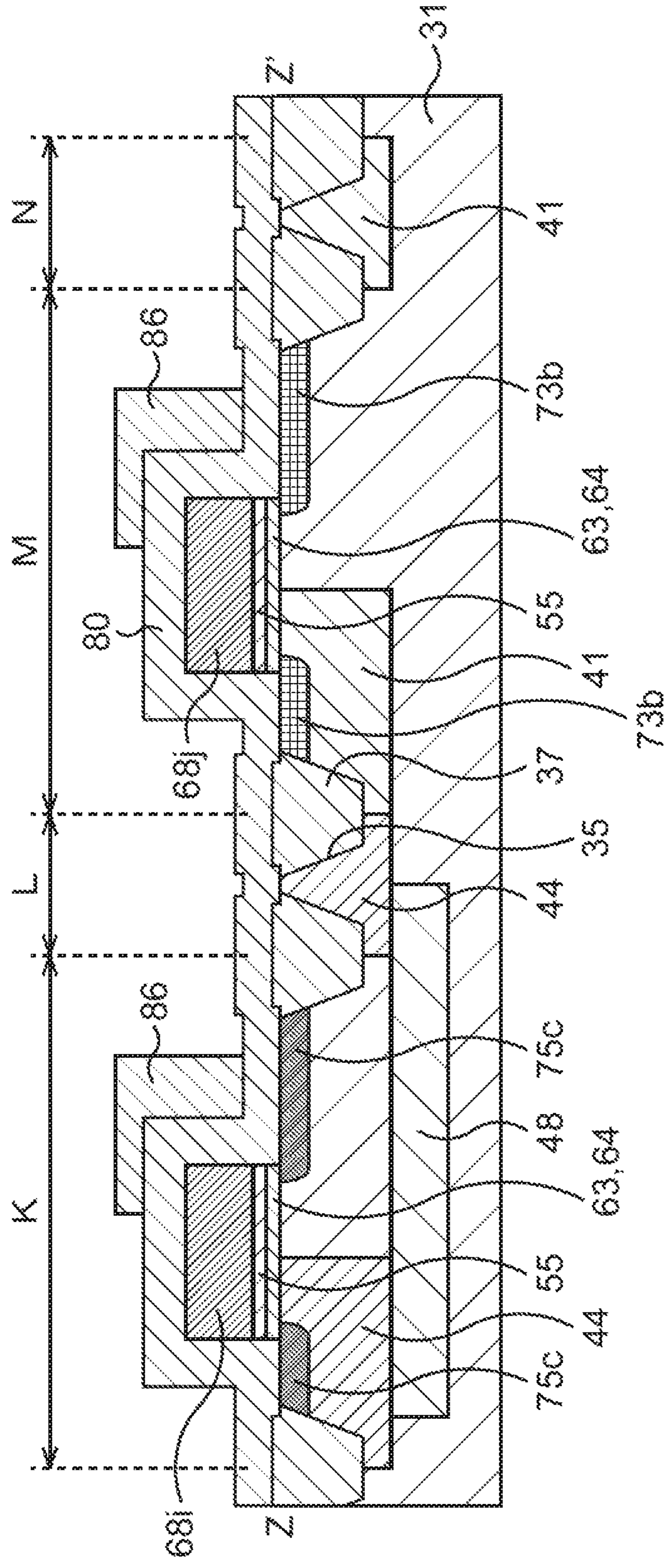
Figure 195:
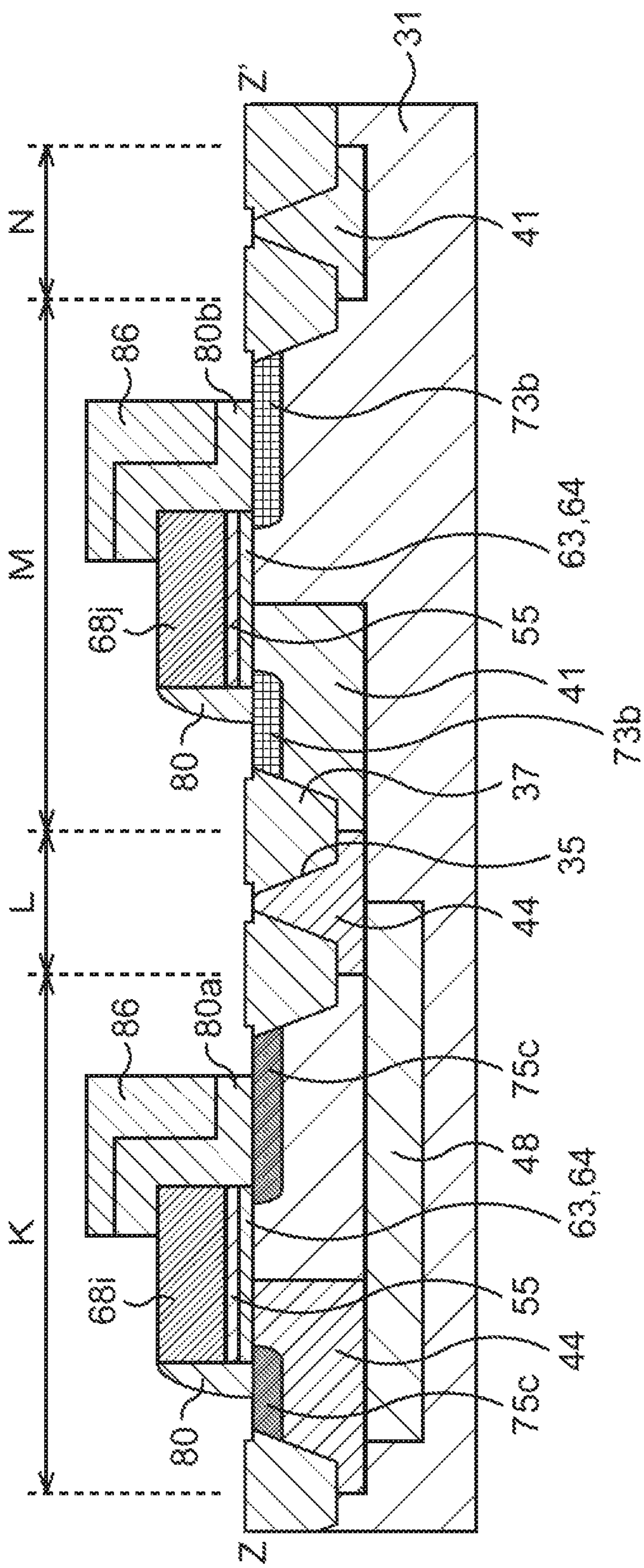
Figure 196:
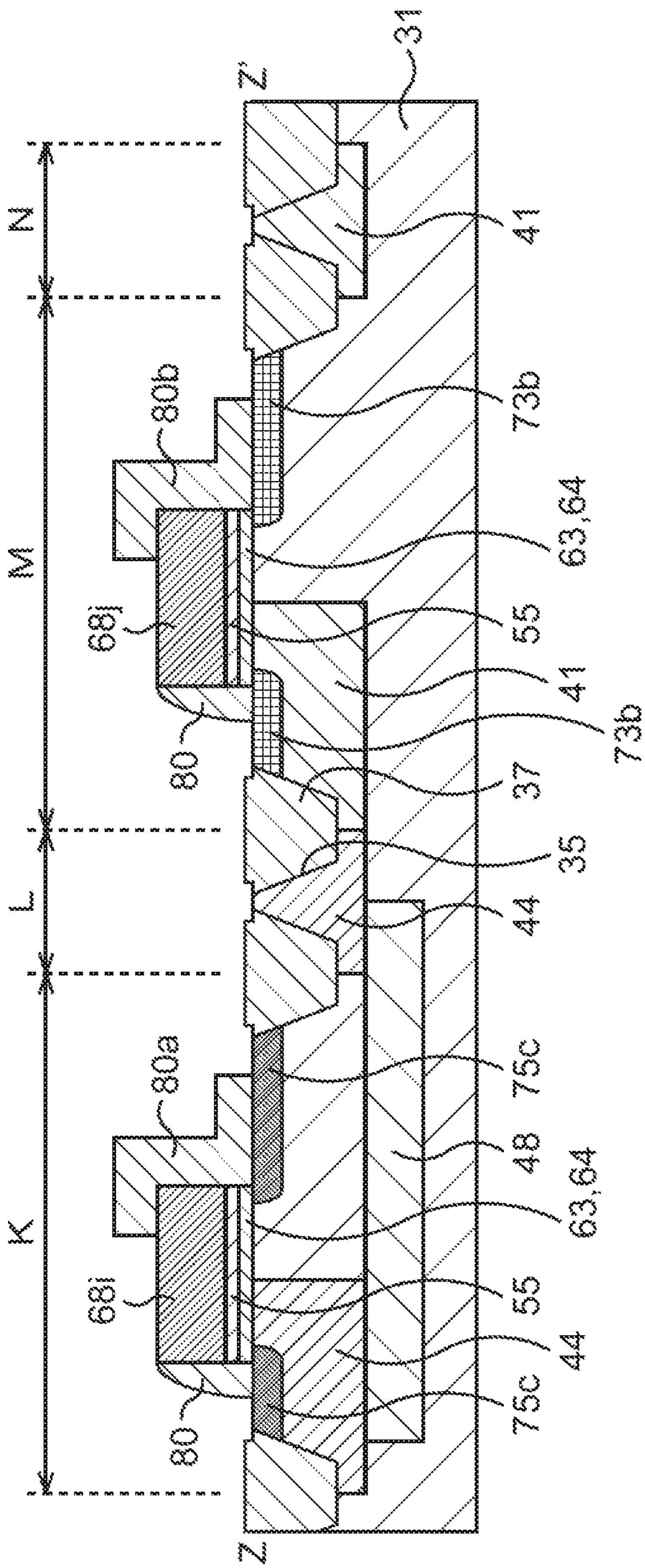
Figure 197:
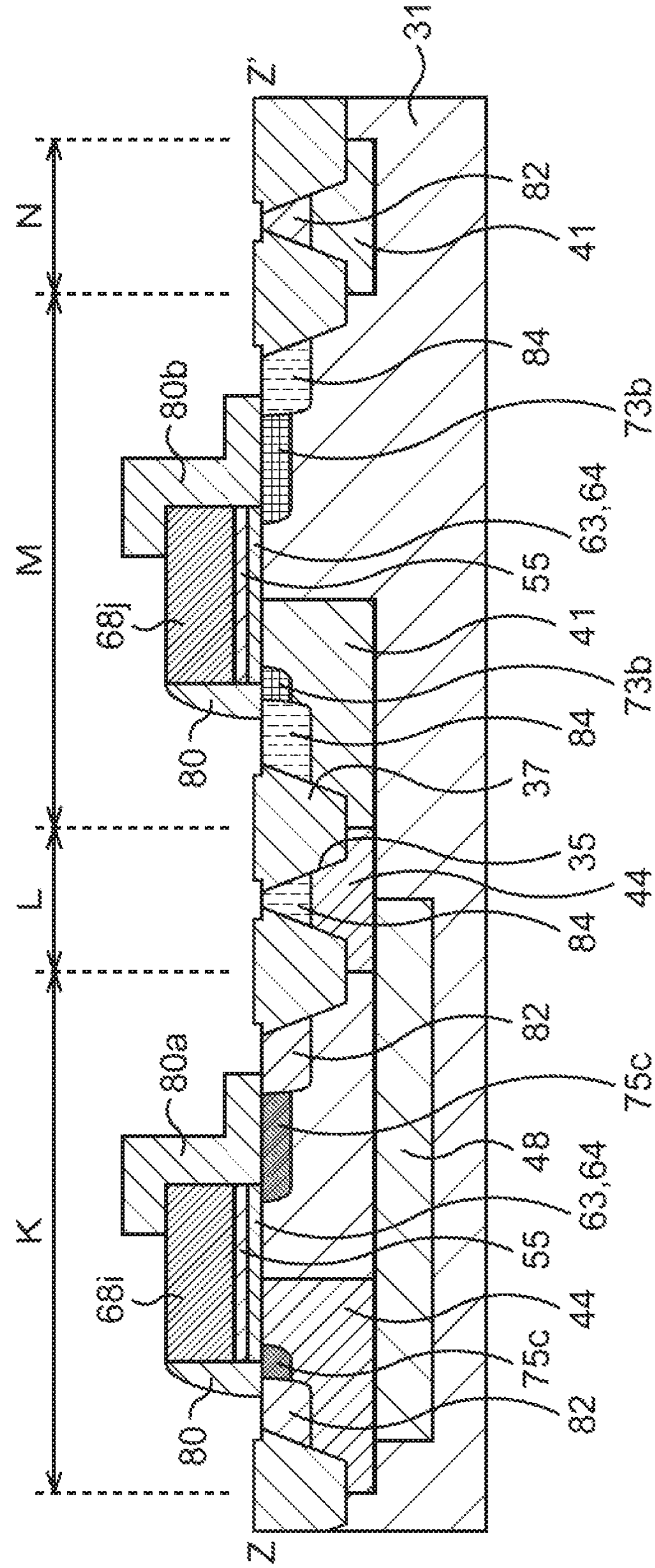
Figure 198:
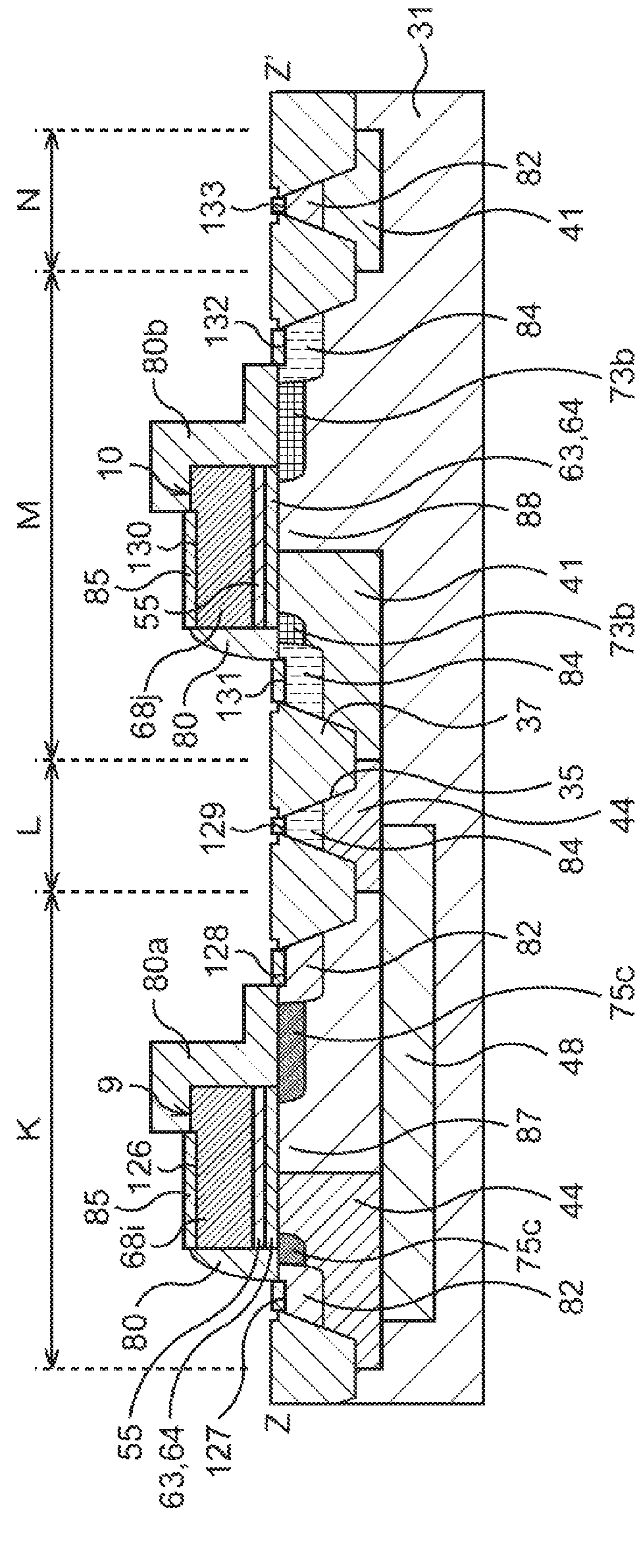
Figure 199:
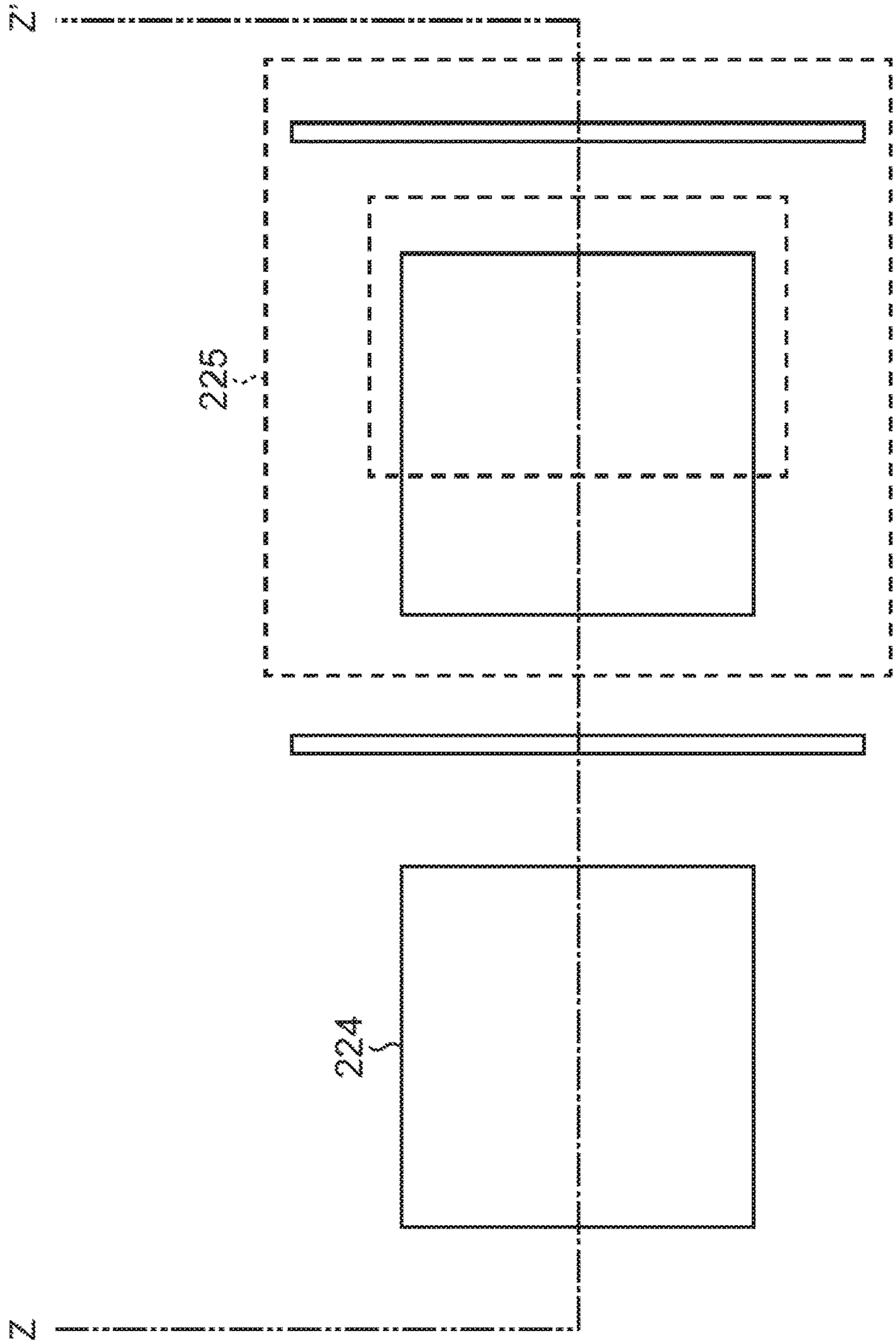
Figure 200:
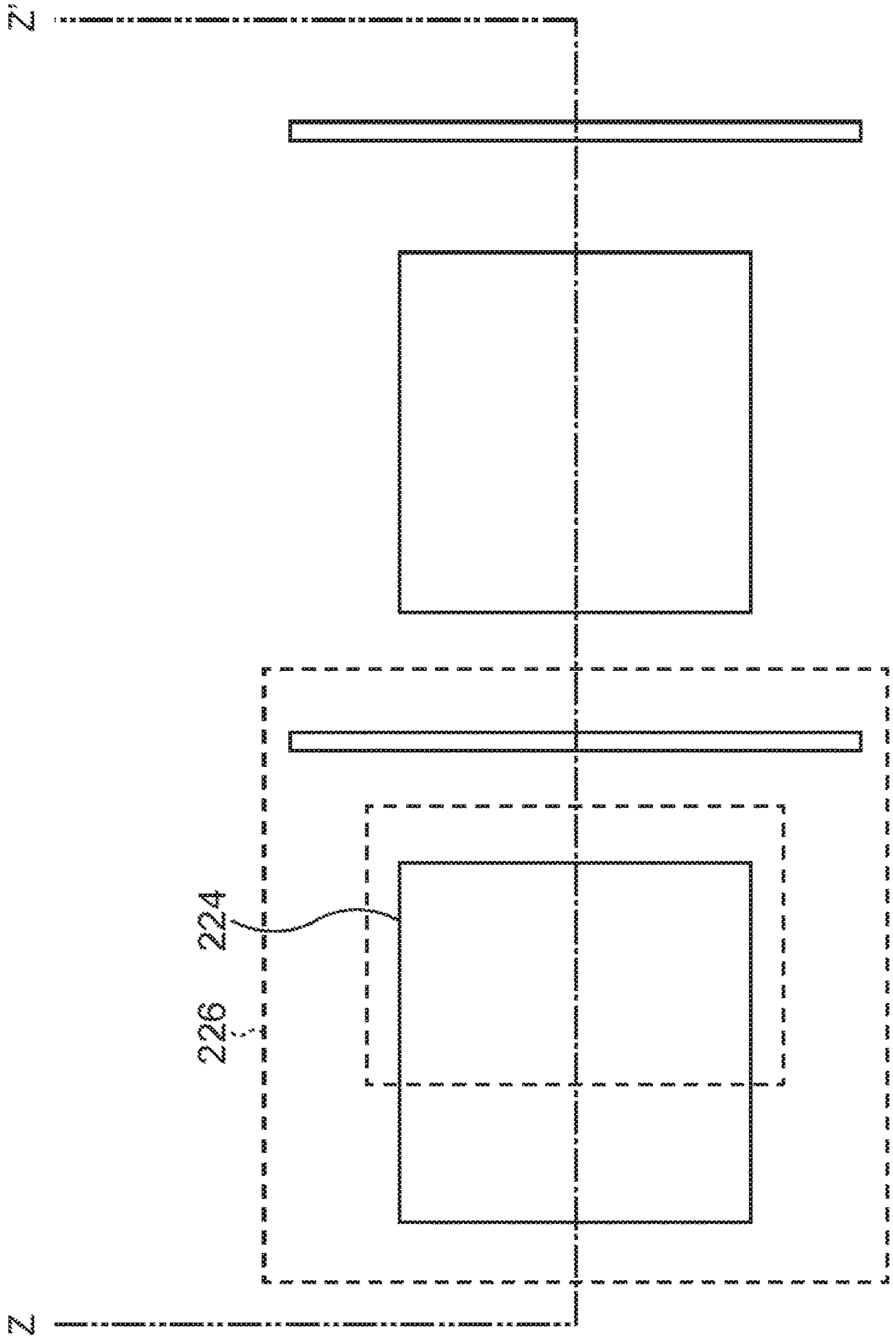
Figure 201:
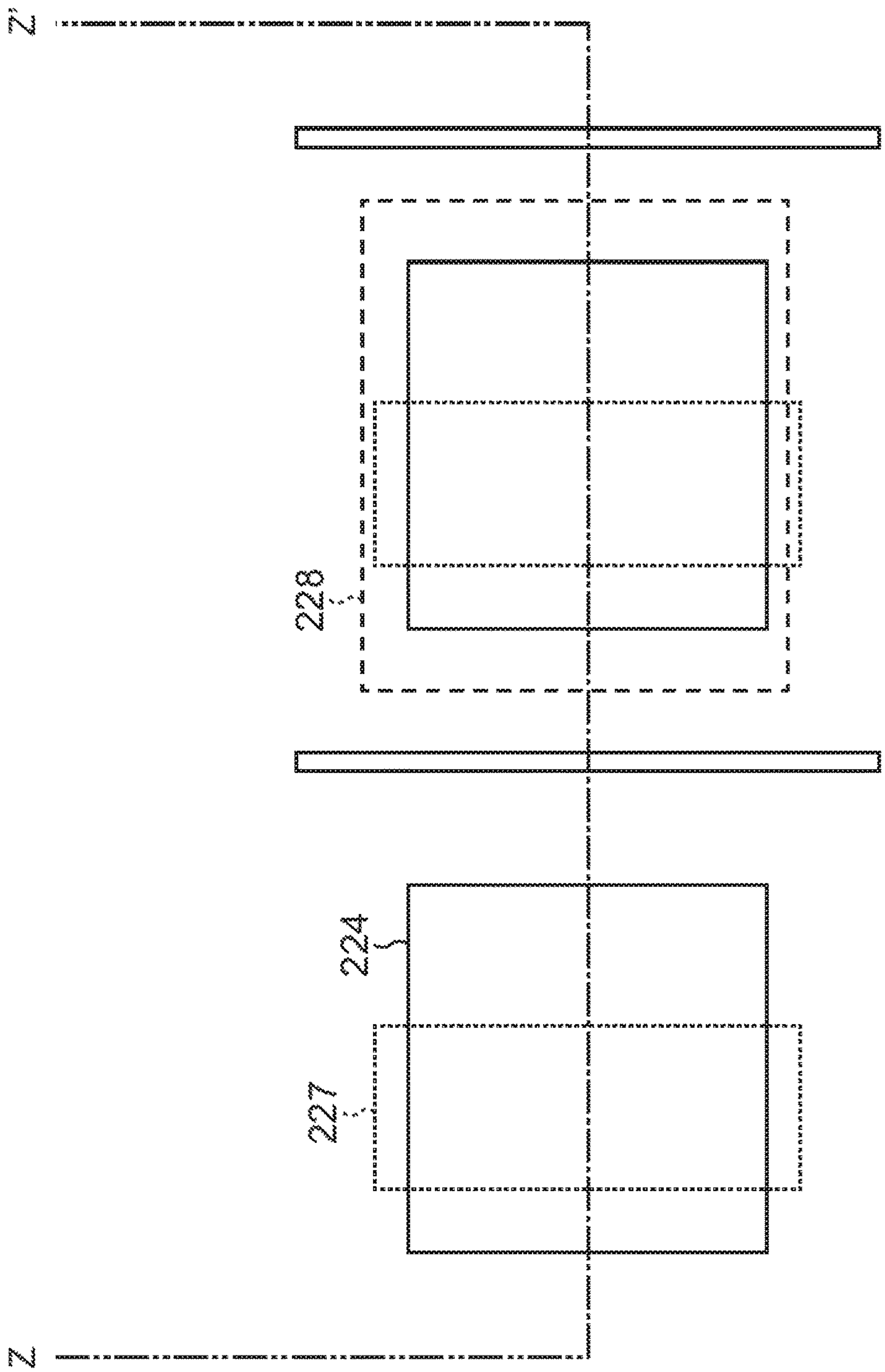
Figure 202:
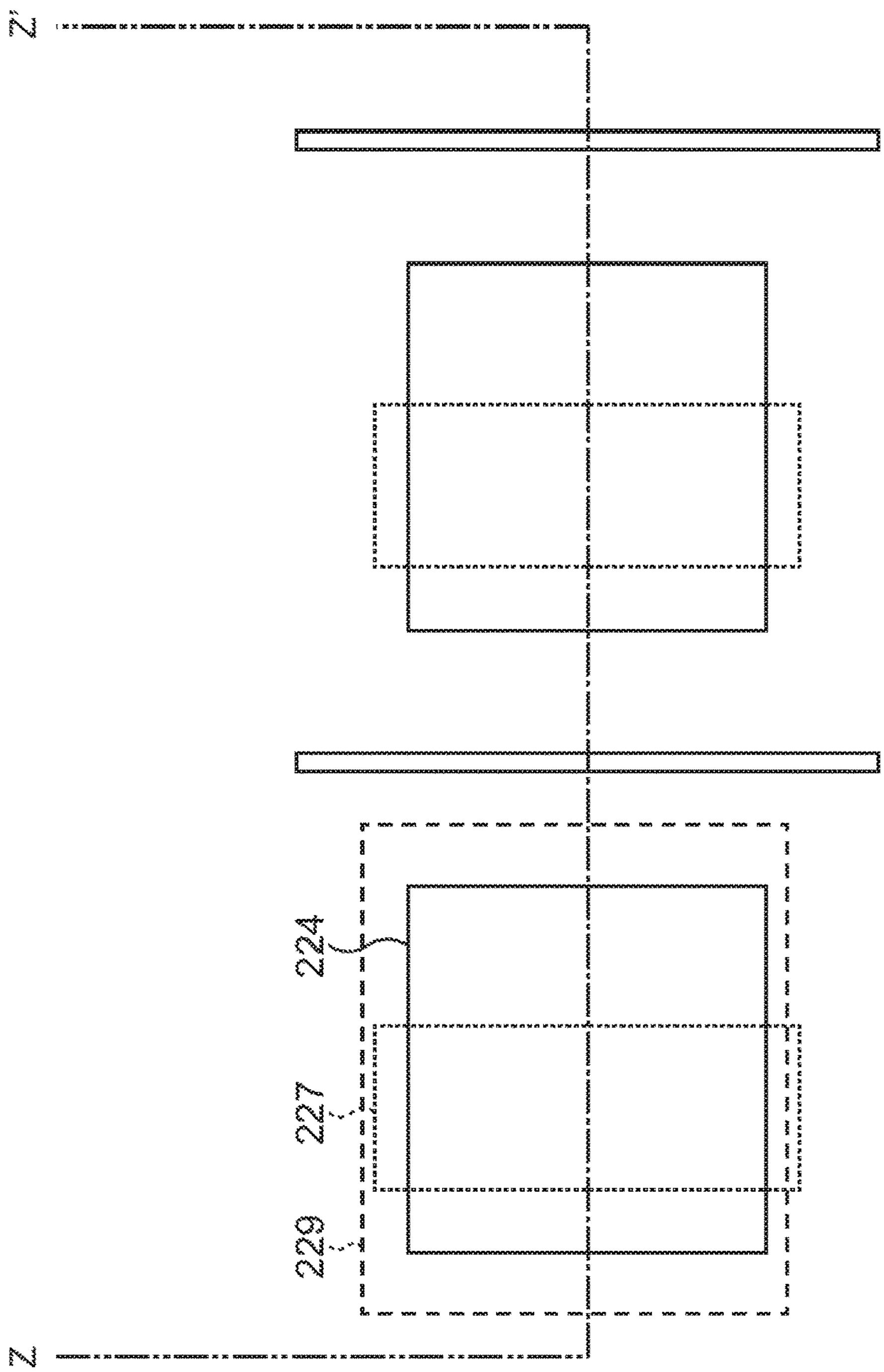
Figure 203:
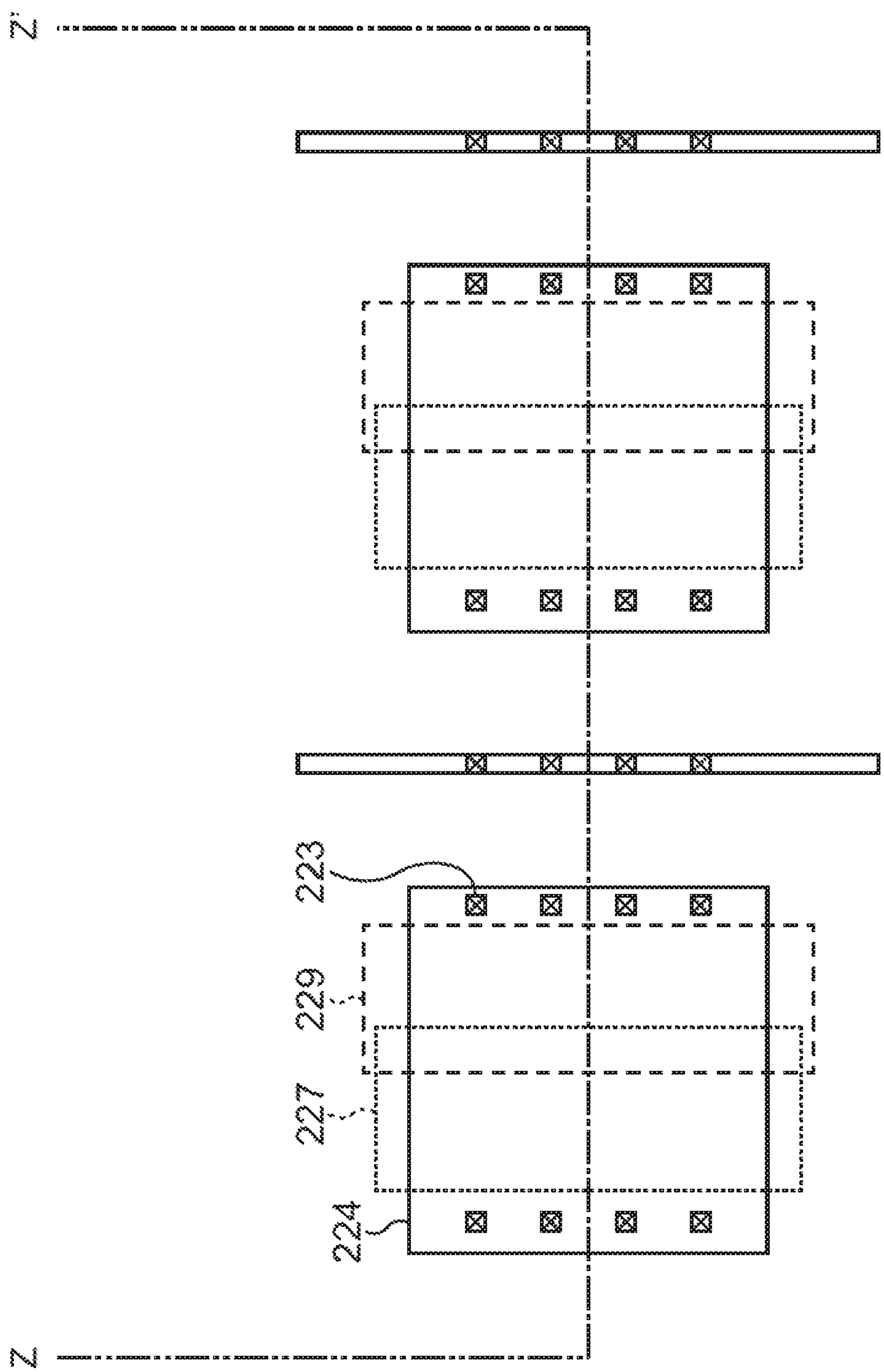
Figure 204:
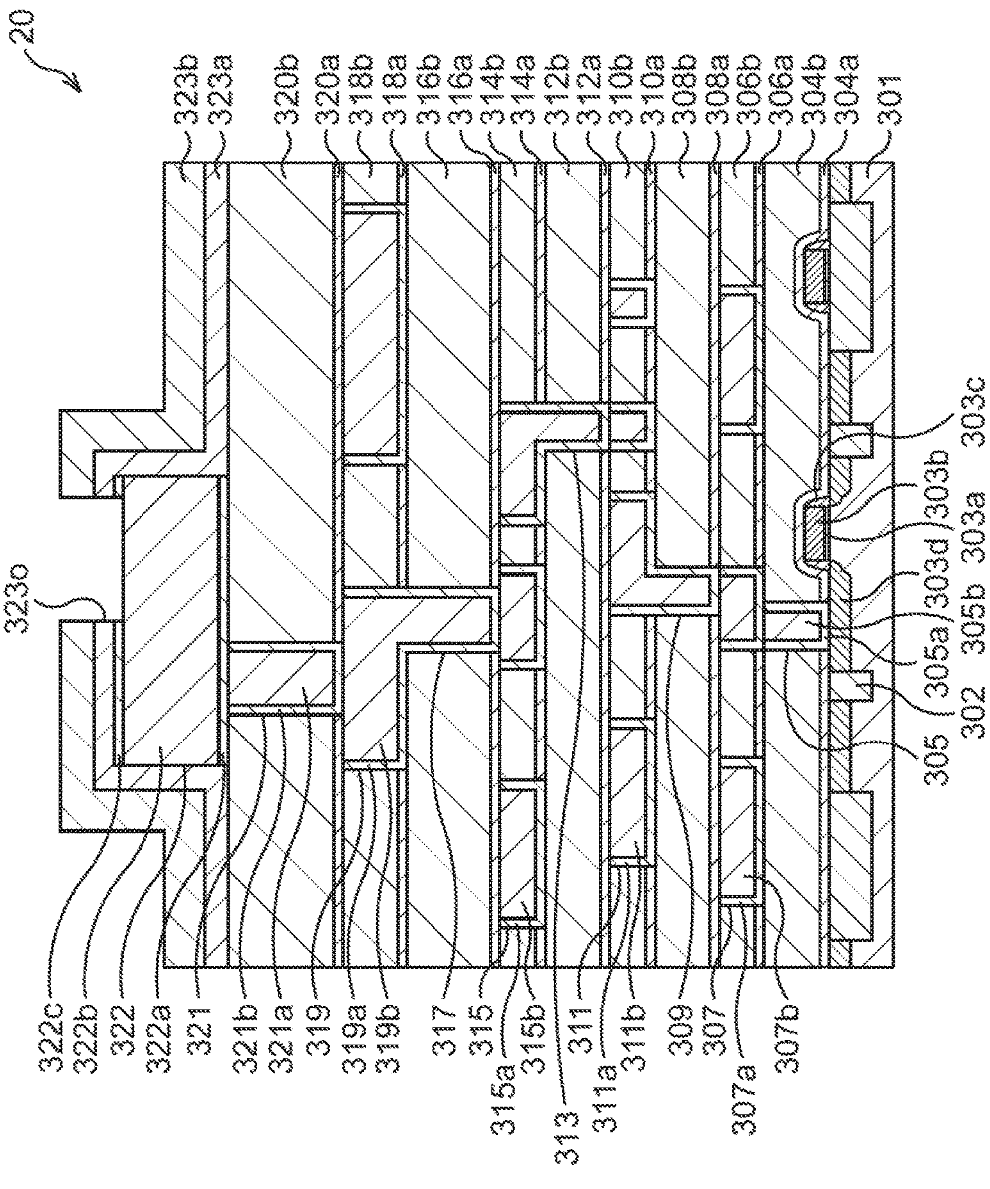

FIG. 132 is a cross-sectional view (part 132) explaining the manufacturing process of the semiconductor device in the first embodiment;

FIG. 133 is a cross-sectional view (part 133) explaining the manufacturing process of the semiconductor device in the first embodiment;

FIG. 134 is a cross-sectional view (part 134) explaining the manufacturing process of the semiconductor device in the first embodiment;

FIG. 135 is a cross-sectional view (part 135) explaining the manufacturing process of the semiconductor device in the first embodiment;

FIG. 136 is a cross-sectional view (part 136) explaining the manufacturing process of the semiconductor device in the first embodiment;

FIG. 137 is a cross-sectional view (part 137) explaining the manufacturing process of the semiconductor device in the first embodiment;

FIG. 138 is a cross-sectional view (part 138) explaining the manufacturing process of the semiconductor device in the first embodiment;

FIG. 139 is a cross-sectional view (part 139) explaining the manufacturing process of the semiconductor device in the first embodiment;

FIG. 140 is a cross-sectional view (part 140) explaining the manufacturing process of the semiconductor device in the first embodiment;

FIG. 141 is a cross-sectional view (part 141) explaining the manufacturing process of the semiconductor device in the first embodiment;

FIG. 142 is a cross-sectional view (part 142) explaining the manufacturing process of the semiconductor device in the first embodiment;

FIG. 143 is a cross-sectional view (part 143) explaining the manufacturing process of the semiconductor device in the first embodiment;

FIG. 144 is a cross-sectional view (part 144) explaining the manufacturing process of the semiconductor device in the first embodiment;

FIG. 145 is a cross-sectional view (part 145) explaining the manufacturing process of the semiconductor device in the first embodiment;

FIG. 146 is a cross-sectional view (part 146) explaining the manufacturing process of the semiconductor device in the first embodiment;

FIG. 147 is a cross-sectional view (part 147) explaining the manufacturing process of the semiconductor device in the first embodiment;

FIG. 148 is a cross-sectional view (part 148) explaining the manufacturing process of the semiconductor device in the first embodiment;

FIG. 149 is a cross-sectional view (part 149) explaining the manufacturing process of the semiconductor device in the first embodiment;

FIG. 150 is a cross-sectional view (part 150) explaining the manufacturing process of the semiconductor device in the first embodiment;

FIG. 151 is a cross-sectional view (part 151) explaining the manufacturing process of the semiconductor device in the first embodiment;

FIG. 152 is a cross-sectional view (part 152) explaining the manufacturing process of the semiconductor device in the first embodiment;

FIG. 153 is a cross-sectional view (part 153) explaining the manufacturing process of the semiconductor device in the first embodiment;

FIG. 154 is a plan view (part 1) illustrating mask patterns for a flash memory element part in the manufacturing process of the semiconductor device in the first embodiment;

FIG. 155 is a plan view (part 2) illustrating the mask patterns for the flash memory element part in the manufacturing process of the semiconductor device in the first embodiment;

FIG. 156 is a plan view (part 3) illustrating the mask patterns for the flash memory element part in the manufacturing process of the semiconductor device in the first embodiment;

FIG. 157 is a plan view (part 4) illustrating the mask patterns for the flash memory element part in the manufacturing process of the semiconductor device in the first embodiment;

FIG. 158 is a plan view (part 5) illustrating the mask patterns for the flash memory element part in the manufacturing process of the semiconductor device in the first embodiment;

FIG. 159 is a plan view (part 6) illustrating the mask patterns for the flash memory element part in the manufacturing process of the semiconductor device in the first embodiment;

FIG. 160 is a plan view (part 7) illustrating the mask patterns for the flash memory element part in the manufacturing process of the semiconductor device in the first embodiment;

FIGS. 161A and 161B are plan views (part 1) illustrating mask patterns for a low-voltage transistor part and a middle withstand voltage transistor part in the manufacturing process of the semiconductor device in the first embodiment;

FIGS. 162A and 162B are plan views (part 2) illustrating the mask patterns for the low-voltage transistor part and the middle withstand voltage transistor part in the manufacturing process of the semiconductor device in the first embodiment;

FIGS. 163A and 163B are plan views (part 3) illustrating the mask patterns for the low-voltage transistor part and the middle withstand voltage transistor part in the manufacturing process of the semiconductor device in the first embodiment;

FIGS. 164A and 164B are plan views (part 4) illustrating the mask patterns for the low-voltage transistor part and the middle withstand voltage transistor part in the manufacturing process of the semiconductor device in the first embodiment;

FIGS. 165A and 165B are plan views (part 5) illustrating the mask patterns for the low-voltage transistor part and the middle withstand voltage transistor part in the manufacturing process of the semiconductor device in the first embodiment;

FIGS. 166A and 166B are plan views (part 6) illustrating the mask patterns for the low-voltage transistor part and the middle withstand voltage transistor part in the manufacturing process of the semiconductor device in the first embodiment;

FIGS. 167A and 167B are plan views (part 7) illustrating the mask patterns for the low-voltage transistor part and the middle withstand voltage transistor part in the manufacturing process of the semiconductor device in the first embodiment;

FIGS. 168A and 168B are plan views (part 8) illustrating the mask patterns for the low-voltage transistor part and the middle withstand voltage transistor part in the manufacturing process of the semiconductor device in the first embodiment;

FIGS. 169A and 169B are plan views (part 9) illustrating the mask patterns for the low-voltage transistor part and the middle withstand voltage transistor part in the manufacturing process of the semiconductor device in the first embodiment;

FIGS. 170A and 170B are plan views (part 10) illustrating the mask patterns for the low-voltage transistor part and the middle withstand voltage transistor part in the manufacturing process of the semiconductor device in the first embodiment;

FIGS. 171A and 171B are plan views (part 11) illustrating the mask patterns for the low-voltage transistor part and the middle withstand voltage transistor part in the manufacturing process of the semiconductor device in the first embodiment;

FIGS. 172A and 172B are plan views (part 12) illustrating the mask patterns for the low-voltage transistor part and the middle withstand voltage transistor part in the manufacturing process of the semiconductor device in the first embodiment;

FIGS. 173A and 173B are plan views (part 13) illustrating the mask patterns for the low-voltage transistor part and the middle withstand voltage transistor part in the manufacturing process of the semiconductor device in the first embodiment;

FIGS. 174A and 174B are plan views (part 14) illustrating the mask patterns for the low-voltage transistor part and the middle withstand voltage transistor part in the manufacturing process of the semiconductor device in the first embodiment;

FIG. 175 is a plan view (part 1) illustrating mask patterns for a high withstand voltage transistor part in the manufacturing process of the semiconductor device in the first embodiment;

FIG. 176 is a plan view (part 2) illustrating the mask patterns for the high withstand voltage transistor part in the manufacturing process of the semiconductor device in the first embodiment;

FIG. 177 is a plan view (part 3) illustrating the mask patterns for the high withstand voltage transistor part in the manufacturing process of the semiconductor device in the first embodiment;

FIG. 178 is a plan view (part 4) illustrating the mask patterns for the high withstand voltage transistor part in the manufacturing process of the semiconductor device in the first embodiment;

FIG. 179 is a plan view (part 5) illustrating the mask patterns for the high withstand voltage transistor part in the manufacturing process of the semiconductor device in the first embodiment;

FIG. 180 is a plan view (part 6) illustrating the mask patterns for the high withstand voltage transistor part in the manufacturing process of the semiconductor device in the first embodiment;

FIG. 181 is a plan view (part 7) illustrating the mask patterns for the high withstand voltage transistor part in the manufacturing process of the semiconductor device in the first embodiment;

FIG. 182 is a plan view (part 8) illustrating the mask patterns for the high withstand voltage transistor part in the manufacturing process of the semiconductor device in the first embodiment;

FIG. 183 is a plan view (part 9) illustrating the mask patterns for the high withstand voltage transistor part in the manufacturing process of the semiconductor device in the first embodiment;

FIG. 184 is a plan view (part 10) illustrating the mask patterns for the high withstand voltage transistor part in the manufacturing process of the semiconductor device in the first embodiment;

FIGS. 185A and 185B are cross-sectional views (part 1) explaining a manufacturing process of a semiconductor device in a modification example of the first embodiment;

FIGS. 186A and 186B are cross-sectional views (part 2) explaining the manufacturing process of the semiconductor device in the modification example of the first embodiment;

FIGS. 187A and 187B are cross-sectional views (part 3) explaining the manufacturing process of the semiconductor device in the modification example of the first embodiment;

FIGS. 188A and 188B are cross-sectional views (part 4) explaining the manufacturing process of the semiconductor device in the modification example of the first embodiment;

FIGS. 189A and 189B are plan views illustrating mask patterns for a low-voltage transistor part and a middle withstand voltage transistor part in the manufacturing process of the semiconductor device in the modification example of the first embodiment;

FIG. 190 is a cross-sectional view (part 1) explaining a manufacturing process of a semiconductor device in a second embodiment;

FIG. 191 is a cross-sectional view (part 2) explaining the manufacturing process of the semiconductor device in the second embodiment;

FIG. 192 is a cross-sectional view (part 3) explaining the manufacturing process of the semiconductor device in the second embodiment;

FIG. 193 is a cross-sectional view (part 4) explaining the manufacturing process of the semiconductor device in the second embodiment;

FIG. 194 is a cross-sectional view (part 5) explaining the manufacturing process of the semiconductor device in the second embodiment;

FIG. 195 is a cross-sectional view (part 6) explaining the manufacturing process of the semiconductor device in the second embodiment;

FIG. 196 is a cross-sectional view (part 7) explaining the manufacturing process of the semiconductor device in the second embodiment;

FIG. 197 is a cross-sectional view (part 8) explaining the manufacturing process of the semiconductor device in the second embodiment;

FIG. 198 is a cross-sectional view (part 9) explaining the manufacturing process of the semiconductor device in the second embodiment;

FIG. 199 is a plan view (part 1) illustrating mask patterns for a high withstand voltage transistor part in the manufacturing process of the semiconductor device in the second embodiment;

FIG. 200 is a plan view (part 2) illustrating the mask patterns for the high withstand voltage transistor part in the manufacturing process of the semiconductor device in the second embodiment;

FIG. 201 is a plan view (part 3) illustrating the mask patterns for the high withstand voltage transistor part in the manufacturing process of the semiconductor device in the second embodiment;

FIG. 202 is a plan view (part 4) illustrating the mask patterns for the high withstand voltage transistor part in the manufacturing process of the semiconductor device in the second embodiment;

FIG. 203 is a plan view (part 5) illustrating the mask patterns for the high withstand voltage transistor part in the manufacturing process of the semiconductor device in the second embodiment; and FIG. 204 is a cross-sectional view explaining a semiconductor device in a third embodiment.

DESCRIPTION OF EMBODIMENTS

First Embodiment

FIGS. 1A-1C to FIG. 153 and FIG. 154 to FIG. 184 are cross-sectional views and plan views explaining a first embodiment, respectively.

Hereinafter, a manufacturing process of a semiconductor device will be explained in detail along the cross-sectional views and the plan views.

FIGS. 1A-1C to FIG. 153 are cross-sectional views (part 1 to part 153) explaining the manufacturing process of the semiconductor device in the first embodiment. FIG. 154 to FIG. 160 are plan views (part 1 to part 7) illustrating mask patterns of a flash memory element part in the manufacturing process of the semiconductor device in the first embodiment. FIGS. 161A and 161B to FIGS. 174A and 174B are plan views (part 1 to part 14) illustrating mask patterns of a low-voltage transistor part and a middle withstand voltage transistor part in the manufacturing process of the semiconductor device in the first embodiment. FIG. 175 to FIG. 184 are plan views (part 1 to part 10) illustrating mask patterns of a high withstand voltage transistor part in the manufacturing process of the semiconductor device in the first embodiment.

Regions A, B illustrated in FIGS. 1A-1C to FIGS. 51A-51C are regions illustrating the flash memory cell element part. The flash memory element part includes the region A where a selection transistor is formed and the region B where a memory transistor is formed. FIG. 1A to FIG. 51A are cross-sectional views illustrating a T-T' line part (a portion indicated with a one-dotted chain line except a portion indicated with a two-dotted chain line, the same applying to the following) illustrated in FIG. 154 to FIG. 160. FIG. 1B to FIG. 51B are cross-sectional views illustrating a U-U' line part illustrated in FIG. 154 to FIG. 160. FIG. 1C to FIG. 51C are cross-sectional views illustrating a V-V' line part illustrated in FIG. 154 to FIG. 160.

Regions C, D illustrated in FIG. 52A to FIG. 102A are regions illustrating the low-voltage transistor part. Regions E, F illustrated in FIG. 52B to FIG. 102B are regions illustrating the middle withstand voltage transistor part. The low-voltage transistor part includes the region C where a p-type low-voltage transistor is formed and the region D where an n-type low-voltage transistor is formed. The middle withstand voltage transistor part includes the region E where a p-type middle withstand voltage transistor is formed and the region F where an n-type middle withstand voltage transistor is formed. FIG. 52A to FIG. 102A are cross-sectional views illustrating a W-W' line part illustrated in FIG. 161A to FIG. 174A. FIG. 52B to FIG. 102B are cross-sectional views illustrating an X-X' line part illustrated in FIG. 161B to FIG. 174B.

Regions G to J illustrated in FIG. 103 to FIG. 153 are regions illustrating the high withstand voltage transistor part. The high withstand voltage transistor part includes the region G where a first p-type high withstand voltage transistor is formed, the region H where a first tap is formed, the region I where a first n-type high withstand voltage transistor is formed, and the region J where a second tap is formed. FIG. 103 to FIG. 153 are cross-sectional views illustrating a Y-Y' line part illustrated in FIG. 175 to FIG. 184.

Figure 1A:
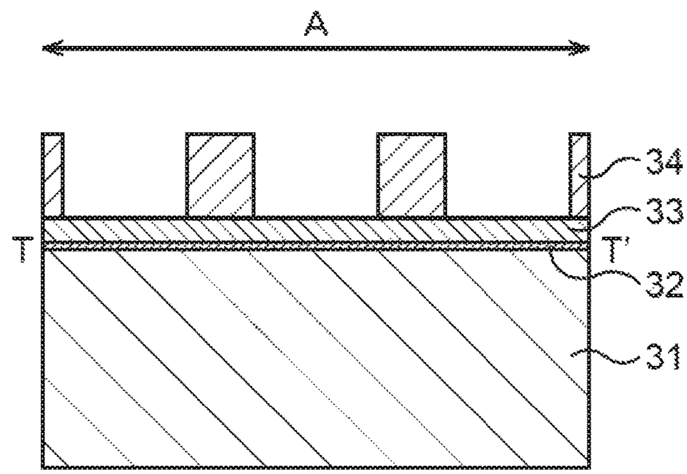
FIGS. 1A-1C are cross-sectional views (part 1) explaining a manufacturing process of a semiconductor device in a first embodiment.
Figure 1B:
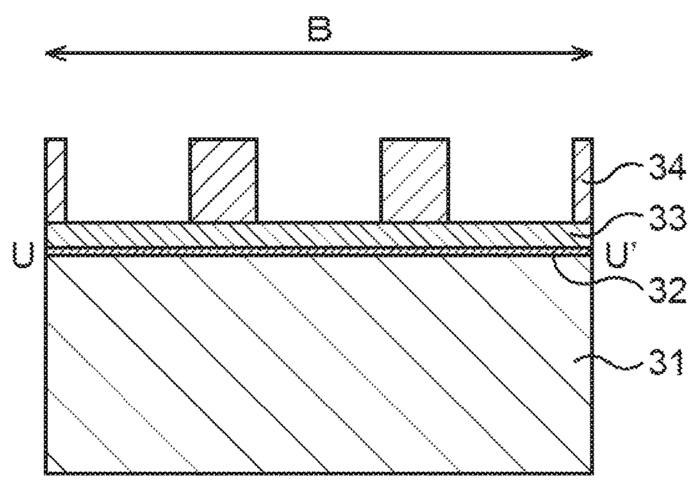
Figure 1C:
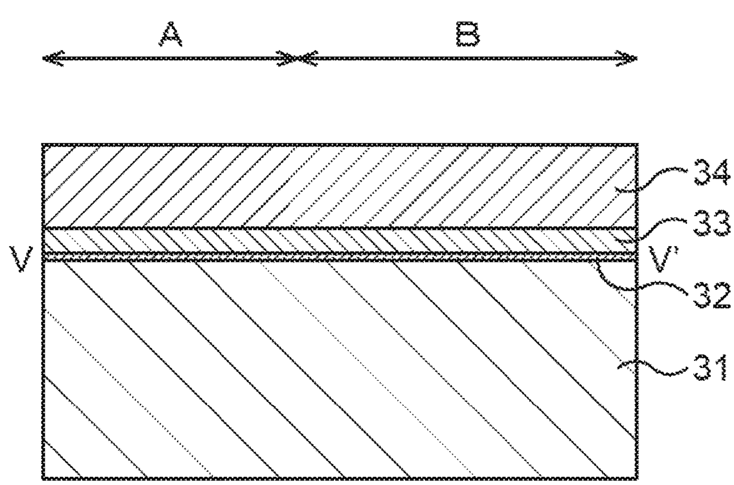
Figure 2A:
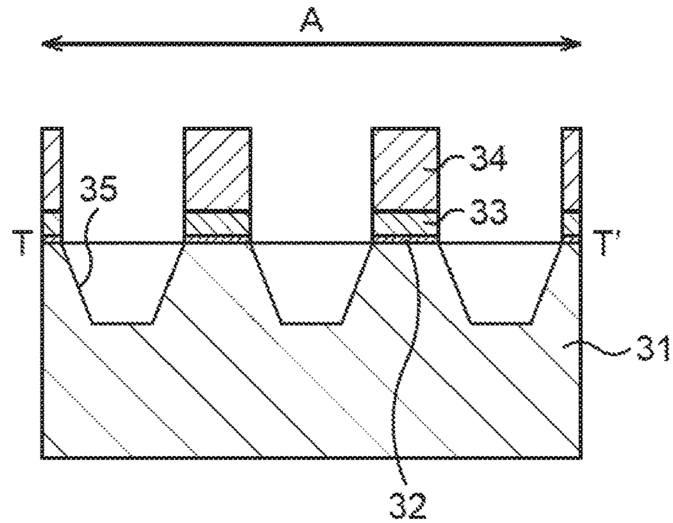
FIGS. 2A-2C are cross-sectional views (part 2) explaining the manufacturing process of the semiconductor device in the first embodiment.
Figure 2B:
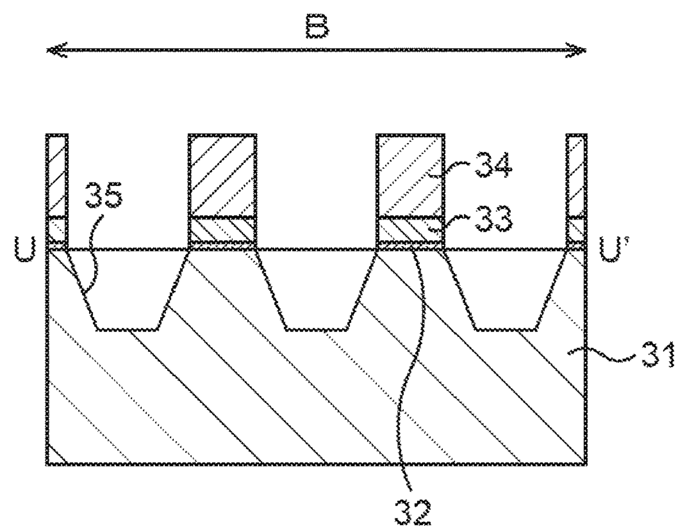
Figure 2C:
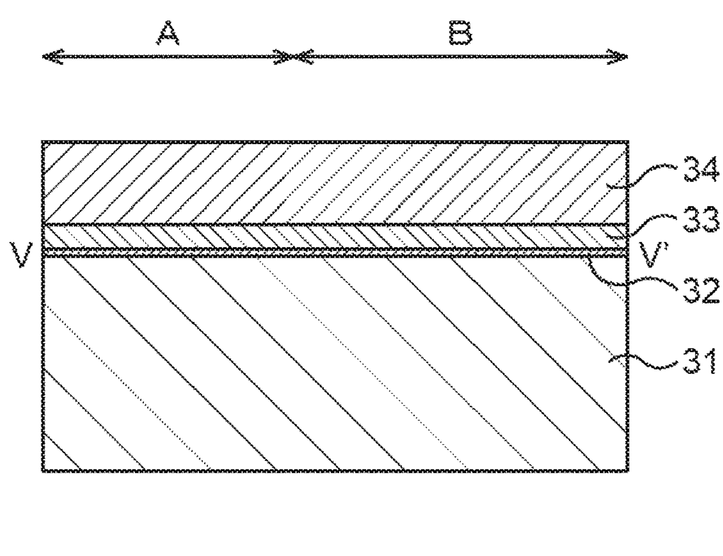
Figure 3A:
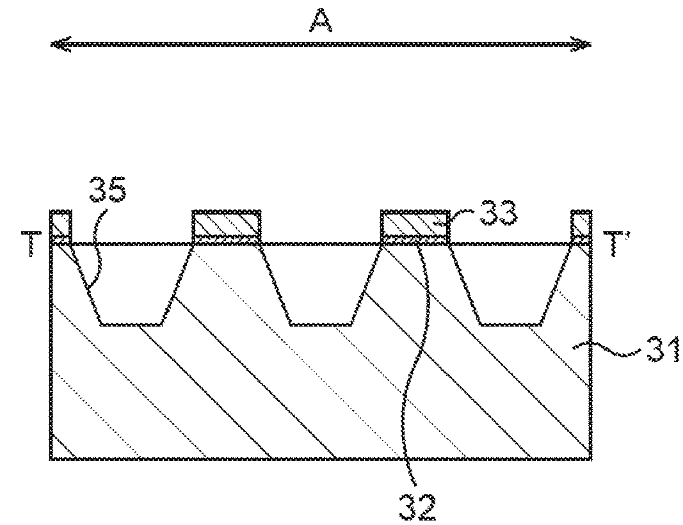
FIGS. 3A-3C are cross-sectional views (part 3) explaining the manufacturing process of the semiconductor device in the first embodiment.
Figure 3B:
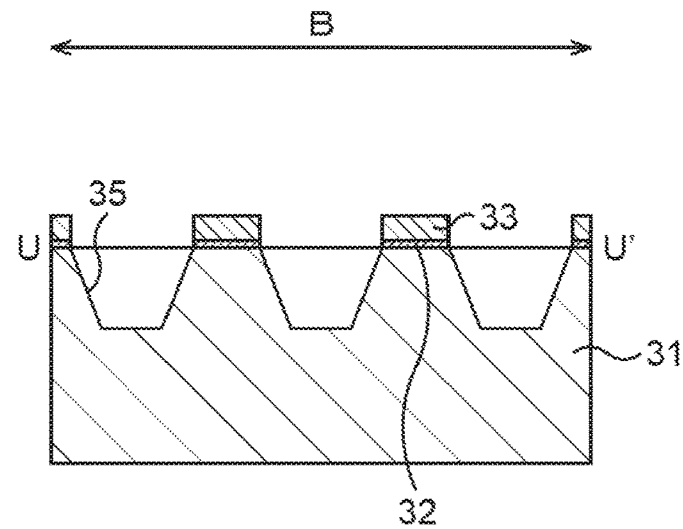
Figure 3C:
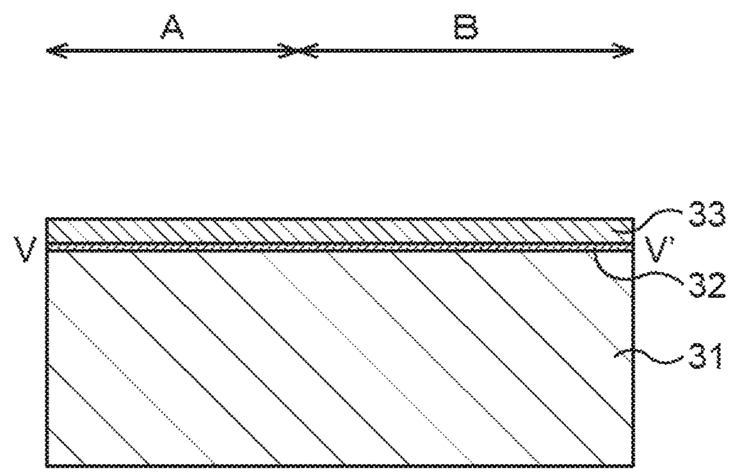
Figure 4A:
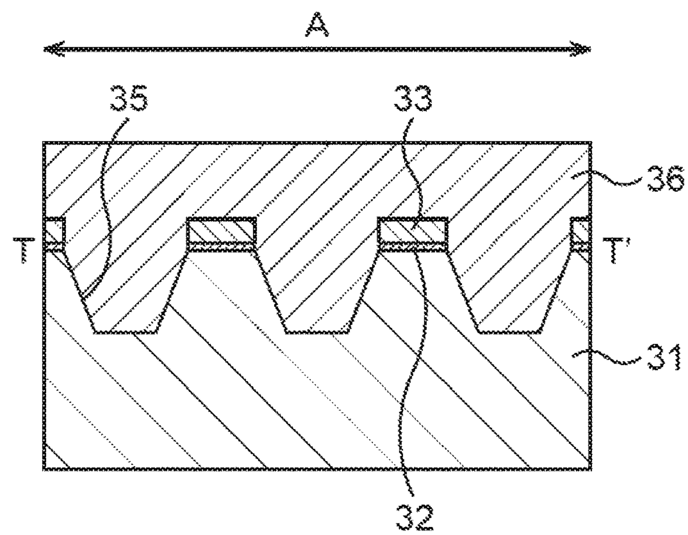
FIGS. 4A-4C are cross-sectional views (part 4) explaining the manufacturing process of the semiconductor device in the first embodiment.
Figure 4B:
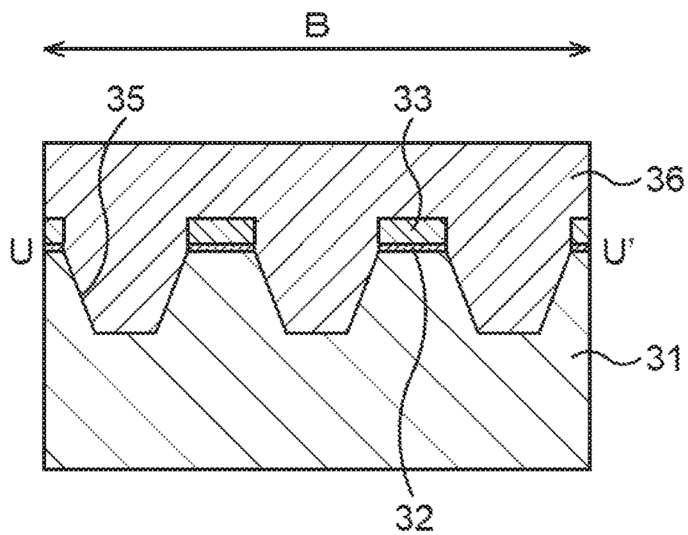
Figure 4C:
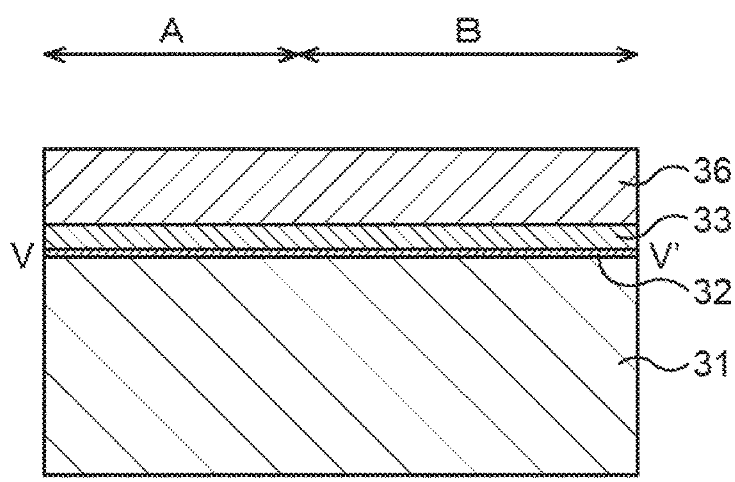
Figure 5A:
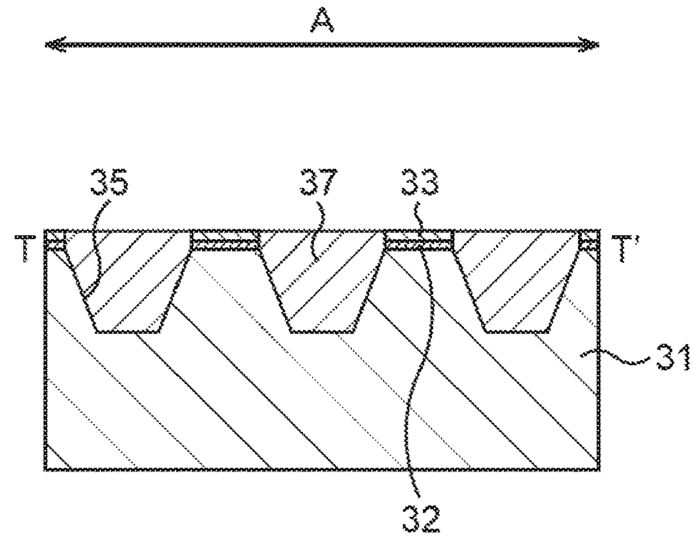
FIGS. 5A-5C are cross-sectional views (part 5) explaining the manufacturing process of the semiconductor device in the first embodiment.
Figure 5B:
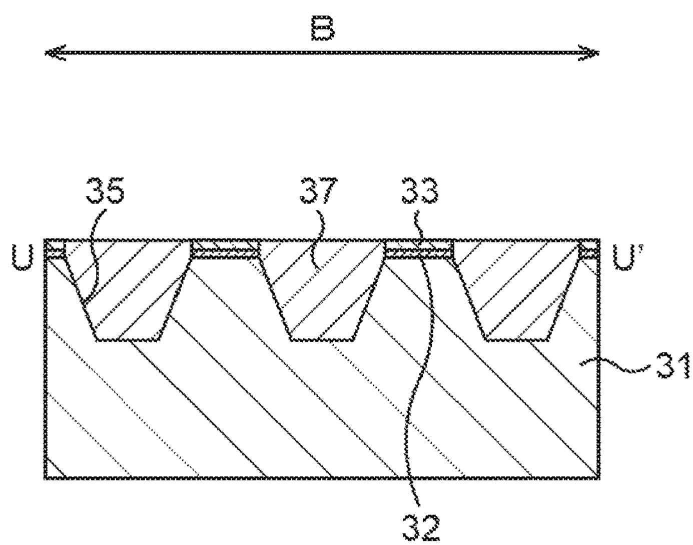
Figure 5C:
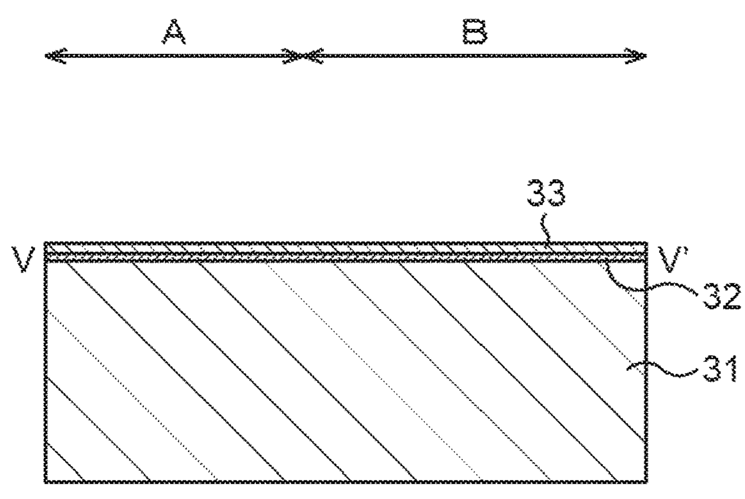
Figure 6A:
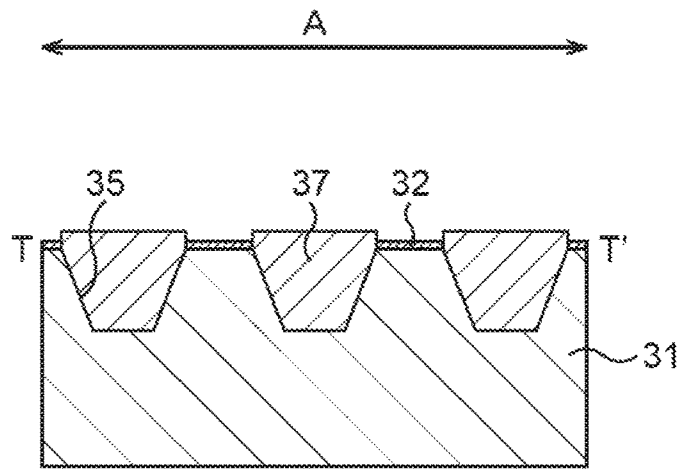
FIGS. 6A-6C are cross-sectional views (part 6) explaining the manufacturing process of the semiconductor device in the first embodiment.
Figure 6B:
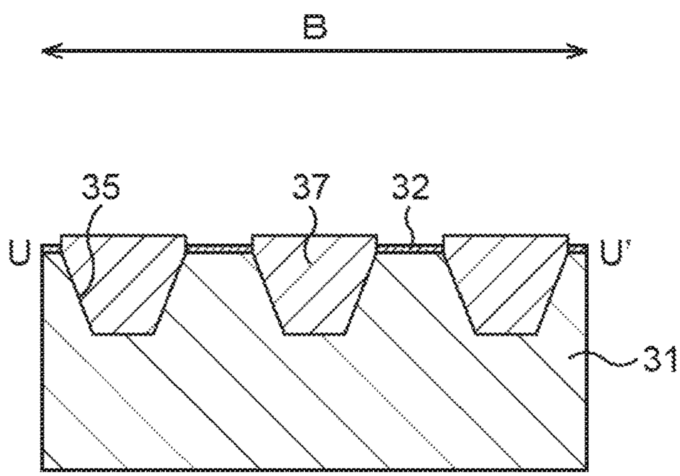
Figure 6C:
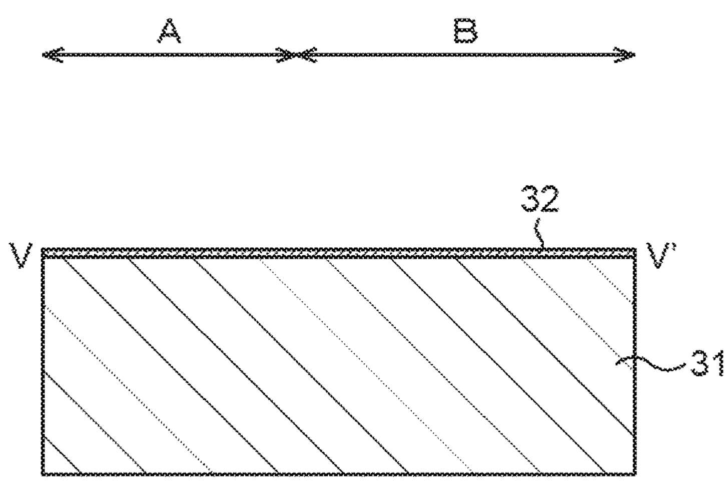
Figure 7A:
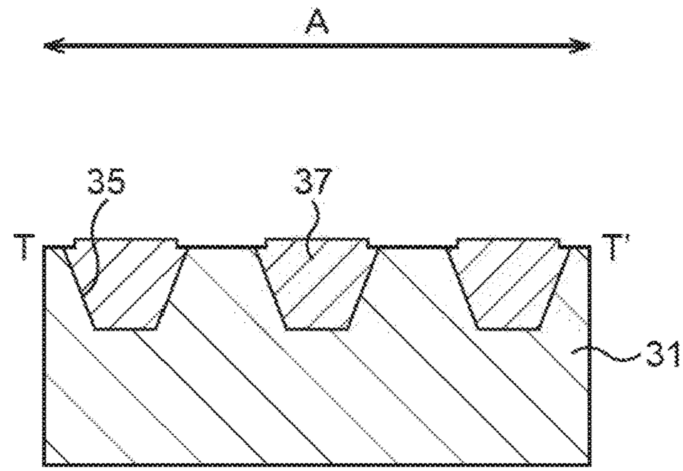
FIGS. 7A-7C are cross-sectional views (part 7) explaining the manufacturing process of the semiconductor device in the first embodiment.
Figure 7B:
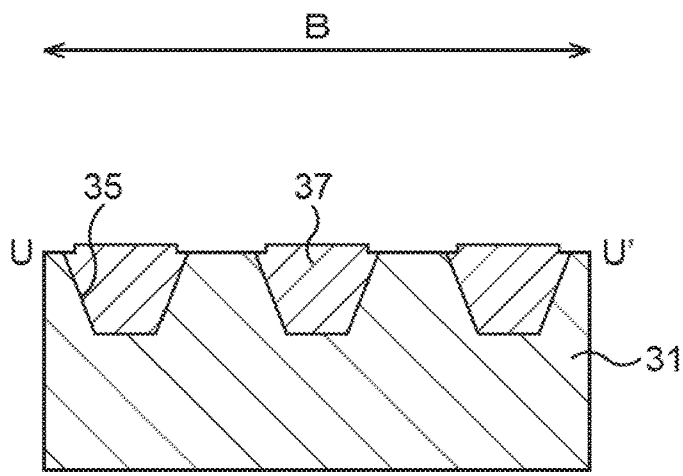
Figure 7C:
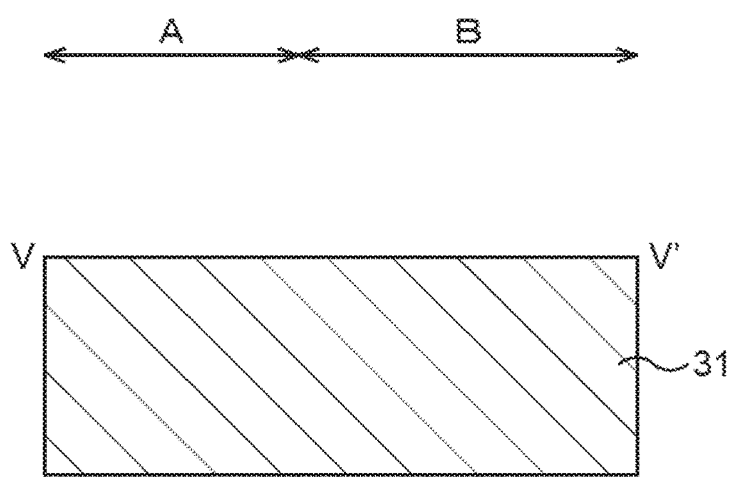
Figure 8A:
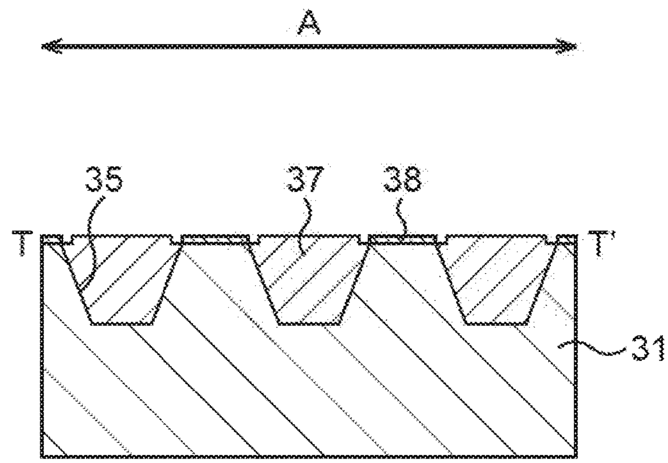
FIGS. 8A-8C are cross-sectional views (part 8) explaining the manufacturing process of the semiconductor device in the first embodiment.
Figure 8B:
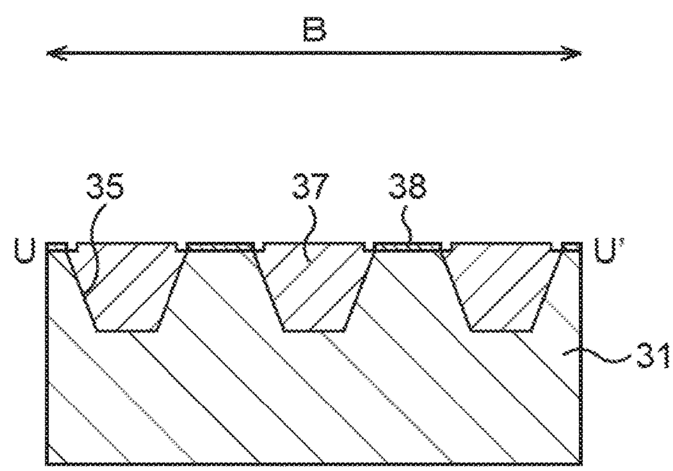
Figure 8C:
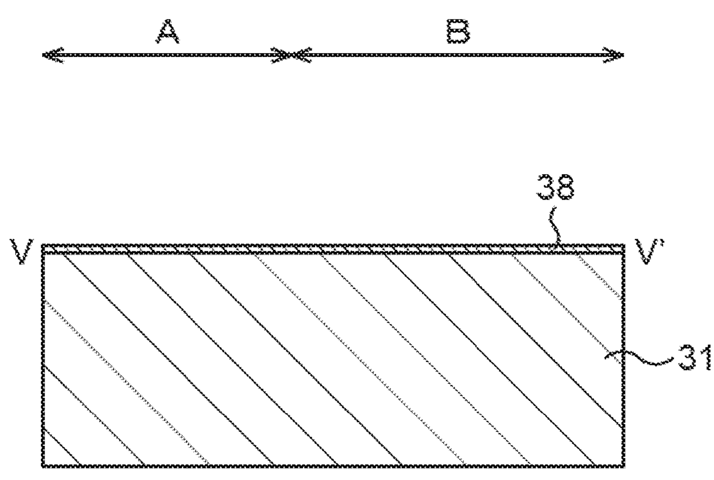
Figure 9A:
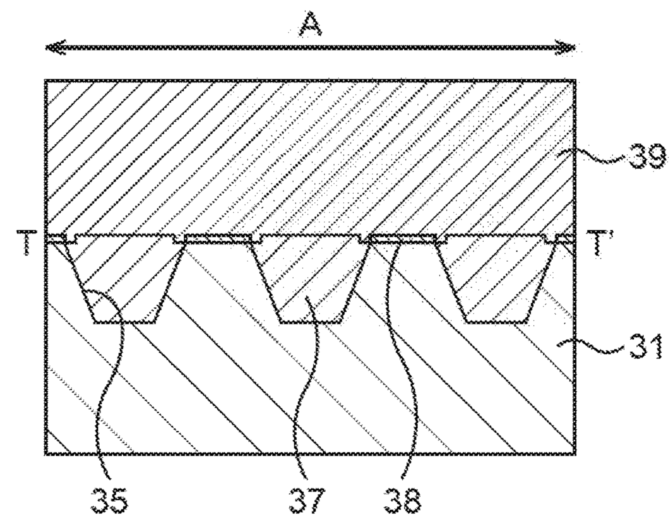
FIGS. 9A-9C are cross-sectional views (part 9) explaining the manufacturing process of the semiconductor device in the first embodiment.
Figure 9B:
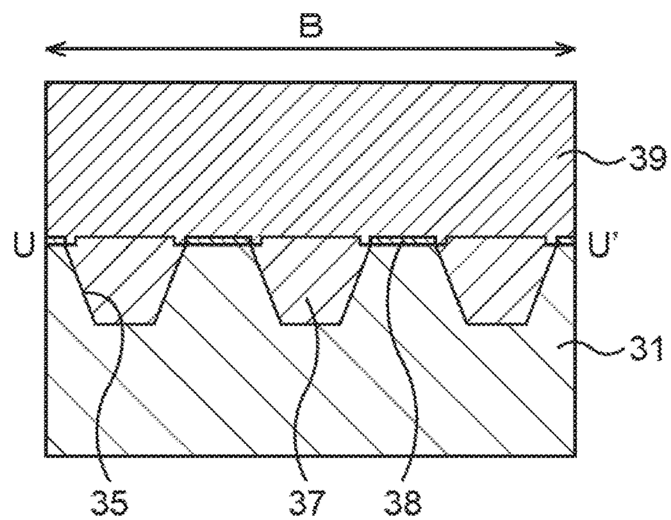
Figure 9C:
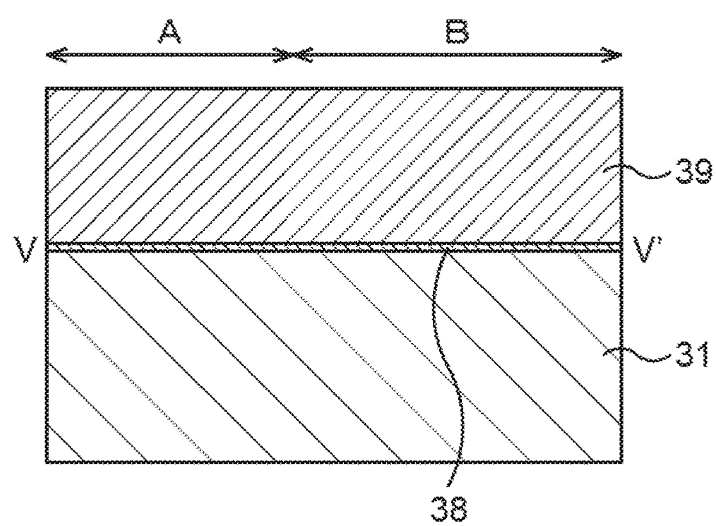
Figure 10A:
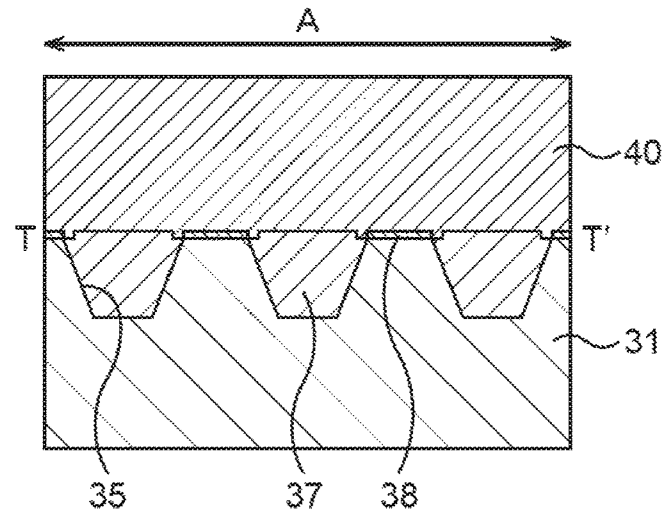
FIGS. 10A-10C are cross-sectional views (part 10) explaining the manufacturing process of the semiconductor device in the first embodiment.
Figure 10B:
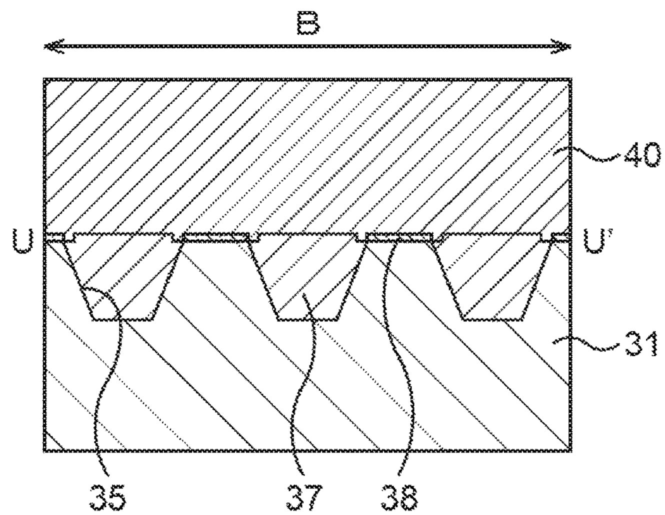
Figure 10C:
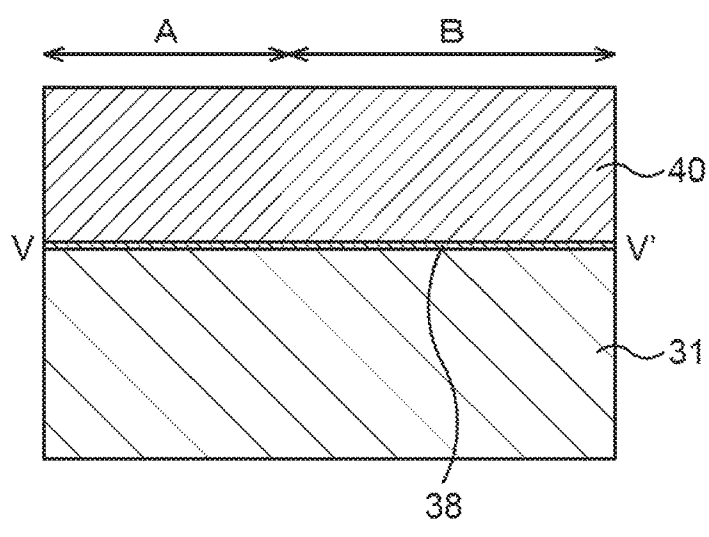
Figure 11A:
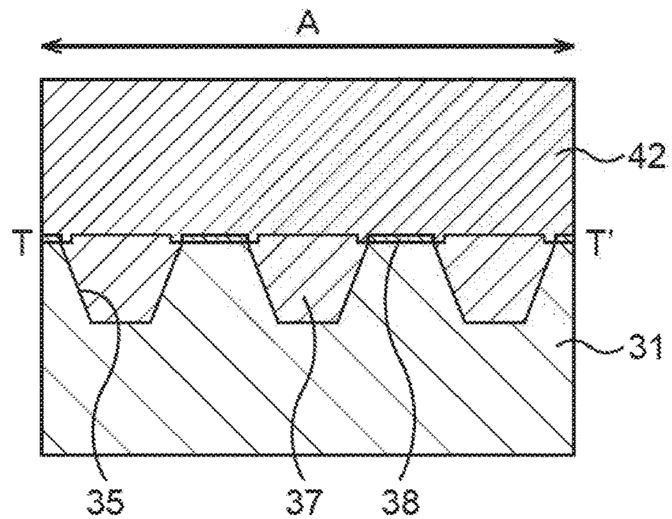
FIGS. 11A-11C are cross-sectional views (part 11) explaining the manufacturing process of the semiconductor device in the first embodiment.
Figure 11B:
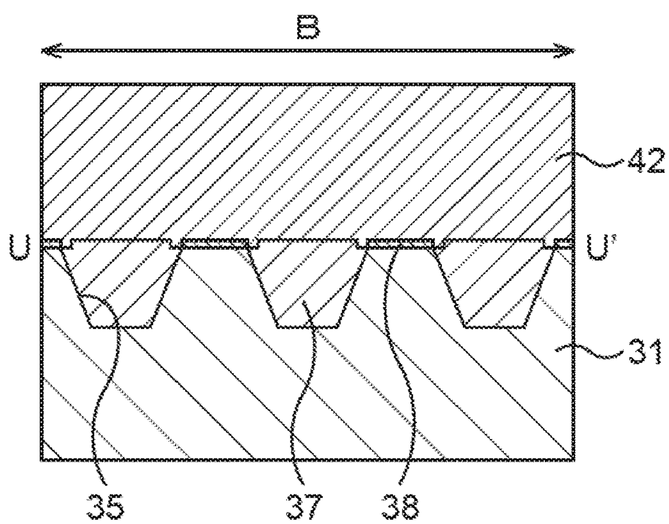
Figure 11C:
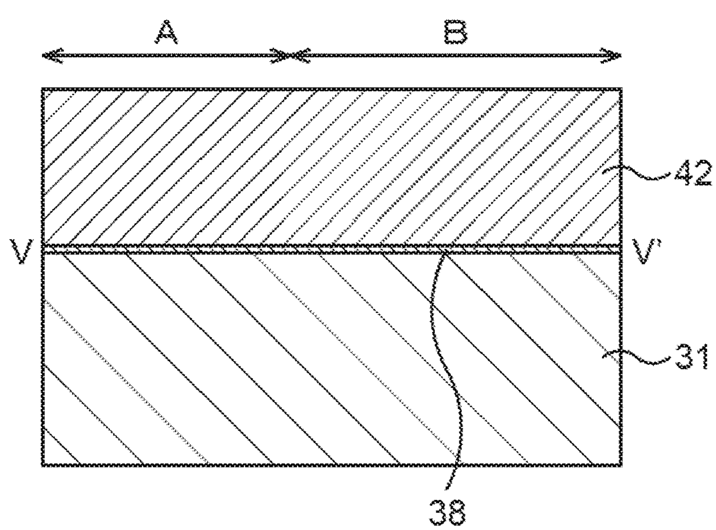
Figure 12A:
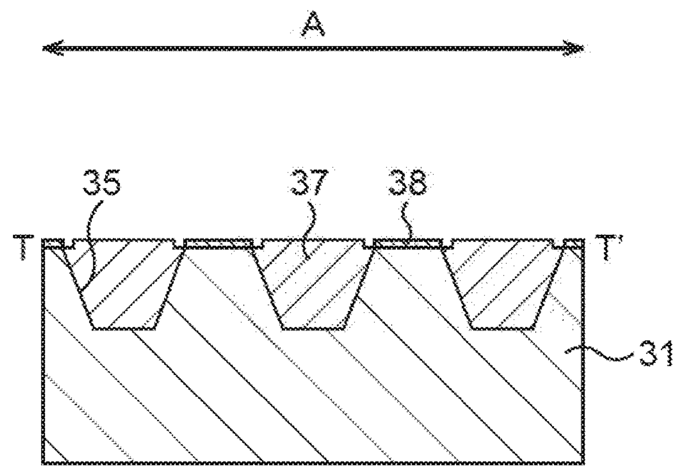
FIGS. 12A-12C are cross-sectional views (part 12) explaining the manufacturing process of the semiconductor device in the first embodiment.
Figure 12B:
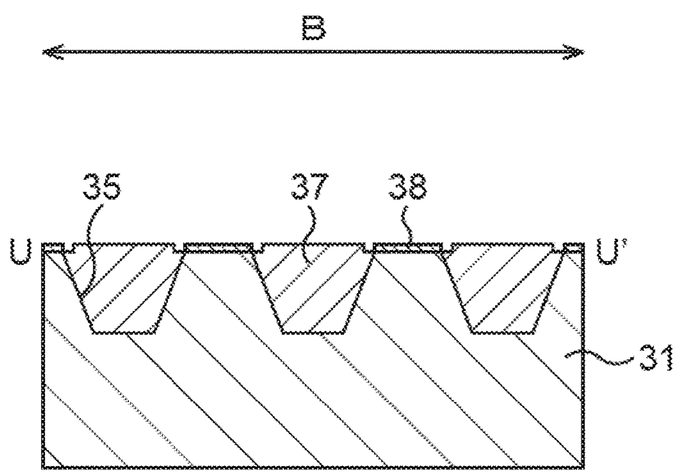
Figure 12C:
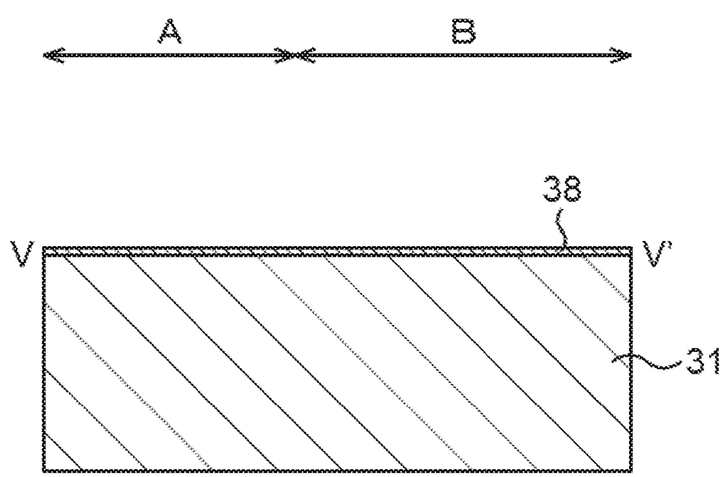
Figure 13A:
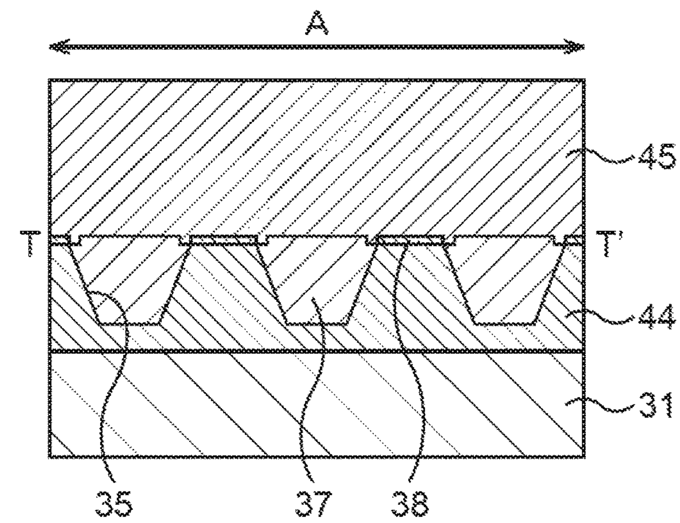
FIGS. 13A-13C are cross-sectional views (part 13) explaining the manufacturing process of the semiconductor device in the first embodiment.
Figure 13B:
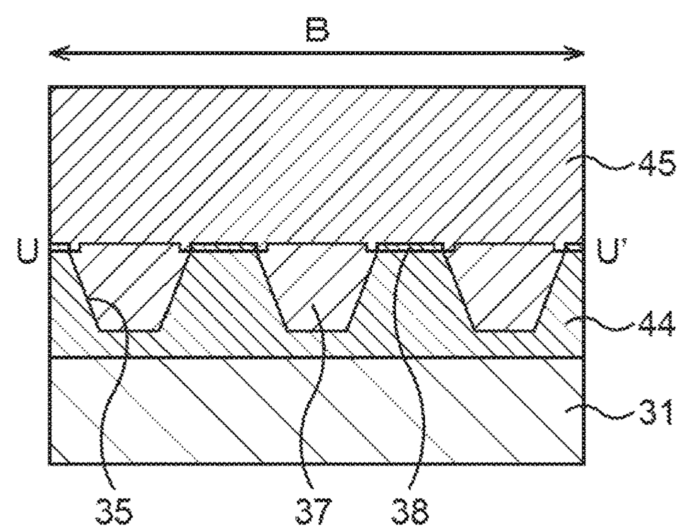
Figure 13C:
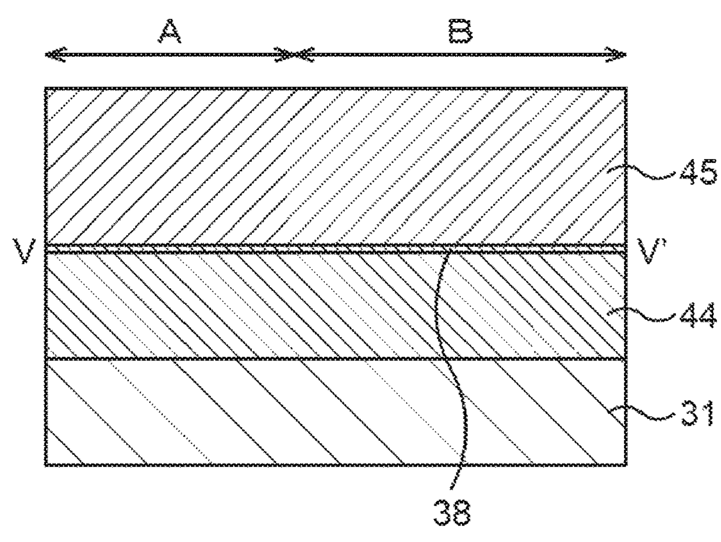
Figure 14A:
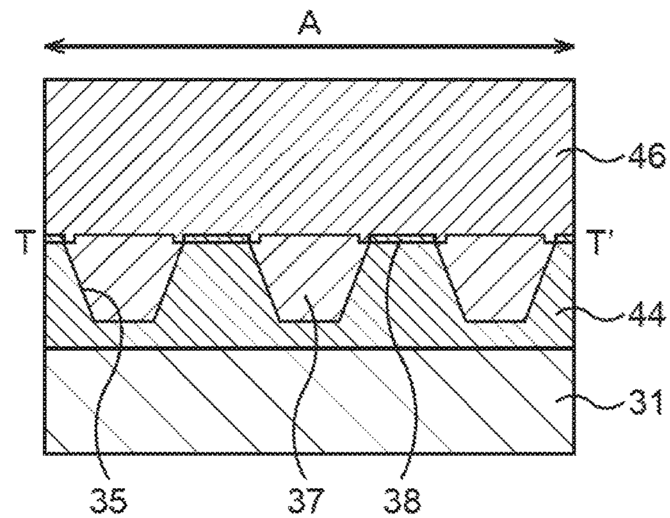
FIGS. 14A-14C are cross-sectional views (part 14) explaining the manufacturing process of the semiconductor device in the first embodiment.
Figure 14B:
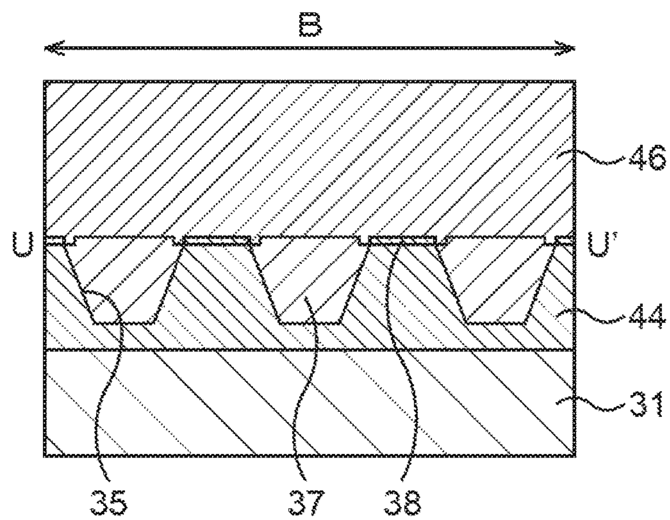
Figure 14C:
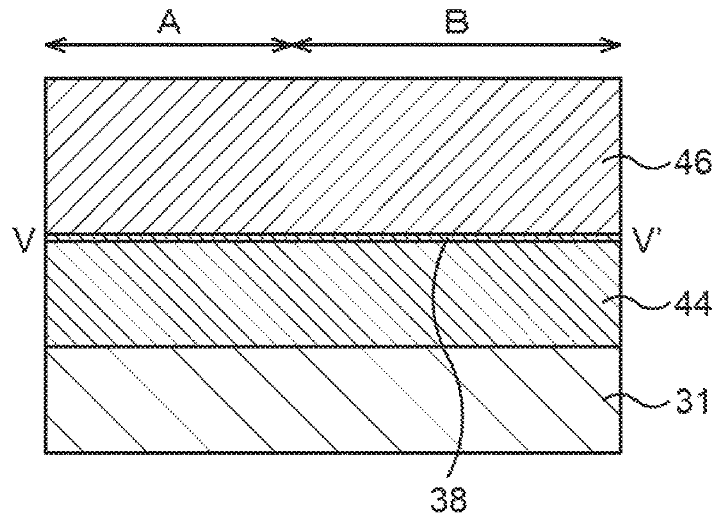
Figure 15A:
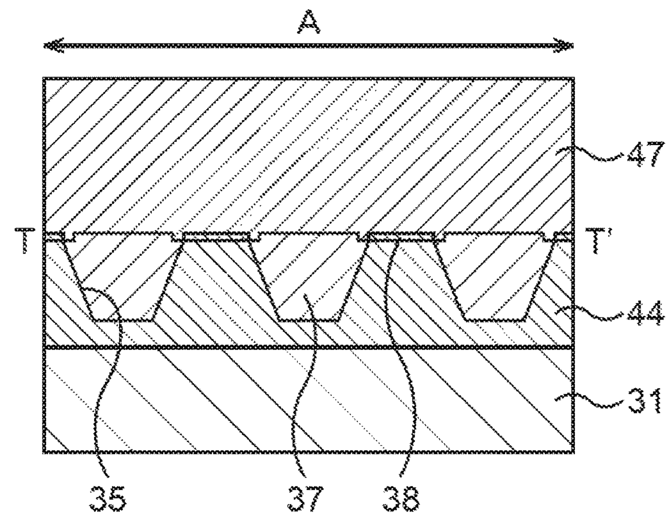
FIGS. 15A-15C are cross-sectional views (part 15) explaining the manufacturing process of the semiconductor device in the first embodiment.
Figure 15B:
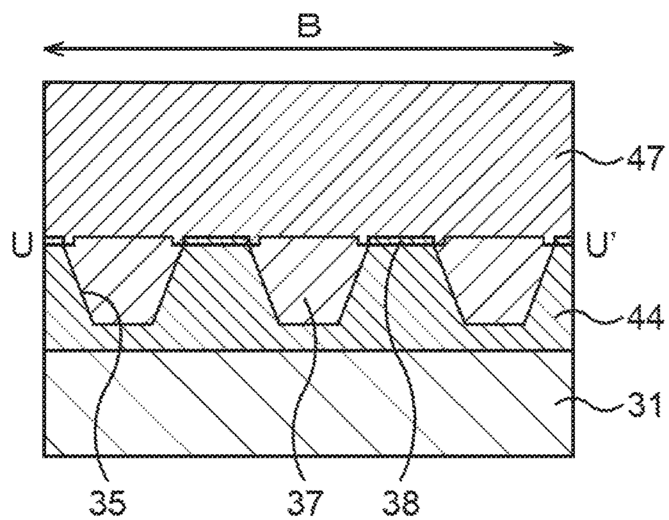
Figure 15C:
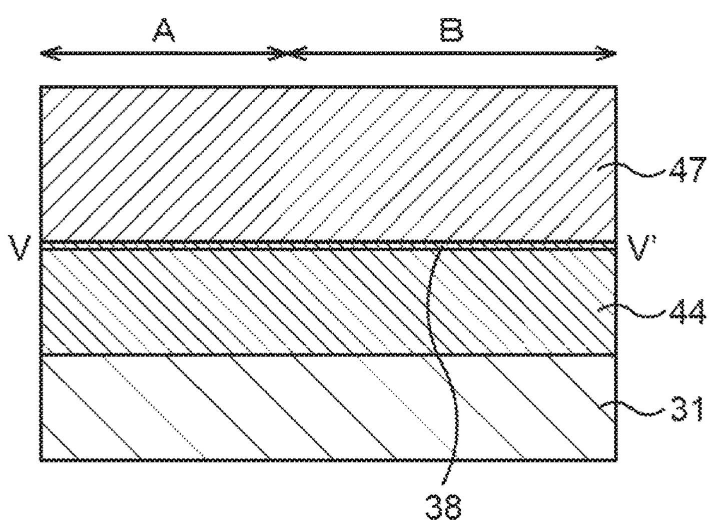
Figure 16A:
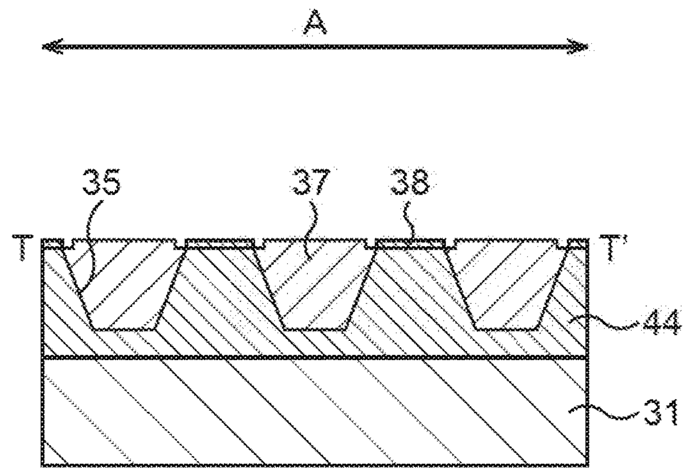
FIGS. 16A-16C are cross-sectional views (part 16) explaining the manufacturing process of the semiconductor device in the first embodiment.
Figure 16B:
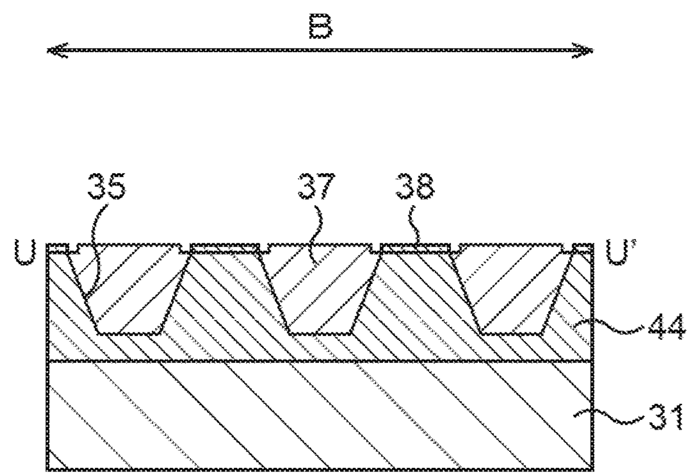
Figure 16C:
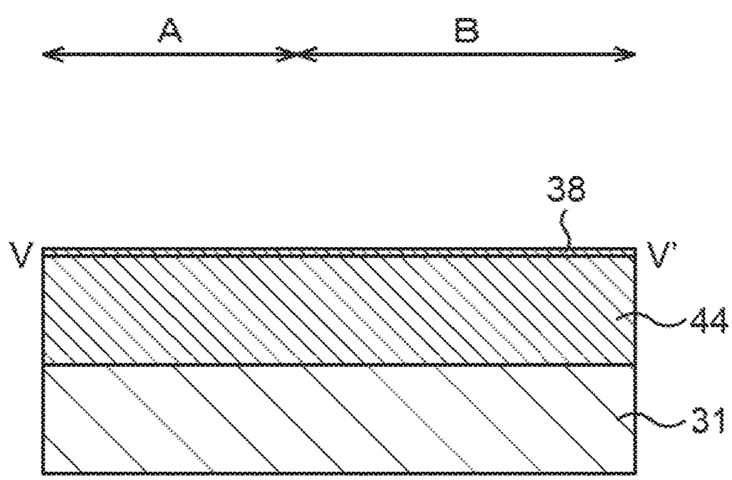
Figure 17A:
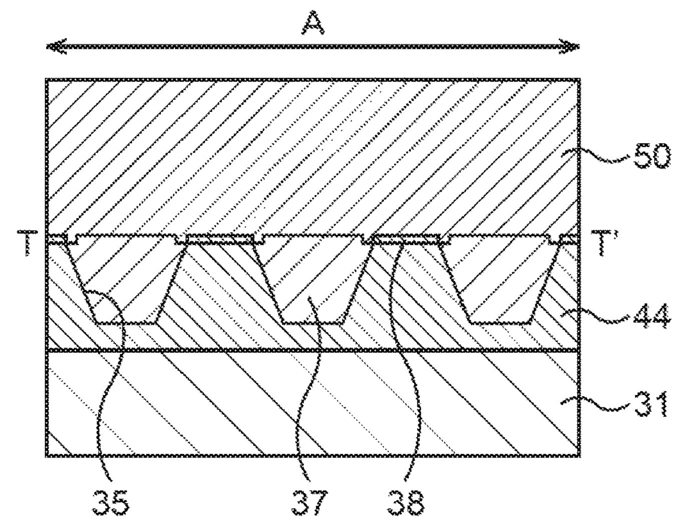
FIGS. 17A-17C are cross-sectional views (part 17) explaining the manufacturing process of the semiconductor device in the first embodiment.
Figure 17B:
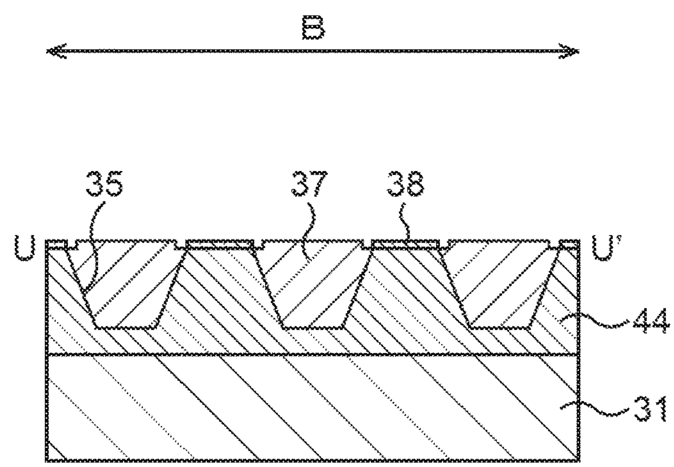
Figure 17C:
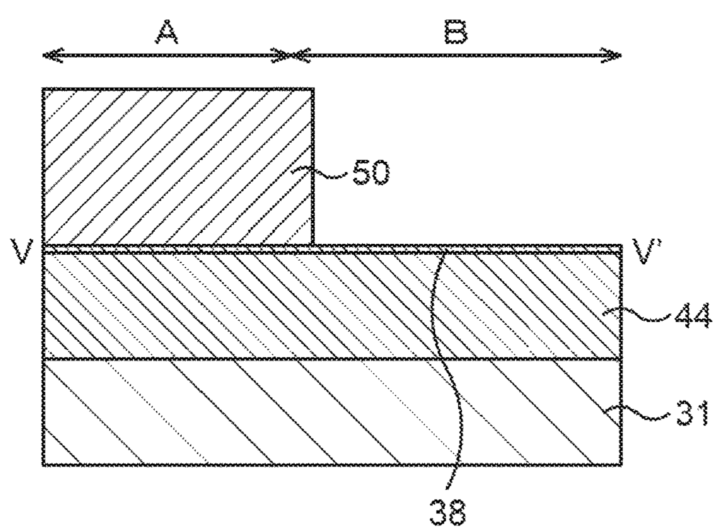
Figure 18A:
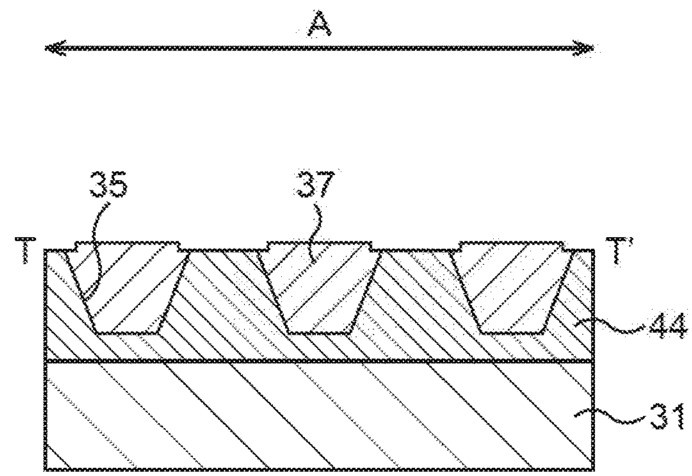
FIGS. 18A-18C are cross-sectional views (part 18) explaining the manufacturing process of the semiconductor device in the first embodiment.
Figure 18B:
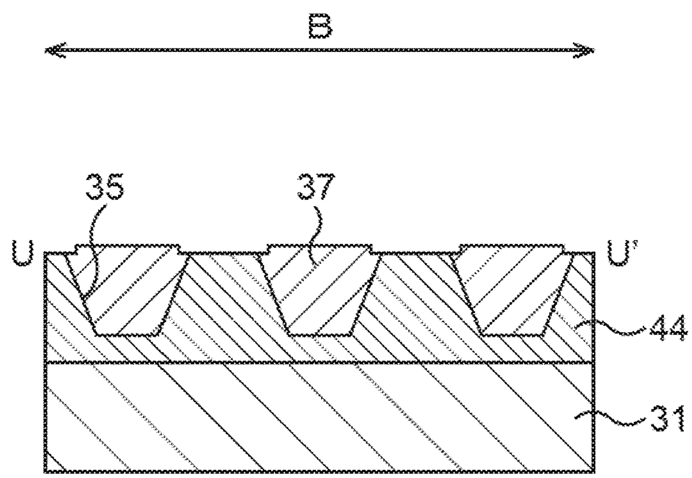
Figure 18C:
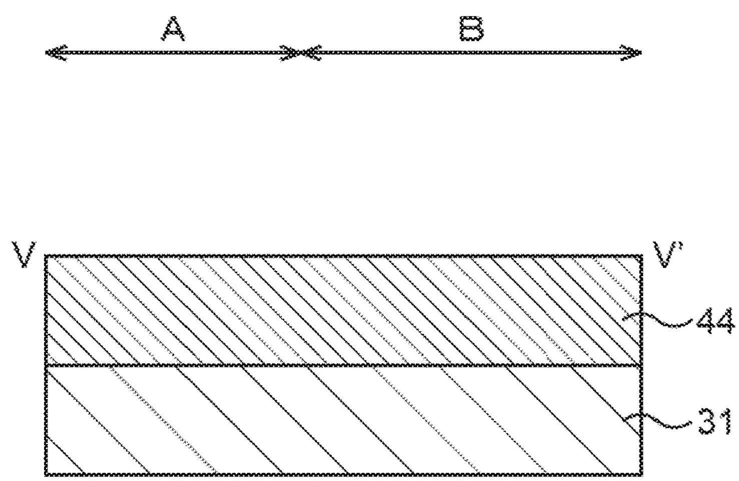
Figure 19A:
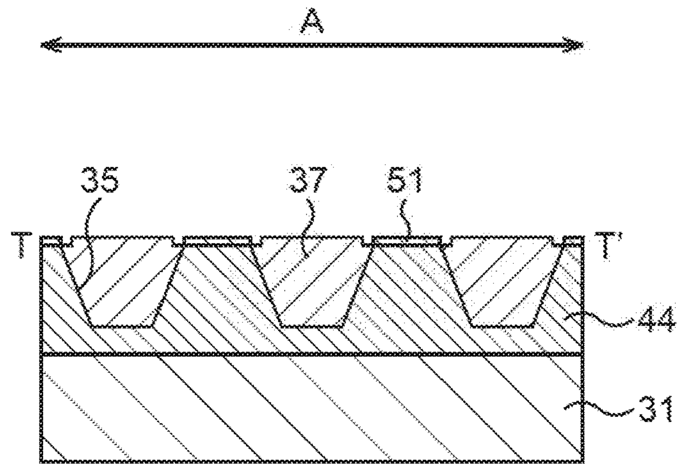
FIGS. 19A-19C are cross-sectional views (part 19) explaining the manufacturing process of the semiconductor device in the first embodiment.
Figure 19B:
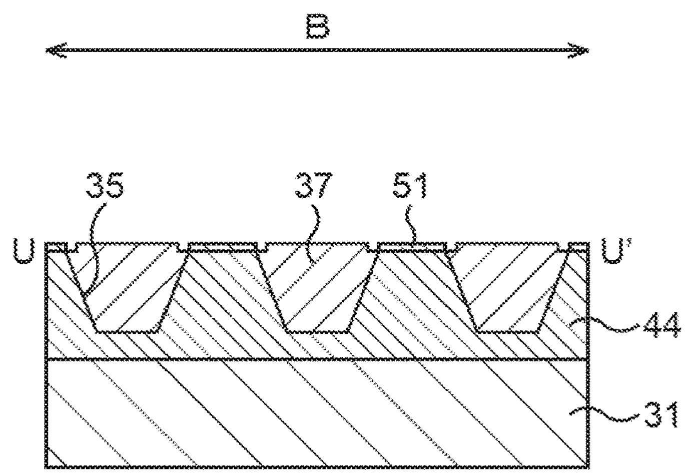
Figure 19C:
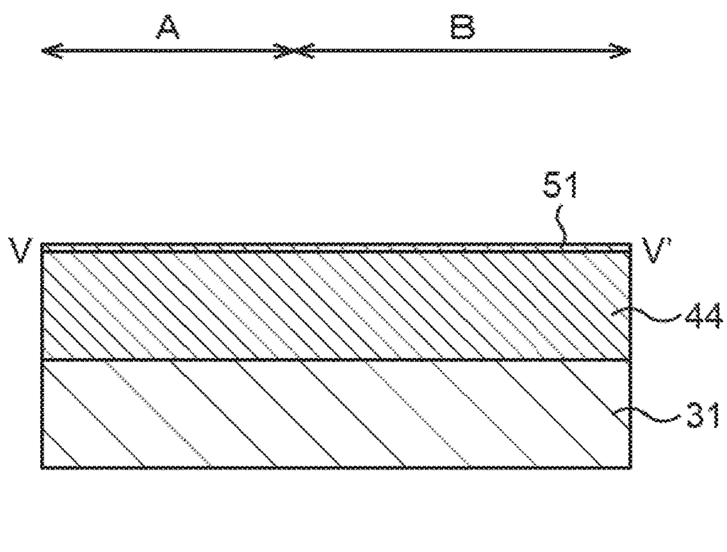
Figure 20A:
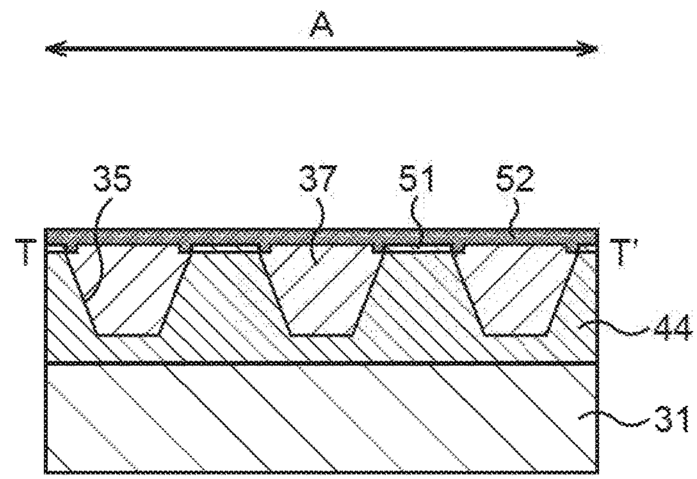
FIGS. 20A-20C are cross-sectional views (part 20) explaining the manufacturing process of the semiconductor device in the first embodiment.
Figure 20B:
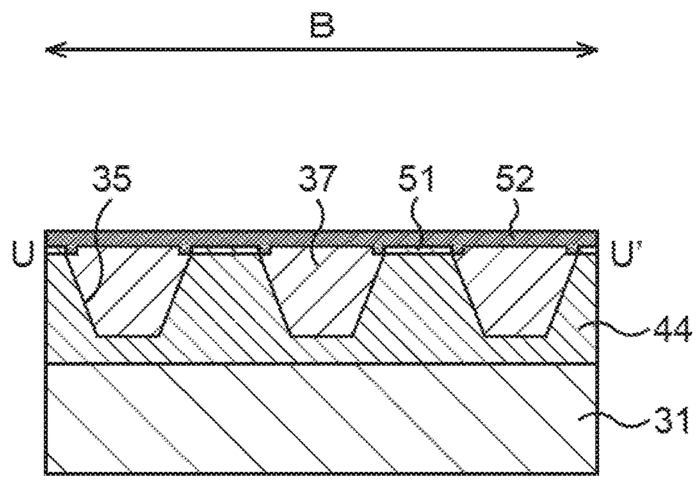
Figure 20C:
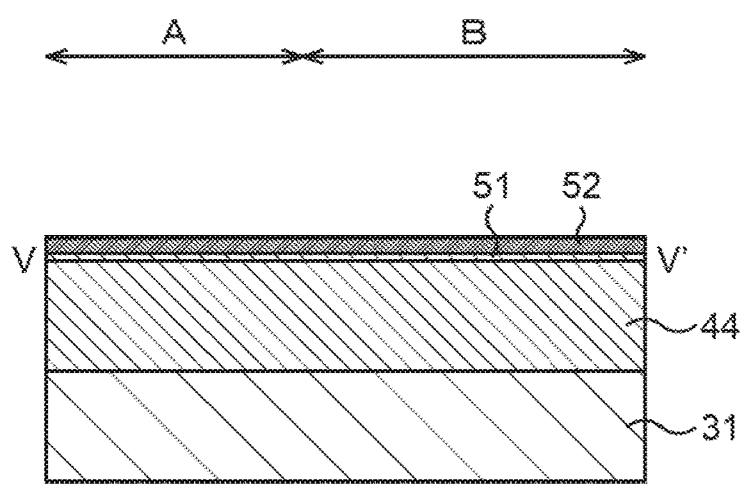
Figure 21A:
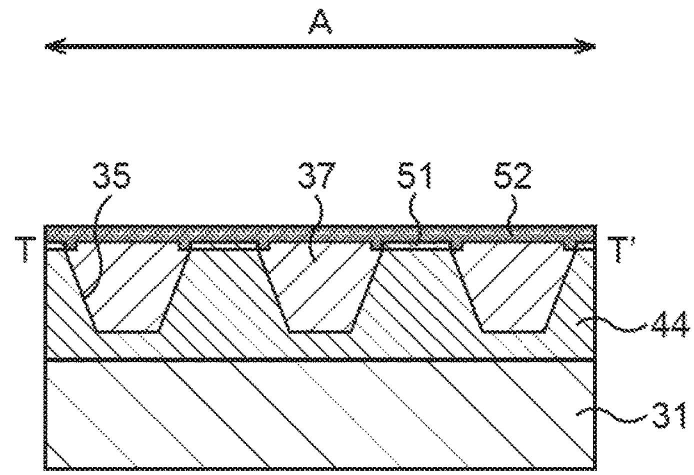
FIGS. 21A-21C are cross-sectional views (part 21) explaining the manufacturing process of the semiconductor device in the first embodiment.
Figure 21B:
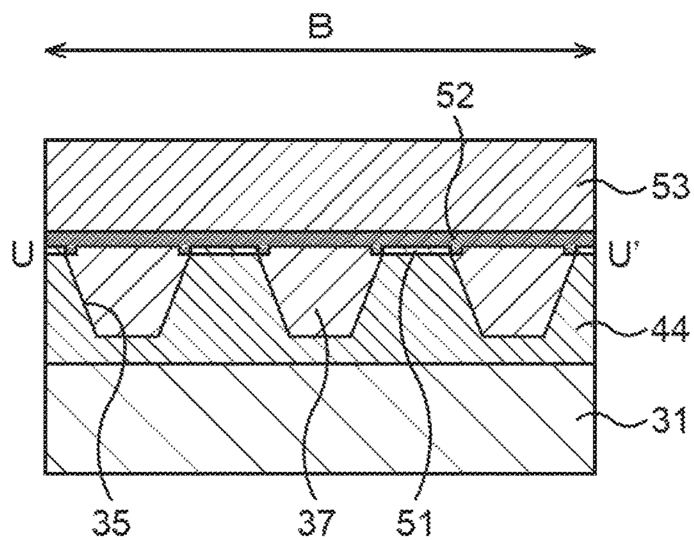
Figure 21C:
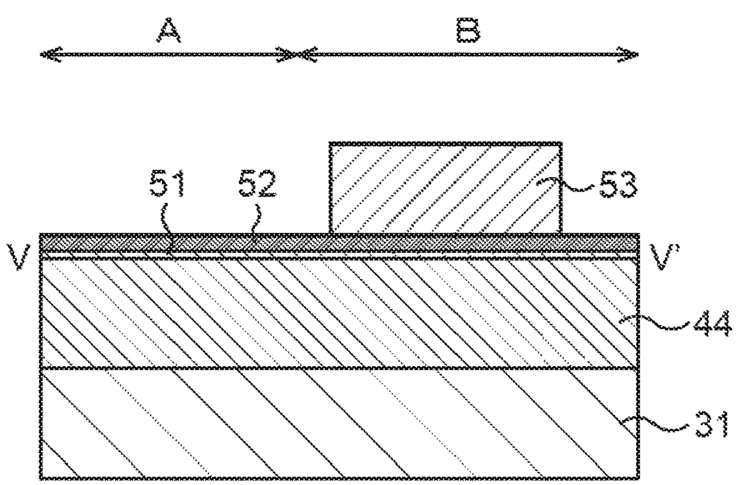
Figure 22A:
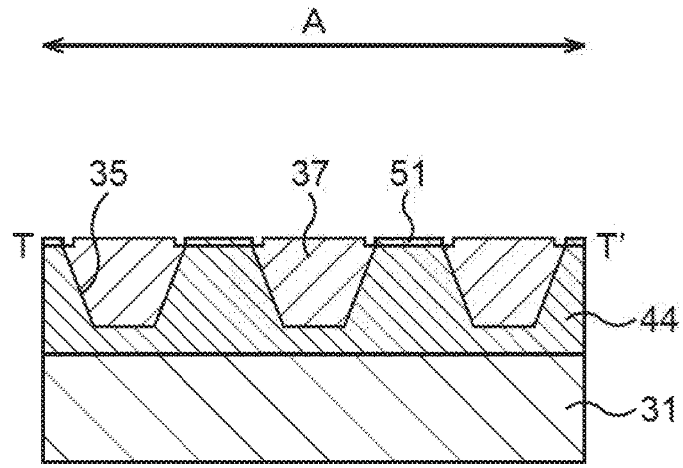
FIGS. 22A-22C are cross-sectional views (part 22) explaining the manufacturing process of the semiconductor device in the first embodiment.
Figure 22B:
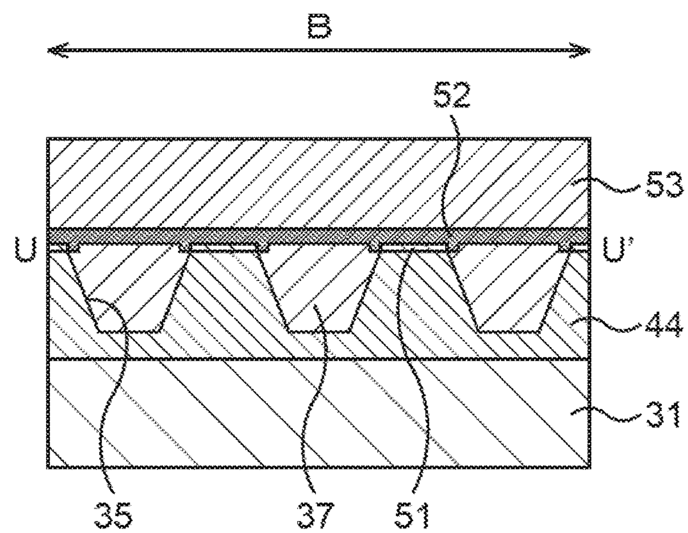
Figure 22C:
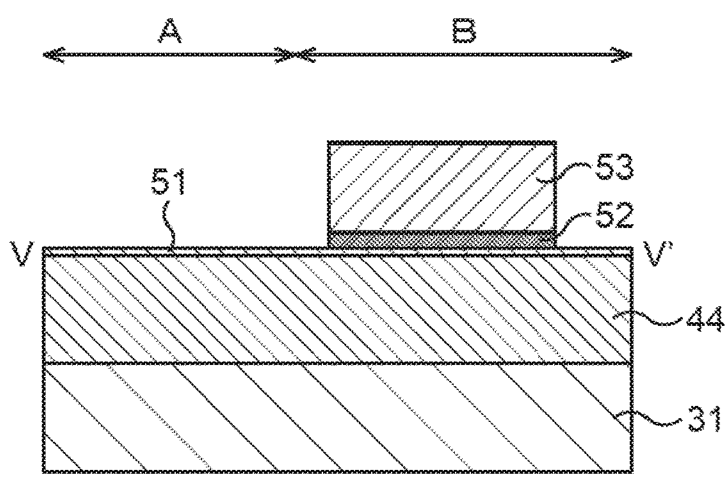
Figure 23A:
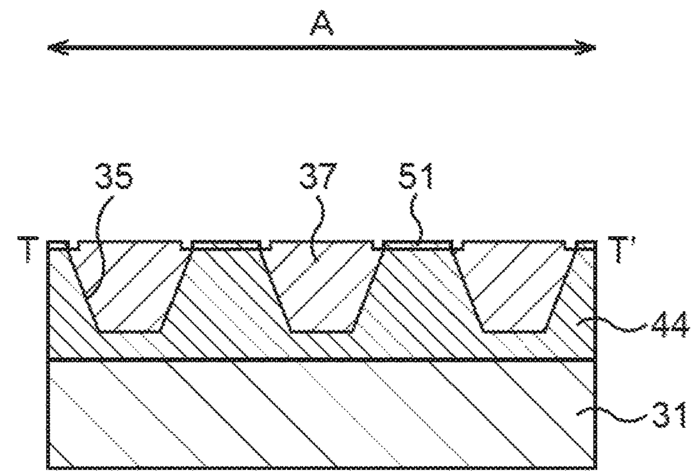
FIGS. 23A-23C are cross-sectional views (part 23) explaining the manufacturing process of the semiconductor device in the first embodiment.
Figure 23B:
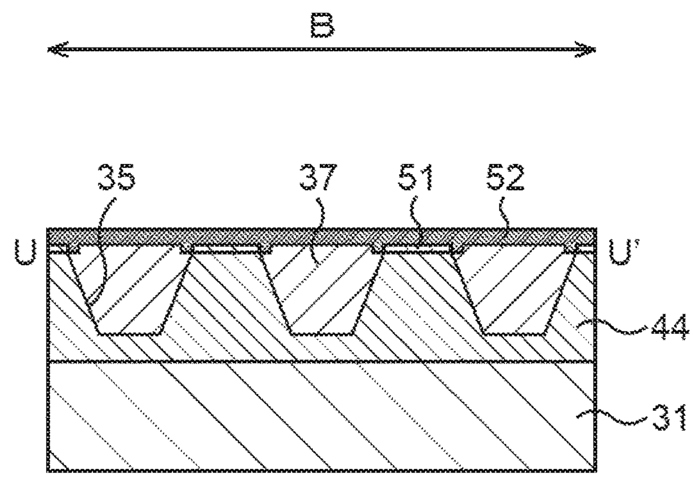
Figure 23C:
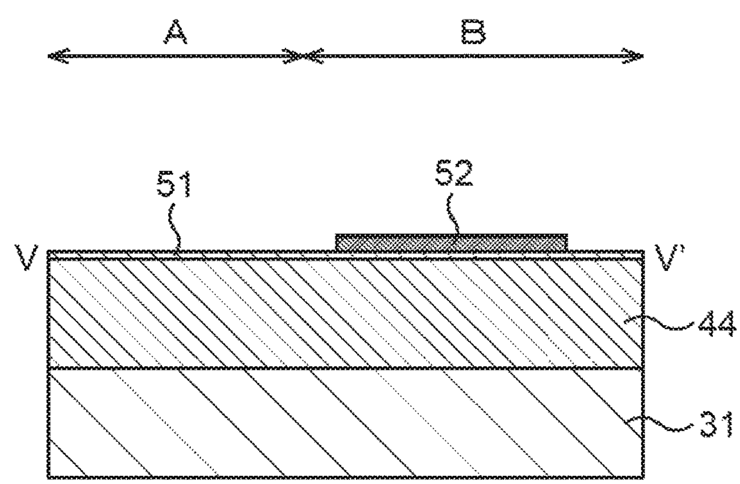
Figure 24A:
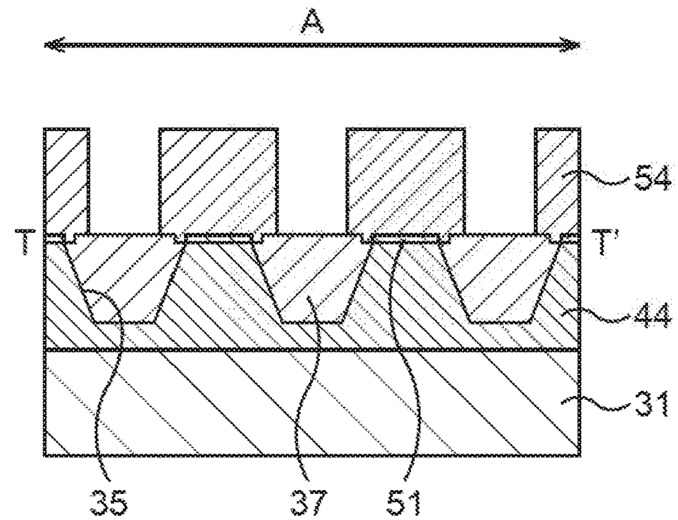
FIGS. 24A-24C are cross-sectional views (part 24) explaining the manufacturing process of the semiconductor device in the first embodiment.
Figure 24B:
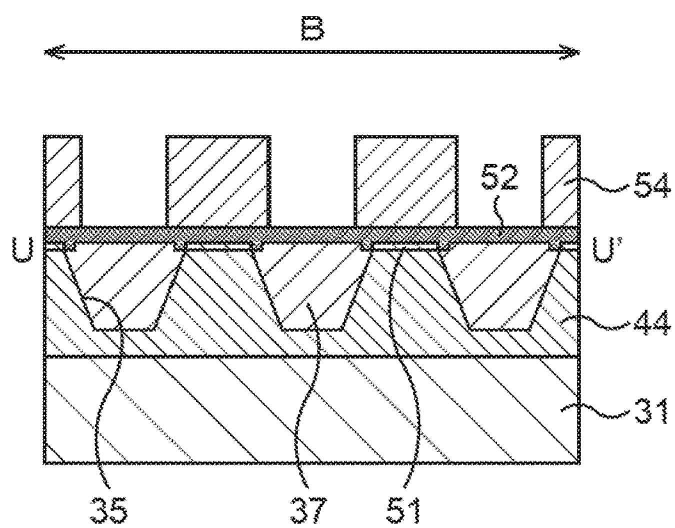
Figure 24C:
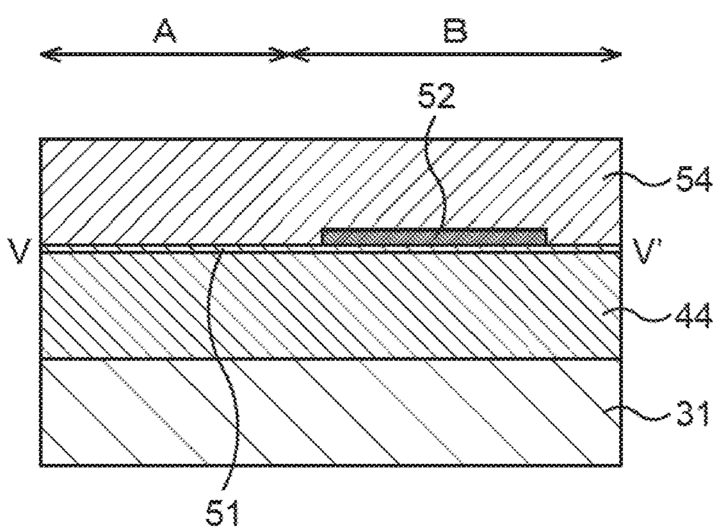
Figure 25A:
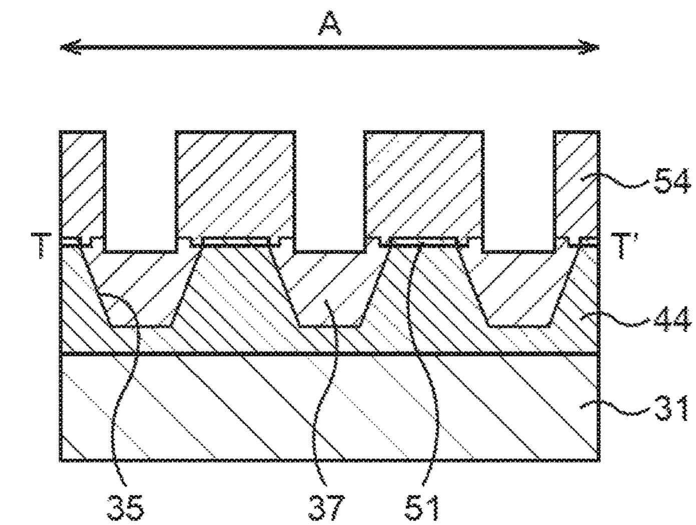
FIGS. 25A-25C are cross-sectional views (part 25) explaining the manufacturing process of the semiconductor device in the first embodiment.
Figure 25B:
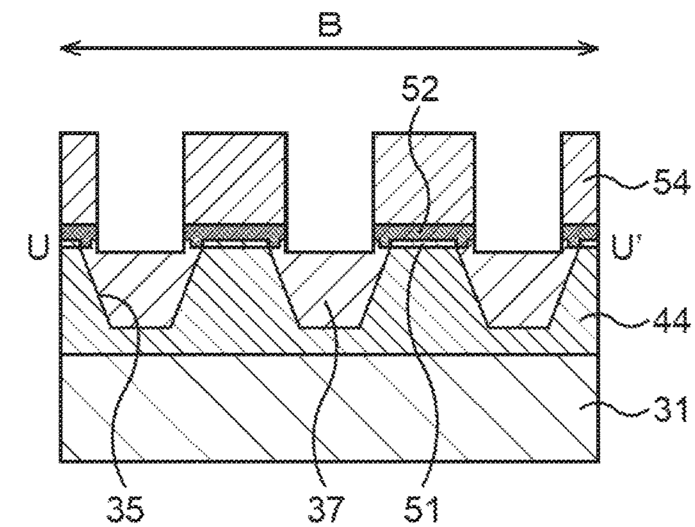
Figure 25C:
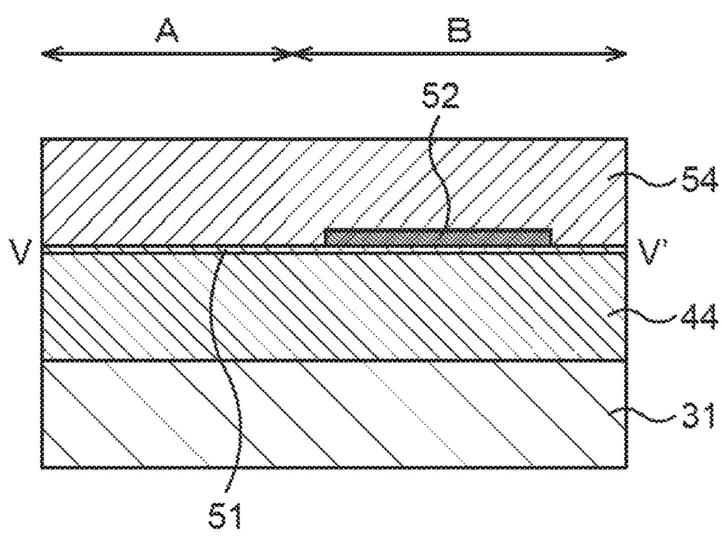
Figure 26A:
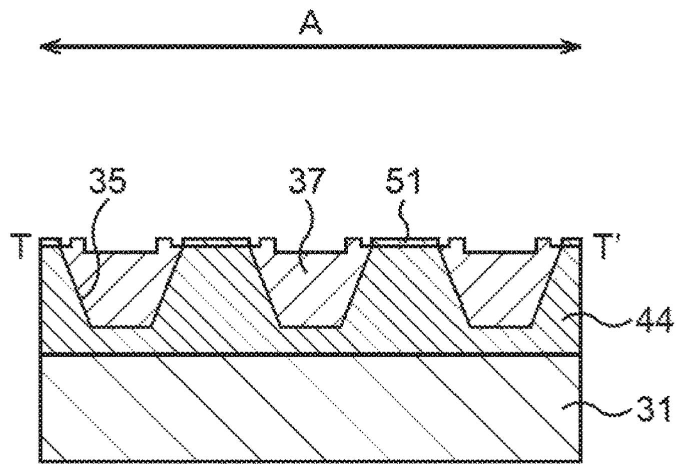
FIGS. 26A-26C are cross-sectional views (part 26) explaining the manufacturing process of the semiconductor device in the first embodiment.
Figure 26B:
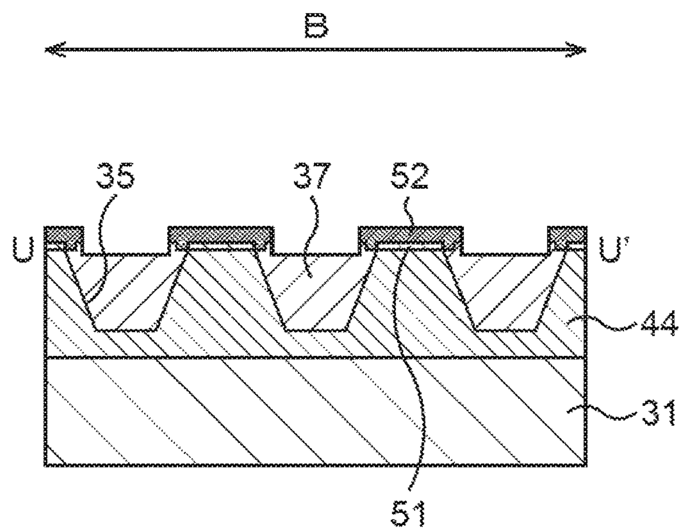
Figure 26C:
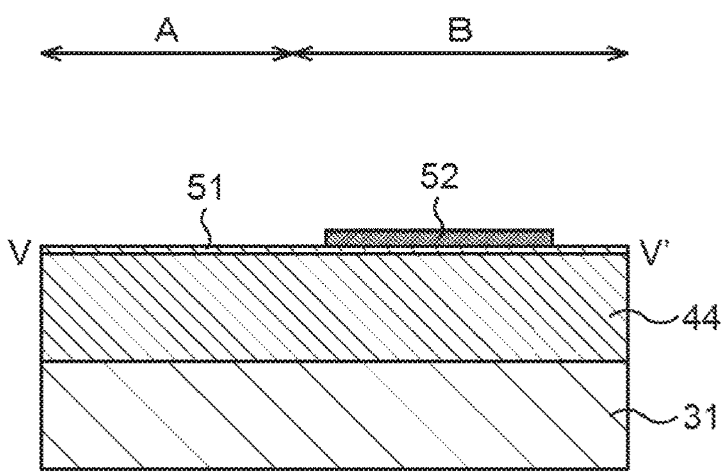
Figure 27A:
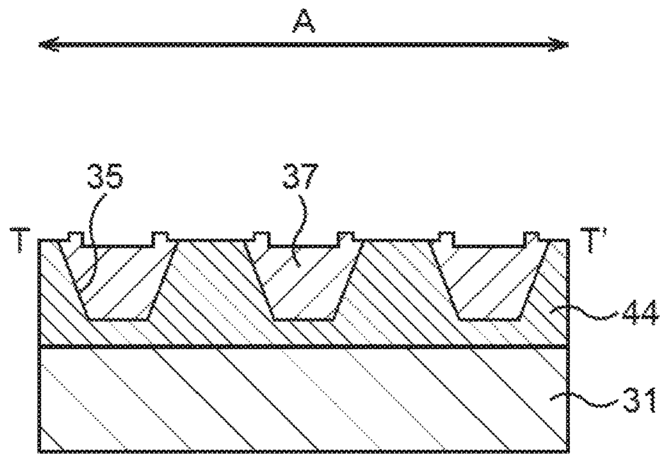
FIGS. 27A-27C are cross-sectional views (part 27) explaining the manufacturing process of the semiconductor device in the first embodiment.
Figure 27B:
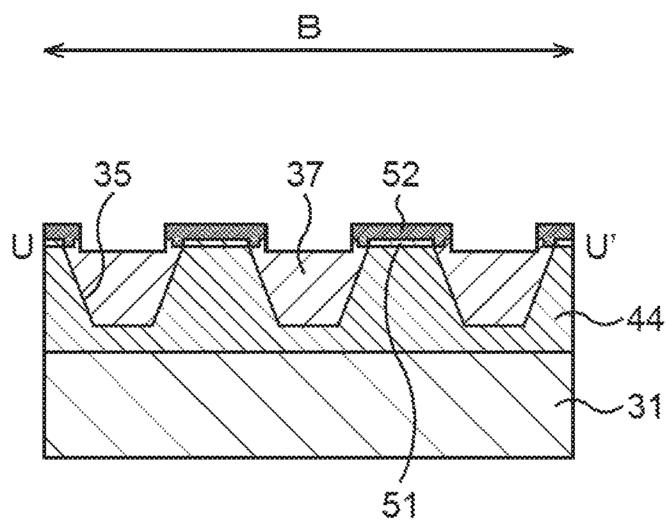
Figure 27C:
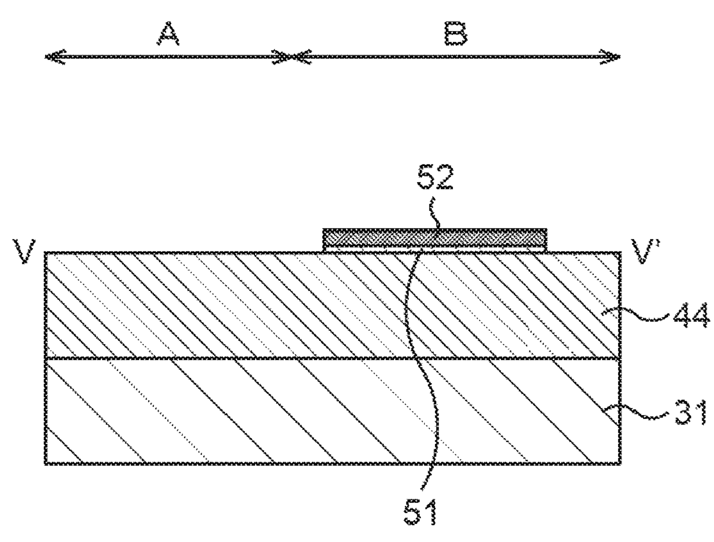
Figure 28A:
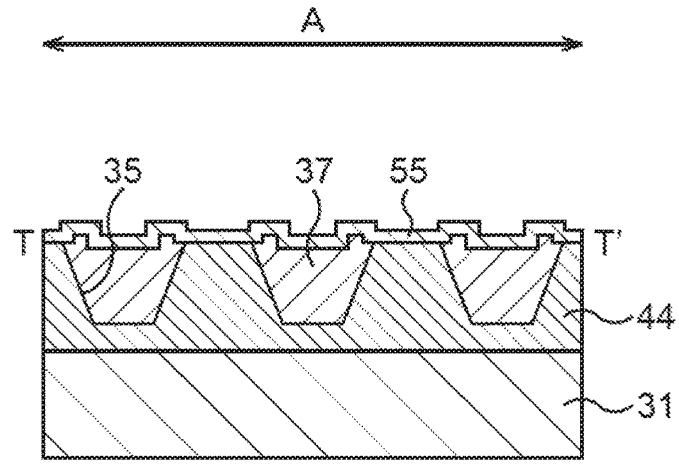
FIGS. 28A-28C are cross-sectional views (part 28) explaining the manufacturing process of the semiconductor device in the first embodiment.
Figure 28B:
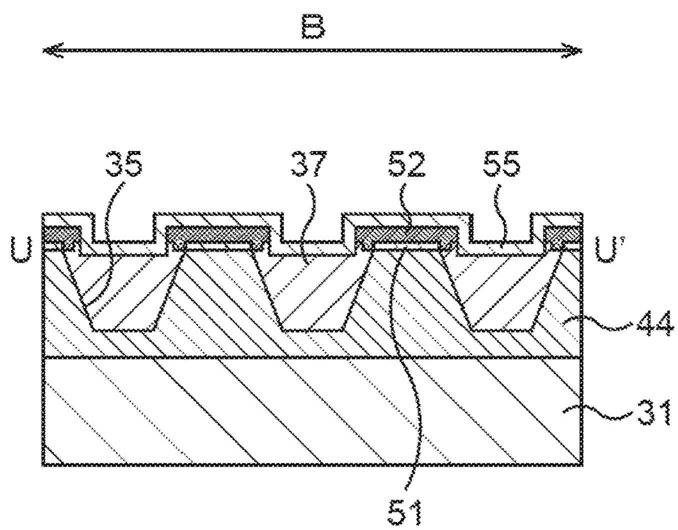
Figure 28C:
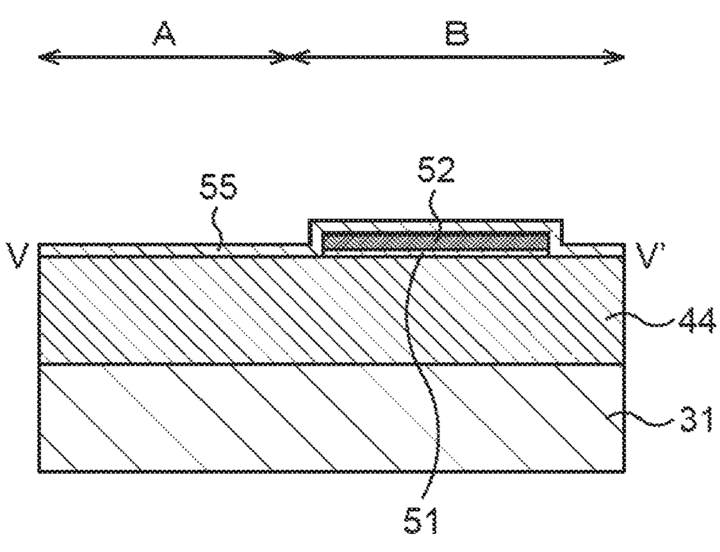
Figure 29A:
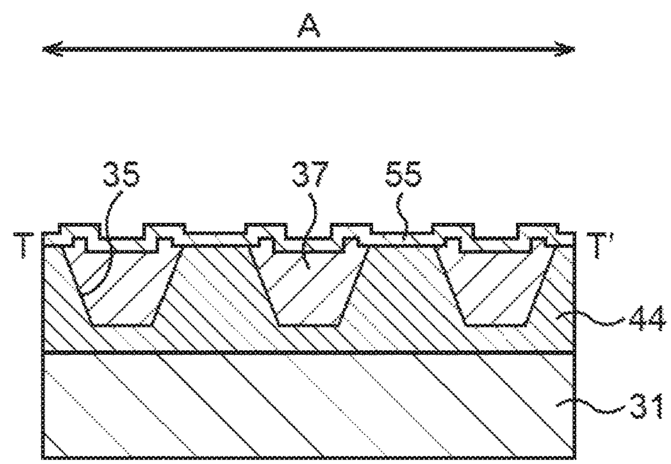
FIGS. 29A-29C are cross-sectional views (part 29) explaining the manufacturing process of the semiconductor device in the first embodiment.
Figure 29B:
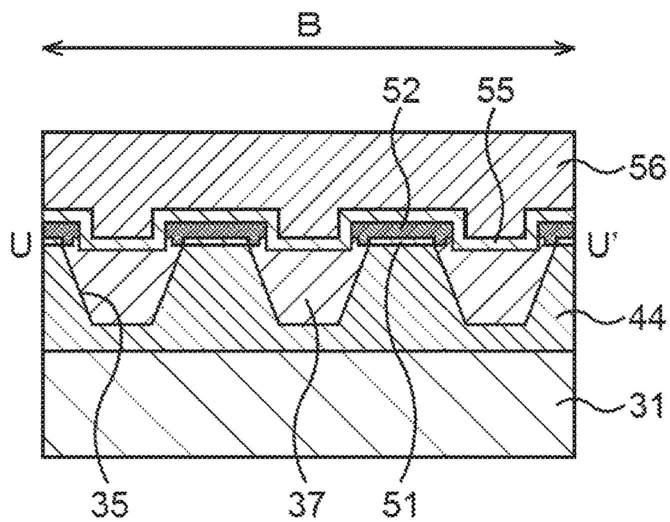
Figure 29C:
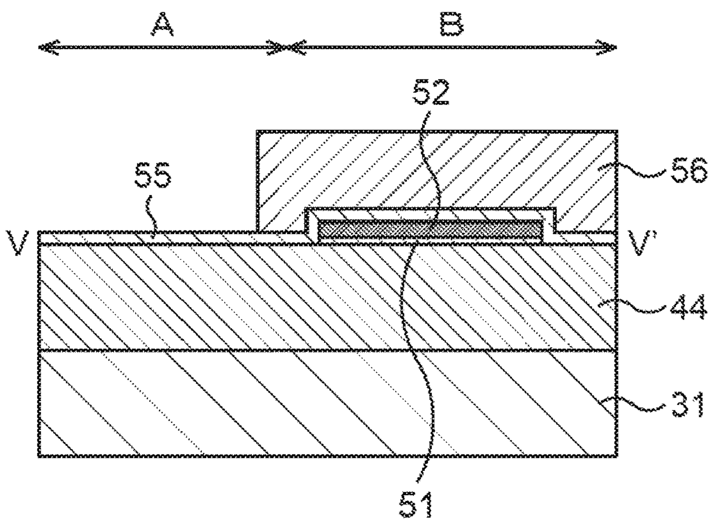
Figure 30A:
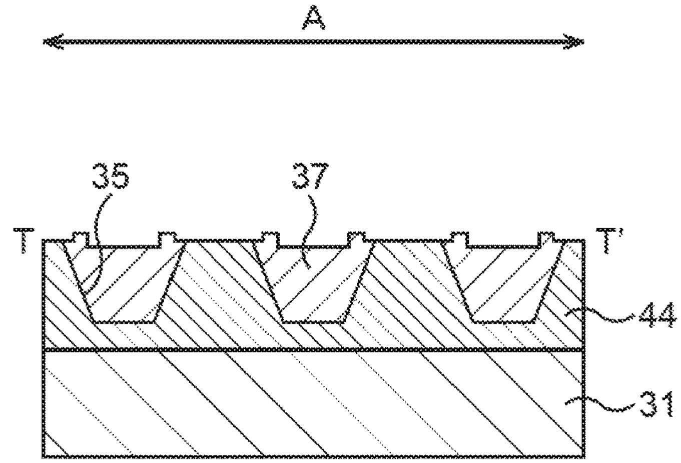
FIGS. 30A-30C are cross-sectional views (part 30) explaining the manufacturing process of the semiconductor device in the first embodiment.
Figure 30B:
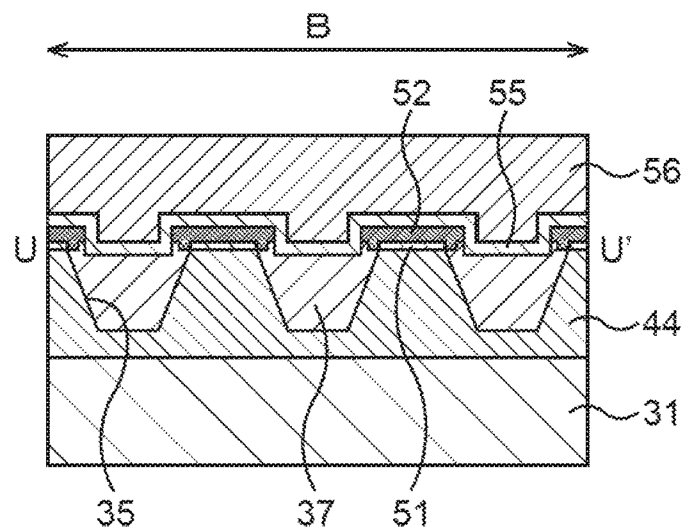
Figure 30C:
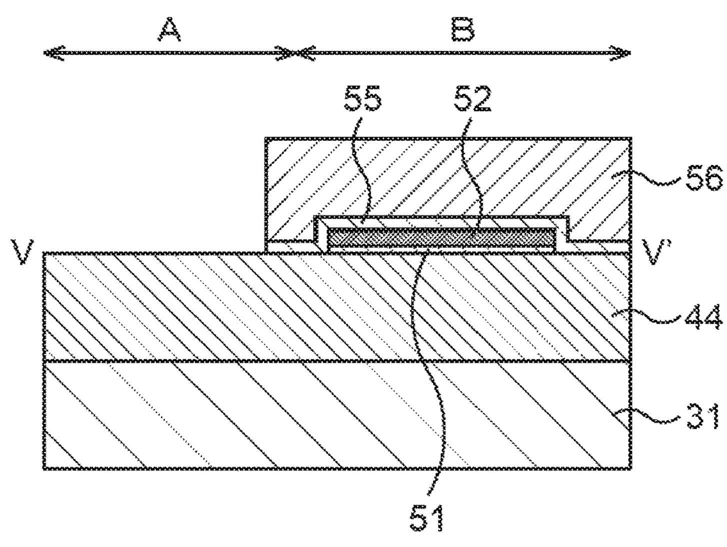
Figure 31A:
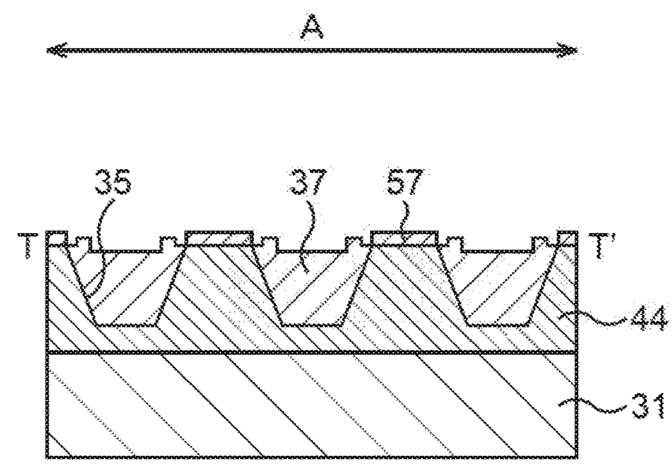
FIGS. 31A-31C are cross-sectional views (part 31) explaining the manufacturing process of the semiconductor device in the first embodiment.
Figure 31B:
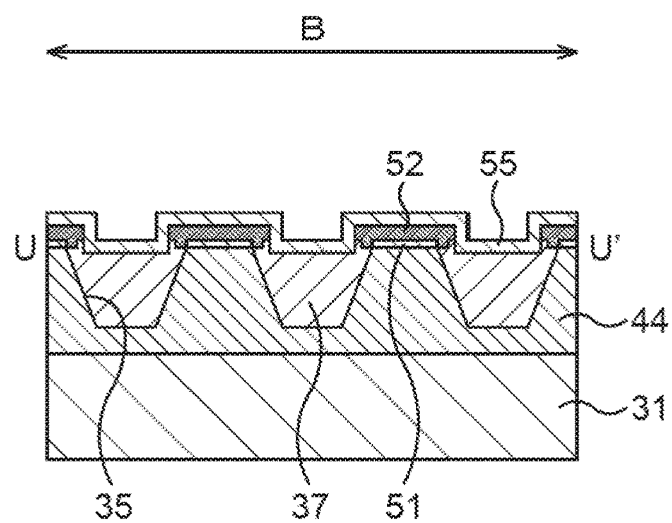
Figure 31C:
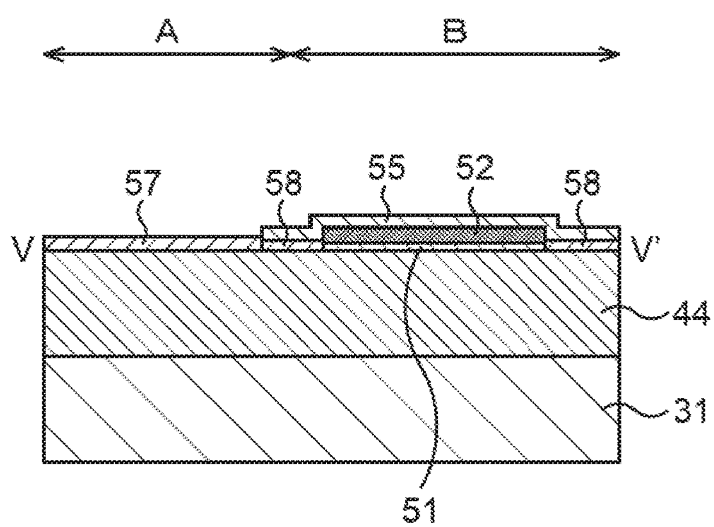
Figure 32A:
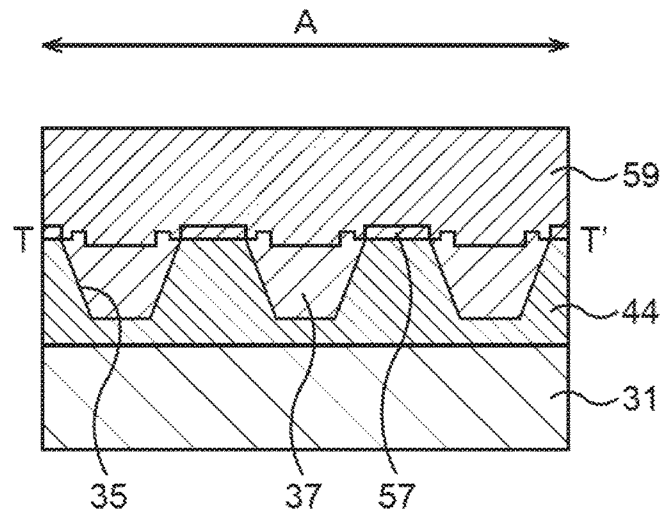
FIGS. 32A-32C are cross-sectional views (part 32) explaining the manufacturing process of the semiconductor device in the first embodiment.
Figure 32B:
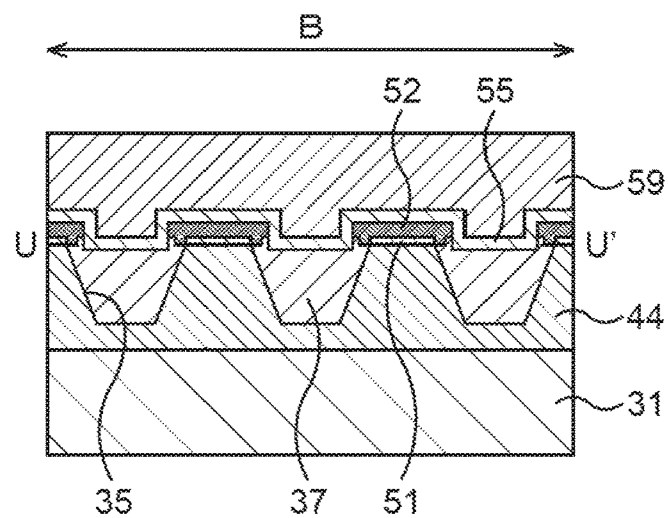
Figure 32C:
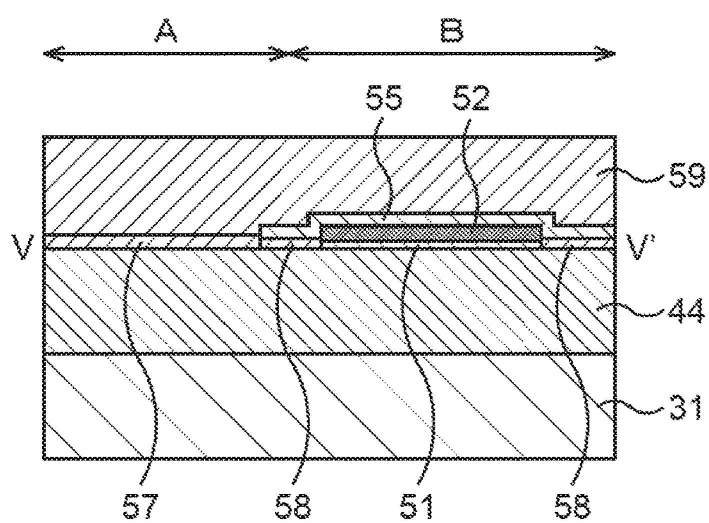
Figure 33A:
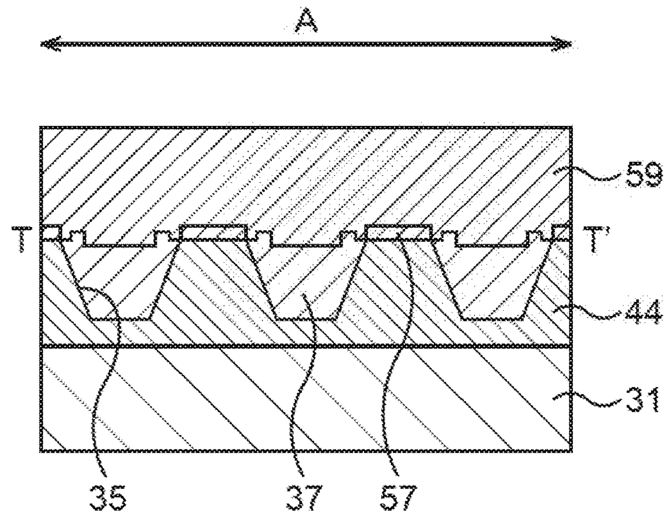
FIGS. 33A-33C are cross-sectional views (part 33) explaining the manufacturing process of the semiconductor device in the first embodiment.
Figure 33B:
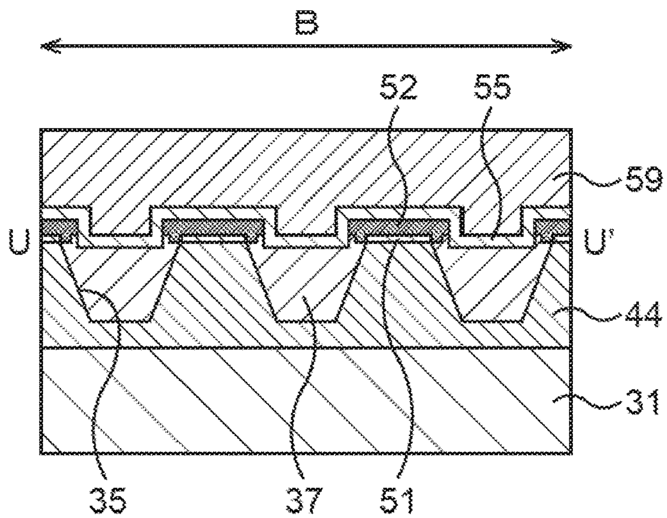
Figure 33C:
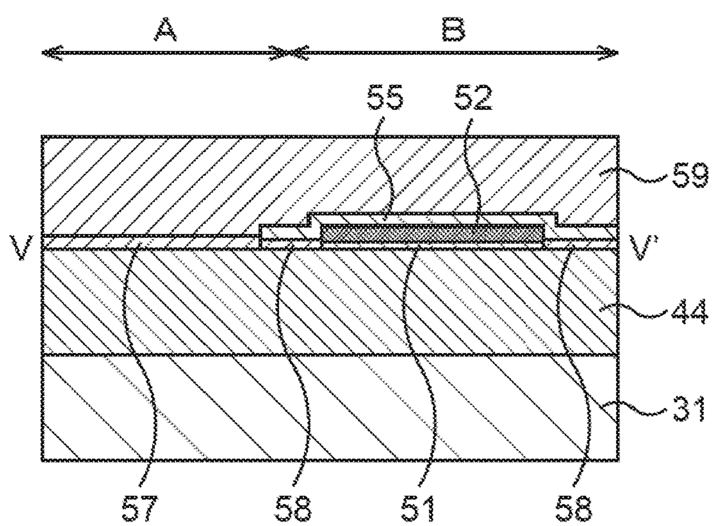
Figure 34A:
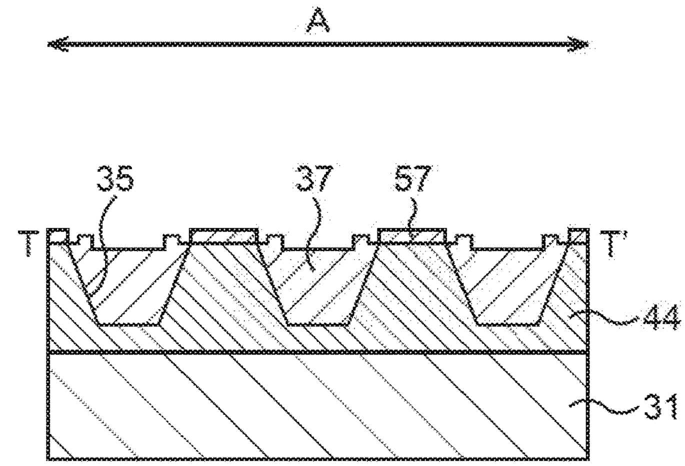
FIGS. 34A-34C are cross-sectional views (part 34) explaining the manufacturing process of the semiconductor device in the first embodiment.
Figure 34B:
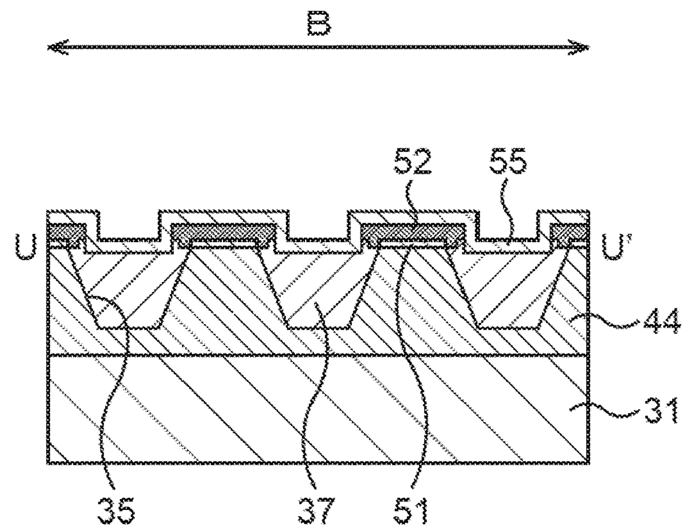
Figure 34C:
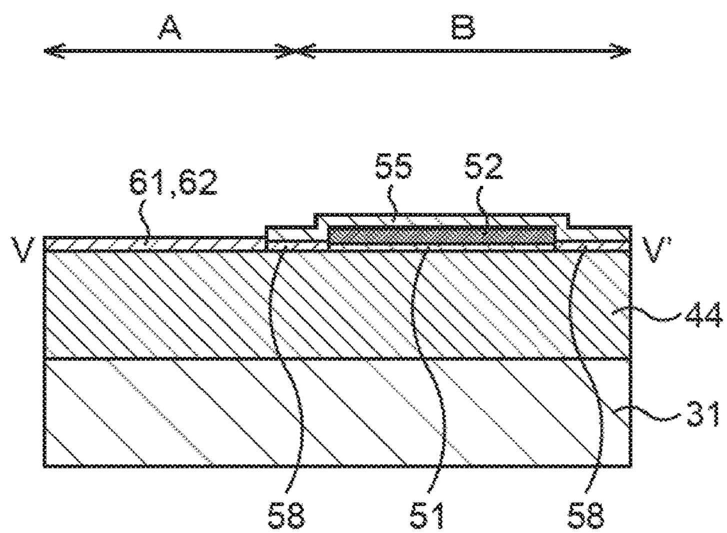
Figure 35A:
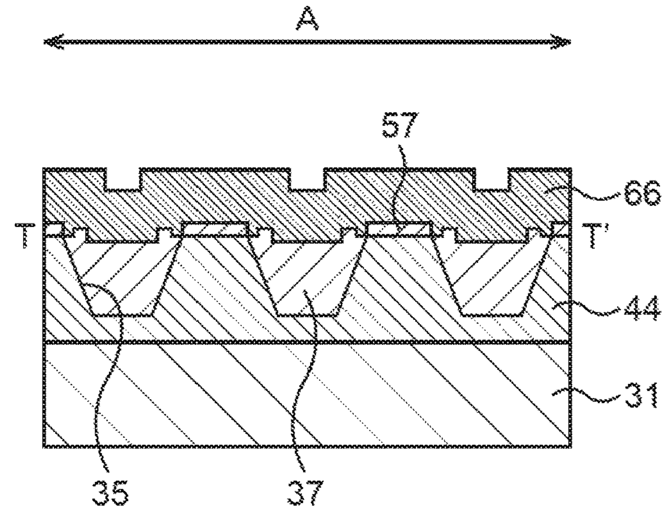
FIGS. 35A-35C are cross-sectional views (part 35) explaining the manufacturing process of the semiconductor device in the first embodiment.
Figure 35B:
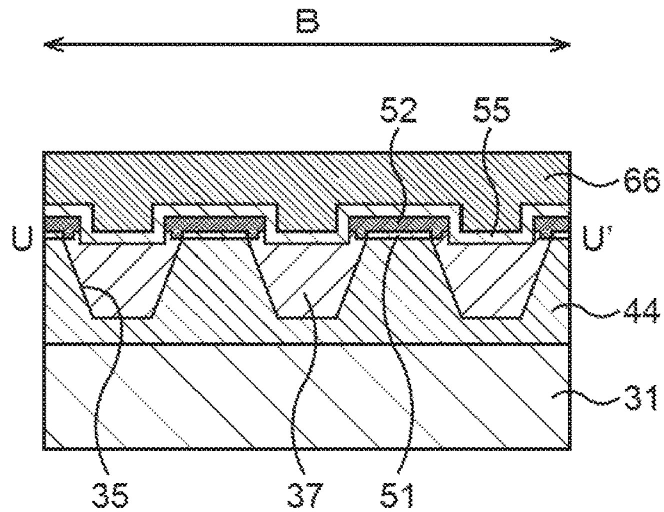
Figure 35C:
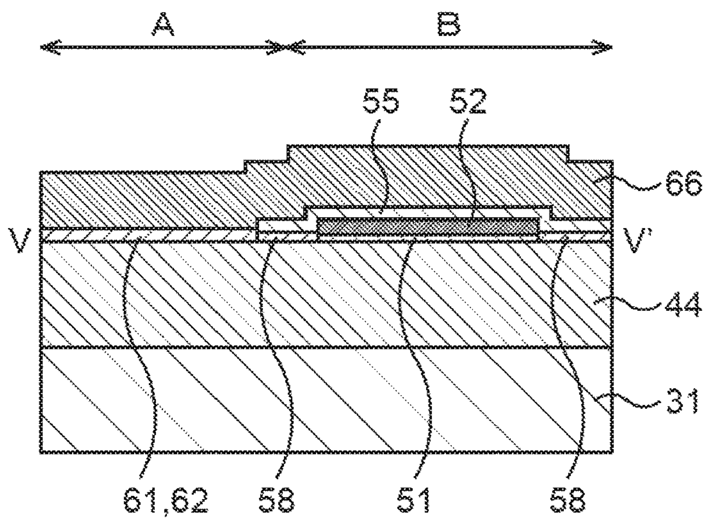
Figure 36A:
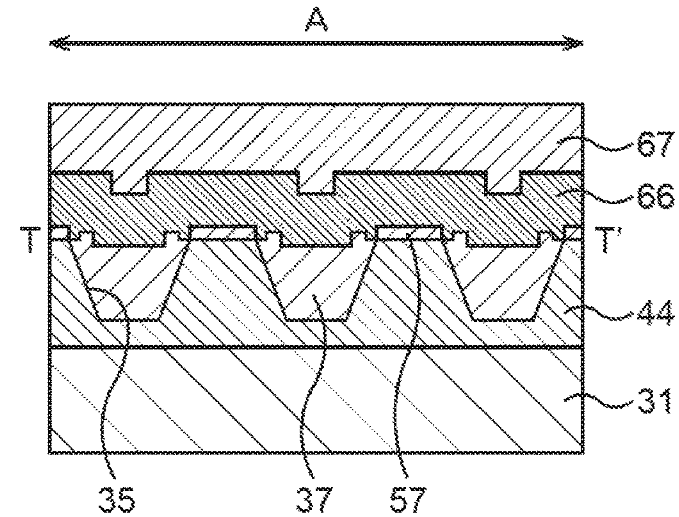
FIGS. 36A-36C are cross-sectional views (part 36) explaining the manufacturing process of the semiconductor device in the first embodiment.
Figure 36B:
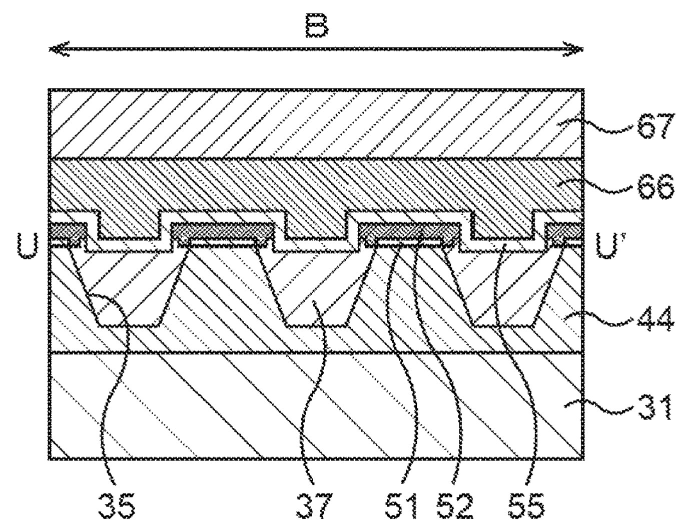
Figure 36C:
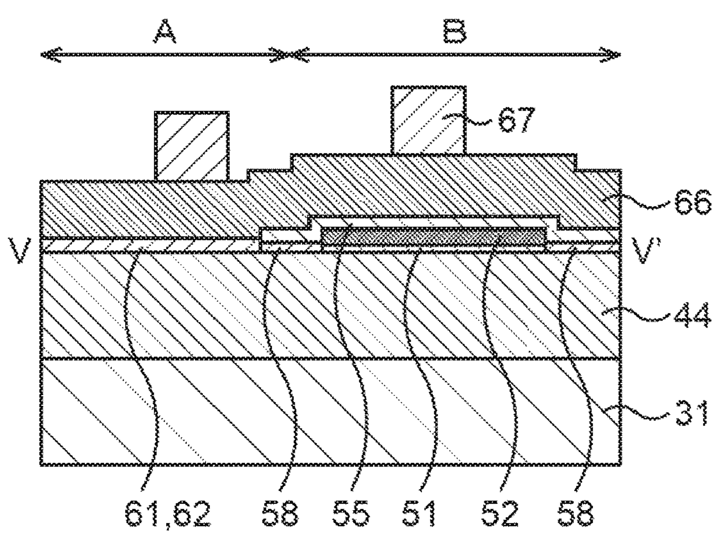
Figure 37A:
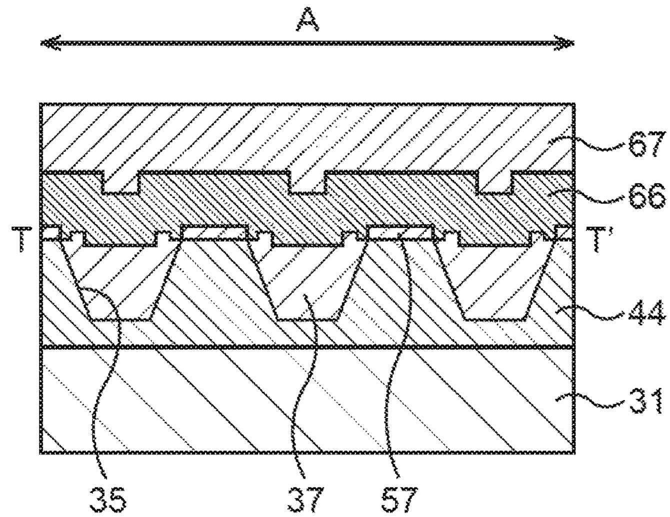
FIGS. 37A-37C are cross-sectional views (part 37) explaining the manufacturing process of the semiconductor device in the first embodiment.
Figure 37B:
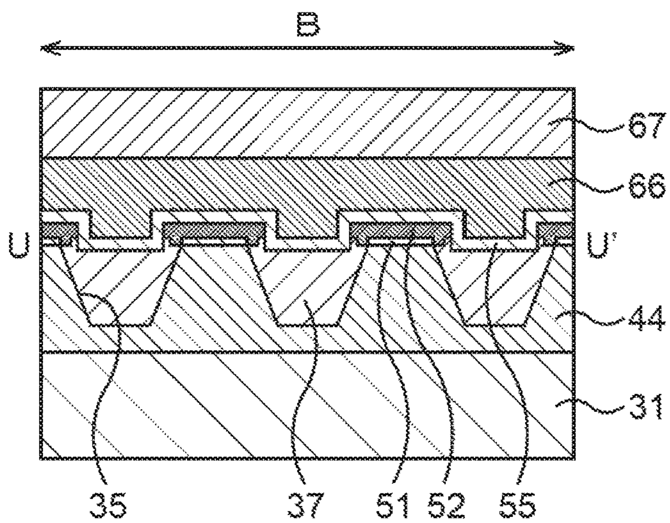
Figure 37C:
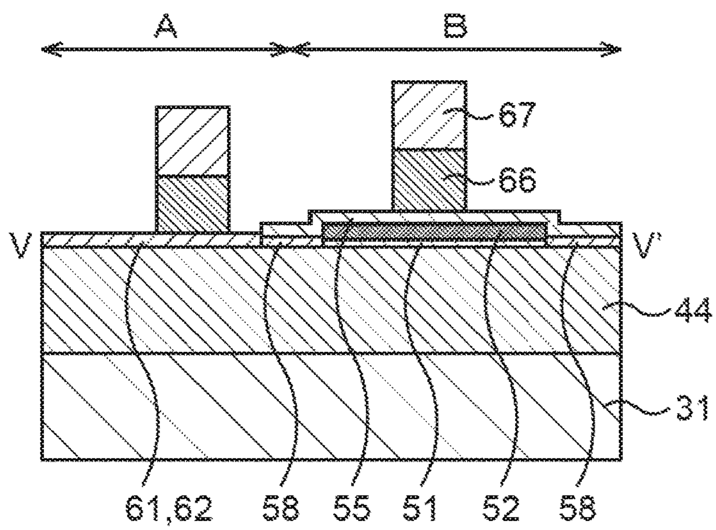
Figure 38A:
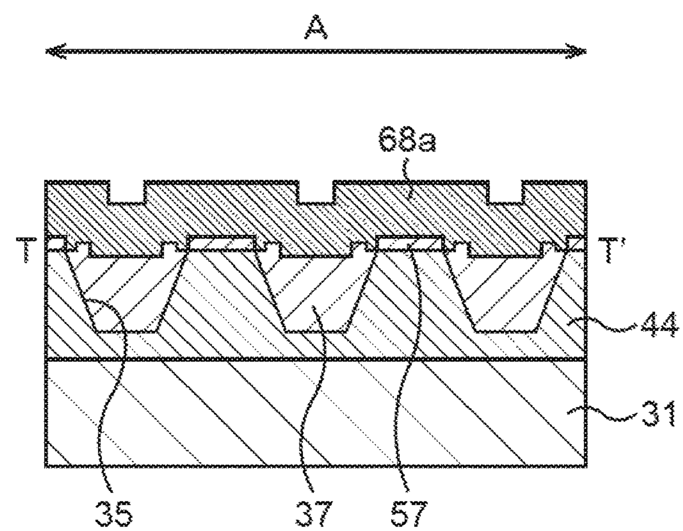
FIGS. 38A-38C are cross-sectional views (part 38) explaining the manufacturing process of the semiconductor device in the first embodiment.
Figure 38B:
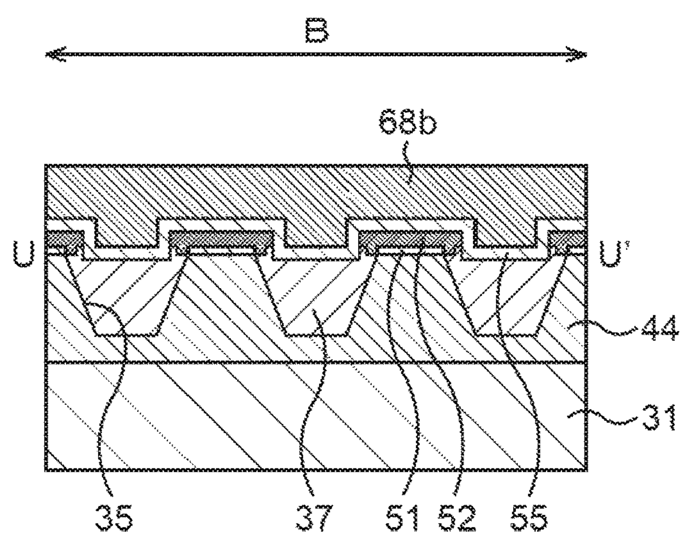
Figure 38C:
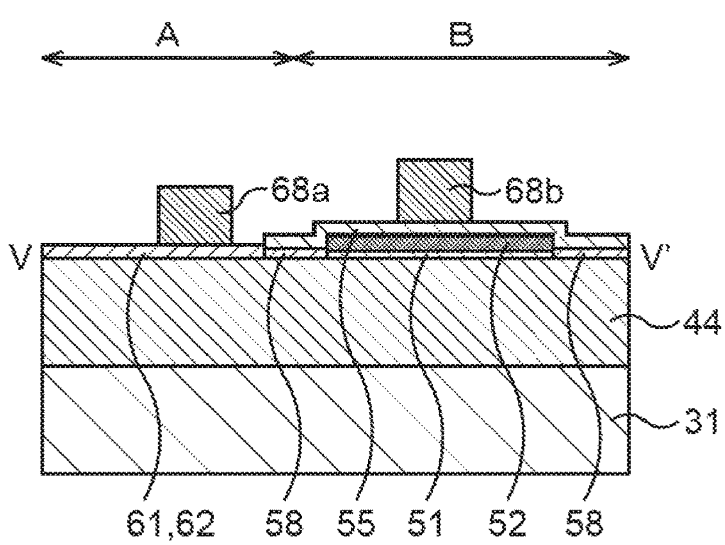
Figure 39A:
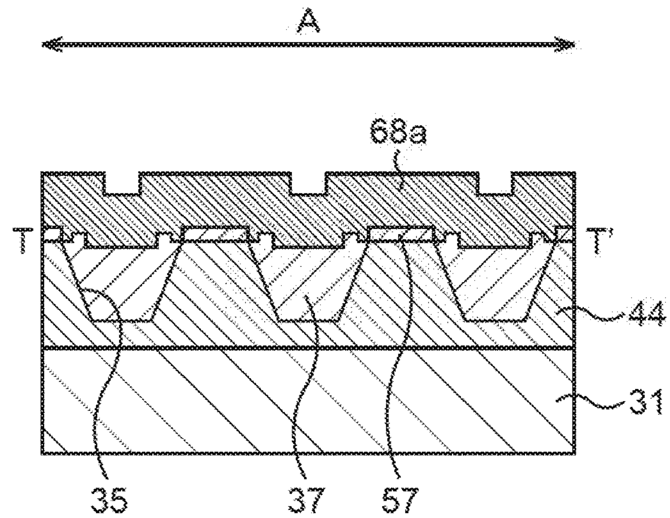
FIGS. 39A-39C are cross-sectional views (part 39) explaining the manufacturing process of the semiconductor device in the first embodiment.
Figure 39B:
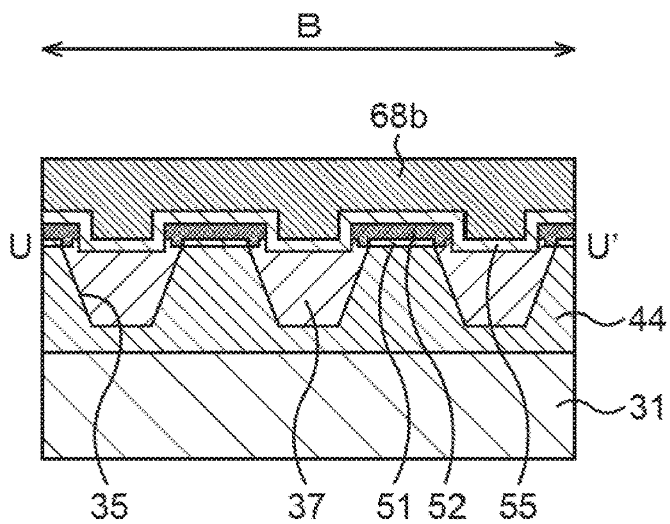
Figure 39C:
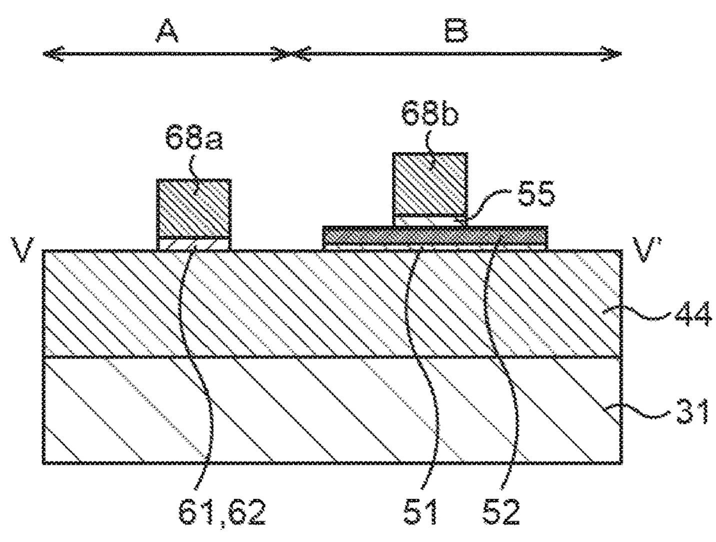
Figure 40A:
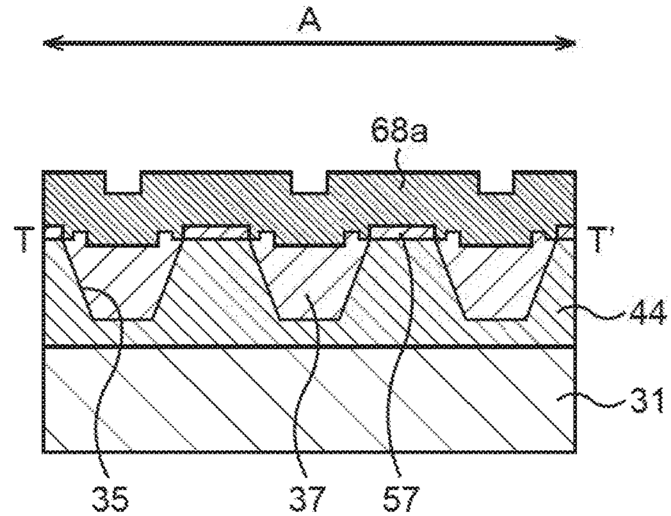
FIGS. 40A-40C are cross-sectional views (part 40) explaining the manufacturing process of the semiconductor device in the first embodiment.
Figure 40B:
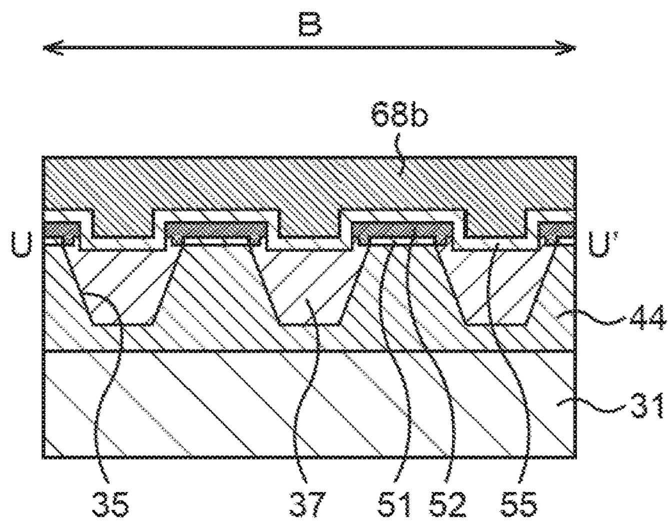
Figure 40C:
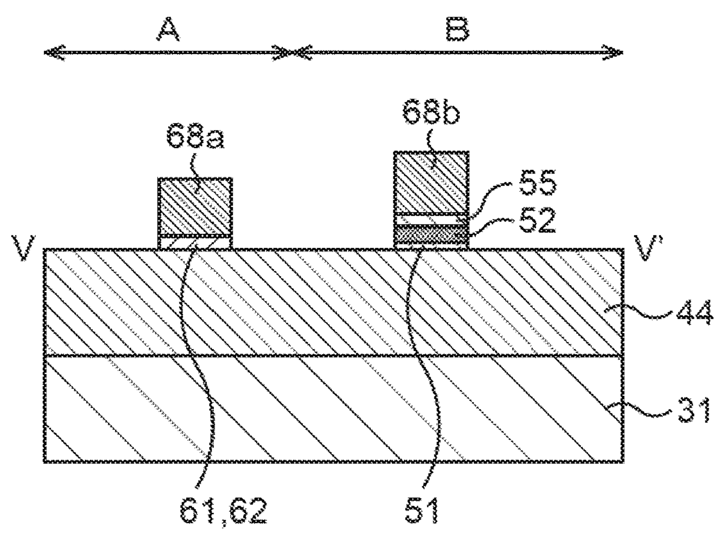
Figure 41A:
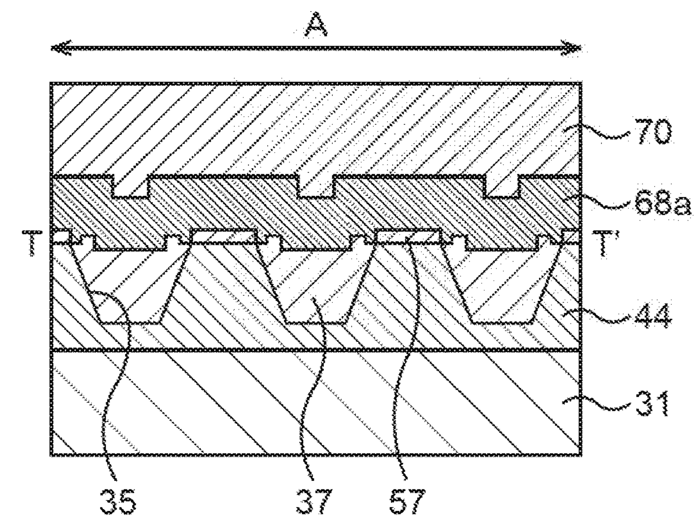
FIGS. 41A-41C are cross-sectional views (part 41) explaining the manufacturing process of the semiconductor device in the first embodiment.
Figure 41B:
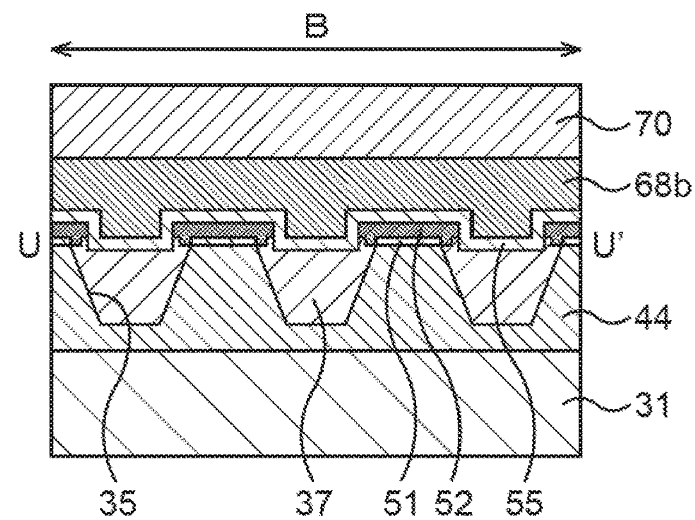
Figure 41C:
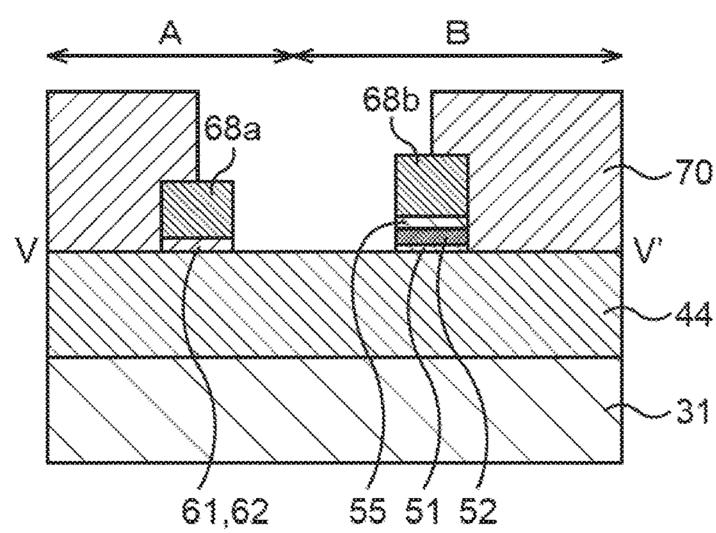
Figure 42A:
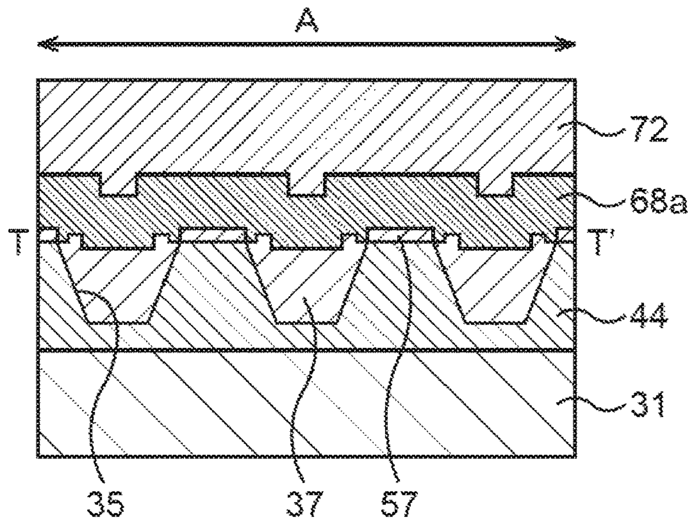
FIGS. 42A-42C are cross-sectional views (part 42) explaining the manufacturing process of the semiconductor device in the first embodiment.
Figure 42B:
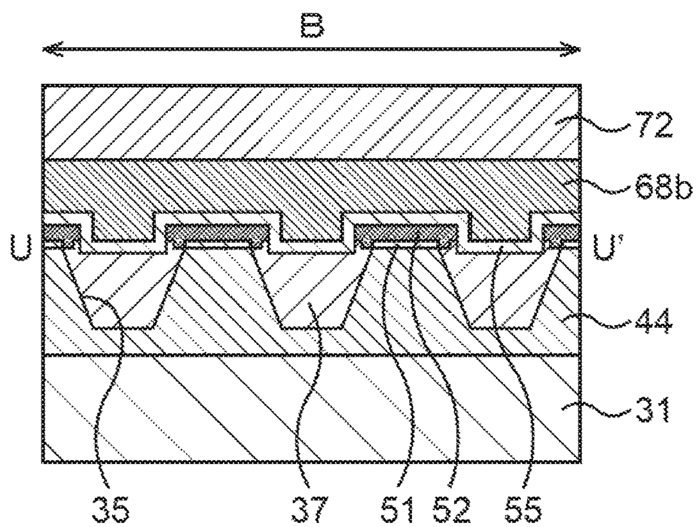
Figure 42C:
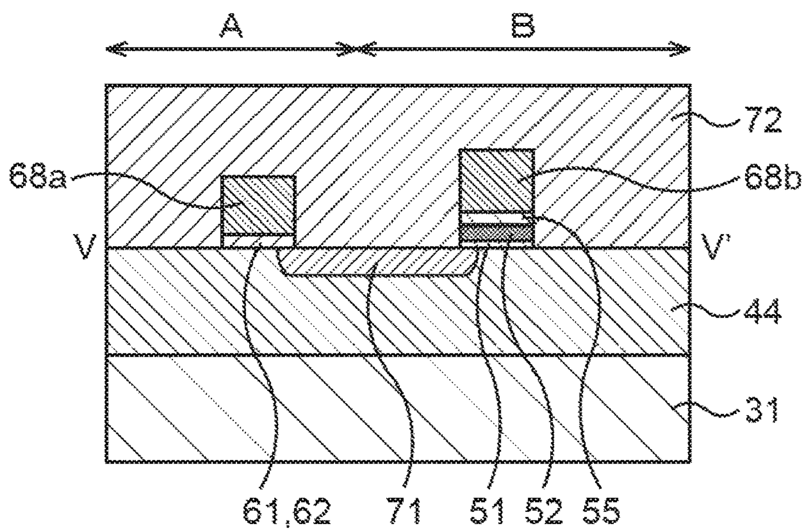
Figure 43A:
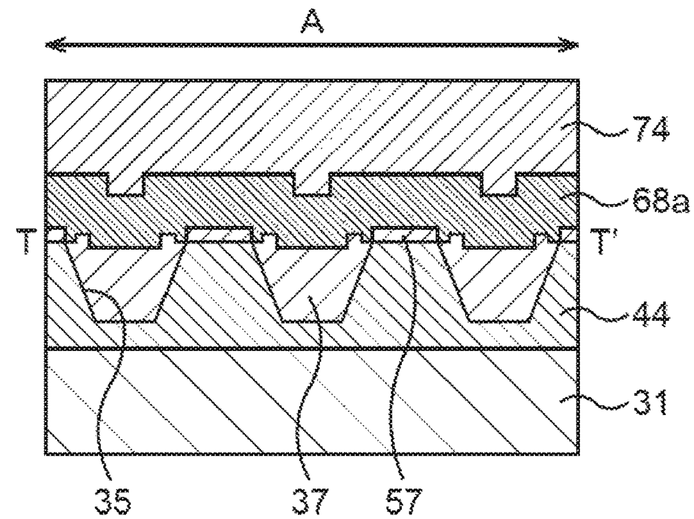
FIGS. 43A-43C are cross-sectional views (part 43) explaining the manufacturing process of the semiconductor device in the first embodiment.
Figure 43B:
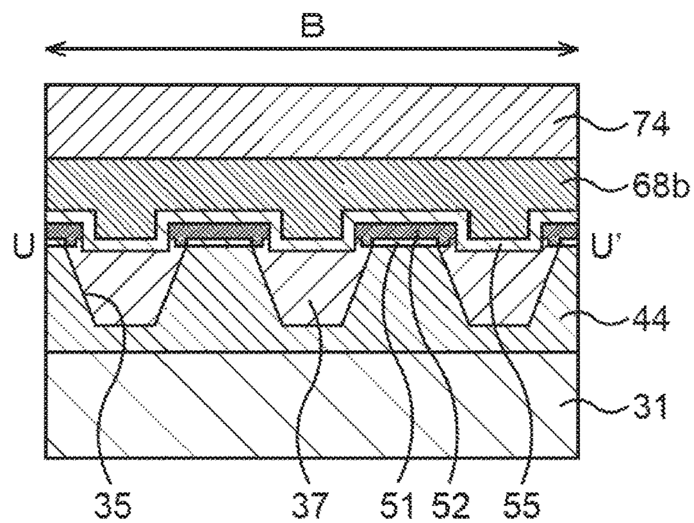
Figure 43C:
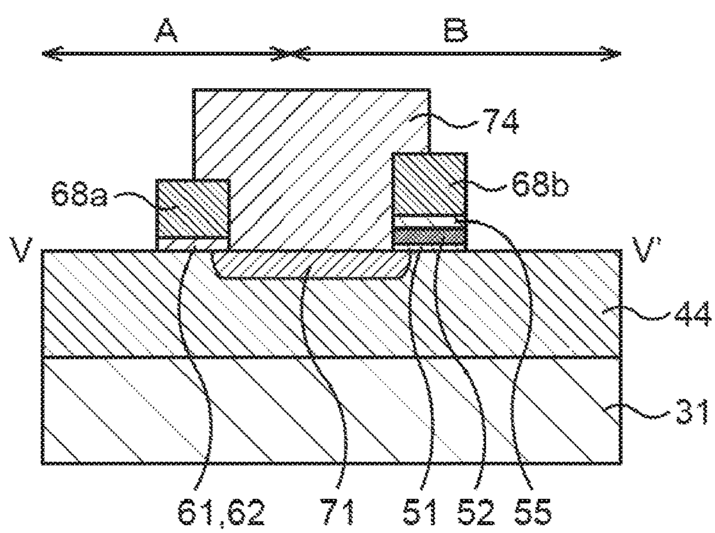
Figure 44A:
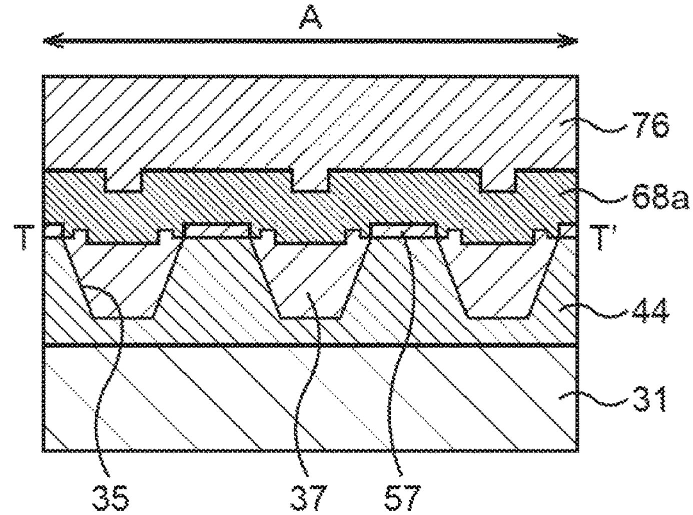
FIGS. 44A-44C are cross-sectional views (part 44) explaining the manufacturing process of the semiconductor device in the first embodiment.
Figure 44B:
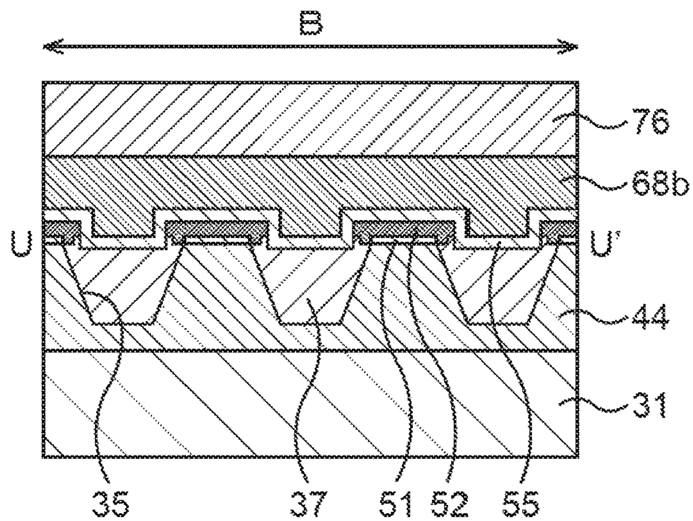
Figure 44C:
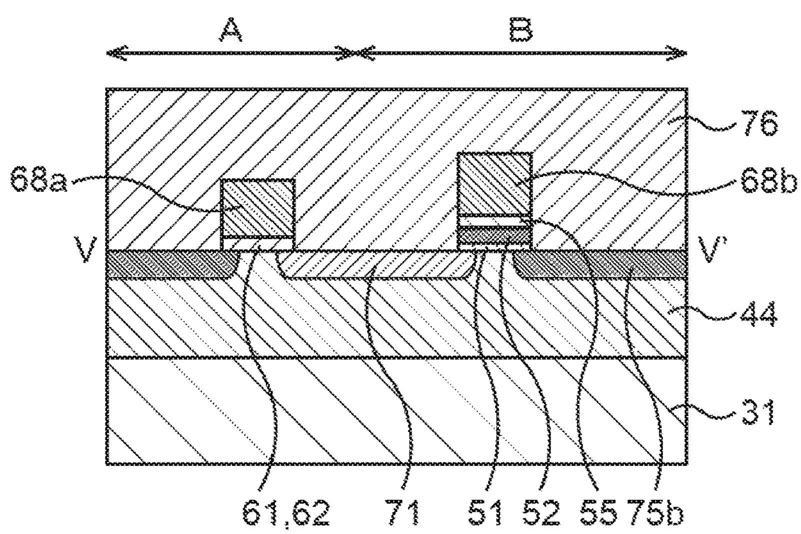
Figure 45A:
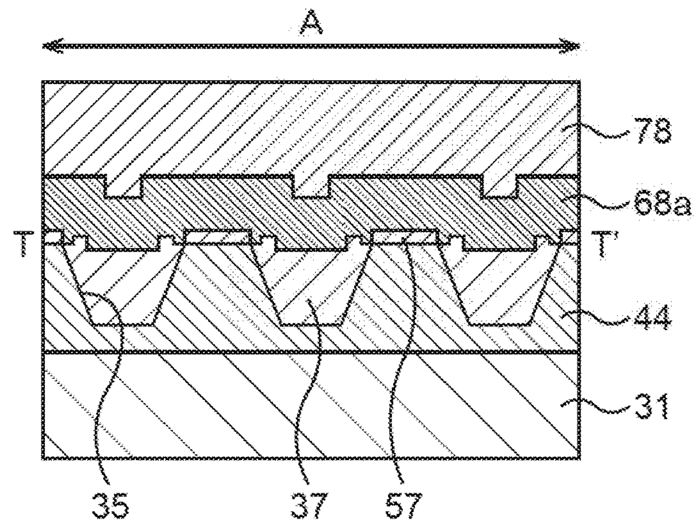
FIGS. 45A-45C are cross-sectional views (part 45) explaining the manufacturing process of the semiconductor device in the first embodiment.
Figure 45B:
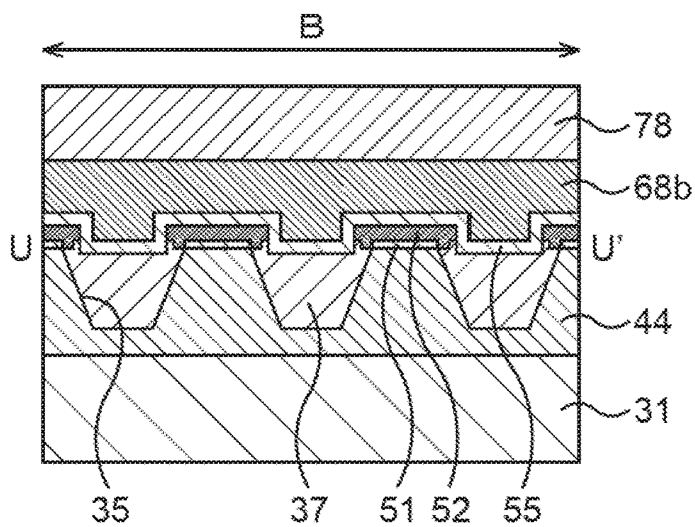
Figure 45C:
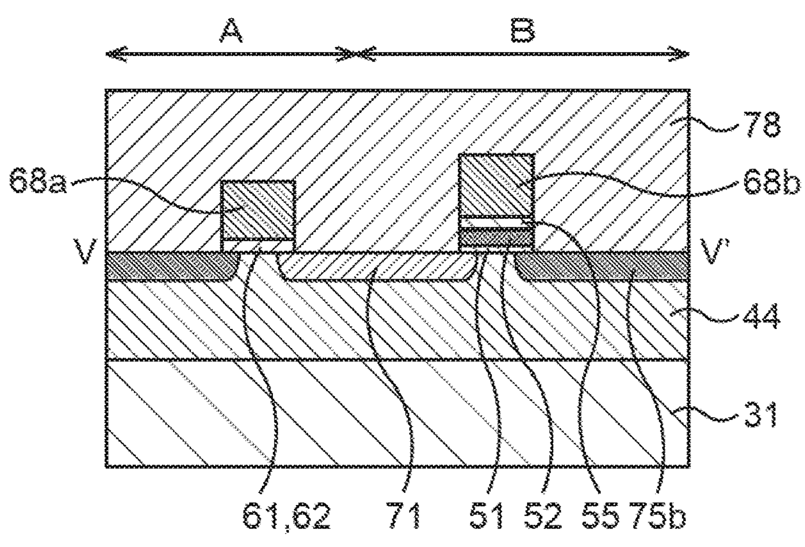
Figure 46A:
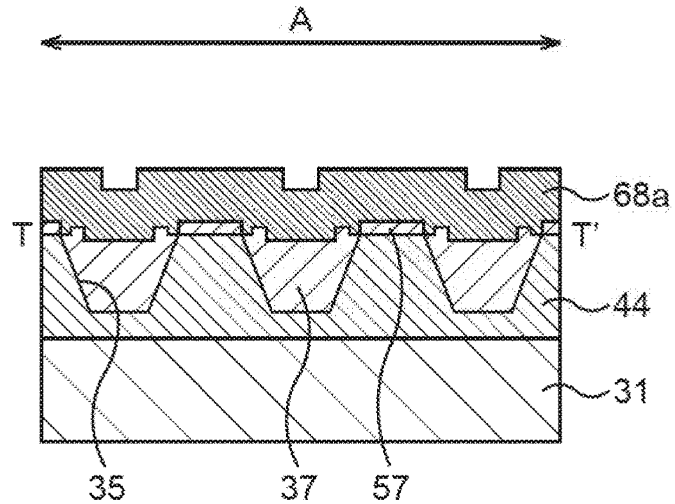
FIGS. 46A-46C are cross-sectional views (part 46) explaining the manufacturing process of the semiconductor device in the first embodiment.
Figure 46B:
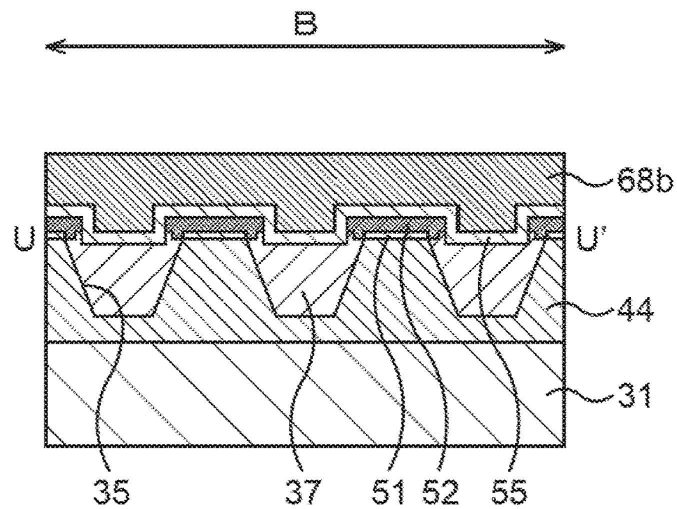
Figure 46C:
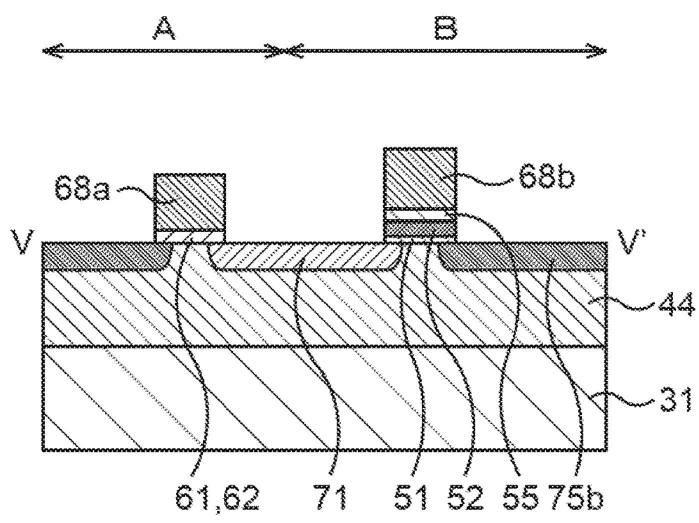
Figure 47A:
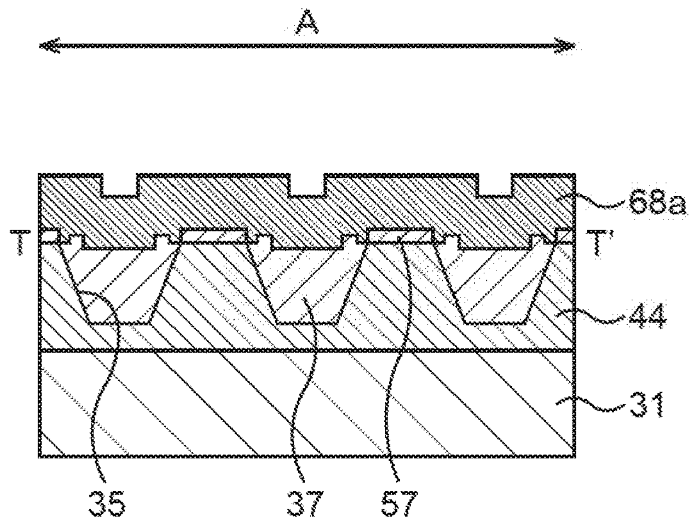
FIGS. 47A-47C are cross-sectional views (part 47) explaining the manufacturing process of the semiconductor device in the first embodiment.
Figure 47B:
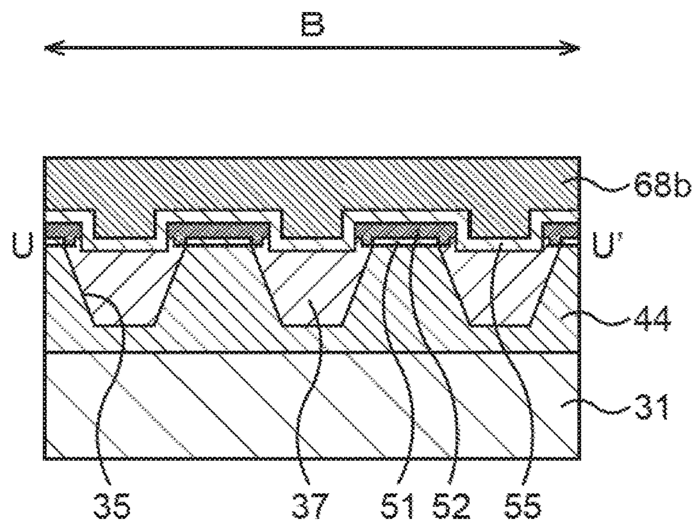
Figure 47C:
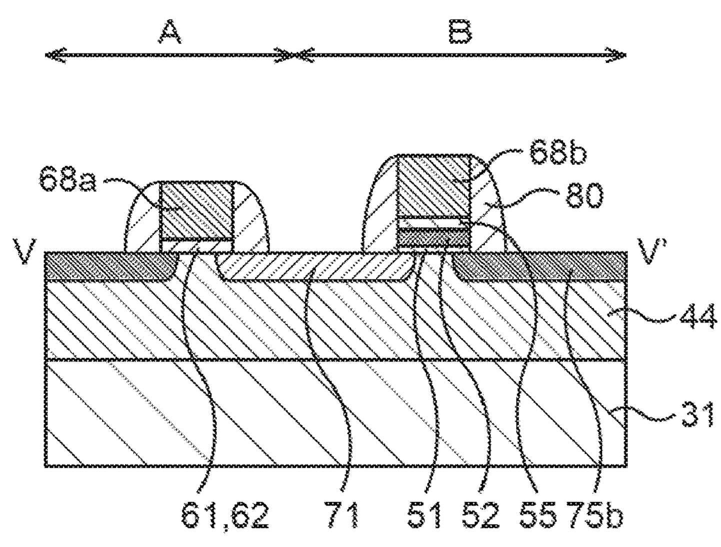
Figure 48A:
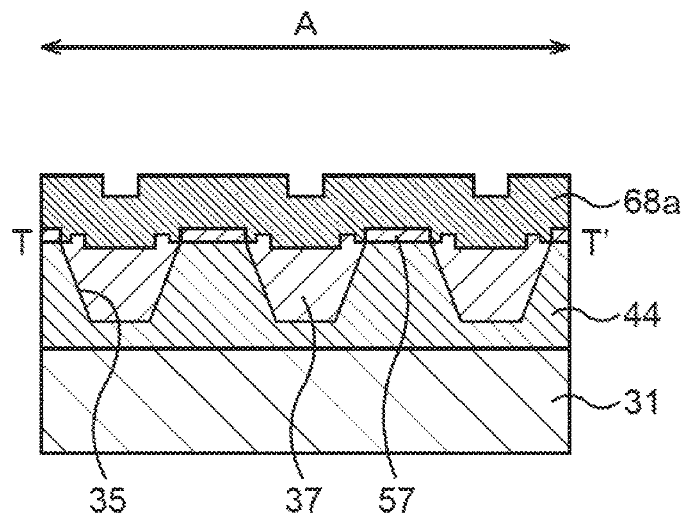
FIGS. 48A-48C are cross-sectional views (part 48) explaining the manufacturing process of the semiconductor device in the first embodiment.
Figure 48B:
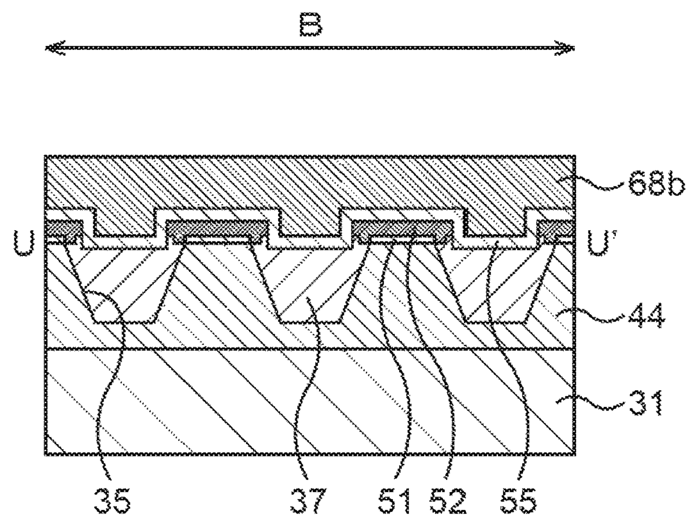
Figure 48C:
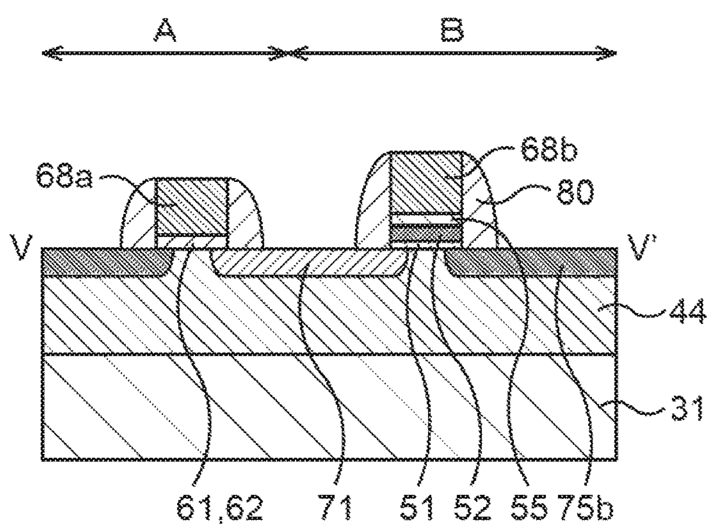
Figure 49A:
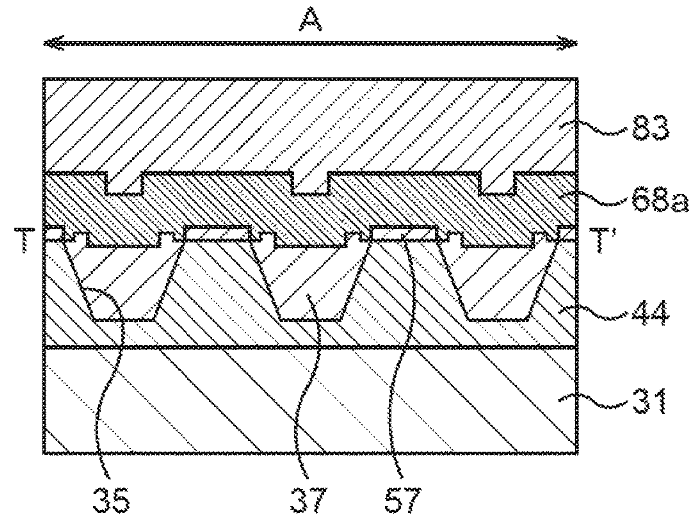
FIGS. 49A-49C are cross-sectional views (part 49) explaining the manufacturing process of the semiconductor device in the first embodiment.
Figure 49B:
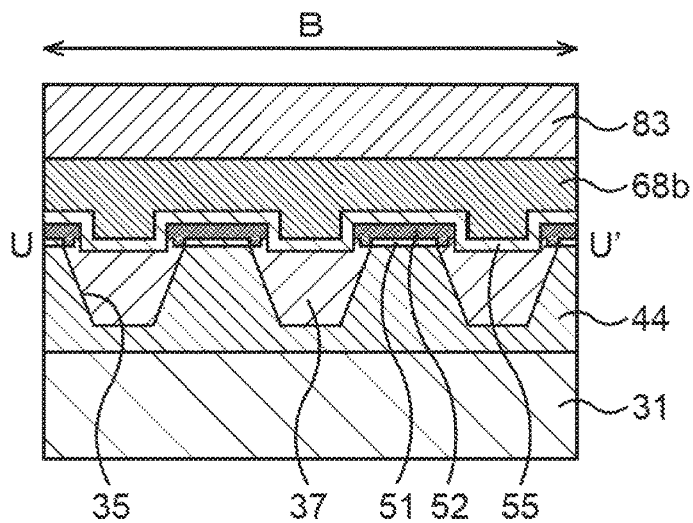
Figure 49C:
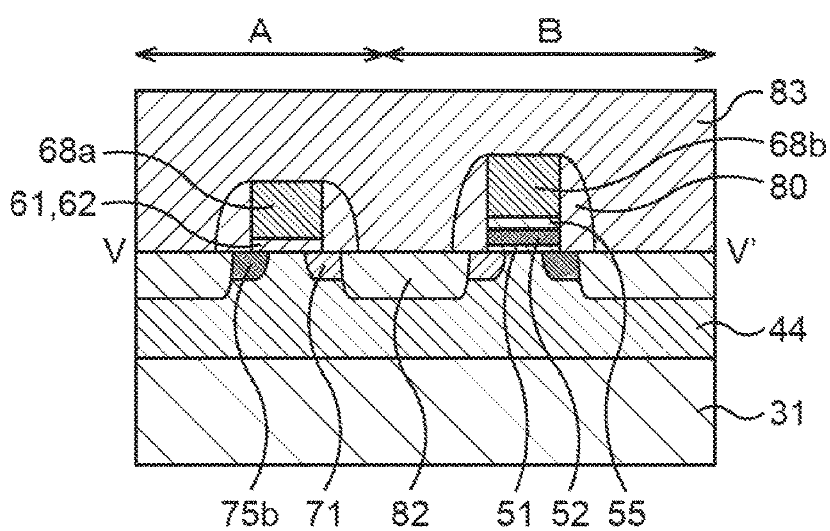
Figure 50A:
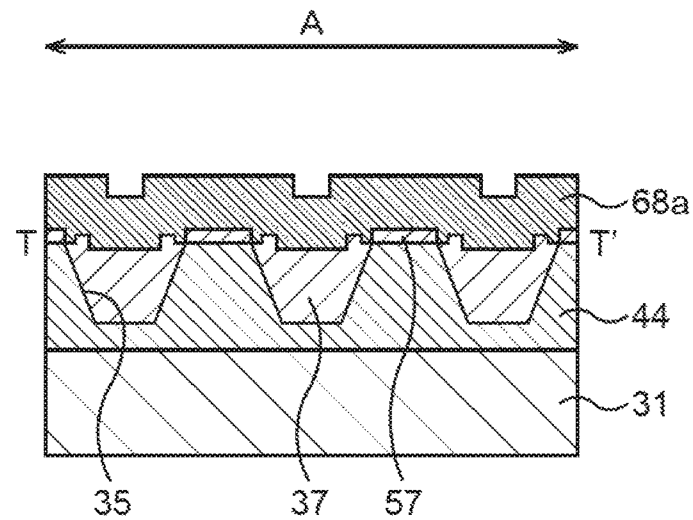
FIGS. 50A-50C are cross-sectional views (part 50) explaining the manufacturing process of the semiconductor device in the first embodiment.
Figure 50B:
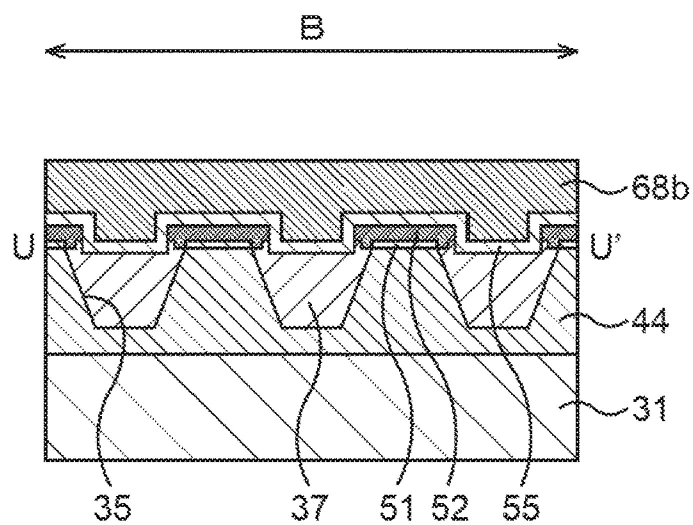
Figure 50C:
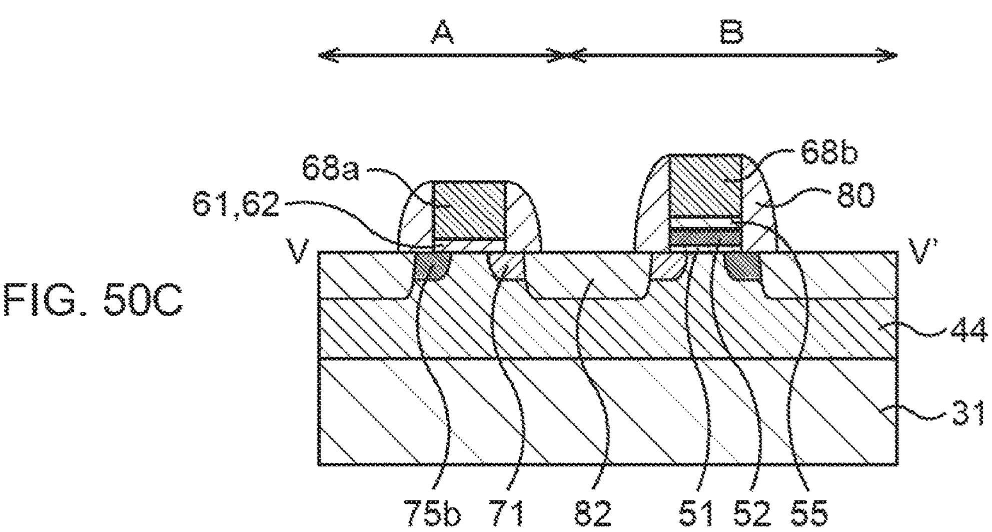
Figure 52A:
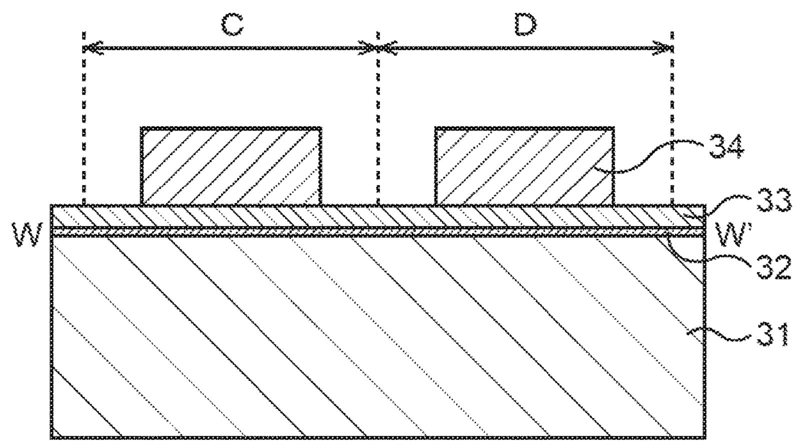
FIGS. 52A and 52B are cross-sectional views (part 52) explaining the manufacturing process of the semiconductor device in the first embodiment.
Figure 52B:
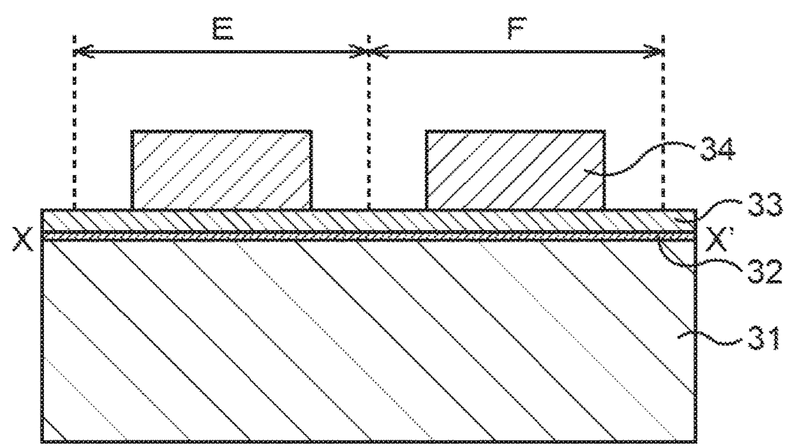
Figure 53A:
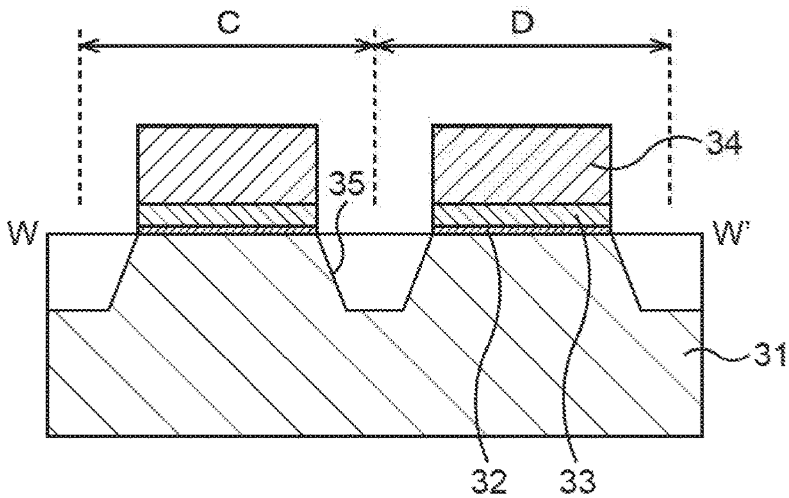
FIGS. 53A and 53B are cross-sectional views (part 53) explaining the manufacturing process of the semiconductor device in the first embodiment.
Figure 53B:
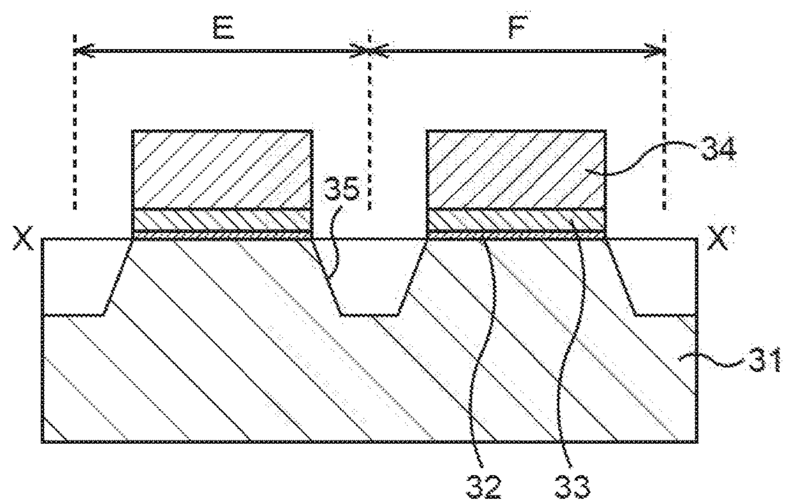
Figure 54A:
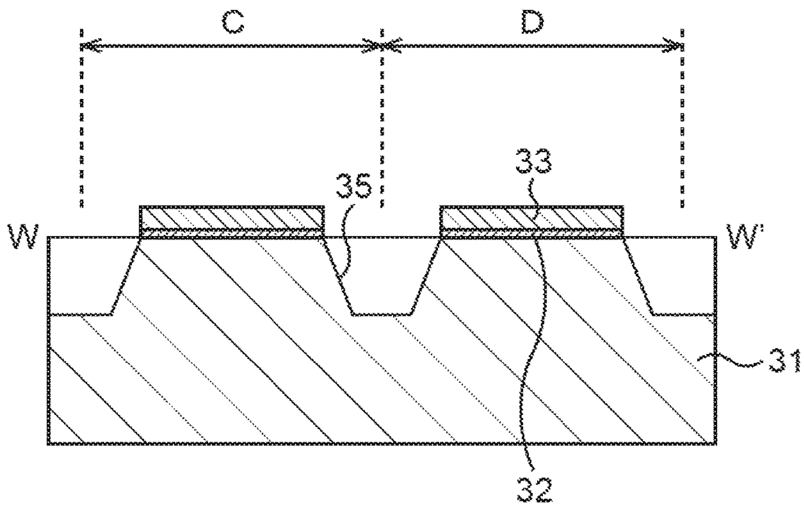
FIGS. 54A and 54B are cross-sectional views (part 54) explaining the manufacturing process of the semiconductor device in the first embodiment.
Figure 54B:
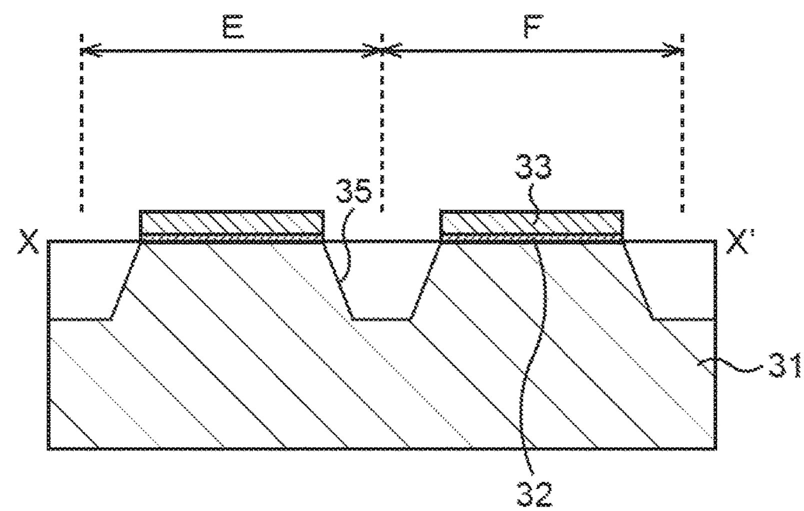
Figure 55A:
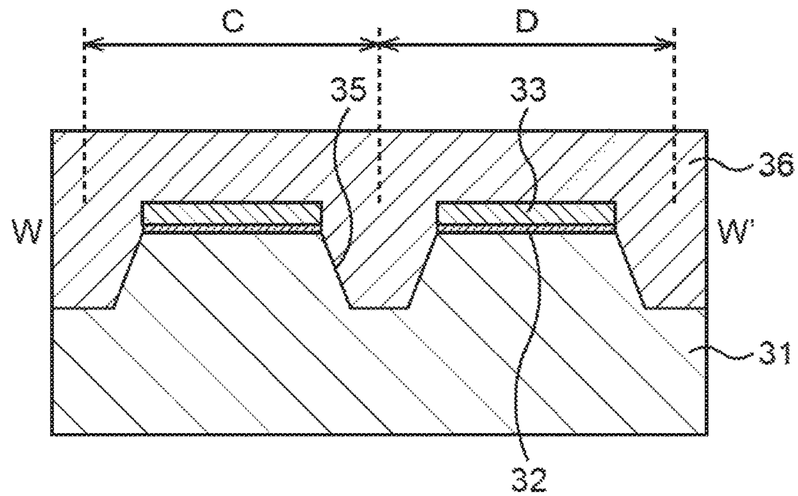
FIGS. 55A and 55B are cross-sectional views (part 55) explaining the manufacturing process of the semiconductor device in the first embodiment.
Figure 55B:
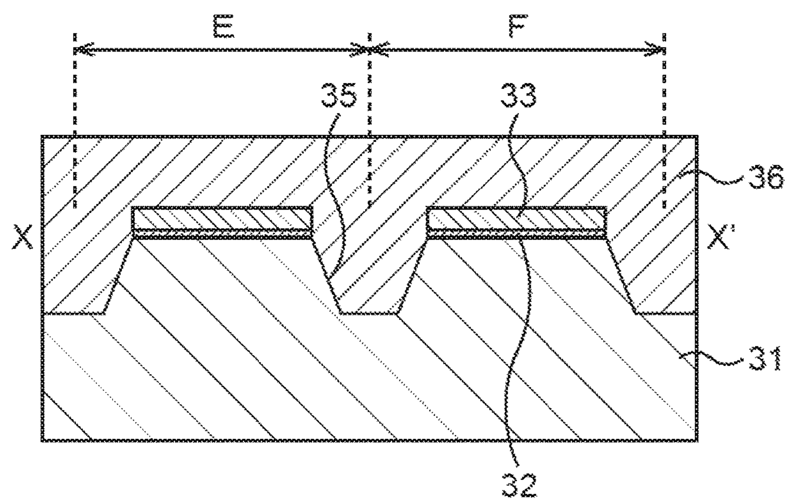
Figure 56A:
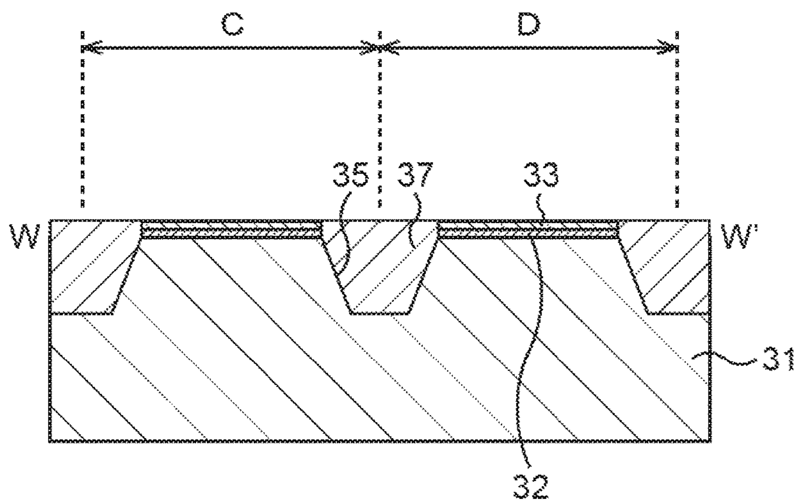
FIGS. 56A and 56B are cross-sectional views (part 56) explaining the manufacturing process of the semiconductor device in the first embodiment.
Figure 56B:
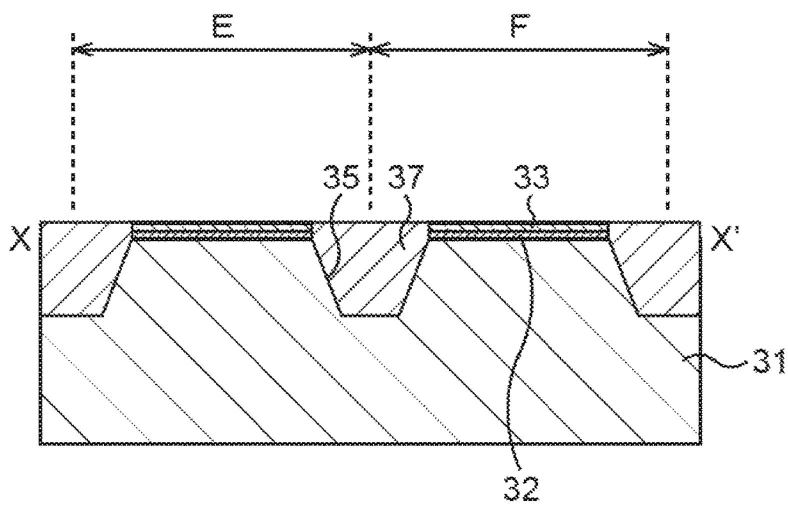
Figure 57A:
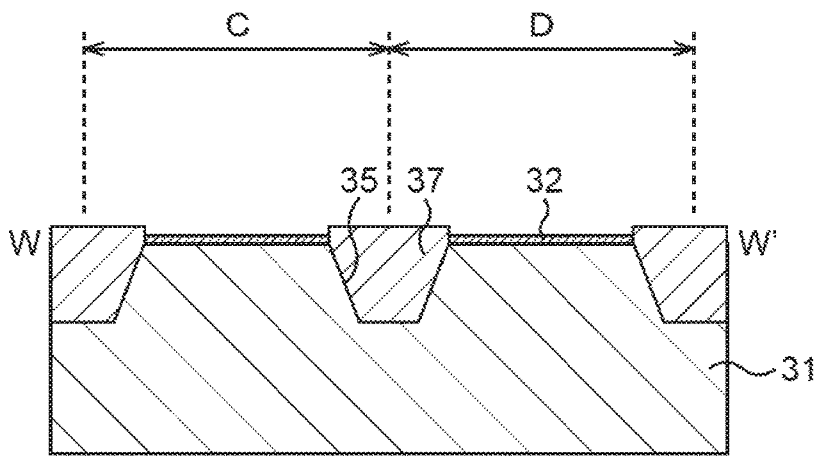
FIGS. 57A and 57B are cross-sectional views (part 57) explaining the manufacturing process of the semiconductor device in the first embodiment.
Figure 57B:
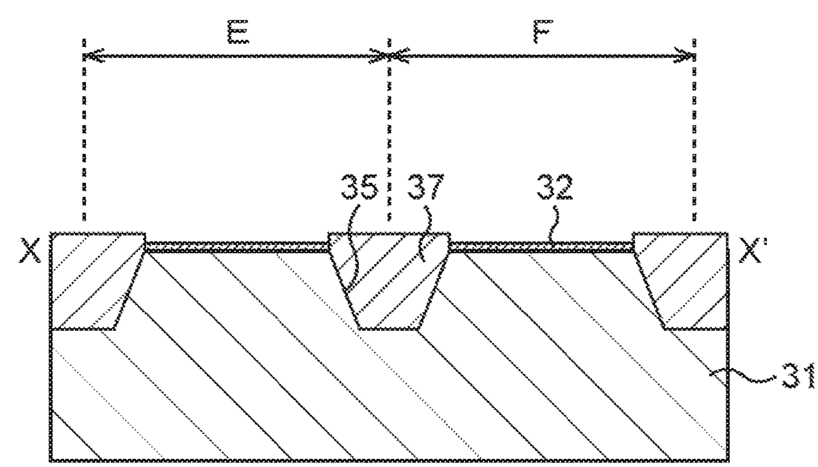
Figure 58A:
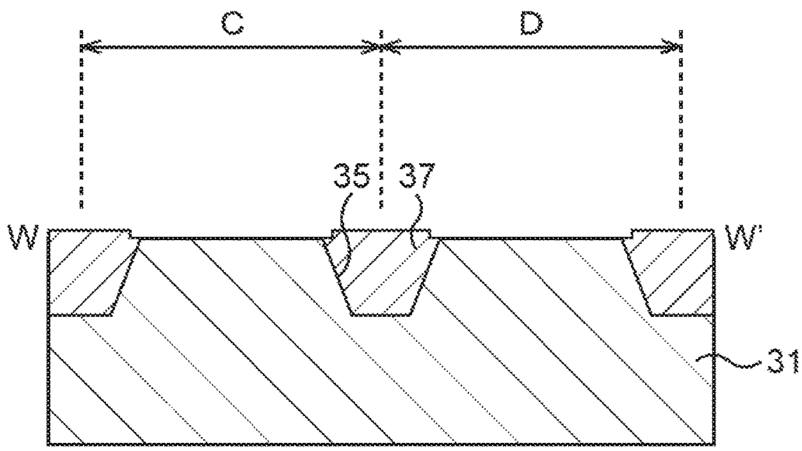
FIGS. 58A and 58B are cross-sectional views (part 58) explaining the manufacturing process of the semiconductor device in the first embodiment.
Figure 58B:
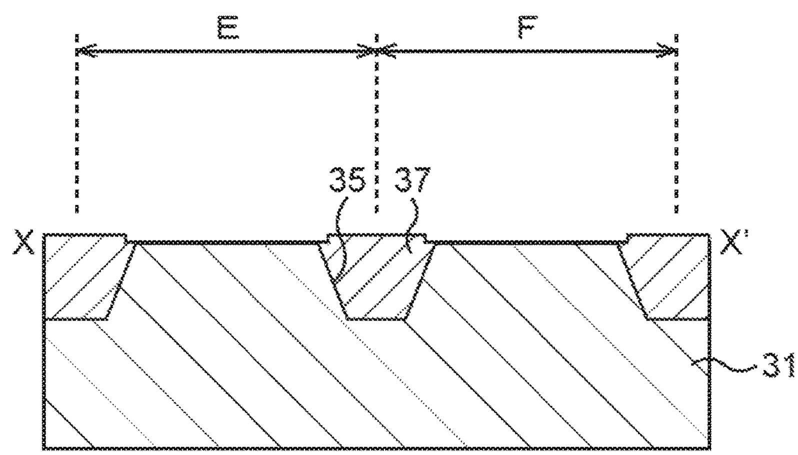
Figure 59A:
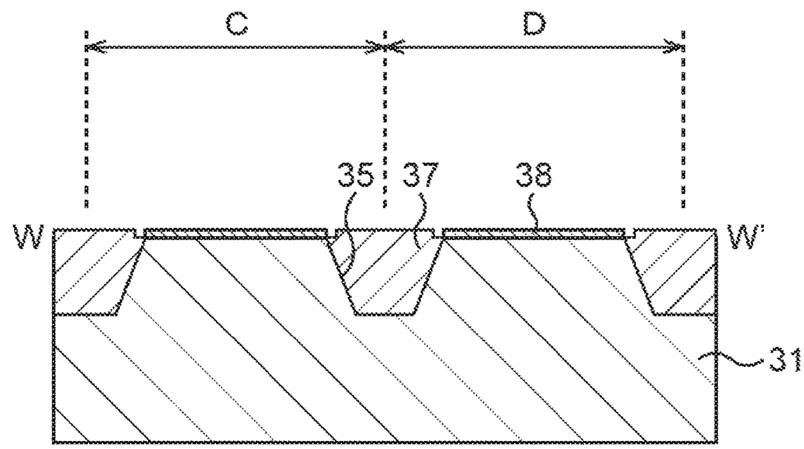
FIGS. 59A and 59B are cross-sectional views (part 59) explaining the manufacturing process of the semiconductor device in the first embodiment.
Figure 59B:
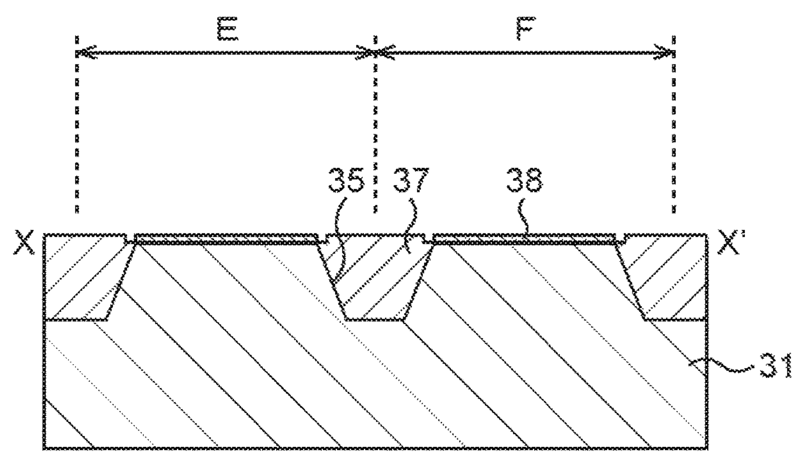
Figure 60A:
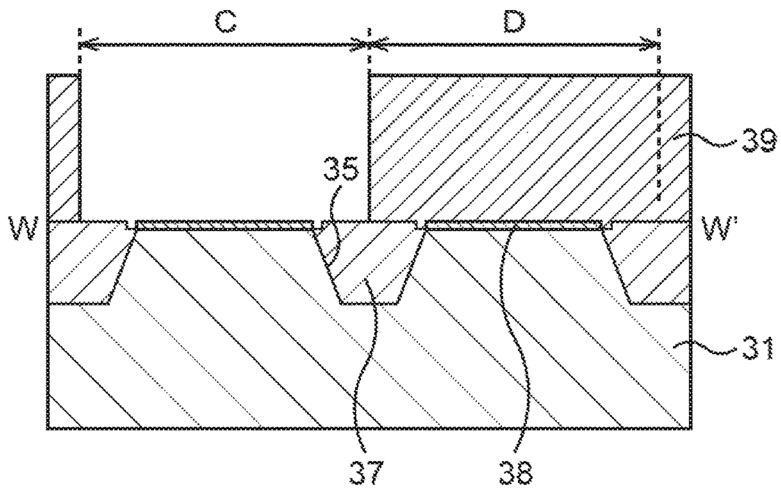
FIGS. 60A and 60B are cross-sectional views (part 60) explaining the manufacturing process of the semiconductor device in the first embodiment.
Figure 60B:
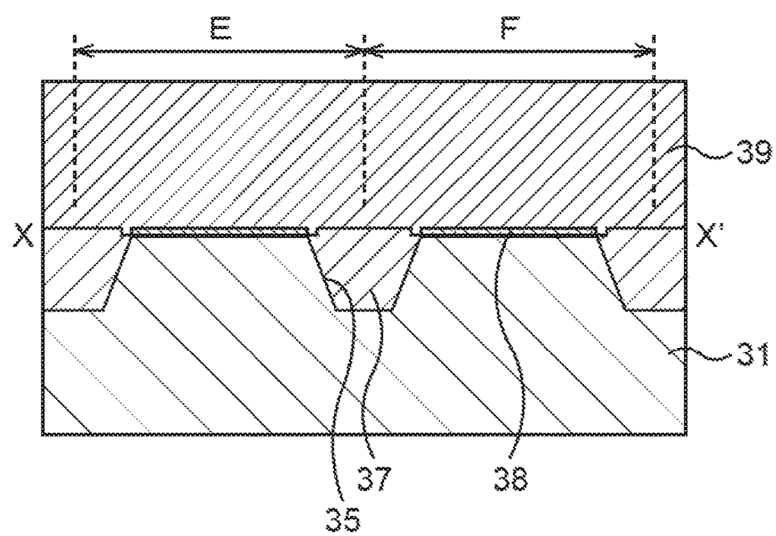
Figure 61A:
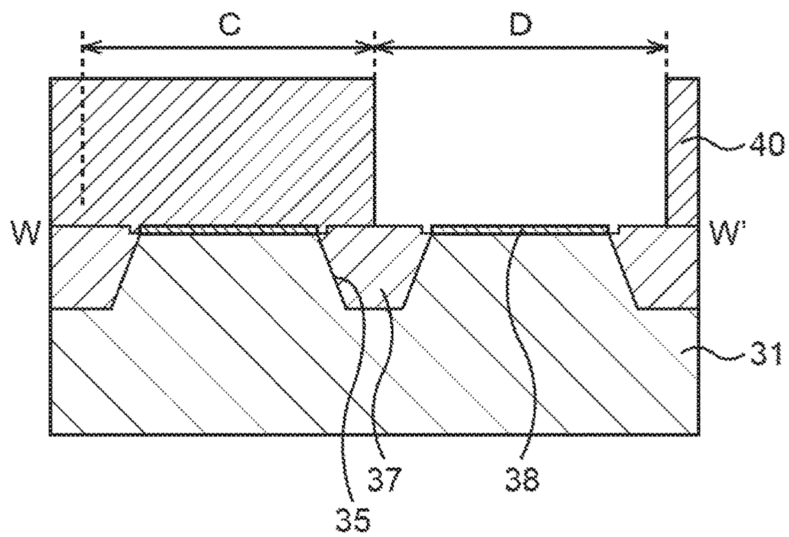
FIGS. 61A and 61B are cross-sectional views (part 61) explaining the manufacturing process of the semiconductor device in the first embodiment.
Figure 61B:
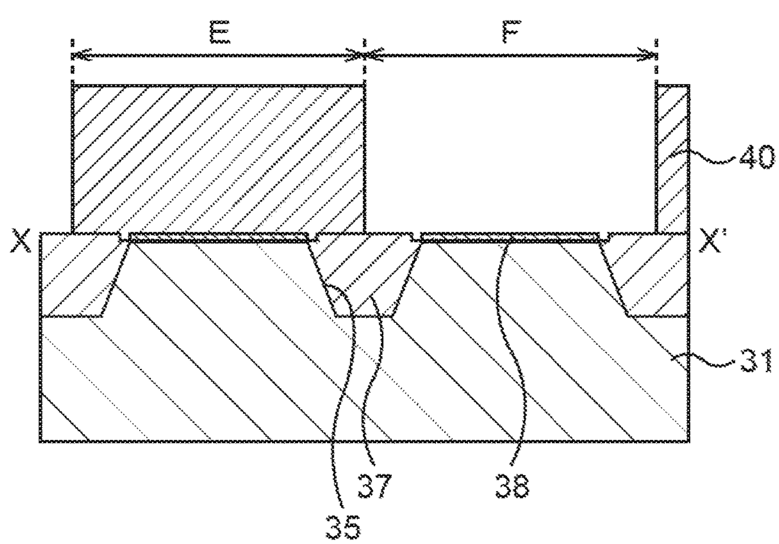
Figure 62A:
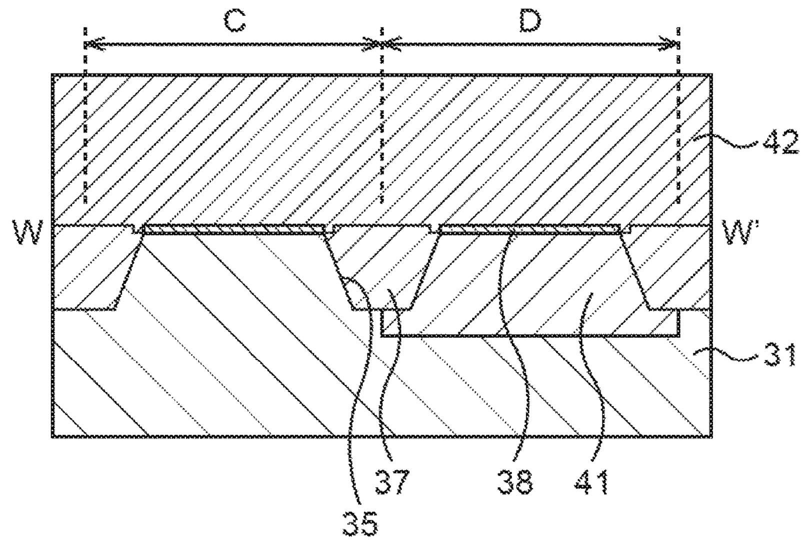
FIGS. 62A and 62B are cross-sectional views (part 62) explaining the manufacturing process of the semiconductor device in the first embodiment.
Figure 62B:
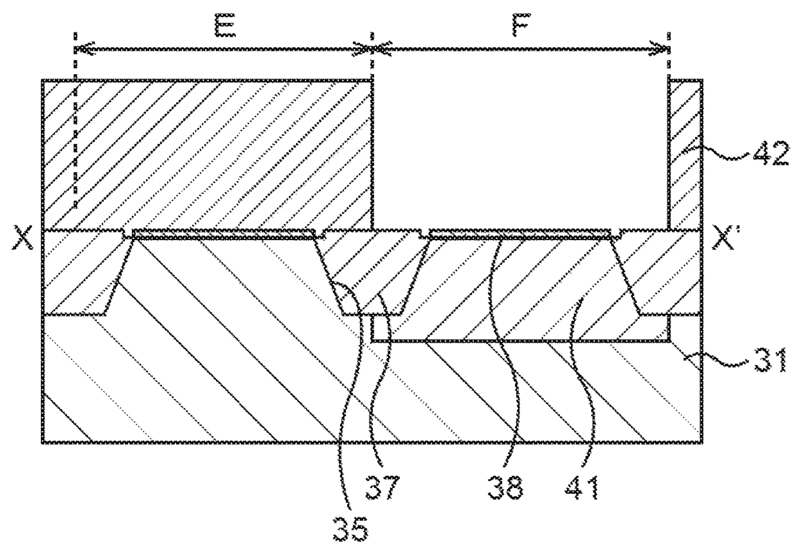
Figure 63A:
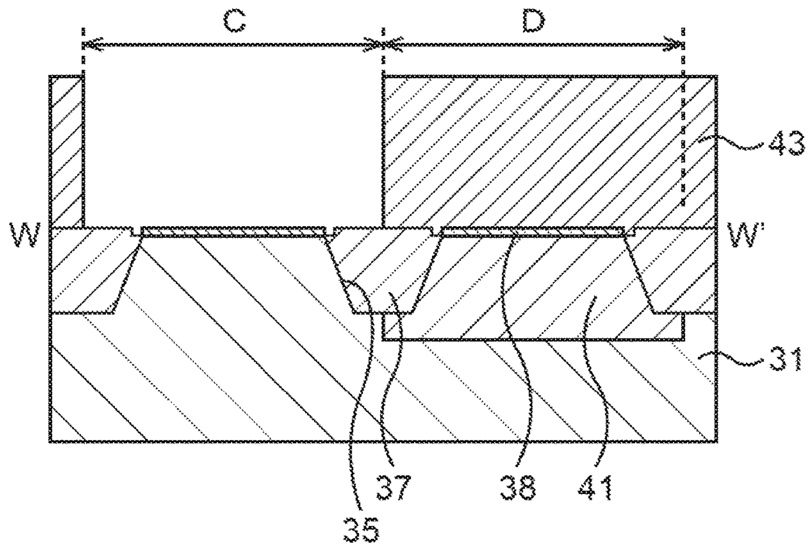
FIGS. 63A and 63B are cross-sectional views (part 63) explaining the manufacturing process of the semiconductor device in the first embodiment.
Figure 63B:
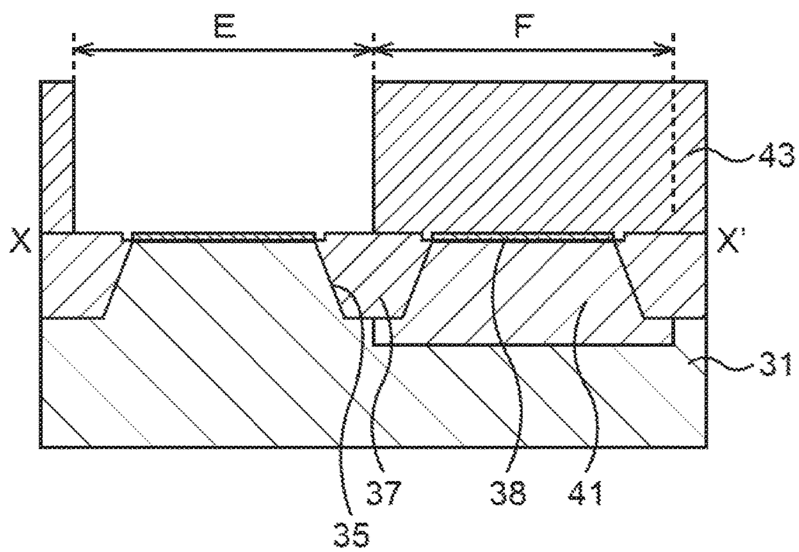
Figure 64A:
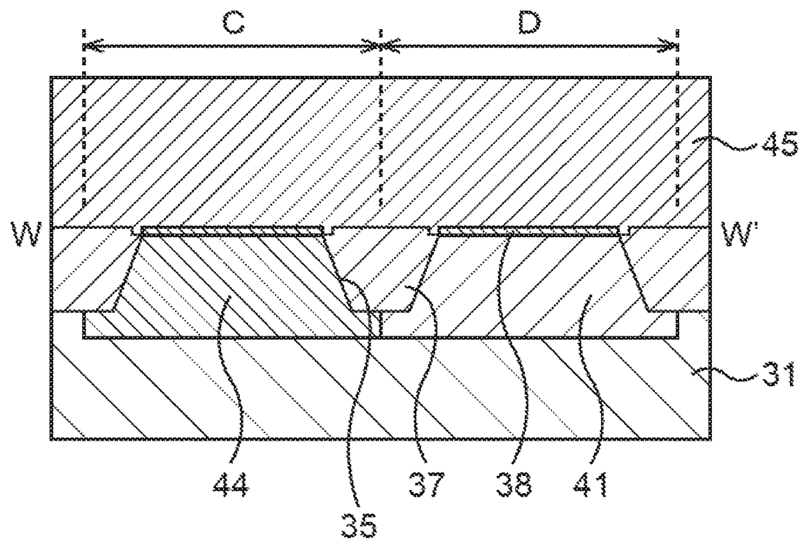
FIGS. 64A and 64B are cross-sectional views (part 64) explaining the manufacturing process of the semiconductor device in the first embodiment.
Figure 64B:
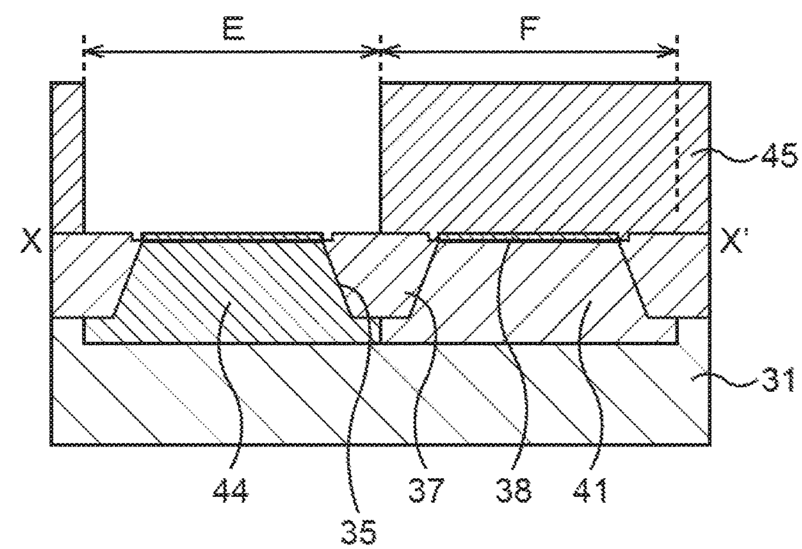
Figure 65A:
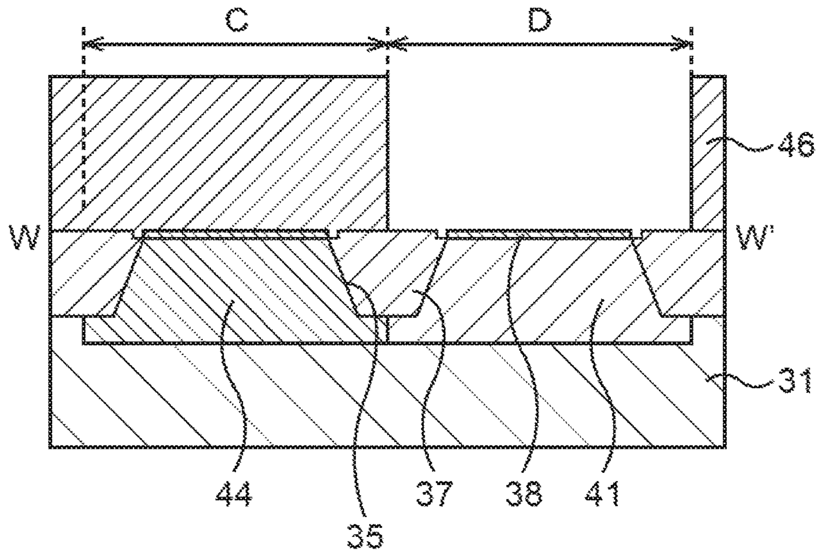
FIGS. 65A and 65B are cross-sectional views (part 65) explaining the manufacturing process of the semiconductor device in the first embodiment.
Figure 65B:
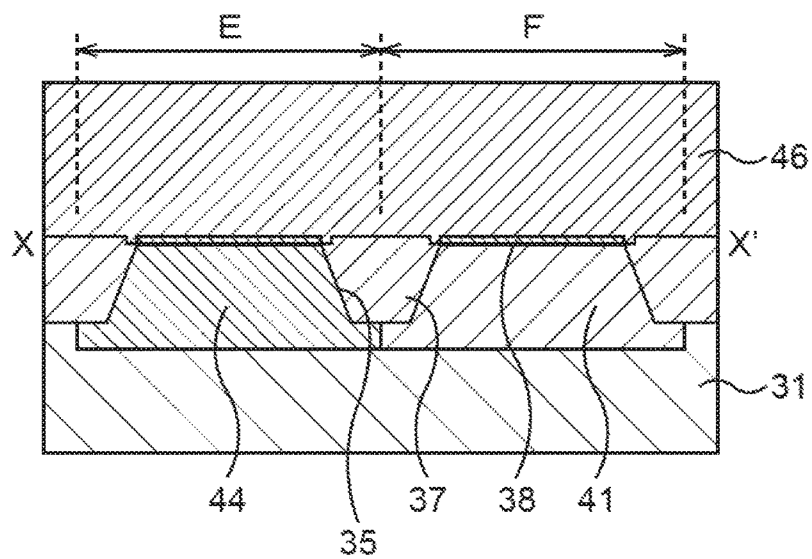
Figure 66A:
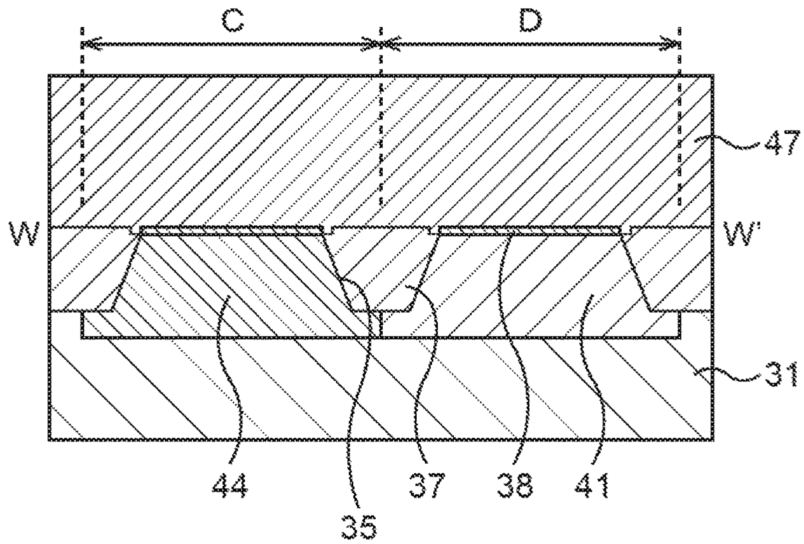
FIGS. 66A and 66B are cross-sectional views (part 66) explaining the manufacturing process of the semiconductor device in the first embodiment.
Figure 66B:
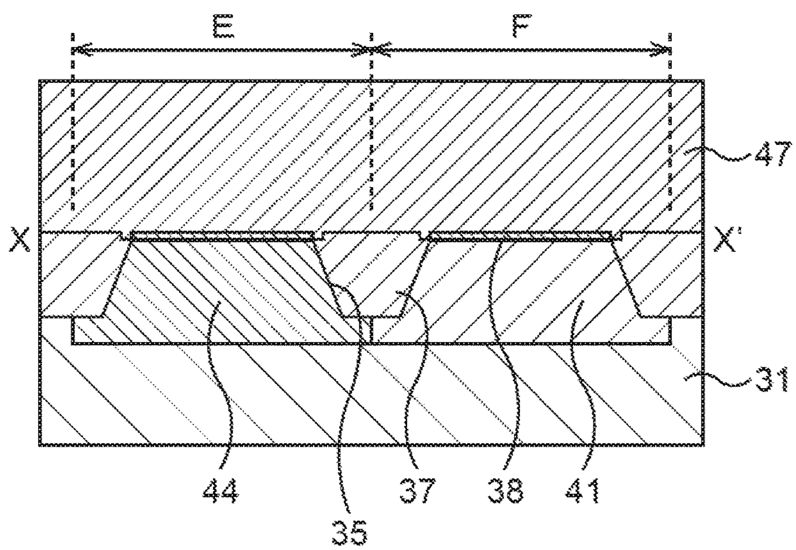
Figure 67A:
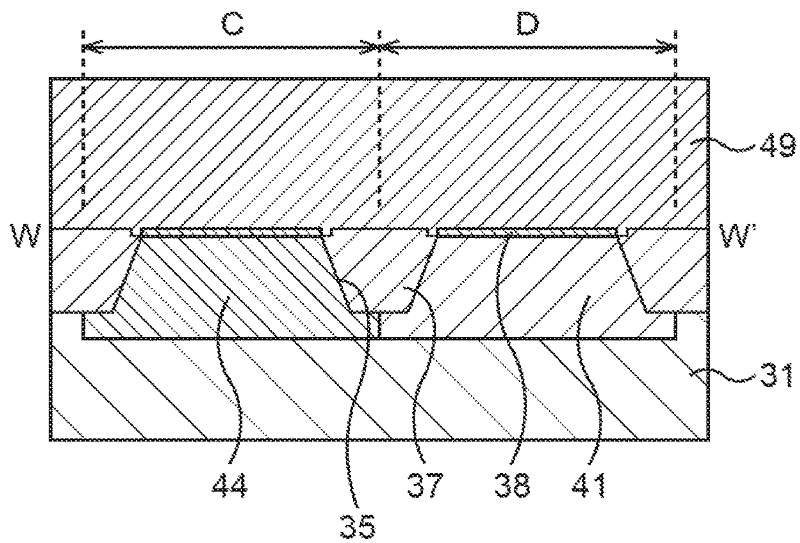
FIGS. 67A and 67B are cross-sectional views (part 67) explaining the manufacturing process of the semiconductor device in the first embodiment.
Figure 67B:
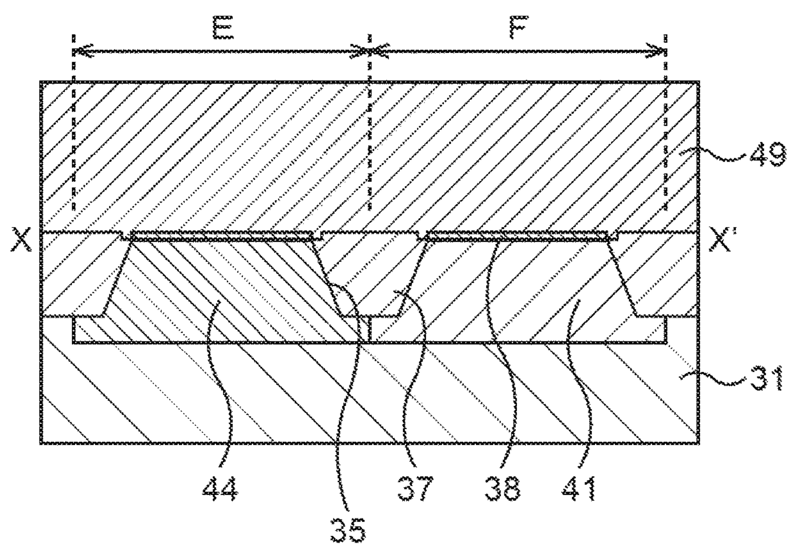
Figure 68A:
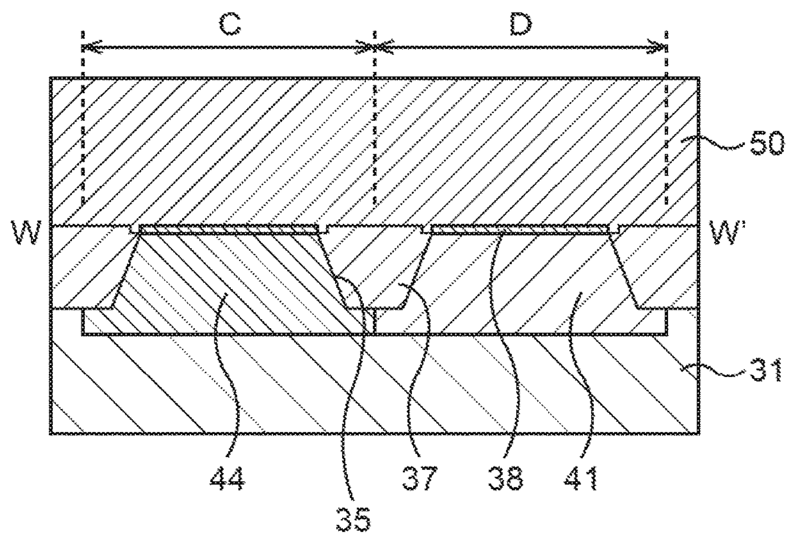
FIGS. 68A and 68B are cross-sectional views (part 68) explaining the manufacturing process of the semiconductor device in the first embodiment.
Figure 68B:
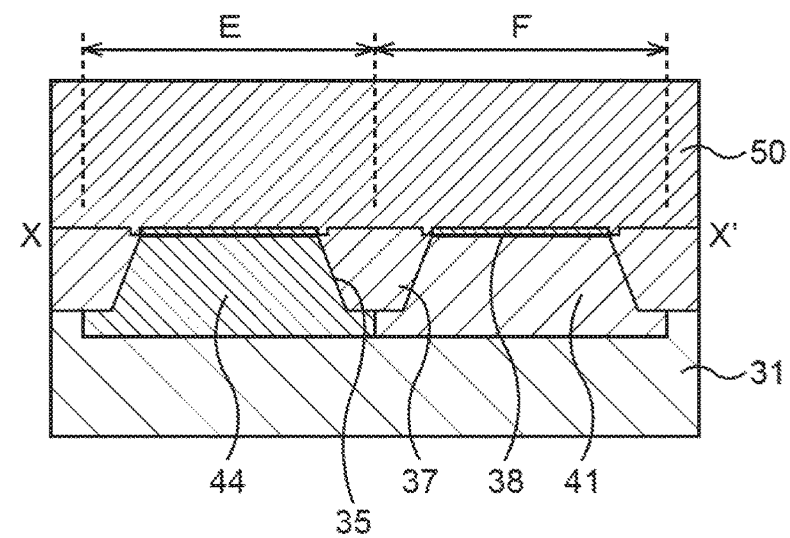
Figure 69A:
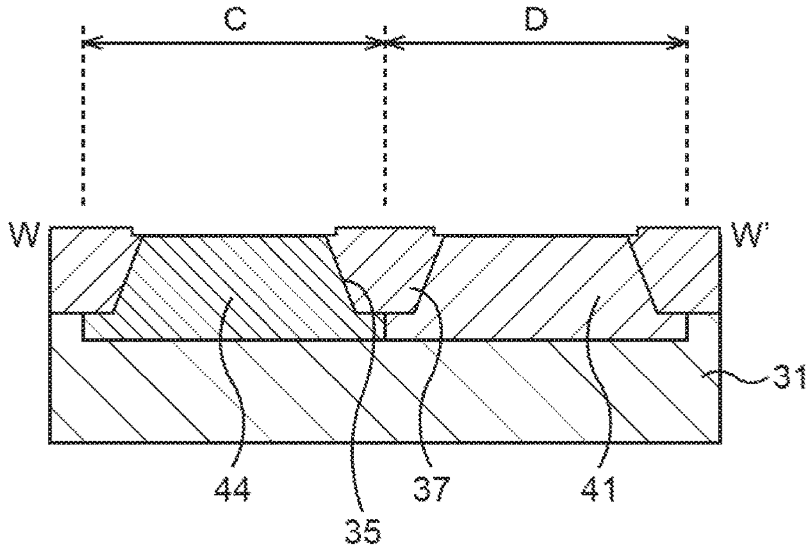
FIGS. 69A and 69B are cross-sectional views (part 69) explaining the manufacturing process of the semiconductor device in the first embodiment.
Figure 69B:
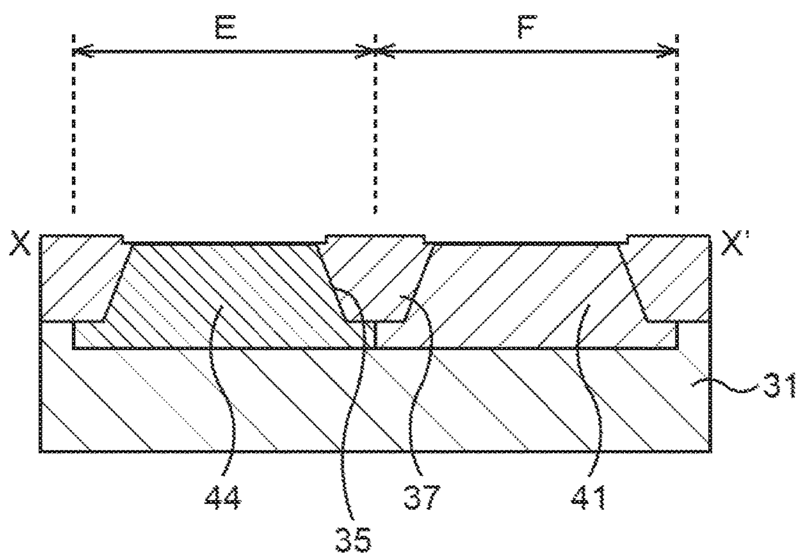
Figure 70A:
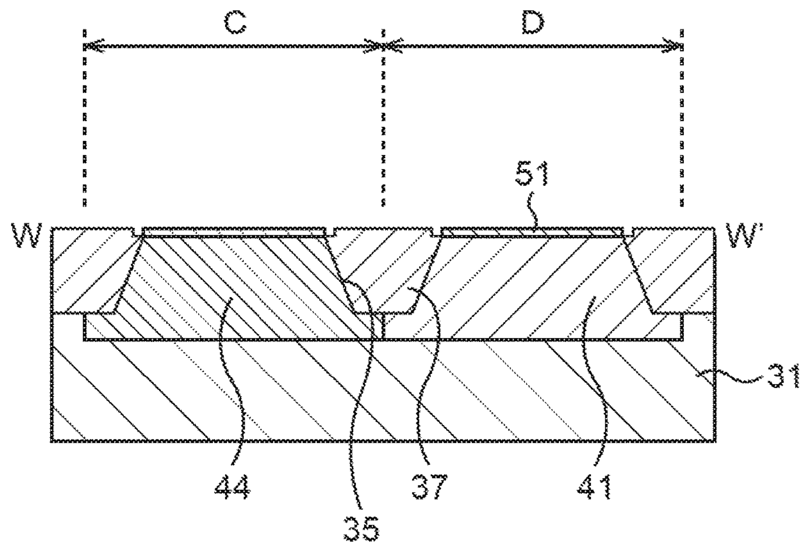
FIGS. 70A and 70B are cross-sectional views (part 70) explaining the manufacturing process of the semiconductor device in the first embodiment.
Figure 70B:
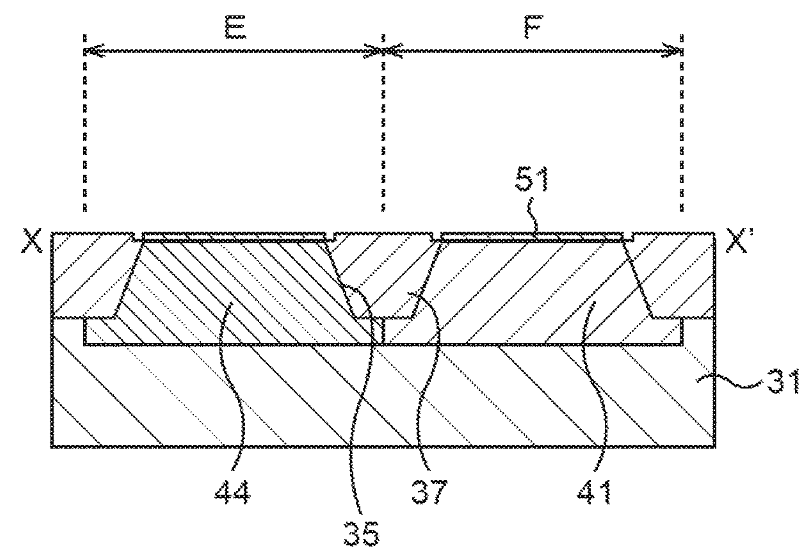
Figure 71A:
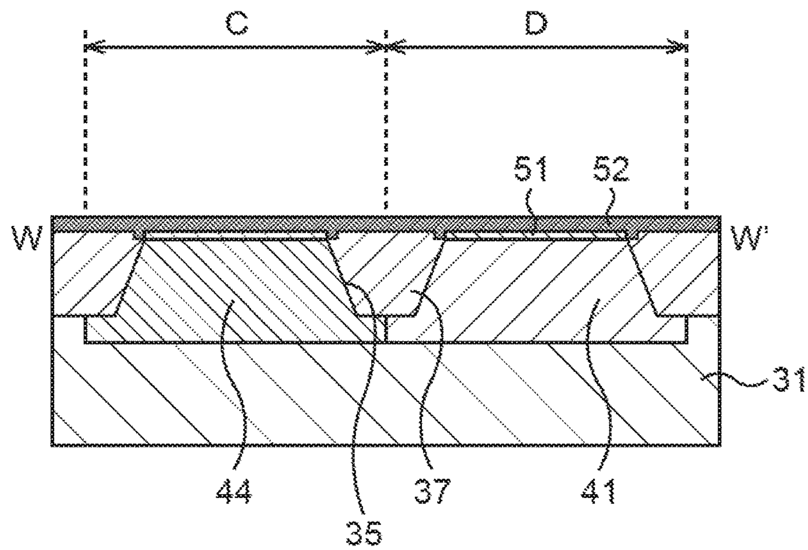
FIGS. 71A and 71B are cross-sectional views (part 71) explaining the manufacturing process of the semiconductor device in the first embodiment.
Figure 71B:
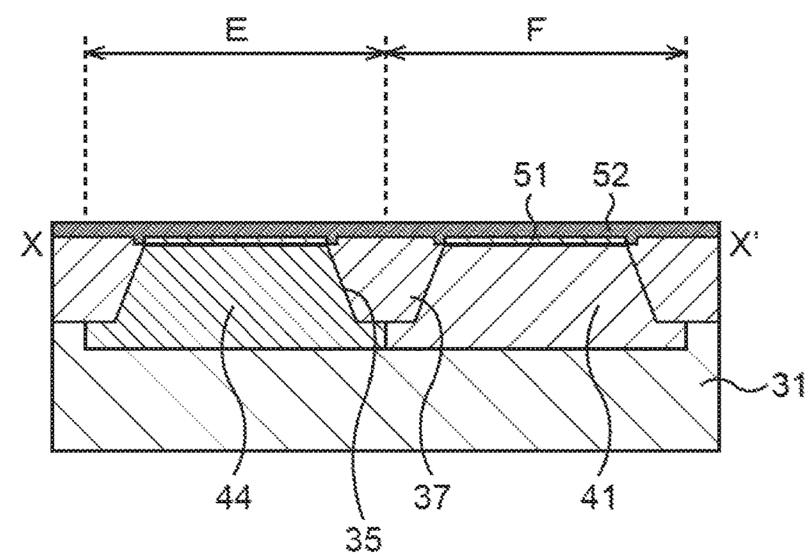
Figure 72A:
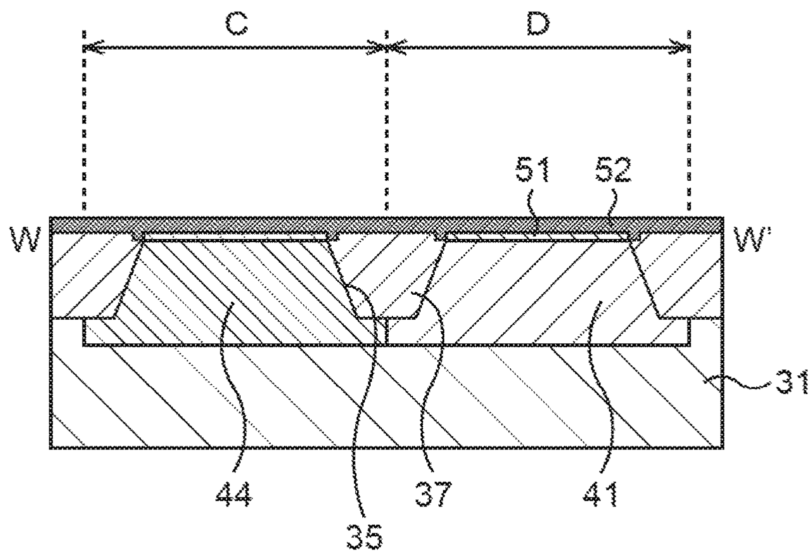
FIGS. 72A and 72B are cross-sectional views (part 72) explaining the manufacturing process of the semiconductor device in the first embodiment.
Figure 72B:
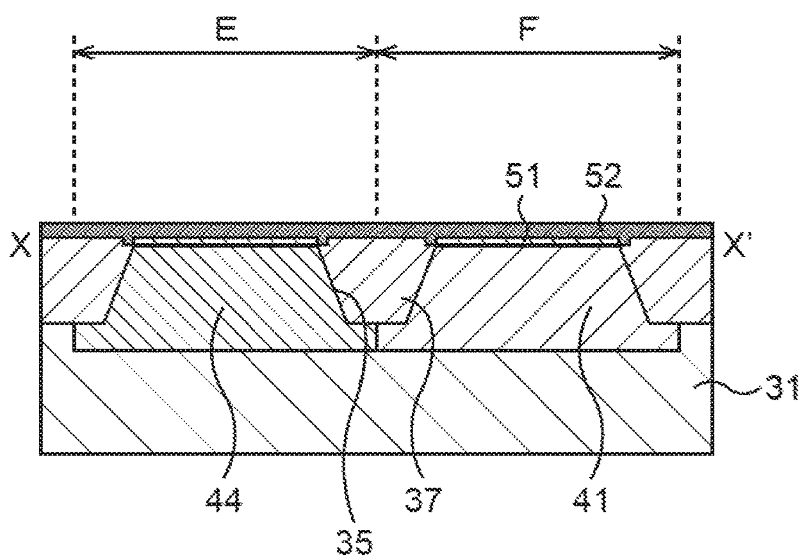
Figure 73A:
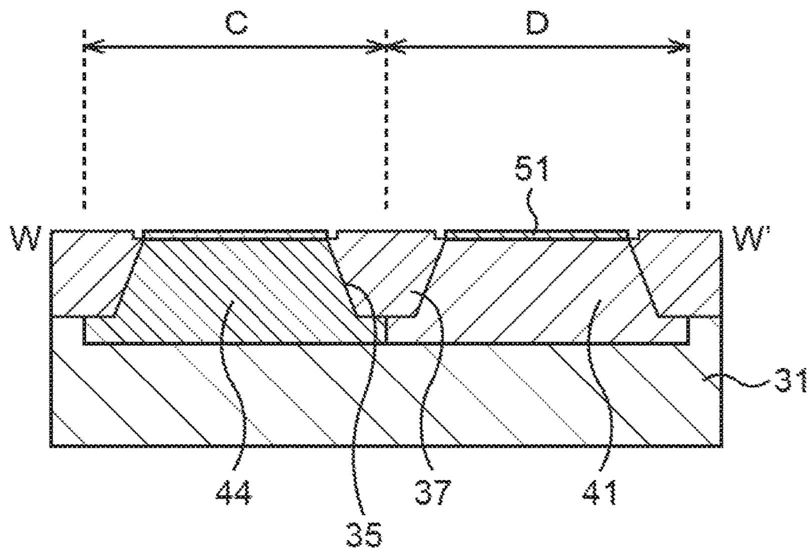
FIGS. 73A and 73B are cross-sectional views (part 73) explaining the manufacturing process of the semiconductor device in the first embodiment.
Figure 73B:
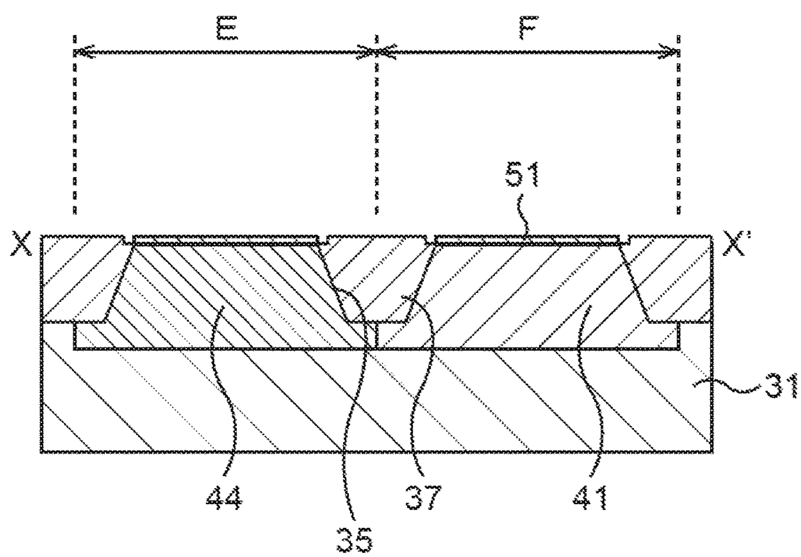
Figure 74A:
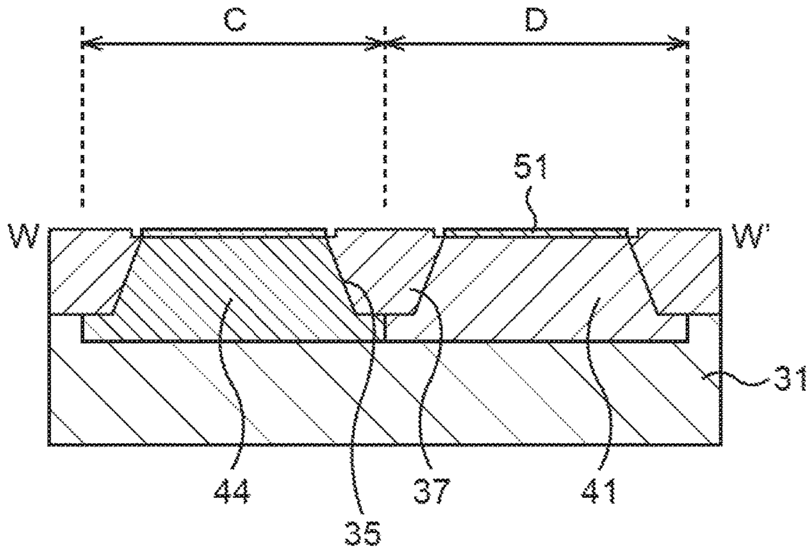
FIGS. 74A and 74B are cross-sectional views (part 74) explaining the manufacturing process of the semiconductor device in the first embodiment.
Figure 74B:
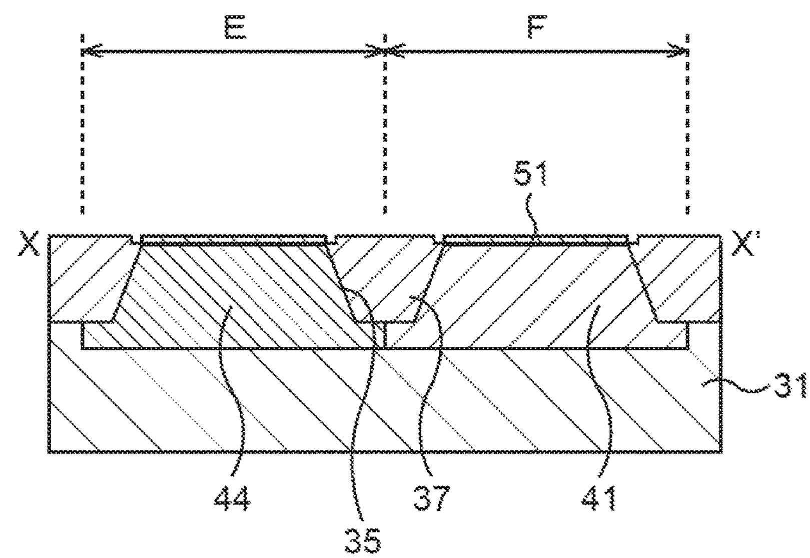
Figure 75A:
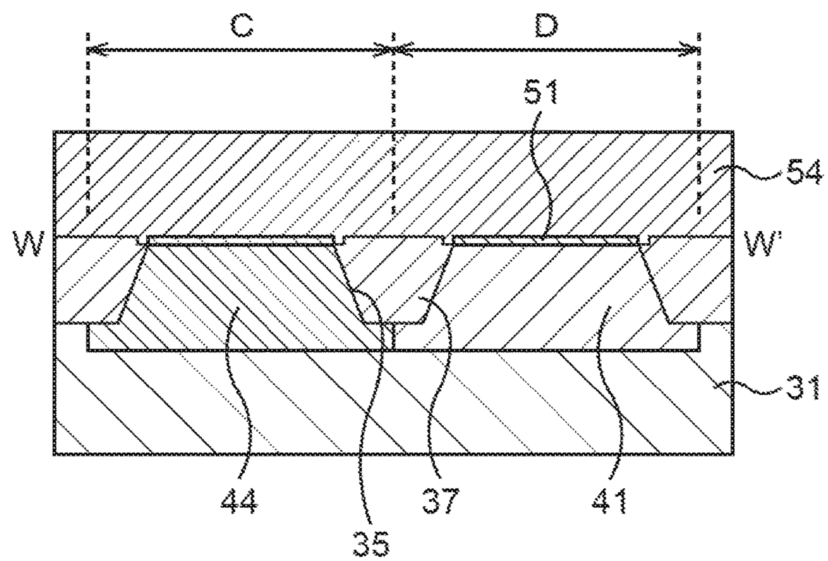
FIGS. 75A and 75B are cross-sectional views (part 75) explaining the manufacturing process of the semiconductor device in the first embodiment.
Figure 75B:
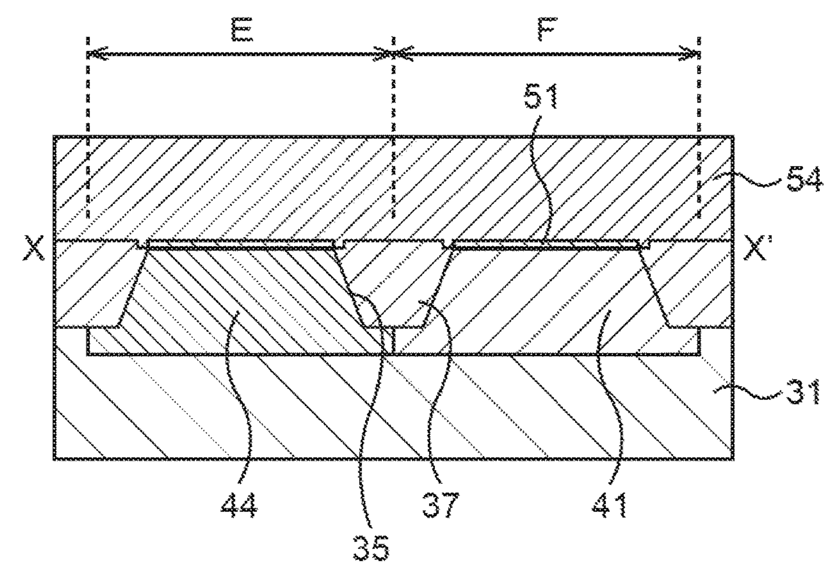
Figure 76A:
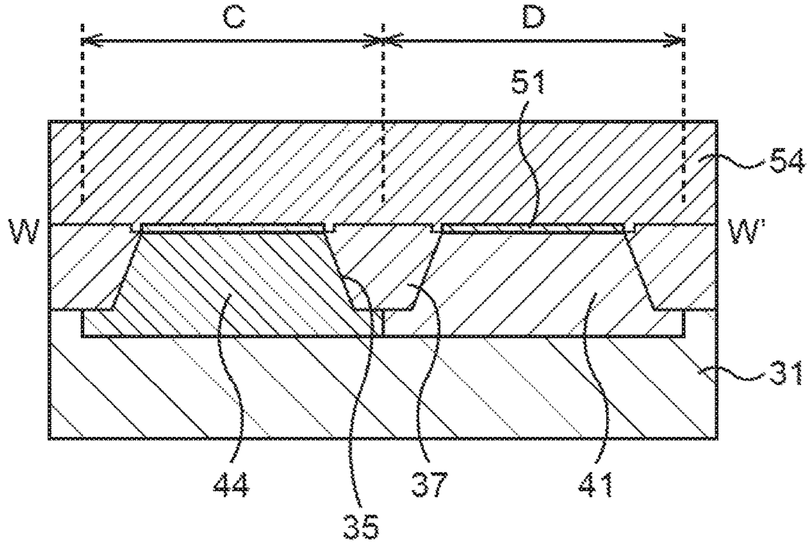
FIGS. 76A and 76B are cross-sectional views (part 76) explaining the manufacturing process of the semiconductor device in the first embodiment.
Figure 76B:
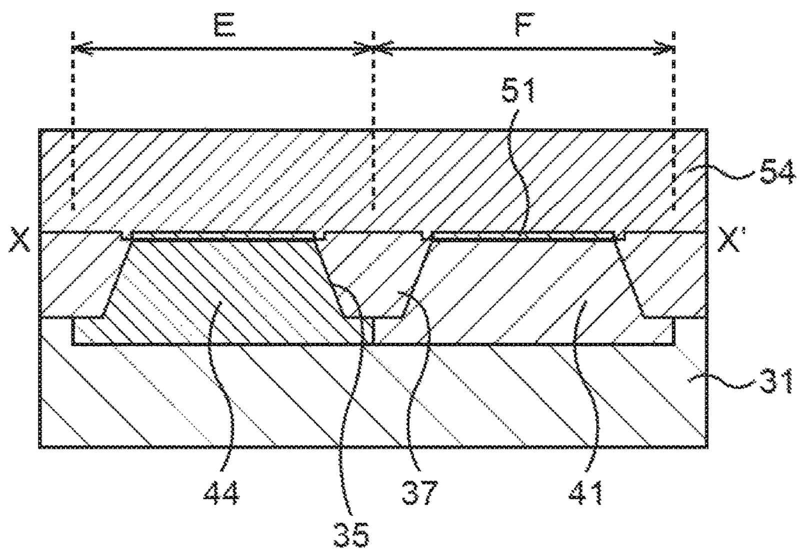
Figure 77A:
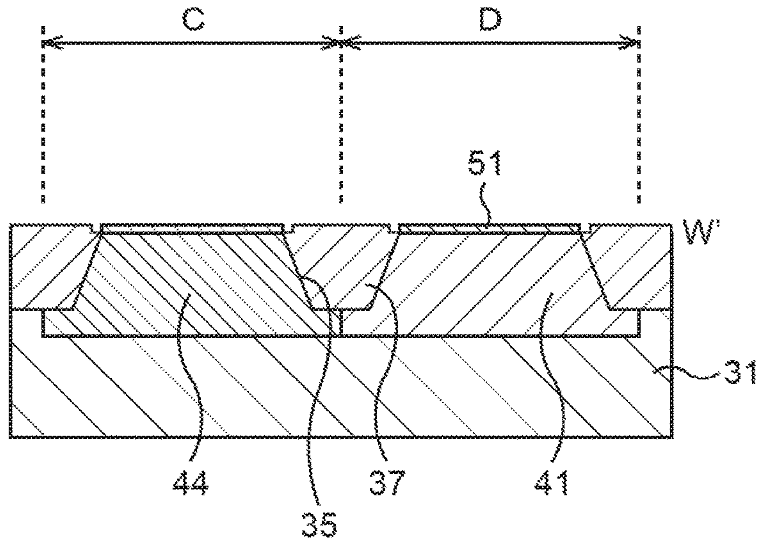
FIGS. 77A and 77B are cross-sectional views (part 77) explaining the manufacturing process of the semiconductor device in the first embodiment.
Figure 77B:
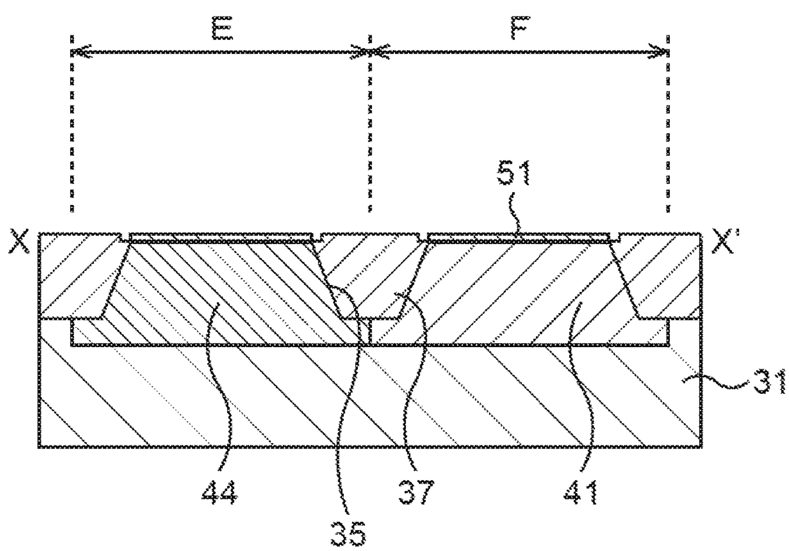
Figure 78A:
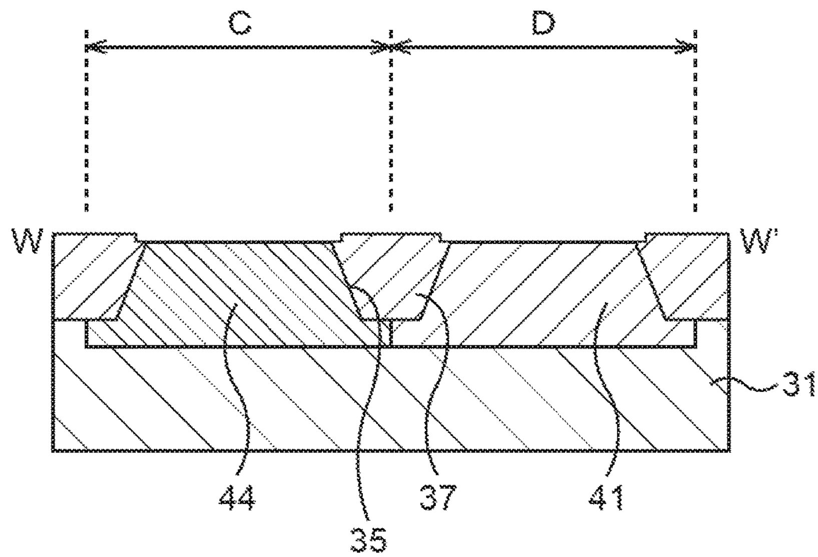
FIGS. 78A and 78B are cross-sectional views (part 78) explaining the manufacturing process of the semiconductor device in the first embodiment.
Figure 78B:
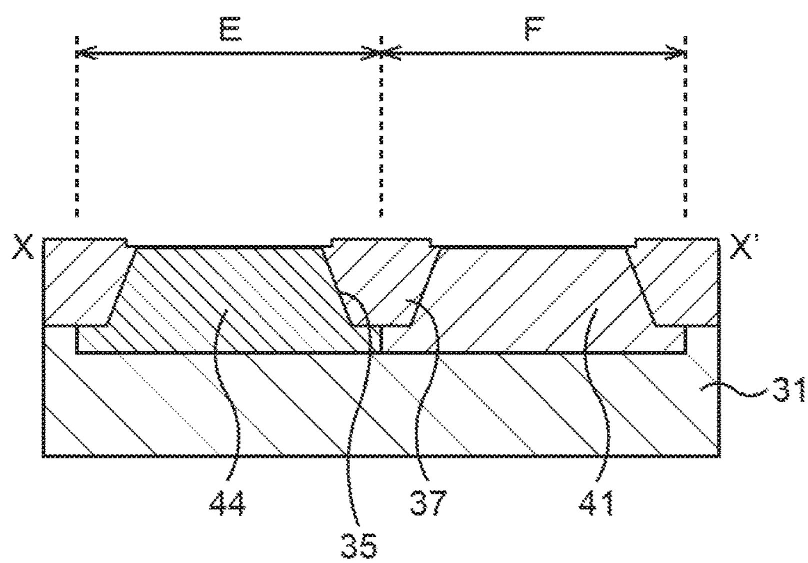
Figure 79A:
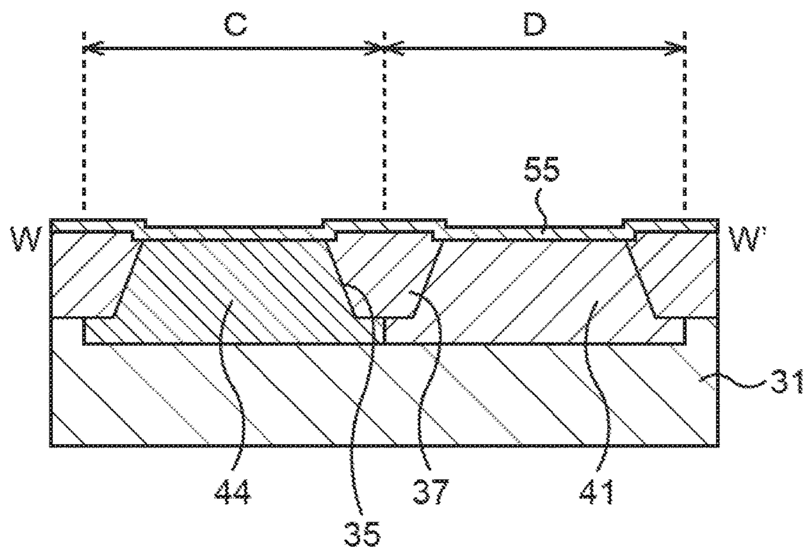
FIGS. 79A and 79B are cross-sectional views (part 79) explaining the manufacturing process of the semiconductor device in the first embodiment.
Figure 79B:
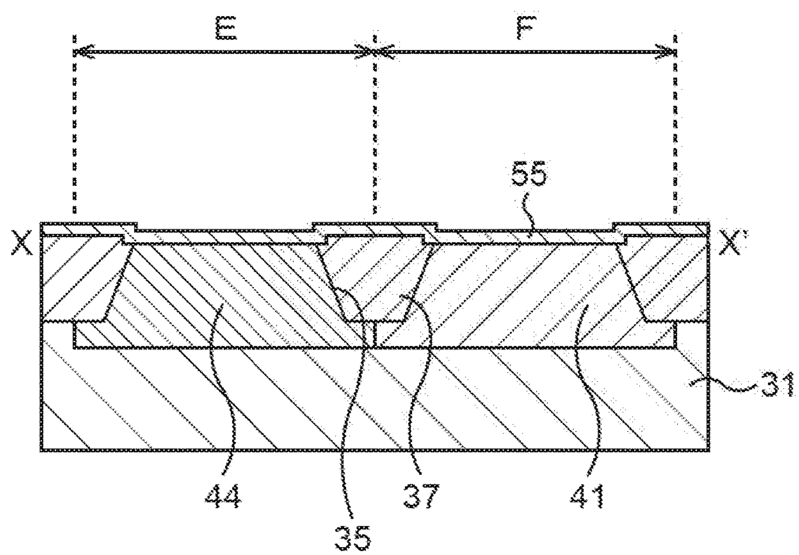
Figure 103:
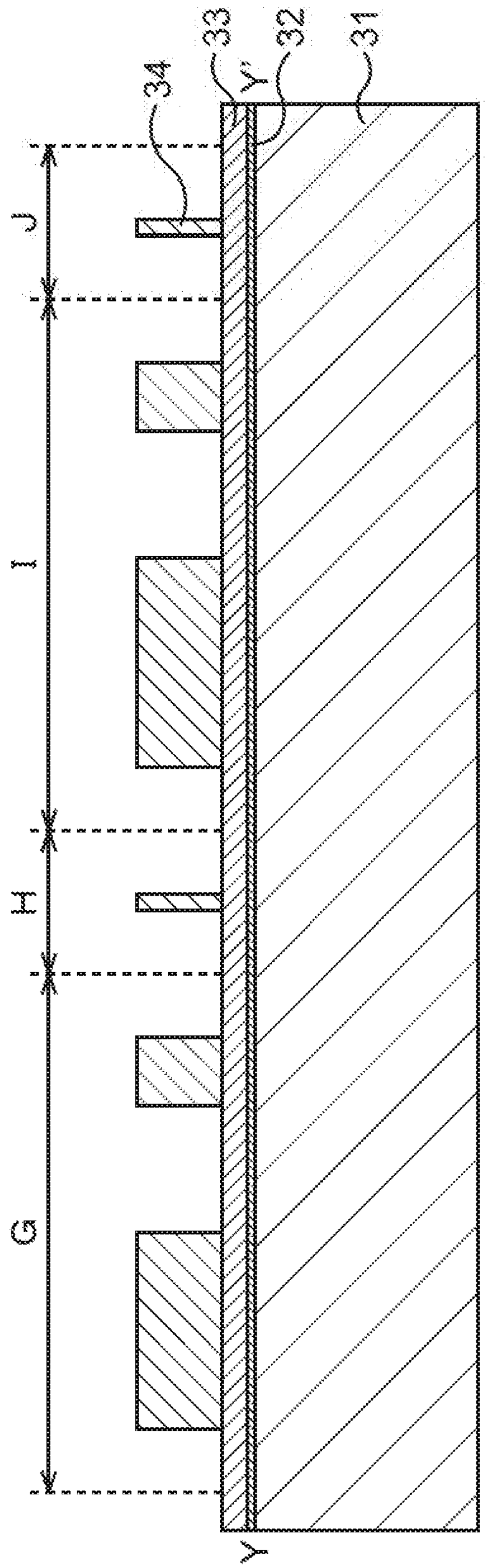
FIG. 103 is a cross-sectional view (part 103) explaining the manufacturing process of the semiconductor device in the first embodiment.
Figure 104:
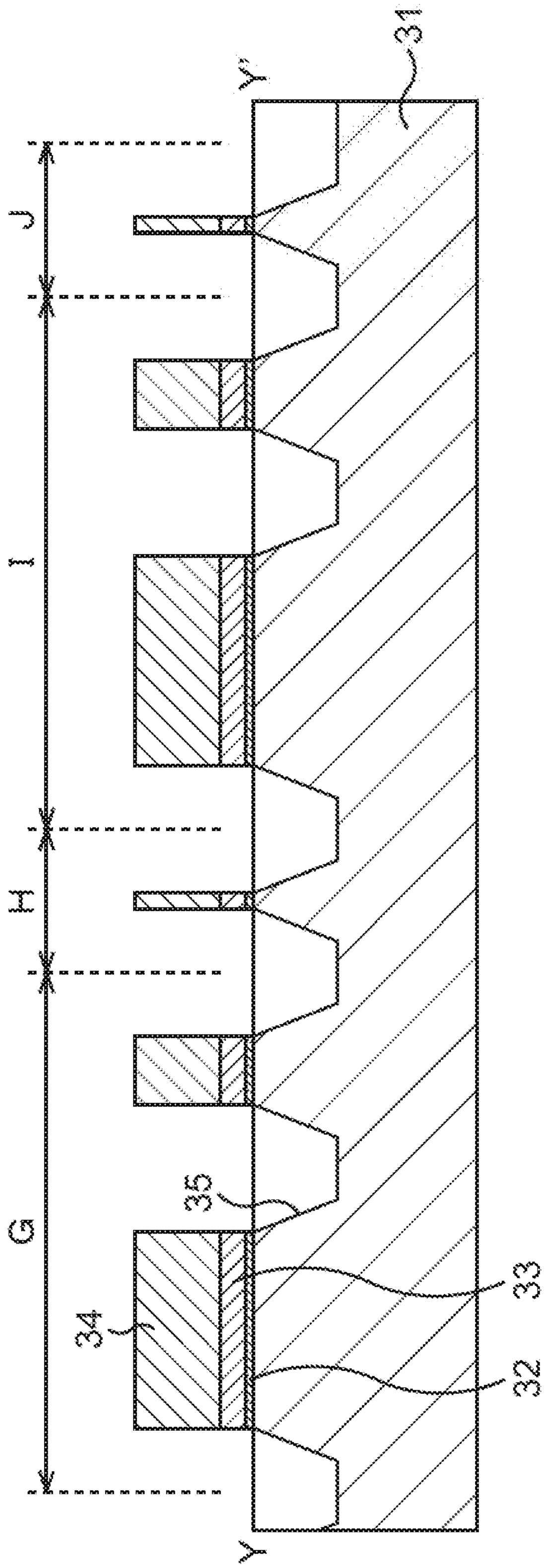
FIG. 104 is a cross-sectional view (part 104) explaining the manufacturing process of the semiconductor device in the first embodiment.
Figure 105:
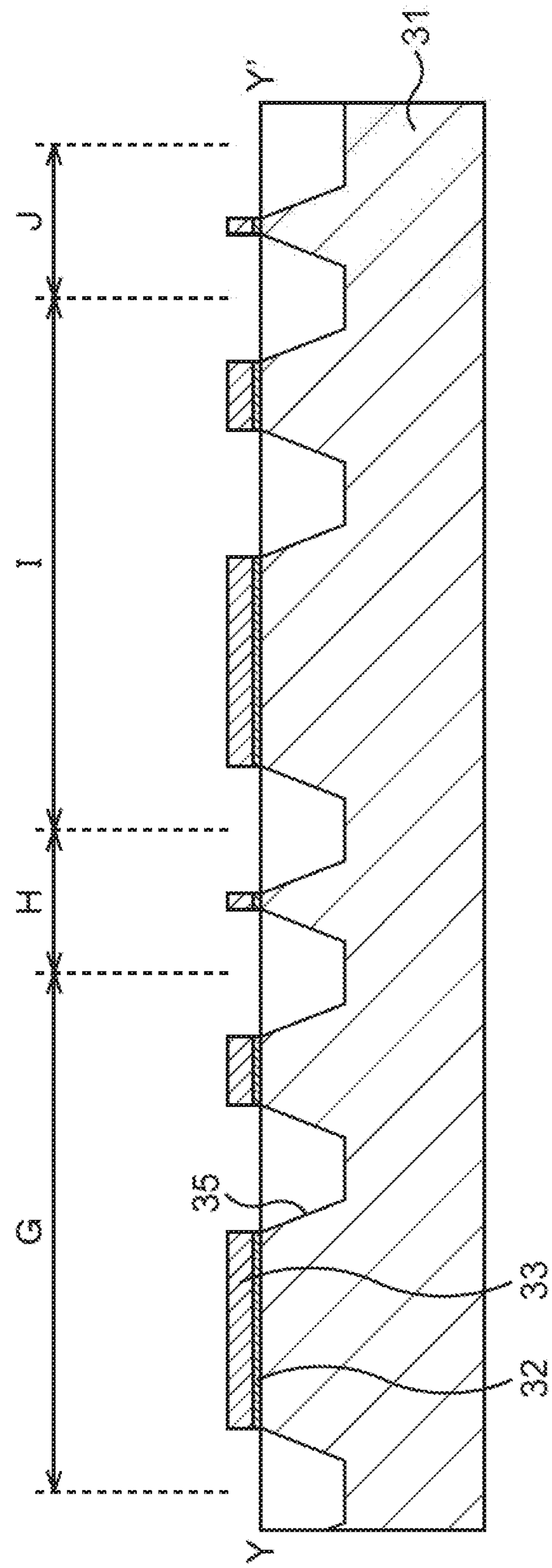
FIG. 105 is a cross-sectional view (part 105) explaining the manufacturing process of the semiconductor device in the first embodiment.
Figure 106:
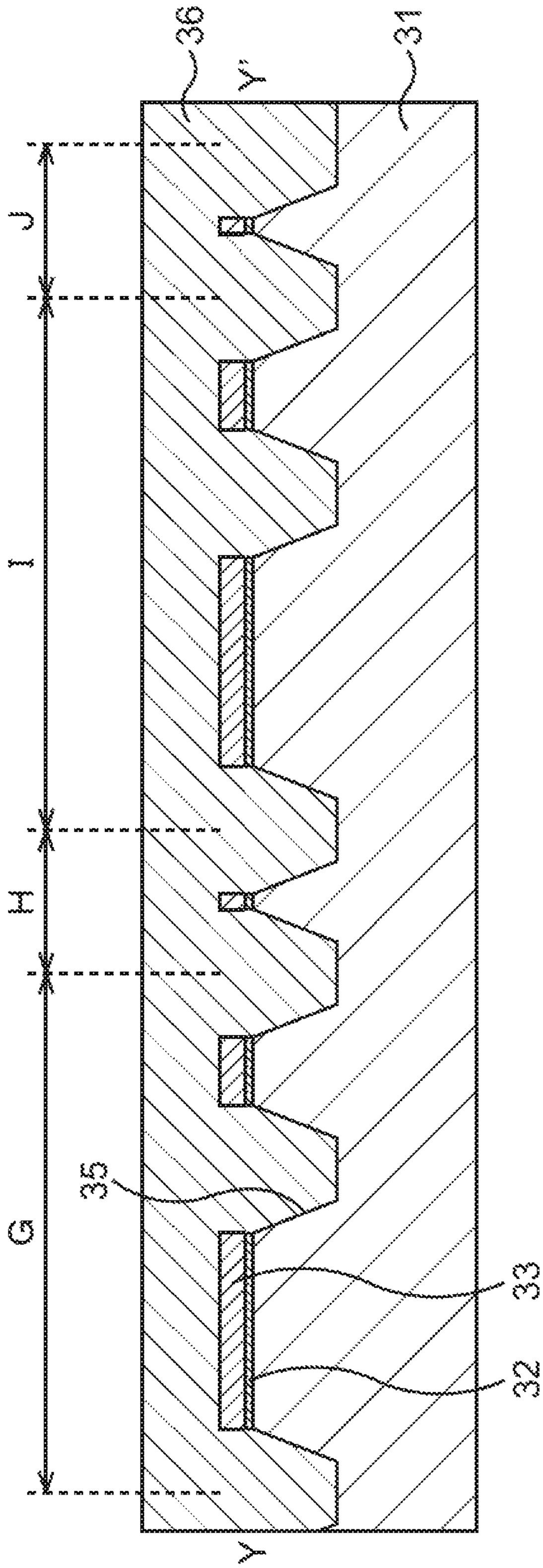
FIG. 106 is a cross-sectional view (part 106) explaining the manufacturing process of the semiconductor device in the first embodiment.
Figure 107:
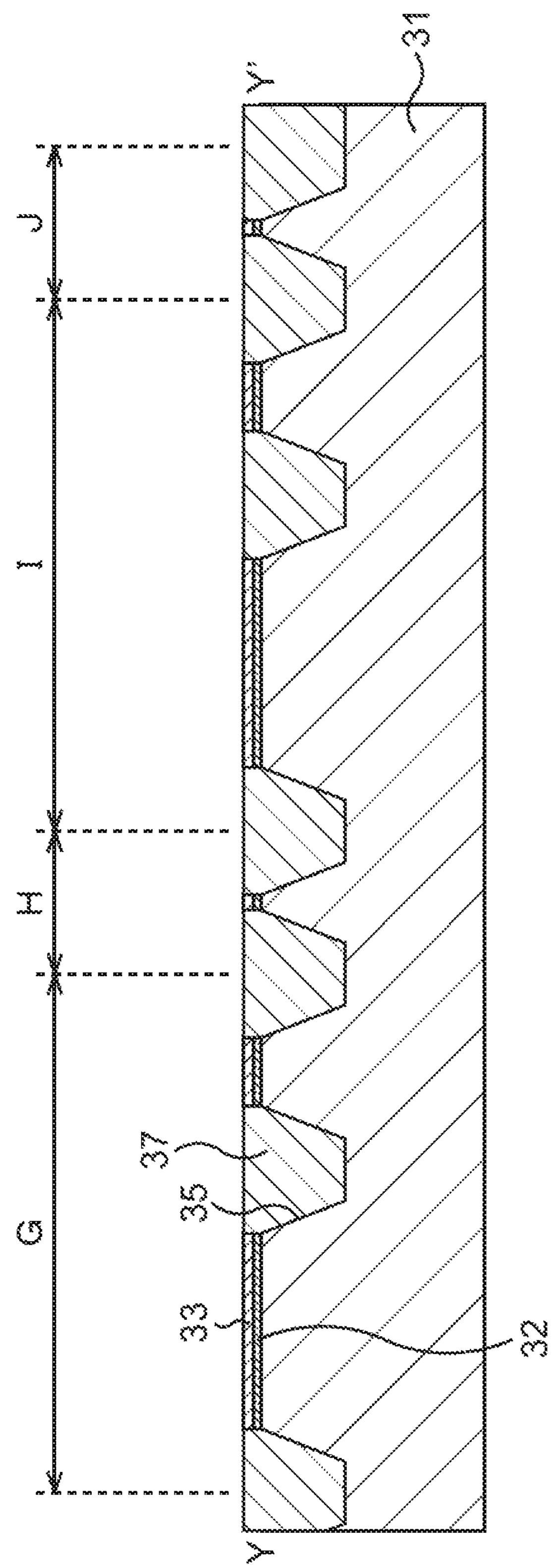
FIG. 107 is a cross-sectional view (part 107) explaining the manufacturing process of the semiconductor device in the first embodiment.
Figure 108:
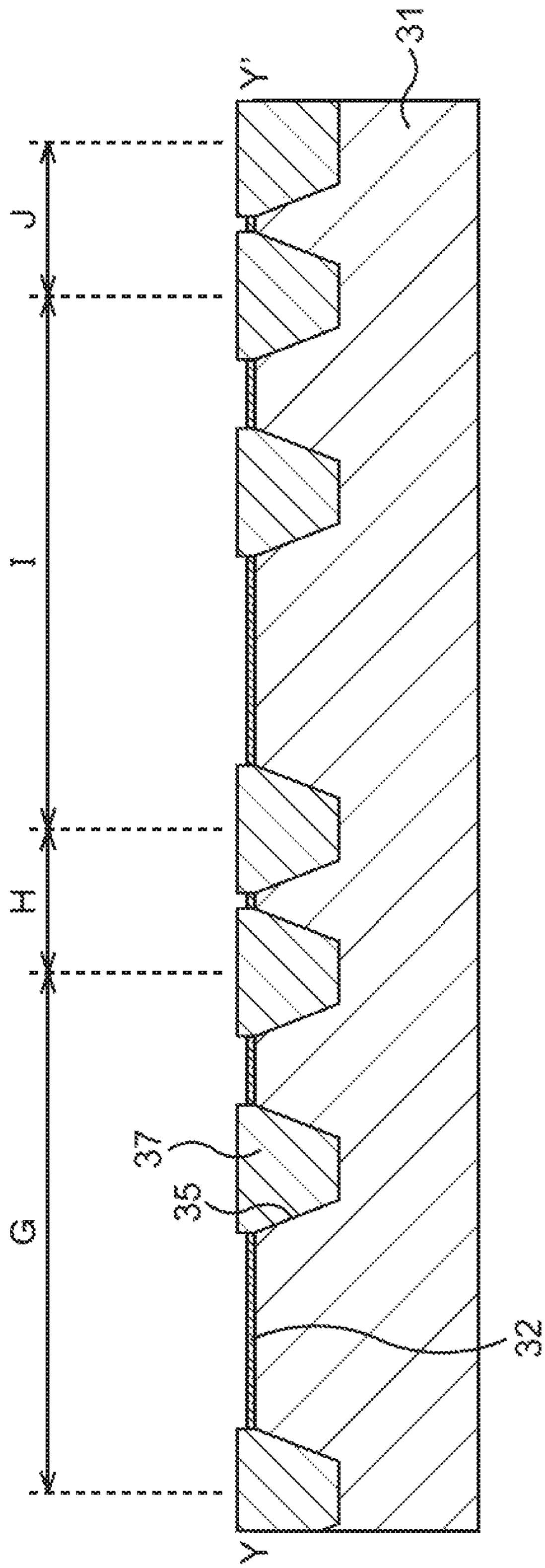
FIG. 108 is a cross-sectional view (part 108) explaining the manufacturing process of the semiconductor device in the first embodiment.
Figure 109:
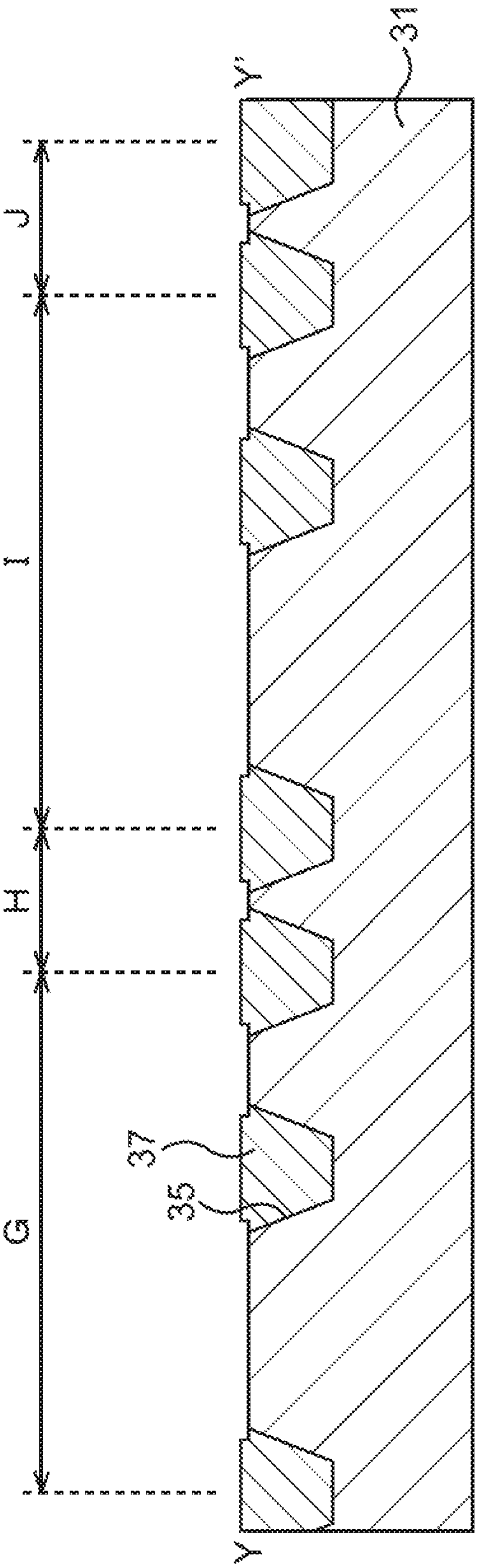
FIG. 109 is a cross-sectional view (part 109) explaining the manufacturing process of the semiconductor device in the first embodiment.
Figure 110:
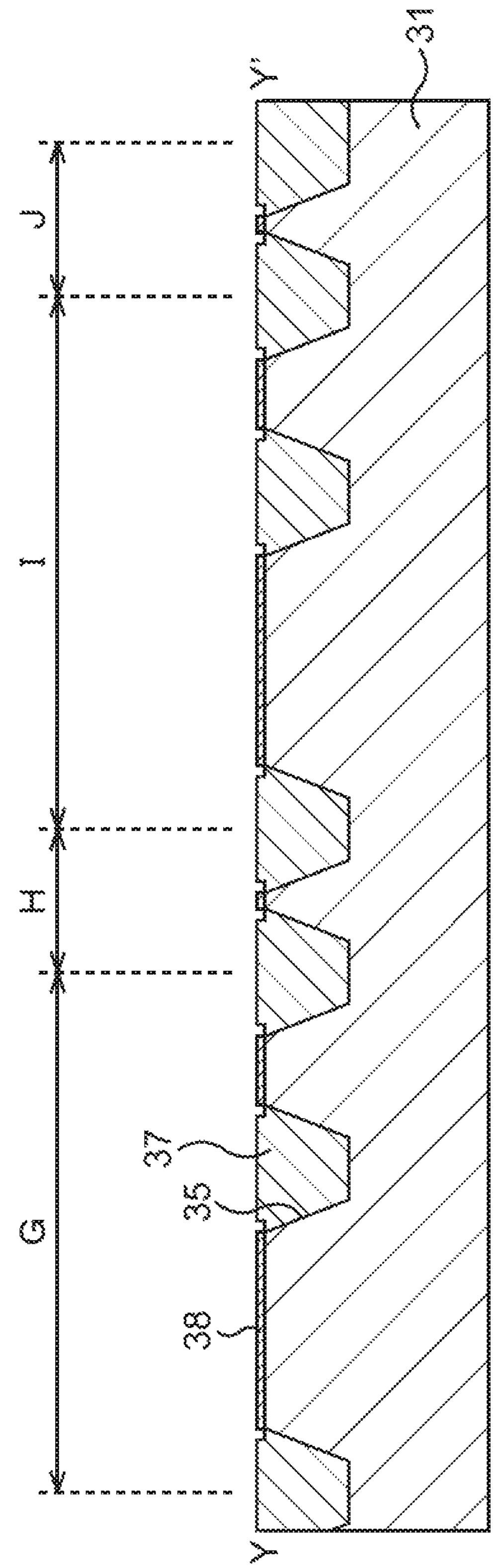
FIG. 110 is a cross-sectional view (part 110) explaining the manufacturing process of the semiconductor device in the first embodiment.
Figure 111:
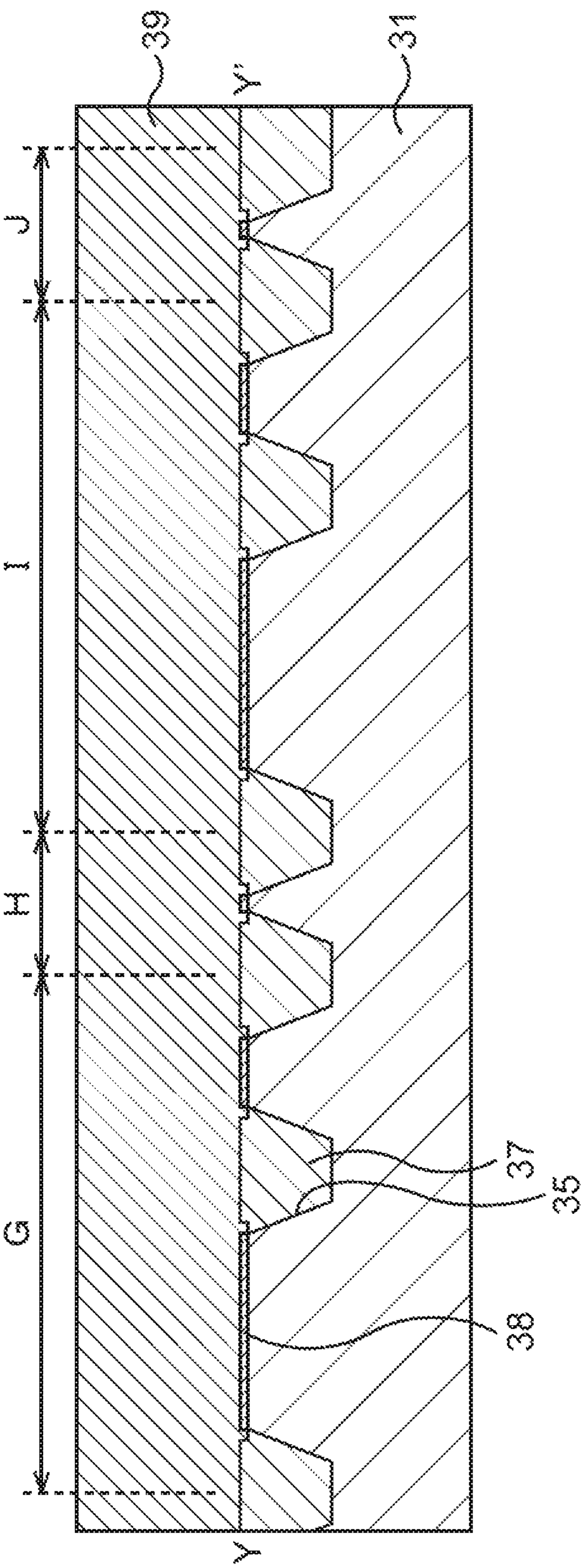
FIG. 111 is a cross-sectional view (part 111) explaining the manufacturing process of the semiconductor device in the first embodiment.

As illustrated in FIGS. 1A-IC, FIGS. 52A-52B and FIG. 103, on a semiconductor substrate 31 of single-crystal silicon, a diffusion furnace performs a thermal oxidation treatment at about 800 to 1000° C. by introducing, for example, an $O_2$ gas thereinto to grow an initial oxide film 32 in a film thickness of about 5 to 15 nm, and a thermal CVD furnace performs a thermal treatment at about 700 to 800° C. by introducing, for example, a silane gas, an ammonia gas, or the like thereinto to form a first nitride film 33 in a film thickness of about 70 to 150 nm. Subsequently, a resist 34 for demarcating an element isolation region is patterned by performing coating, exposure, and developing treatments. The resist 34 here is the one made by transferring mask patterns 201 for element isolation illustrated in FIG. 154, FIGS. 161A-161B and FIG. 175.

Subsequently, as illustrated in FIGS. 2A-2C, FIGS. 53A-53B, and FIG. 104, etching is performed on the first nitride film 33 in plasma using the resist 34 as a mask and using, for example, a $CF_4$ gas, a mixed gas containing a $SF_6$ gas, or the like. Then, etching is performed on the initial oxide film 32 in plasma using, for example, a $CF_4$ gas, a mixed gas containing a $CHF_3$ gas, or the like. Then, etching is performed on the semiconductor substrate 31 in plasma using, for example, a $Cl_2$ gas, a mixed gas containing a HBr gas, or the like in order. Through this treatment, an element isolation trench 35 having a depth of about 250 to 350 nm is formed in the semiconductor substrate.

Subsequently, as illustrated in FIGS. 3A-3C, FIGS. 54A-54B, and FIG. 105, the resist 34 is removed using, for example, an $O_2$ gas, a mixed gas containing an $O_2$ gas, or the like.

Subsequently, as illustrated in FIGS. 4A-4C, FIGS. 55A-55B, and FIG. 106, a plasma oxide film 36 is formed to be embedded in the element isolation trench 35 using, for example, a high-density plasma CVD method.

Subsequently, as illustrated in FIGS. 5A-5C, FIGS. 56A-56B, and FIG. 107, polishing is performed using a chemical mechanical polishing (CMP) method to remove the plasma oxide film 36 until the first nitride film 33 is exposed to the surface, and stopped on the first nitride film 33. At this time, generally, appropriate over-polishing is performed so as to prevent occurrence of residue. In this embodiment, for example, the first nitride film 33 is left at about 40 to 100 nm.

Subsequently, as illustrated in FIGS. 6A-6C, FIGS. 57A-57B, and FIG. 108, for example, a phosphoric acid treatment is performed to remove the first nitride film 33.

Subsequently, as illustrated in FIGS. 7A-7C, FIGS. 58A-58B, and FIG. 109, for example, a hydrofluoric acid treatment is performed to remove the initial oxide film 32. The plasma oxide film 36 is left in the element isolation trench 35 to form an element isolation 37 in a shallow trench isolation (STI) structure.

Subsequently, as illustrated in FIGS. 8A-8C, FIGS. 59A-59B, and FIG. 110, the diffusion furnace performs a thermal oxidation treatment at about 800 to 900° C. by introducing, for example, an $O_2$ gas thereinto to grow a sacrificial oxide film 38 in a film thickness of about 5 to 20 nm.

Subsequently, as illustrated in FIGS. 9A-9C, FIGS. 60A-60B, and FIG. 111, a resist 39 opening the region C where the p-type low-voltage transistor is formed is patterned by performing coating, exposure, and developing treatments. The resist 39 here is the one made by transferring a mask pattern 202 for p-type low-voltage transistor channel implantation illustrated in FIGS. 161A and 161B. Note that since the regions A, B indicating the flash memory cell element part and the regions I to L indicating the high withstand voltage transistor part have no opening, their drawing is omitted. Then, using the resist 39 as a mask, ion implantation of, for example, arsenic is performed at about 50 to 100 KeV, in about 6.00E12 to 9.00E12 $cm^{-2}$, and at a tilt angle of 7° to form a channel (not illustrated) of the p-type low-voltage transistor. Then, the resist 39 is removed using, for example, an $O_2$ gas, a mixed gas containing an $O_2$ gas, or the like.

Subsequently, as illustrated in FIGS. 10A-10C, FIGS. 61A-61B, and FIG. 112, a resist 40 opening the region D where the n-type low-voltage transistor is formed, the region F where the n-type middle withstand voltage transistor is formed, the region G where the first p-type high withstand voltage transistor is formed, the region I where the first n-type high withstand voltage transistor is formed, and the region J where the second tap is formed, is patterned by performing coating, exposure, and developing treatments. The resist 40 here is the one made by transferring mask patterns 203 for P-well implantation illustrated in FIG. 162A, FIG. 162B and FIG. 175. Note that since the regions A, B indicating the flash memory cell element part have no opening, their drawing is omitted. Then, using the resist 40 as a mask, ion implantation of, for example, of boron is performed four times in four directions at about 100 to 200 KeV, in about 6.00E12 to 9.00E12 $cm^{-2}$, and at a tilt angle of 7° to form P-wells 41 in various transistors. Then, the resist 40 is removed using, for example, an $O_2$ gas, a mixed gas containing an $O_2$ gas, or the like.

Subsequently, as illustrated in FIGS. 11A-11C, FIGS. 62A-62B, and FIG. 113, a resist 42 opening the region F where the n-type middle withstand voltage transistor is formed and the region I where the first n-type high withstand voltage transistor is formed, is patterned by performing coating, exposure, and developing treatments. The resist 42 here is the one made by transferring a mask pattern 204 for n-type middle withstand voltage transistor channel implantation illustrated in FIGS. 163A and 163B. Note that as illustrated in FIGS. 163A and 163B, the mask pattern 204 for n-type middle withstand voltage transistor channel implantation simultaneously opens a part of the first n-type high withstand voltage transistor as illustrated in FIG. 176. Accordingly, ion implantation is performed also on the region of the transistor other than the n-type middle withstand voltage transistor under the conditions subsequently described. Note that since the regions A, B indicating the flash memory cell element part have no opening, their drawing is omitted. Then, using a resist 42 as a mask, ion implantation of, for example, boron is performed at about 8 to 16 KeV, in about 4.00E12 to 8.00E12 $cm^{-2}$, and at a tilt angle of 7° to form a channel (not illustrated) of the n-type middle withstand voltage transistor. As described above, a channel (not illustrated) is similarly formed at a part of the first n-type high withstand voltage transistor. Then, the resist 42 is removed using, for example, an $O_2$ gas, a mixed gas containing an Oz gas, or the like.

Subsequently, as illustrated in FIGS. 12A-12C, FIGS. 63A-63B, and FIG. 114, a resist 43 opening the region A where the selection transistor is formed, the region B where the memory transistor is formed, the region C where the p-type low-voltage transistor is formed, the region E where the p-type middle withstand voltage transistor is formed, the region G where the first p-type high withstand voltage transistor is formed, the region H where the first tap is formed, and the region I where the first n-type high withstand voltage transistor is formed, is patterned by performing coating, exposure, and developing treatments. The resist 43 here is the one made by transferring mask patterns 205 for N-well implantation illustrated in FIG. 164A, FIG. 164B and FIG. 177. Note that since the regions A, B indicating the flash memory element cell part are entirely opened, their drawing is omitted. Then, using the resist 43 as a mask, ion implantation of, for example, phosphorus is performed four times in four directions at about 250 to 500 KeV, in about 6.00E12 to 1.20E13 $cm^{-2}$, and at a tilt angle of 7° to form N-wells 44 in the various transistors. Then, the resist 43 is removed using, for example, an $O_2$ gas, a mixed gas containing an $O_2$ gas, or the like.

Subsequently, as illustrated in FIGS. 13A-13C, FIGS. 64A-64B, and FIG. 115, the resist 45 opening the region E where the p-type middle withstand voltage transistor is formed and the region G where the first p-type high withstand voltage transistor is formed, is patterned by performing coating, exposure, and developing treatments. The resist 45 here is the one made by transferring a mask pattern 206 for p-type middle withstand voltage transistor channel implantation as illustrated in FIGS. 165A and 165B. Note that as illustrated in FIG. 178, the mask pattern 206 for p-type middle withstand voltage transistor channel implantation simultaneously opens a part of the first p-type high withstand voltage transistor. Accordingly, ion implantation is performed also on the region of transistor other than the p-type middle withstand voltage transistor under the conditions subsequently described. Note that since the regions A, B indicating the flash memory cell element part have no opening, their drawing is omitted. Then, using the resist 45 as a mask, ion implantation of, for example, arsenic is performed at about 80 to 160 KeV, in about 3.00E12 to 6.00E12 $cm^{-2}$, and at a tilt angle of 7° to form a channel (not illustrated) of the p-type middle withstand voltage transistor. As described above, the channel (not illustrated) is similarly formed at a part of the first p-type high withstand voltage transistor. Then, the resist 45 is removed using, for example, an $O_2$ gas, a mixed gas containing an Oz gas, or the like.

Subsequently, as illustrated in FIGS. 14A-14C, FIGS. 65A-65B, and FIG. 116, a resist 46 opening the region D where the n-type low-voltage transistor is formed is patterned by performing coating, exposure, and developing treatments. The resist 46 here is the one made by transferring a mask pattern 207 for n-type low-voltage transistor channel implantation as illustrated in FIGS. 166A and 166B. Note that since the regions A, B indicating the flash memory cell element part and the regions I to L indicating the high withstand voltage transistor part have no opening, their drawing is omitted. Then, using the resist 46 as a mask, ion implantation of, for example, indium is performed at about 80 to 160 KeV, in about 3.20E12 to 6.40E12 $cm^{-2}$, and at a tilt angle of 0°. Further, ion implantation of, for example, indium is performed at about 50 to 100 KeV, in about 1.20E13 to 2.40E13 $cm^{-2}$, and at a tilt angle of 7°. Further, ion implantation of, for example, boron is performed at about 8 to 16 KeV, in about 8.00E11 to 1.60E12 $cm^{-2}$, and at a tilt angle of 7° to form a channel (not illustrated) of the n-type low-voltage transistor. Then, the resist 46 is removed using, for example, an $O_2$ gas, a mixed gas containing an $O_2$ gas, or the like.

Subsequently, as illustrated in FIGS. 15A-15C, FIGS. 66A-66B, and FIG. 117, a resist 47 opening the region G where the first p-type high withstand voltage transistor is formed and a part of the region H where the first tap is formed, is patterned by performing coating, exposure, and developing treatments. The resist 47 here is the one made by transferring a mask pattern 208 for p-type high withstand voltage transistor deep N-well implantation as illustrated in FIG. 179. Note that since the regions A, B indicating the flash memory cell element part, the regions C, D indicating the low-voltage transistor part, and the regions E, F indicating the middle withstand voltage transistor part have no opening, their drawing is omitted. Then, using the resist 47 as a mask, ion implantation of, for example, phosphorus is performed at about 500 to 800 KeV, in about 3.00E12 to 8.00E12 $cm^{-2}$, and at a tilt angle of 0° to form a deep N-well 48 of the first p-type high withstand voltage transistor. Then, the resist 47 is removed using, for example, an $O_2$ gas, a mixed gas containing an $O_2$ gas, or the like.

Subsequently, as illustrated in FIGS. 16A-16C, FIGS. 67A-67B, and FIG. 118, a resist 49 entirely opening the region A where the selection transistor is formed and the region B where the memory transistor is formed is patterned by performing coating, exposure, and developing treatments. The resist 49 here is the one made by transferring a mask pattern 209 for flash memory cell implantation (not illustrated) entirely opening the flash memory element part. Note that since the regions C to F indicating the low-voltage transistor part and the middle withstand voltage transistor part and the regions G to J indicating the high withstand voltage transistor part have no opening, their drawing is omitted. Then, using the resist 49 as a mask, ion implantation of, for example, arsenic is performed at about 80 to 150 KeV, in about 2.00E12 to 6.00E12 $cm^{-2}$, and at a tilt angle of 7° to form a flash memory cell implantation layer (not illustrated). Then, the resist 49 is removed using, for example, an $O_2$ gas, a mixed gas containing an $O_2$ gas, or the like.

Subsequently, as illustrated in FIGS. 17A-17C, FIGS. 68A-68B, and FIG. 119, a resist 50 opening the region B where the memory transistor is formed is patterned by performing coating, exposure, and developing treatments. The resist 50 here is the one made by transferring a mask pattern 210 for memory transistor channel implantation as illustrated in FIG. 154. Note that since the regions C to F indicating the low-voltage transistor part and the middle withstand voltage transistor part and the regions G to J indicating the high withstand voltage transistor part have no opening, their drawing is omitted. Then, using the resist 50 as a mask, ion implantation of, for example, arsenic is performed at about 8 to 20 KeV, in about 1.00E13 to 3.00E13 $cm^{-2}$, and at a tilt angle of 0° to form a channel (not illustrated) of the memory transistor. Then, the resist 50 is removed using, for example, an $O_2$ gas, a mixed gas containing an $O_2$ gas, or the like.

Then, the diffusion furnace performs a thermal treatment at 950 to 1100° C. for about 3 to 20 seconds to activate the above-described ion-implanted ions in the silicon substrate.

Subsequently, as illustrated in FIGS. 18A-18C, FIGS. 69A-69B, and FIG. 120, for example, a hydrofluoric acid treatment is performed to remove the sacrificial oxide film 38.

Subsequently, as illustrated in FIGS. 19A-19C, FIGS. 70A-70B, and FIG. 121, the diffusion furnace performs a wet oxidation treatment at about 700 to 900° C. by introducing, for example, an $O_2$ gas thereinto to grow a tunnel oxide film 51 in a film thickness of about 2 to 15 nm. Note that the tunnel oxide film 51 is a film on the lower side of an Oxide-Nitride-Oxide (ONO) structure required for a function of writing, storing, and erasing information with respect to a flash memory cell. The tunnel oxide film 51 is a film through which electric charges pass when the electric charges from the substrate are made to flow in and flow out by the tunnel effect.

Subsequently, as illustrated in FIGS. 20A-20C, FIGS. 71A-71B, and FIG. 122, the thermal CVD furnace performs a thermal treatment at about 700 to 900° C. by introducing a silane gas, an ammonia gas, or the like thereinto, or a plasma CVD furnace performs a treatment at about 300 to 400° C. by introducing a silane gas, an ammonia gas, or the like thereinto, to form a second nitride film 52 in a film thickness of about 5 to 30 nm on the entire surface. Note that the second nitride film 52 is an intermediate film of the ONO structure required for the function of writing, storing, and erasing information with respect to the flash memory cell. The second nitride film 52 is a charge-storage film which can store electric charges from the substrate after passing through the tunnel oxide film 51.

Subsequently, as illustrated in FIGS. 21A-21C, FIGS. 72A-72B, and FIG. 123, a resist 53 opening the region A where the selection transistor is formed is patterned by performing coating, exposure, and developing treatments. The resist 53 here is the one made by transferring a mask pattern 211 for first memory cell nitride film etching as illustrated in FIG. 155. Note that since the regions C to F indicating the low-voltage transistor part and the middle withstand voltage transistor part and the regions G to J indicating the high withstand voltage transistor part are entirely opened, their drawing is omitted.

Subsequently, as illustrated in FIGS. 22A-22C, FIGS. 73A-73B, and FIG. 124, etching is performed on the second nitride film 52 in plasma using the resist 53 as a mask and using, for example, a $CF_4$ gas, a mixed gas containing a $CHF_3$ gas, or the like, and stopped on the tunnel oxide film 51.

Subsequently, as illustrated in FIGS. 23A-23C, FIGS. 74A-74B, and FIG. 125, the resist 53 is removed using, for example, an $O_2$ gas, a mixed gas containing an $O_2$ gas, or the like.

Subsequently, as illustrated in FIGS. 24A-24C, FIGS. 75A-75B, and FIG. 126, a resist 54 opening parts of the region A where the selection transistor is formed and the region B where the memory transistor is formed is patterned by performing coating, exposure, and developing treatments. The resist 54 here is the one made by transferring mask patterns 212 for second memory cell nitride film etching as illustrated in FIG. 156. Note that since the regions C to F indicating the low-voltage transistor part and the middle withstand voltage transistor part and the regions G to J indicating the high withstand voltage transistor part have no opening, their drawing is omitted.

Subsequently, as illustrated in FIGS. 25A-25C, FIGS. 76A-76B, and FIG. 127, etching is performed on the second nitride film 52 in plasma using the resist 54 as a mask and using, for example, a $CF_4$ gas, a mixed gas containing a $SF_6$ gas, or the like. In this event, the surface of the element isolation 37 of the STI structure is slightly etched by the influence of appropriate over-etching into a shape recessed from the surface of the shape before the etching.

Subsequently, as illustrated in FIGS. 26A-26C, FIGS. 77A-77B, and FIG. 128, the resist 54 is removed using, for example, an $O_2$ gas, a mixed gas containing an $O_2$ gas, or the like. Here, the second nitride film 52 and the tunnel oxide film 51 remain in the memory transistor, and the tunnel oxide film 51 remains on the semiconductor substrate 31 in the other transistors.

Subsequently, as illustrated in FIGS. 27A-27C, FIGS. 78A-78B, and FIG. 129, for example, a hydrofluoric acid treatment is performed to remove the tunnel oxide film 51. Since the second nitride film 52 remains in the memory transistor here, the tunnel oxide film 51 in the memory transistor is not etched. The tunnel oxide film 51 in the other transistors is removed.

Subsequently, as illustrated in FIGS. 28A-28C, FIGS. 79A-79B, and FIG. 130, the thermal CVD furnace performs a thermal treatment at about 700 to 900° C. by introducing, for example, a silane gas, an $O_2$ gas, or the like thereinto to form a CVD oxide film 55 in a film thickness of about 5 to 15 nm. Note that the CVD oxide film 55 is an upper film of the ONO structure required for the function of writing, storing, and erasing information with respect to the flash memory cell. The CVD oxide film 55 is a film for ensuring insulating properties with the charge-storage film when voltage is applied to a later-described gate electrode of the memory transistor. Existence of the CVD oxide film 55 makes it possible to provide a function for enabling appropriate storage and discharge of electric charges when voltage is applied in a direction of storing electric charges into the charge-storage film and when voltage is applied in a direction of discharging electric charges from the charge-storage film.

Subsequently, as illustrated in FIGS. 29A-29C, FIGS. 80A-80B, and FIG. 131, a resist 56 opening a part of the region A where the selection transistor is formed is patterned by performing coating, exposure, and developing treatments. The resist 56 here is the one made by transferring a mask pattern 213 for memory cell CVD oxide film etching as illustrated in FIG. 157. Note that since the regions C to F indicating the low-voltage transistor part and the middle withstand voltage transistor part are entirely opened and the regions G to J indicating the high withstand voltage transistor part have no opening, their drawing is omitted.

Note that the resist 56 is formed to encapsulate the second nitride film 52 in plan view. In the hydrofluoric acid treatment to be subsequently performed, etching is performed in a state where the CVD oxide film 55 covers the tunnel oxide film 51, thereby preventing the tunnel oxide film 51 from being etched to retreat.

Subsequently, as illustrated in FIGS. 30A-30C, FIGS. 81A-81B, and FIG. 132, for example, a hydrofluoric acid treatment is performed using the resist 56 as a mask to remove the CVD oxide film 55. Since the regions G to J indicating the high withstand voltage transistor part have no opening here, the CVD oxide film 55 remains therein. On the other hand, since a part of the region A where the selection transistor is formed and the regions C to F indicating the low-voltage transistor part and the middle withstand voltage transistor part are entirely opened, the CVD oxide film 55 is removed to expose the surface of the semiconductor substrate 31. Then, the resist 56 is removed using, for example, an $O_2$ gas, a mixed gas containing an $O_2$ gas, or the like.

Subsequently, as illustrated in FIGS. 31A-31C, FIGS. 82A-82B, and FIG. 133, a thermal diffusion furnace performs a wet oxidation treatment at about 700 to 900° C. by introducing, for example, an $O_2$ gas thereinto to grow a first thermal oxide film 57 in a film thickness of about 4 to 8 nm. The first thermal oxide film 57 is not formed in the memory transistor where the CVD oxide film 55, the second nitride film 52, and the tunnel oxide film 51 remain. On the other hand, the first thermal oxide film 57 is formed in the region A where the surface of the semiconductor substrate 31 is exposed and the selection transistor is formed and in the regions C to F where the low-voltage transistor and the middle withstand voltage transistor are formed. Further, in the regions G to J where a high withstand voltage transistor is formed, the CVD oxide film 55 remains and the silicon at the interface with the semiconductor substrate 31 is oxidized to grow a first interface oxide layer 58. Therefore, the regions G to J where the high withstand voltage transistor is formed increase in thickness due to the formation of the first interface oxide layer 58 along with the CVD oxide film 55.

Subsequently, as illustrated in FIGS. 32A-32C, FIGS. 83A-83B, and FIG. 134, a resist 59 opening the region C where the p-type low-voltage transistor is formed and the region D where the n-type low-voltage transistor is formed, is patterned by performing coating, exposure, and developing treatments. The resist 59 here is the one made by transferring a mask pattern 214 for low-voltage transistor gate insulating film formation etching as illustrated in FIGS. 167A and 167B. Here, the regions E, F where the middle withstand voltage transistor is formed is covered by the resist 59. Note that since the regions A, B where the flash memory element part is formed and the regions G to J where the high withstand voltage transistor is formed have no opening, their drawing is omitted.

Subsequently, as illustrated in FIGS. 33A-33C, FIGS. 84A-84B, and FIG. 135, for example, a hydrofluoric acid treatment is performed using the resist 59 as a mask to remove the first thermal oxide film 57. Since the regions A, B indicating the memory transistor part, the regions E, F indicating the middle withstand voltage transistor, and the regions G to J indicating the high withstand voltage transistor part have no opening in the resist 59, the CVD oxide film 55, the second nitride film 52, and the tunnel oxide film 51 including the first thermal oxide film 57 remain. On the other hand, since the regions C, D indicating the low-voltage transistor are opened, the first thermal oxide film 57 is removed to expose the surface of the semiconductor substrate 31. Then, the resist 59 is removed using, for example, an $O_2$ gas, a mixed gas containing an Oz gas, or the like.

Subsequently, as illustrated in FIGS. 34A-34C, FIGS. 85A-85B, and FIG. 136, the thermal diffusion furnace performs a thermal oxidation treatment at about 700 to 900° C. by introducing, for example, an $O_2$ gas thereinto to grow a second thermal oxide film 60 in a film thickness of about 1 to 3 nm.

Here, the second thermal oxide film 60 is not formed in the memory transistor where the CVD oxide film 55, the second nitride film 52, and the tunnel oxide film 51 remain. On the other hand, the second thermal oxide film 60 is formed in the regions C, D where the surface of the semiconductor substrate 31 is exposed and the low-voltage transistor is formed.

Further, in the regions E, F where the middle withstand voltage transistor is formed, the first thermal oxide film 57 remains and the silicon at the interface with the semiconductor substrate 31 is oxidized to grow a second interface oxide layer 61. Therefore, in the regions E, F where the middle withstand voltage transistor is formed, a third thermal oxide film 62 is grown in a film thickness of about 4.1 to 8.5 nm by combination of the first thermal oxide film 57 and the second interface oxide layer 61. Therefore, the regions E, F where the middle withstand voltage transistor is formed increase in thickness.

Further, in the regions G to J where the high withstand voltage transistor is formed, the first interface oxide layer 58 remains and the silicon at the interface between the semiconductor substrate 31 and the first interface oxide layer 58 is oxidized to grow a third interface oxide layer 63. Therefore, in the regions G to J where the high withstand voltage transistor is formed, a fourth thermal oxide film 64 is grown by combination of the first interface oxide layer 58 and the third interface oxide layer 63. Therefore, the regions G to J where the high withstand voltage transistor is formed increase in thickness due to the formation of the fourth thermal oxide film 64 along with the CVD oxide film 55. By combination of the CVD oxide film 55 and the fourth thermal oxide film 64, an oxide film 65 having the largest film thickness of about 6.5 to 17.3 nm remains.

When this process is completed, gate insulating films different in film thickness are formed in the various transistors.

In the regions C, D where the low-voltage transistor lowest in operating voltage is formed, the thinnest second thermal oxide film 60 suitable for fast operation is formed. Further, the second thermal oxide film 60 is formed by the diffusion furnace, and functions as an excellent gate insulating film with less deterioration in transistor characteristics.

In the regions E, F where the middle withstand voltage transistor is formed, the third thermal oxide film 62 having an intermediate film thickness is formed. The third thermal oxide film 62 is formed along with the first thermal oxide film 57 and the second interface oxide layer 61 by the diffusion furnace, and functions as an excellent gate insulating film with less deterioration in transistor characteristics.

In the region A where the selection transistor is formed, the third thermal oxide film 62 having an intermediate film thickness is formed. As with the above-described contents, the third thermal oxide film 62 is formed along with the first thermal oxide film 57 and the second interface oxide layer 61 by the diffusion furnace, and functions as an excellent gate insulating film with less deterioration in transistor characteristics. In particular, the selection transistor used in the flash memory element part is useful in suppressing the power consumption by suppressing leak characteristics as much as possible, and the excellent gate insulating film is suitable in constituting the flash memory element part.

In the region B where the memory transistor is formed, the ONO structure is formed by the CVD oxide film 55, the second nitride film 52, and the tunnel oxide film 51. The tunnel oxide film 51 is suppressed in influence of oxidation by another high thermal treatment to minimum by leaving the second nitride film 52 and the CVD oxide film 55, and can suitably maintain the functions of write, read, and erasure of the flash memory element.

In the regions G to J where the high withstand voltage transistor is formed, the fourth thermal oxide film 64 is formed at the interface with the silicon substrate accompanying the oxidation by the other high thermal treatment along with the CVD oxide film 55 being a film on the upper side of the flash memory element. By combination of the CVD oxide film 55 and the fourth thermal oxide film 64, the oxide film 65 having a film thickness withstanding the highest operation voltage can be formed.

In the process of this embodiment, a step of oxidation accompanied by a higher thermal treatment is not added to the regions G to J where the high withstand voltage transistor is formed, thereby making it possible to prevent variation of the characteristics of other transistor elements and to form the thickest oxide film 65 while reducing the number of steps.

Note that the third thermal oxide film 62 is the one made by combining the first thermal oxide film 57 and the second interface oxide layer 61 formed when forming the second thermal oxide film 60, and can be adjusted to have a desired film thickness by appropriately adjusting forming conditions of the first thermal oxide film 57 and forming conditions of the second thermal oxide film 60.

Further, the fourth thermal oxide film 64 is the one made by combining the first interface oxide layer 58 formed when forming the first thermal oxide film 57 and the third interface oxide layer 63 formed when forming the second thermal oxide film 60, and can be adjusted to have a desired film thickness by appropriately adjusting forming conditions of the first thermal oxide film 57 and forming conditions of the second thermal oxide film 60.

Subsequently, as illustrated in FIGS. 35A-35C, FIGS. 86A-86B, and FIG. 137, the thermal CVD furnace performs a thermal treatment at about 500 to 700° C. by introducing, for example, a silane gas thereinto to form a gate electrode film 66 made of polysilicon in a film thickness of about 100 to 160 nm. Note that the gate electrode film 66 is a film functioning as gate electrodes of the various transistors, the selection transistor of the flash memory cell part, and the memory transistor of the flash memory part after processing.

Subsequently, as illustrated in FIGS. 36A-36C, FIGS. 87A-87B, and FIG. 138, a resist 67 for processing the gate electrodes is patterned by performing coating, exposure, and developing treatments. The resist 67 here is the one made by transferring mask patterns 215 for etching gate electrodes of the various transistors, the selection transistor of the flash memory cell part, and the memory transistor of the flash memory part as illustrated in FIG. 158, FIGS. 168A-168B, and FIG. 180.

Subsequently, as illustrated in FIGS. 37A-37C, FIGS. 88A-88B, and FIG. 139, etching is performed on the gate electrode film 66 in plasma using the resist 67 as a mask and using, for example, a HBr gas, a mixed gas containing a $SF_6$ gas, or the like, and stopped on the element isolation 37, on the CVD oxide film 55, on the second thermal oxide film 60, and on the third thermal oxide film 62.

Subsequently, as illustrated in FIGS. 38A-38C, FIGS. 89A-89B, and FIG. 140, the resist 67 is removed using, for example, an $O_2$ gas, a mixed gas containing an $O_2$ gas, or the like. The mask patterns 215 for gate electrode etching are transferred to the gate electrode film to process gate electrodes 68*a* to 68*h* of the selection transistor and the memory transistor of the memory cell element part, and the various transistors.

Subsequently, as illustrated in FIGS. 39A-39C, FIGS. 90A-90B, and FIG. 141, for example, a hydrofluoric acid treatment is performed using the gate electrodes 68*a* to 68*h* as a mask to etch the CVD oxide film 55, the second thermal oxide film 60, the third thermal oxide film 62, and the fourth thermal oxide film 64 which are exposed to the surface, to thereby expose the semiconductor substrate 31 and the second nitride film 52. Though the element isolation 37 is exposed to the surface here, the reduction amount from the surface is suppressed to minimum by setting an appropriate over-etching amount.

Subsequently, a resist 69 opening the regions A, B where the flash memory element part is formed is patterned by performing coating, exposure, and developing treatments. The regions C to F where the low-voltage transistor and the middle withstand voltage transistor are formed and the regions G to J where the high withstand voltage transistor is formed are covered by the resist 69. Note that since the regions A, B where the flash memory element part is formed are entirely opened, their drawing is omitted. Further, since the regions C to F where low-voltage transistor and the middle withstand voltage transistor are formed and the regions G to J where the high withstand voltage transistor is formed have no opening, their drawing is omitted.

Subsequently, as illustrated in FIGS. 40A-40C, FIGS. 91A-91B, and FIG. 142, etching is performed on the second nitride film 52 and the tunnel oxide film 51 remaining and exposed in the region B where the memory transistor of the flash memory element part is formed, in plasma using the resist 69 as a mask and using, for example, a $CF_4$ gas, a mixed gas containing a $SF_6$ gas, or the like, and stopped on the semiconductor substrate 31. Though there is a portion where the element isolation 37 is exposed (not illustrated) here, the reduction amount from the surface is suppressed to minimum by setting an appropriate over-etching amount. Then, the resist 69 is removed using, for example, an $O_2$ gas, a mixed gas containing an $O_2$ gas, or the like. Between the gate electrode 68*b* in the region B where the memory transistor of the flash memory element part is formed and the semiconductor substrate 31, the ONO structure of the flash memory element composed of the CVD oxide film 55, the second nitride film 52, and the tunnel oxide film 51 is formed.

Subsequently, as illustrated in FIGS. 41A-41C, FIGS. 92A-92B, and FIG. 143, a resist 70 opening a part of the region A where the selection transistor is formed and a part of the region B where the memory transistor is formed is patterned by performing coating, exposure, and developing treatments. The resist 70 here is the one made by transferring a mask pattern 216 for first flash memory cell LDD implantation as illustrated in FIG. 159. Note that since the regions C to F indicating the low-voltage transistor part and the middle withstand voltage transistor part and the regions G to J indicating the high withstand voltage transistor part have no opening, their drawing is omitted. Then, using the resist 70 as a mask, ion implantation of, for example, BF is performed at about 2 to 10 KeV, in about 1.60E15 to 3.20E15 $cm^{-2}$, and at a tilt angle of 0° to form a first flash memory cell LDD layer 71. Then, the resist 70 is removed using, for example, an $O_2$ gas, a mixed gas containing an $O_2$ gas, or the like.

Subsequently, as illustrated in FIGS. 42A-42C, FIGS. 93A-93B, and FIG. 144, a resist 72 opening the region F where the n-type middle withstand voltage transistor is formed is patterned by performing coating, exposure, and developing treatments. The resist 72 here is the one made by transferring a mask pattern 217 for n-type middle withstand voltage transistor LDD implantation illustrated in FIGS. 169A and 169B. Note that a part of the first n-type high withstand voltage transistor is simultaneously opened as illustrated in FIG. 181. Accordingly, ion implantation is performed also on the region of the transistor other than the n-type middle withstand voltage transistor under the conditions subsequently described. Note that since the regions A, B indicating the flash memory cell element part have no opening, their drawing is omitted. Then, using the resist 72 as a mask, ion implantation of, for example, phosphorus is performed at about 10 to 30 KeV, in about 4.00E13 to 8.00E13 $cm^{-2}$, and at a tilt angle of 0° to form an n-type middle withstand voltage transistor LDD layer 73*a*.

Simultaneously, an n-type high withstand voltage transistor LDD layer 73*b* is formed. Then, the resist 72 is removed using, for example, an $O_2$ gas, a mixed gas containing an $O_2$ gas, or the like.

Subsequently, as illustrated in FIGS. 43A-43C, FIGS. 94A-94B, and FIG. 145, a resist 74 opening the region E where the p-type middle withstand voltage transistor is formed is patterned by performing coating, exposure, and developing treatments. The resist 74 here is the one made by transferring a mask pattern 218 for p-type middle withstand voltage transistor LDD implantation illustrated in FIGS. 170A and 170B. Note that the mask pattern 218 for p-type middle withstand voltage transistor LDD implantation simultaneously opens a part of the region A where the selection transistor is formed and a part of the region B where the memory transistor is formed as illustrated in FIG. 160 and a part of the region G where the first p-type high withstand voltage transistor is formed as illustrated in FIG. 182. Accordingly, ion implantation is performed also on the regions of transistors other than the p-type middle withstand voltage transistor under the conditions subsequently described. Then, using the resist 74 as a mask, ion implantation of, for example, BF is performed four times in four directions at about 10 to 30 KeV, in about 6.00E13 to 1.20E14 $cm^{-2}$, and at a tilt angle of 0° to form a p-type middle withstand voltage transistor LDD layer 75*a*. Simultaneously, a second flash memory cell LDD layer 75*b* and a p-type high withstand voltage transistor LDD layer 75*c* are formed. Then, the resist 74 is removed using, for example, an $O_2$ gas, a mixed gas containing an $O_2$ gas, or the like.

Subsequently, as illustrated in FIGS. 44A-44C, FIGS. 95A-95B, and FIG. 146, a resist 76 opening the region D where the n-type low-voltage transistor is formed is patterned by performing coating, exposure, and developing treatments. The resist 76 here is the one made by transferring a mask pattern 219 for n-type low-voltage transistor LDD implantation as illustrated in FIGS. 171A and 171B. Note that since the regions A, B indicating the flash memory element part and the regions G to J indicating the high withstand voltage transistor part have no opening, their drawing is omitted. Then, using the resist 76 as a mask, ion implantation of, for example, germanium is performed at about 10 to 20 KeV, in about 4.00E14 to 8.00E14 $cm^{-2}$, and at a tilt angle of 0°. Then, ion implantation of indium is performed four times in four directions at about 30 to 60 KeV, in about 8.00E12 to 1.60E13 $cm^{-2}$, and at a tilt angle of 28°. Then, ion implantation of arsenic is performed four times in four directions at about 1 to 3 KeV, in about 2.00E14 to 4.00E14 $cm^{-2}$, and at a tilt angle of 0°. Then, ion implantation of arsenic is performed at about 4 to 8 KeV, in about 1.20E15 to 2.00E15 $cm^{-2}$, and at a tilt angle of 0° to form an n-type low-voltage transistor LDD layer 77. Then, the resist 76 is removed using, for example, an $O_2$ gas, a mixed gas containing an $O_2$ gas, or the like.

Subsequently, as illustrated in FIGS. 45A-45C, FIGS. 96A-96B, and FIG. 147, a resist 78 opening the region C where the p-type low-voltage transistor is formed is patterned by performing coating, exposure, and developing treatments. The resist 78 here is the one made by transferring a mask pattern 220 for p-type low-voltage transistor LDD implantation as illustrated in FIGS. 172A and 172B. Note that since the regions A, B indicating the flash memory element part and the regions G to J indicating the high withstand voltage transistor part have no opening, their drawing is omitted. Then, using the resist 78 as a mask, ion implantation of, for example, arsenic is performed four times in four directions at about 50 to 80 KeV, in about 4.00E12 to 8.00E12 $cm^{-2}$, and at a tilt angle of 28'. Then, ion implantation of boron is performed four times in four directions at about 0.5 to 1 KeV, in about 2.40E14 to 4.80E14 $cm^{-2}$ and at a tilt angle of 0° to form a p-type low-voltage transistor LDD layer 79.

Subsequently, as illustrated in FIGS. 46A-46C, FIGS. 97A-97B, and FIG. 148, the resist 78 is removed using, for example, an $O_2$ gas, a mixed gas containing an $O_2$ gas, or the like.

Subsequently, as illustrated in FIGS. 47A-47C, FIGS. 98A-98B, and FIG. 149, the thermal CVD furnace performs a thermal treatment at about 500 to 600° C. by introducing, for example, a bis(tertiary-butylamino) silane gas thereinto to form a sidewall oxide film 80 in a film thickness of about 60 to 120 nm. Then, etching back is performed on the sidewall oxide film 80 on the entire surface in plasma using, for example, a $CF_4$ gas, a mixed gas containing a $CHF_3$ gas, or the like. An appropriate over-etching amount is set, and a sidewall structure is formed while the sidewall oxide film 80 is left on the sidewalls of the gate electrodes 68*a* to 68*h*.

Subsequently, as illustrated in FIGS. 48A-48C, FIGS. 99A-99B, and FIG. 150, a resist 81 opening the region A where the selection transistor is formed, the region B where the memory transistor is formed, the region C where the p-type low-voltage transistor is formed, the region E where the p-type middle withstand voltage transistor is formed, the region G where the first p-type high withstand voltage transistor is formed, and the region J where the second tap is formed, is patterned by performing coating, exposure, and developing treatments. The resist 81 here is the one made by transferring mask patterns 221 for PSD implantation illustrated in FIGS. 173A-173B and FIG. 183. Note that since the regions A, B indicating the flash memory cell element part are entirely opened, their drawing is omitted. Then, using the resist 81 as a mask, ion implantation of, for example, boron is performed at about 6 to 12 KeV, in about 8.00E12 to 1.60E13 $cm^{-2}$, and at a tilt angle of 0° Then, ion implantation of, for example, germanium is performed at about 15 to 30 KeV, in about 4.00E14 to 8.00E14 $cm^{-2}$, and at a tilt angle of 0°. Then, ion implantation of boron is performed four times in four directions at about 3 to 6 KeV, in about 1.20E15 to 2.40E15 $cm^{-2}$, and at a tilt angle of 0° to form a PSD layer 82. Then, the resist 81 is removed using, for example, an $O_2$ gas, a mixed gas containing an $O_2$ gas, or the like.

Subsequently, as illustrated in FIGS. 49A-49C, FIGS. 100A-100B, and FIG. 151, a resist 83 opening the region D where the n-type low-voltage transistor is formed, the region F where the n-type middle withstand voltage transistor is formed, the region H where the first tap is formed, and the region I where the first n-type high withstand voltage transistor is formed, is patterned by performing coating, exposure, and developing treatments. The resist 83 here is the one made by transferring mask patterns 222 for NSD implantation illustrated in FIGS. 174A-174B and FIG. 184. Note that since the regions A, B indicating the flash memory cell element part have no opening, their drawing is omitted. Then, using the resist 83 as a mask, ion implantation of, for example, phosphorus is performed at about 6 to 16 KeV, in about 1.00E16 to 2.00E16 $cm^{-2}$, and at a tilt angle of 0° to form an NSD layer 84.

Subsequently, as illustrated in FIGS. 50A-50C, FIGS. 101A-101B, and FIG. 152, the resist 83 is removed using, for example, an $O_2$ gas, a mixed gas containing an $O_2$ gas, or the like.

Then, a lamp annealing apparatus performs a thermal treatment at 900 to 1100° C. for about 0.1 to 3 seconds to activate the above-described ion-implanted ions in the silicon substrate.

Subsequently, as illustrated in FIGS. 51A-51C, FIGS. 102A-102B, and FIG. 153, a cobalt film is formed on the entire surface, in a film thickness of about 3 to 6 nm by a sputtering method. Then, the lamp annealing apparatus performs a thermal treatment at about 500 to 600° C. for about 10 to 60 seconds. Then, a chemical solution treatment with an ammonia hydrogen peroxide solution and a sulfuric acid hydrogen peroxide solution is performed to remove the cobalt film that has not reacted with silicon while leaving a silicide layer that has reacted with silicon. The unreacted cobalt film on the element isolation 37 having no silicon and on the sidewall oxide film 80 is removed. Then, the lamp annealing apparatus performs a treatment at about 600 to 8001 for about 10 to 60 seconds to form a cobalt silicide film 85 on the surfaces of the gate electrodes 68*a* to 68*h* and on the surface of the semiconductor substrate 31.

Figure 51A:
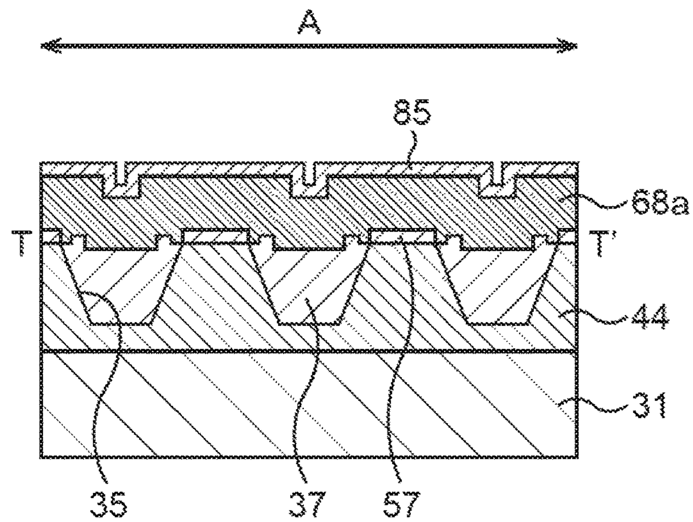
FIGS. 51A-51C are cross-sectional views (part 51) explaining the manufacturing process of the semiconductor device in the first embodiment.
Figure 51B:
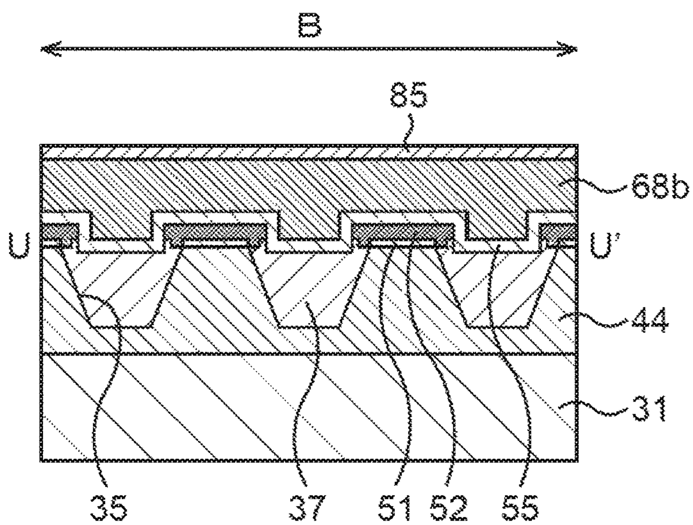
Figure 51C:
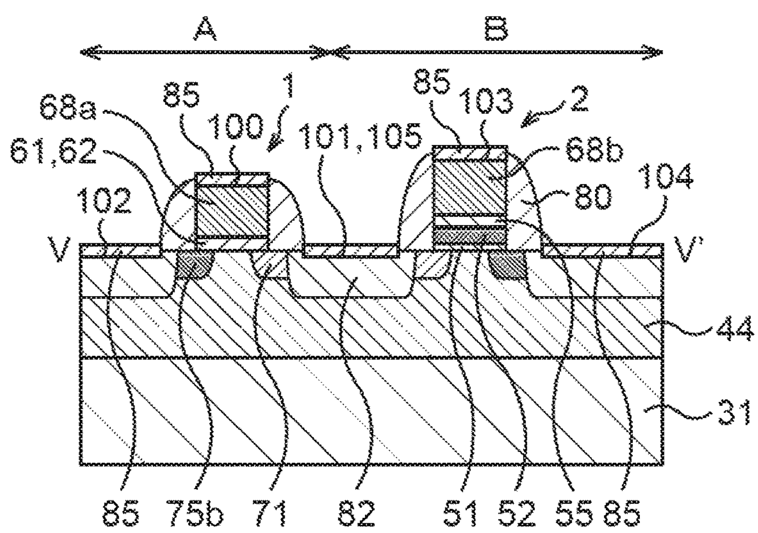

As illustrated in FIGS. 51A-51C, a selection transistor 1 functions as a switching element by a gate 100 of the selection transistor, a source 101 of the selection transistor, a drain 102 of the selection transistor, and the N-well 44.

As illustrated in FIGS. 51A-51C, a memory transistor 2 functions as a storage element by a gate 103 of the memory transistor, a source 104 of the memory transistor, a drain 105 of the memory transistor, and the N-well 44. The drain 105 of the memory transistor also serves as the source 101 of the selection transistor.

At the time of reading information stored in the memory transistor 2, a potential of, for example, 1.6 V is applied to the gate 103 of the memory transistor, the source 104 of the memory transistor, and the N-well 44, and the drain 105 of the memory transistor (common to the source 101 of the selection transistor), and the gate 100 of the selection transistor, and the drain 102 of the selection transistor are set to 0 V, whereby the information is read depending on whether current flows from the source 104 of the memory transistor to the drain 105 of the memory transistor.

At the time of recording information in the memory transistor 2, 9 V is applied to the gate 103 of the memory transistor, 5 V is applied to the source 104 of the memory transistor and the N-well 44, and the gate 100 the selection transistor, and the drain 105 of the memory transistor (common to the source 101 of the selection transistor), and the drain 102 of the selection transistor are set to 0 V, whereby the information is written by electrons generated by current flowing from the source 104 of the memory transistor to the drain 105 of the memory transistor being accumulated in the second nitride film 52 of the ONO structure.

At the time of erasing the information stored in the memory transistor 2, −4 to −10 V is applied to the gate 103 of the memory transistor, and 6 to 12 V is applied to the source 104 of the memory transistor and the N-well 44, whereby the information is erased.

As described above, the selection transistor 1 and the memory transistor 2 constitute the flash memory element part. The flash memory element part stores information in the memory transistor 2, erases the information when needed, and reads the stored information, and thereby functions as a flash memory.

Figure 102A:
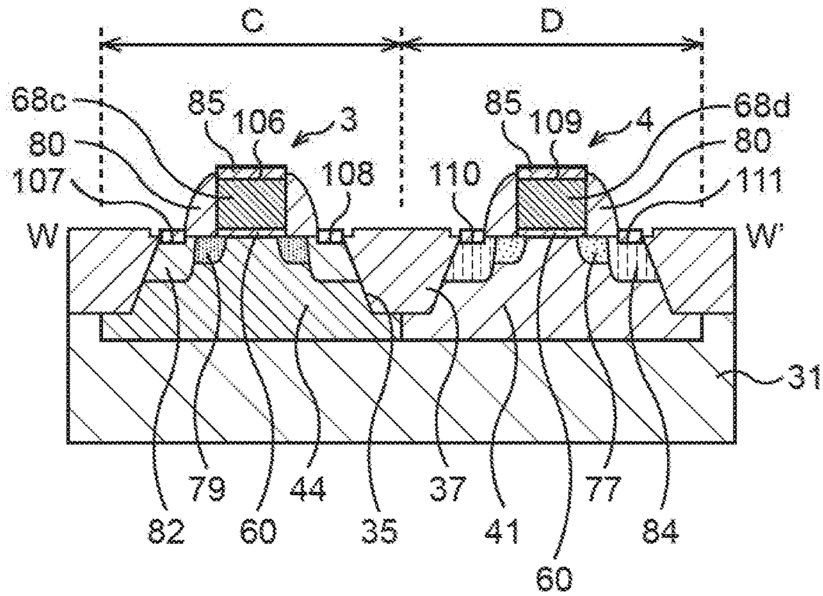
FIGS. 102A and 102B are cross-sectional views (part 102) explaining the manufacturing process of the semiconductor device in the first embodiment.

As illustrated in FIG. 102A, a p-type low-voltage transistor 3 functions as a switching element by a gate 106 of the p-type low-voltage transistor, a source 107 of the p-type low-voltage transistor, a drain 108 of the p-type low-voltage transistor, and the N-well 44.

As illustrated in FIG. 102A, an n-type low-voltage transistor 4 functions as a switching element by a gate 109 of the n-type low-voltage transistor, a source 110 of the n-type low-voltage transistor, a drain 111 of the n-type low-voltage transistor, and the P-well 41.

Figure 102B:
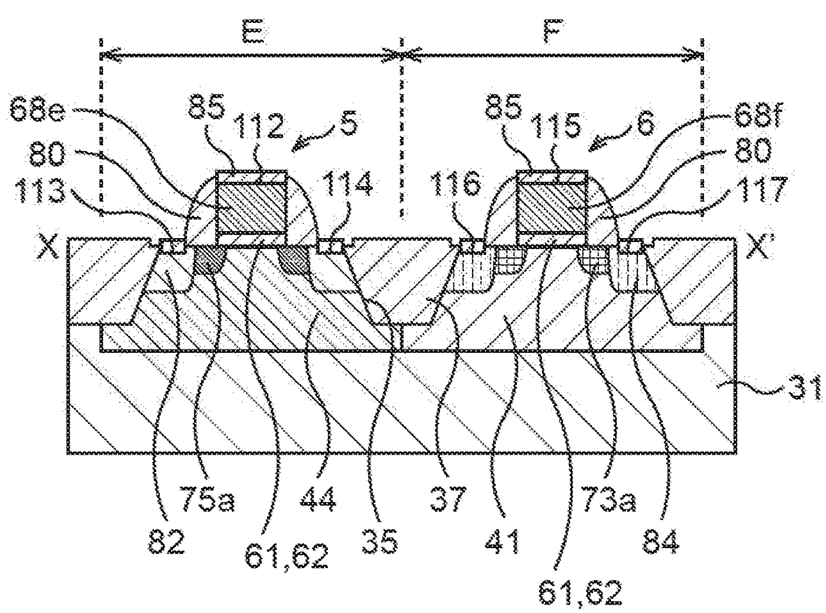

As illustrated in FIG. 102B, a p-type middle withstand voltage transistor 5 functions as a switching element by a gate 112 of the p-type middle withstand voltage transistor, a source 113 of the p-type middle withstand voltage transistor, a drain 114 of the p-type middle withstand voltage transistor, and the N-well 44.

As illustrated in FIG. 102B, an n-type middle withstand voltage transistor 6 functions as a switching element by a gate 115 of the n-type middle withstand voltage transistor, a source 116 of the n-type middle withstand voltage transistor, a drain 117 of the n-type middle withstand voltage transistor, and the P-well 41.

As illustrated in FIG. 153, a first p-type high withstand voltage transistor 7 functions as a switching element by a gate 118 of the first p-type high withstand voltage transistor, a source 119 of the first p-type high withstand voltage transistor, a drain 120 of the first p-type high withstand voltage transistor, a first tap 121, the N-well 44, the P-well 41, and the deep N-well 48. In the semiconductor substrate 31 on the lower side of the gate 118 of the first p-type high withstand voltage transistor, the N-well 44 is arranged on the side of the source 119 of the first p-type high withstand voltage transistor. On the other hand, in the semiconductor substrate 31 on the lower side of the gate 118 of the first p-type high withstand voltage transistor, the P-well 41 and the element isolation 37 are arranged on the side of the drain 120 of the first p-type high withstand voltage transistor. Further, the P-well 41 is surrounded by the N-well 44 and the deep N-well 48. This structure is called a laterally diffused MOS (LDMOS). The LDMOS structure enables suitable improvement in drain withstand voltage, and is therefore applicable to a circuit required to operate at higher voltage.

As illustrated in FIG. 153, a first n-type high withstand voltage transistor 8 functions as a switching element by a gate 122 of the first n-type high withstand voltage transistor, a source 123 of the first n-type high withstand voltage transistor, a drain 124 of the first n-type high withstand voltage transistor, a second tap 125, the P-well 41, and the N-well 44. In the semiconductor substrate 31 on the lower side of the gate 122 of the first n-type high withstand voltage transistor, the P-well 41 is arranged on the side of the source 123 of the first n-type high withstand voltage transistor. On the other hand, in the semiconductor substrate 31 on the lower side of the gate 122 of the first n-type high withstand voltage transistor, the N-well 44 and the element isolation 37 are arranged on the side of the drain 124 of the first n-type high withstand voltage transistor. Further, the N-well 44 is surrounded by the P-well 41 and the semiconductor substrate 31. This structure is called an LDMOS similarly to the first p-type high withstand voltage transistor 7. The LDMOS structure enables suitable improvement in drain withstand voltage, and is therefore applicable to a circuit required to operate at higher voltage.

Subsequently, though not illustrated, an interlayer insulating film is formed on the entire surface of the semiconductor substrate 31, contacts for electrical connection are formed on the various gates 68*a* to 68*h* and on the semiconductor substrate 31, and wiring connected to the contacts is sequentially formed. Further, the connected wiring is connected to pads for communicating electric signals with an external part to function as a semiconductor device. Note that an example where contact patterns 223 are arranged as illustrated in FIG. 160, FIGS. 174A-174B, and FIG. 184 is illustrated as one example.

As illustrated in FIGS. 51A-51C, the selection transistor 1 and the memory transistor 2 are formed.

In the selection transistor 1, the third thermal oxide film 62 is formed between the gate electrode 68*a* and the semiconductor substrate 31. The third thermal oxide film 62 is formed by thermal oxidation. Accordingly, the gate insulating film of the selection transistor is kept excellent in quality and formed not to deteriorate the element characteristics. In particular, high voltage is applied to the flash memory element part to perform operations of write, read, and erasure. Therefore, it is preferable to use a gate insulating film excellent in quality also for the selection transistor 1.

The memory transistor 2 has the ONO structure in which the CVD oxide film 55, the second nitride film 52, and the tunnel oxide film 51 are layered between the gate electrode 68*b* and the semiconductor substrate 31. Voltage is appropriately applied between the gate electrode 68*b* of the memory transistor 2 and the semiconductor substrate, whereby electric charges are accumulated or released in/from the second nitride film through the tunnel oxide film to enable storage of information. Further, the selection transistor 1 can be operated to read the information. Consequently, the memory transistor 2 is structured to be able to operate the flash memory element part.

As illustrated in FIG. 102A, the p-type low-voltage transistor 3 and the n-type low-voltage transistor 4 are formed.

In each of the p-type low-voltage transistor 3 and the n-type low-voltage transistor 4, the second thermal oxide film 60 is formed between the gate electrode 68*c*, 68*d* and the semiconductor substrate 31. The second thermal oxide film 60 is formed by thermal oxidation. Accordingly, the gate insulating films of the p-type low-voltage transistor 3 and the n-type low-voltage transistor 4 are kept excellent in quality and formed thinnest, and therefore formed to be suitable for high-speed operation without deteriorating the element characteristics.

Further, as illustrated in FIG. 102B, the p-type middle withstand voltage transistor 5 and the n-type middle withstand voltage transistor 6 are formed.

In each of the p-type middle withstand voltage transistor 5 and the n-type middle withstand voltage transistor 6, the third thermal oxide film 62 is formed between the gate electrode 68*e*, 68*f* and the semiconductor substrate 31 as in the selection transistor 1. The third thermal oxide film 62 is formed by thermal oxidation. Accordingly, the gate insulating films of the p-type middle withstand voltage transistor 5 and the n-type middle withstand voltage transistor 6 are kept excellent in quality and formed not to deteriorate the element characteristics. In particular, for example, for the purpose of communicating electric signals with the external part, voltage higher than that to the low-voltage transistor is applied to the middle withstand voltage transistor. The third thermal oxide film 62 is formed larger in film thickness than the second thermal oxide film 60 and is therefore preferably able to apply high voltage in terms of withstand voltage characteristics.

As illustrated in FIG. 153, the first p-type high withstand voltage transistor 7 and the first n-type high withstand voltage transistor 8 are formed.

In each of the first p-type high withstand voltage transistor 7 and the first n-type high withstand voltage transistor 8, the oxide film 65 is formed by layering the CVD oxide film 55 and the fourth thermal oxide film 64 between the gate electrode 68*g*, 68*h* and the semiconductor substrate 31. In other words, the gate insulating films of the first p-type high withstand voltage transistor 7 and the first n-type high withstand voltage transistor 8 are formed to be thicker than the third thermal oxide film 62 so as to withstand application of high voltage. In particular, for example, in the case where high voltage is required to cause the flash memory element to perform operations of write, read, and erasure, the high withstand voltage transistor can use a switching circuit that applies appropriate voltage, for example, a voltage of 5 V or more to the flash memory element part at the corresponding portion. The oxide film 65 where the CVD oxide film 55 and the fourth thermal oxide film 64 are layered is formed to be thicker than the third thermal oxide film 62, and is therefore preferably able to apply higher voltage in terms of withstand voltage characteristics.

Note that in the first embodiment, the step of forming the element isolation, the step of forming the well and the channel, and the step of forming the tunnel oxide layer and the charge-storage layer are described in order as one example. The order of these steps may be changed as needed. For example, the well and the channel may be formed before the step of forming the element isolation. If needed, a mark for alignment being a level difference may be formed in advance on the silicon substrate using a patterning technique and an etching technique, the well and the channel may be formed using the mark, and thereafter the element isolation may be formed. Alternatively, the channel may be formed after the well and the element isolation are formed. Further, for example, after the well and the channel are formed in the region of the flash memory transistor and the tunnel oxide layer and the charge-storage layer are formed, the well and the channel of another transistor can be formed in another step. For example, in the case where it is desired to prevent the well and the channel of the other transistor from being affected by diffusion in the thermal process in the step of forming the tunnel oxide layer, it is preferable to provide a step of partially forming the well and the channel of the other transistor afterwards in the other step. This enables stabilization of the electric properties of the other transistor. Not limited to the above, the step of forming the well and the channel in each region may be changed as needed in the order of forming them for each region as long as before the gate insulating film or the tunnel oxide film remaining on the substrate is finally formed. It is also possible to change the order to an order of steps which is suitable for the electric properties of the region of each transistor.

Modification Example of First Embodiment

The manufacturing process of the semiconductor device is described in the first embodiment. The semiconductor device can be similarly manufactured even if some of the steps in the first embodiment are changed. Hereinafter, a manufacturing process of a semiconductor device will be described in detail along cross-sectional views and plan views as the modification example of the first embodiment. Note that the same components as those in the first embodiment are denoted by the same signs.

FIGS. 185A and 185B to FIGS. 189A and 189B are cross-sectional views and a plan view explaining the modification example of the first embodiment, respectively. FIG.

185A to FIG. 188A are cross-sectional views illustrating a W-W' line part illustrated in and FIG. 189A. FIG. 185B to FIG. 188B are cross-sectional views illustrating an X-X' line part illustrated in and FIG. 189B. The modification example of the first embodiment is made by changing some of the steps from those in the first embodiment, and can similarly manufacture the semiconductor device. More specifically, the shapes of the mask patterns used in some of the steps are changed, and the number of times of treatment with chemical solutions on the surface of the semiconductor device in the region of the low-voltage transistor is reduced.

A CVD oxide film 55 is formed similarly to the steps illustrated in FIGS. 1A-1C to FIGS. 28A-28C, FIGS. 52A-52B to FIGS. 79A-79B and FIG. 103 to FIG. 130 using the manufacturing process described in the first embodiment.

Figure 80A:
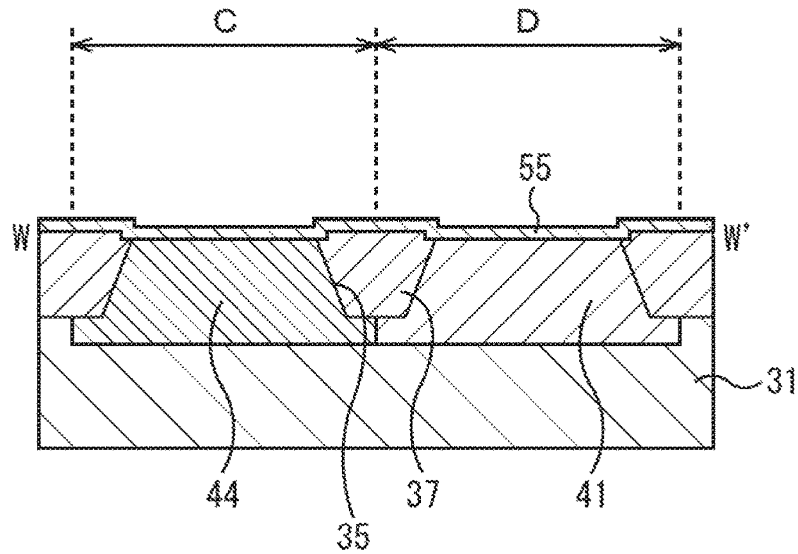
FIGS. 80A and 80B are cross-sectional views (part 80) explaining the manufacturing process of the semiconductor device in the first embodiment.
Figure 80B:
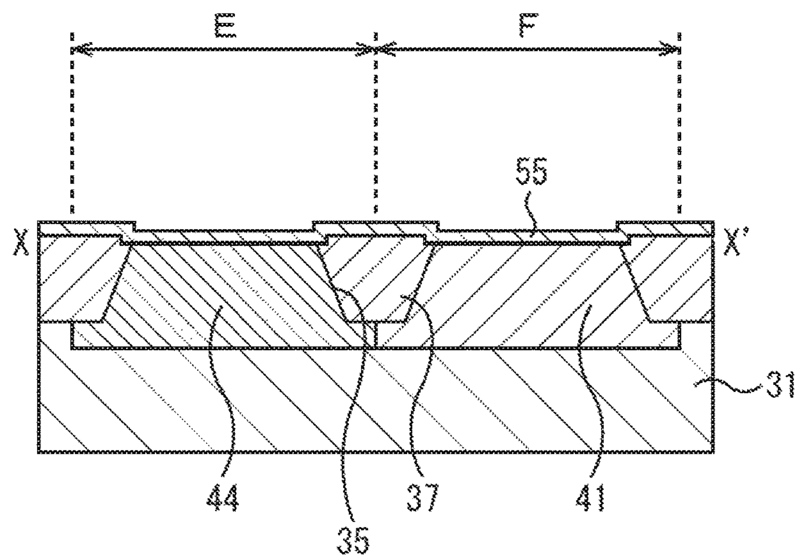

Subsequently, as in the step illustrated in FIGS. 29A-29C and FIG. 131, the resist 56 opening a part of the region A where the selection transistor is formed is patterned by performing coating, exposure, and developing treatments. In the first embodiment, as illustrated in FIGS. 80A and 80B, the regions C to F indicating the low-voltage transistor part and the middle withstand voltage transistor part are entirely opened. However, the modification example of the first embodiment is different from the first embodiment in that, as illustrated in FIGS. 185A and 185B, the regions E, F indicating the middle withstand voltage transistor part are opened as in the first embodiment but the regions C, D indicating the low-voltage transistor part are not opened. The resist 56 here is the one made by transferring the mask pattern 213 for memory cell CVD oxide film etching illustrated in FIG. 157. In the modification example of the first embodiment, in FIGS. 185A and 185B, the resist 56 simultaneously opens the regions E, F indicating the middle withstand voltage transistor part as illustrated in FIGS. 185A and 185B.

Figure 81A:
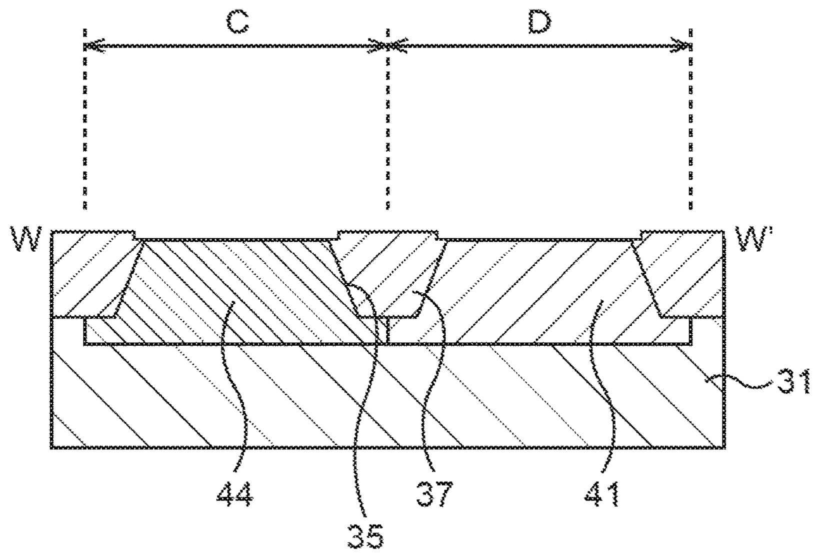
FIGS. 81A and 81B are cross-sectional views (part 81) explaining the manufacturing process of the semiconductor device in the first embodiment.
Figure 81B:
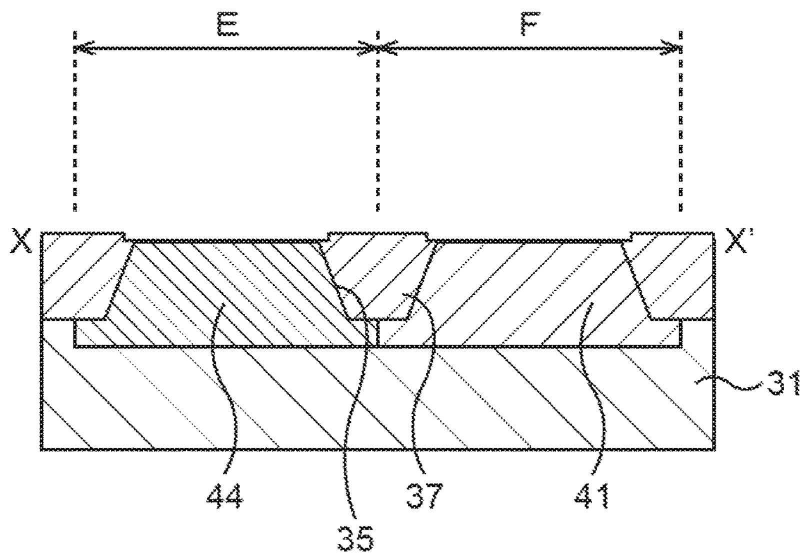

Subsequently, as in the step illustrated in FIGS. 30A-30C and FIG. 132, for example, a hydrofluoric acid treatment is performed using the resist 56 as a mask to remove the CVD oxide film 55. Since the regions C to F indicating the low-voltage transistor part and the middle withstand voltage transistor part are entirely opened, the CVD oxide film 55 is removed as illustrated in FIGS. 81A and 81B in the first embodiment, whereas since the regions C, D indicating the low-voltage transistor part are not opened, the CVD oxide film 55 remains as illustrated in FIGS. 186A and 186B in the modification example of the first embodiment unlike the first embodiment. On the other hand, since the regions E, F indicating the middle withstand voltage transistor part are opened, the CVD oxide film is removed to expose the surface of the semiconductor substrate 31. Then, the resist 56 is removed using, for example, an $O_2$ gas, a mixed gas containing an $O_2$ gas, or the like as in the first embodiment. Accordingly, the surface of the semiconductor substrate 31 is not exposed to the hydrofluoric acid treatment in the C, D indicating the low-voltage transistor part.

Figure 82A:
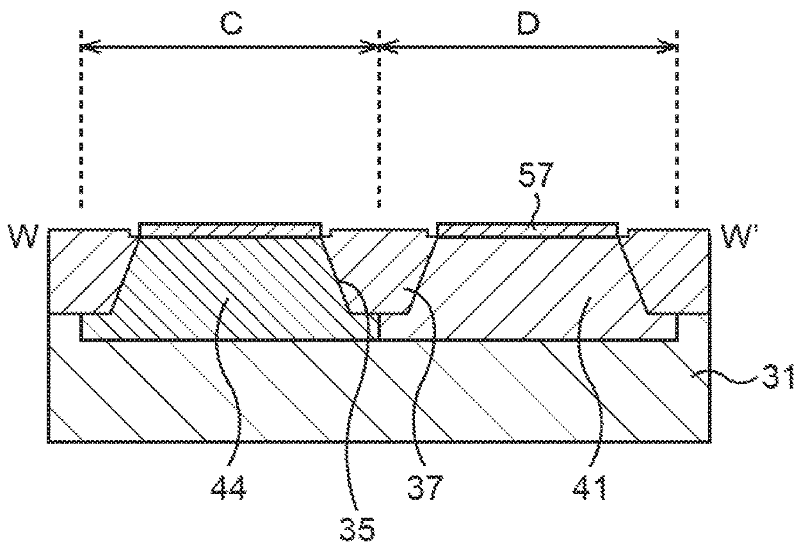
FIGS. 82A and 82B are cross-sectional views (part 82) explaining the manufacturing process of the semiconductor device in the first embodiment.
Figure 82B:
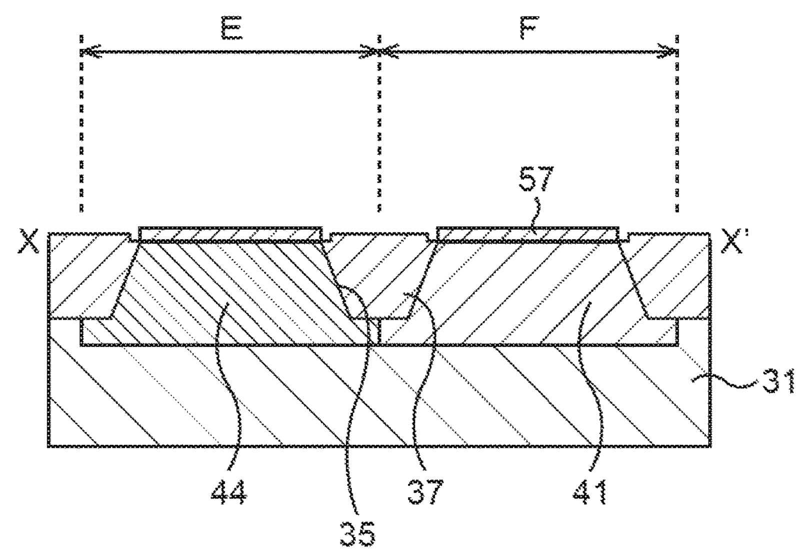

Subsequently, as in the step illustrated in FIGS. 31A-31C and FIG. 133, the first thermal oxide film 57 is grown. Here, in the first embodiment, as illustrated in FIGS. 82A and 82B, the first thermal oxide film 57 is formed in the regions C to F where the surface of the semiconductor substrate 31 is exposed and the low-voltage transistor and the middle withstand voltage transistor are formed. In the modification example of the first embodiment, as illustrated in FIGS. 187A and 187B, the first thermal oxide film 57 is formed in the regions E, F where the surface of the semiconductor substrate 31 is exposed and the middle withstand voltage transistor is formed as in the first embodiment. However, as illustrated in FIGS. 187A and 187B, in the regions C, D where the low-voltage transistor is formed, since the surface of the semiconductor substrate 31 is covered by the CVD oxide film 55, the silicon at the interface with the semiconductor substrate 31 is oxidized to grow the first interface oxide layer 58 as in the regions G to J where the high withstand voltage transistor is formed in FIG. 133 in the first embodiment. Accordingly, the regions C, D where the low-voltage transistor is formed are formed with the first interface oxide layer 58 along with the CVD oxide film 55 and thereby increase in thickness. Therefore, in the modification example of the first embodiment, the structure of the film to be formed on the surface of the semiconductor substrate 31 in the regions C, D where the low-voltage transistor is formed is different from that in the first embodiment.

Figure 83A:
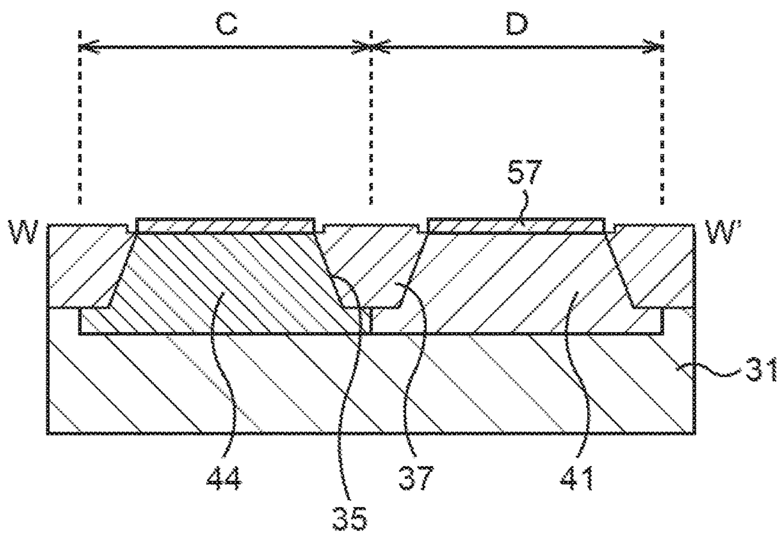
FIGS. 83A and 83B are cross-sectional views (part 83) explaining the manufacturing process of the semiconductor device in the first embodiment.
Figure 83B:
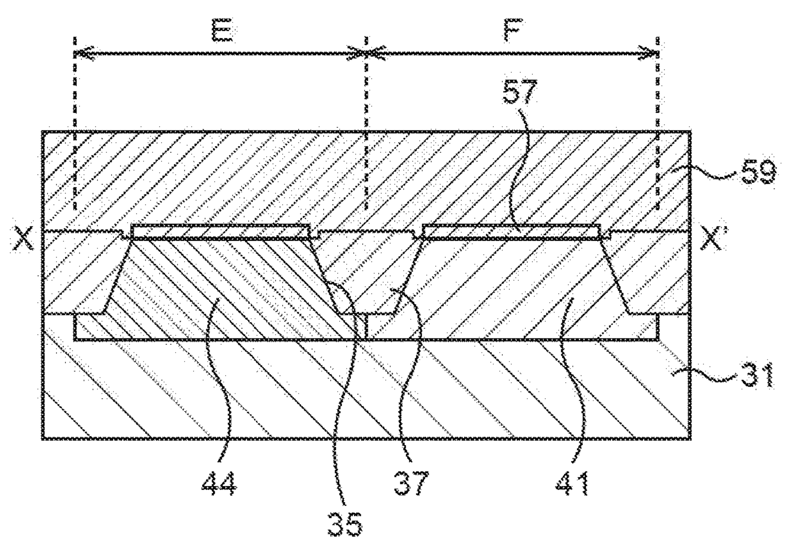
Figure 84A:
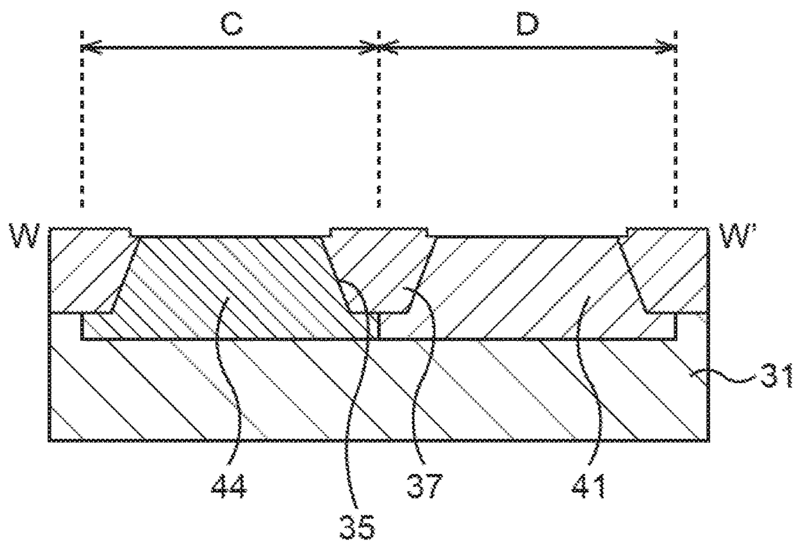
FIGS. 84A and 84B are cross-sectional views (part 84) explaining the manufacturing process of the semiconductor device in the first embodiment.
Figure 84B:
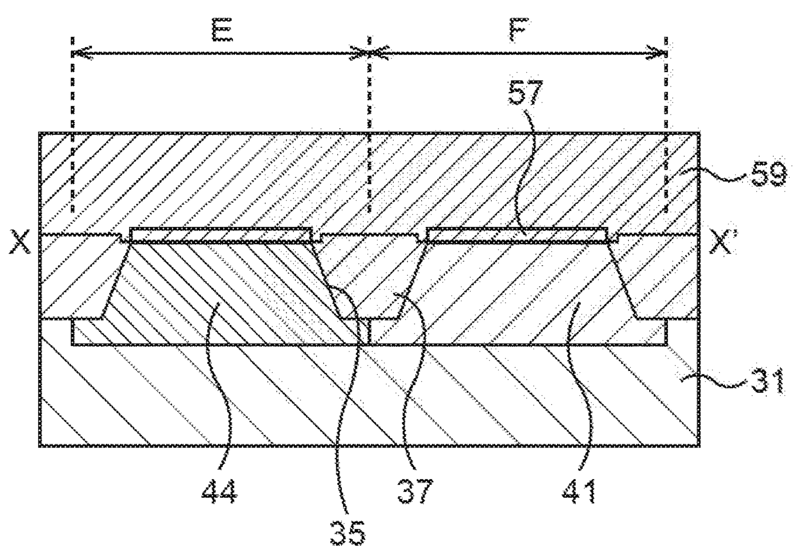
Figure 85A:
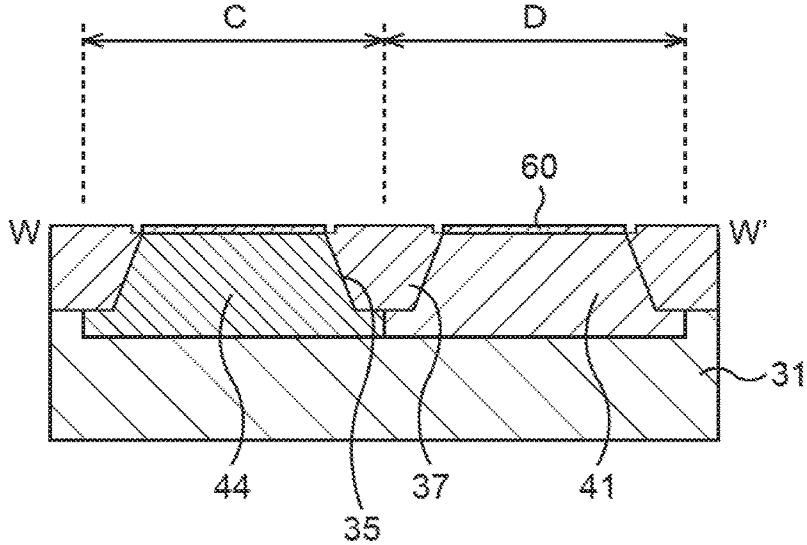
FIGS. 85A and 85B are cross-sectional views (part 85) explaining the manufacturing process of the semiconductor device in the first embodiment.
Figure 85B:
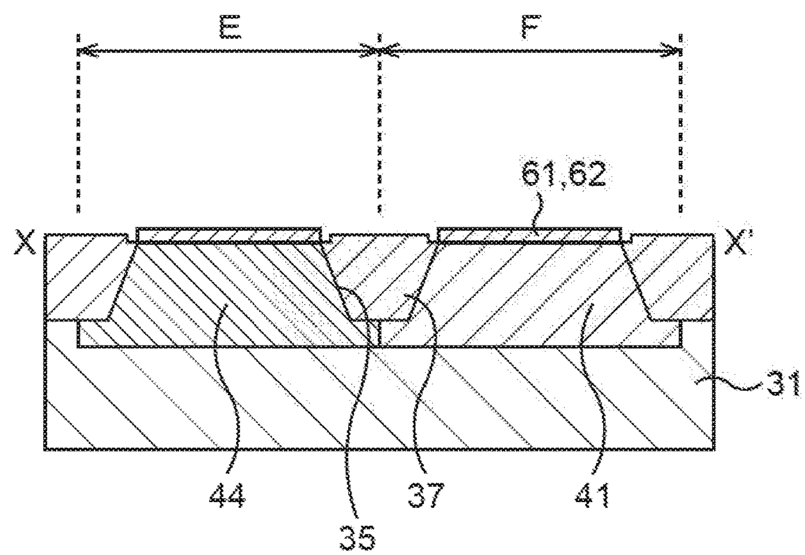
Figure 86A:
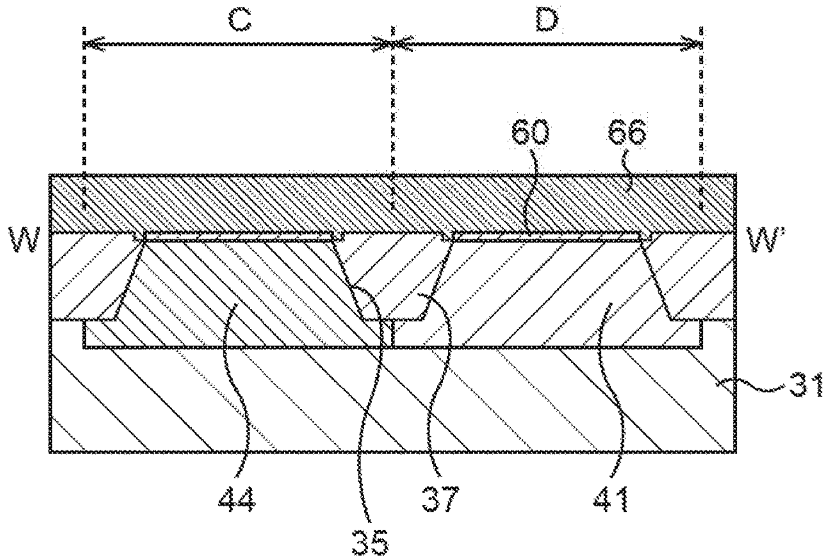
FIGS. 86A and 86B are cross-sectional views (part 86) explaining the manufacturing process of the semiconductor device in the first embodiment.
Figure 86B:
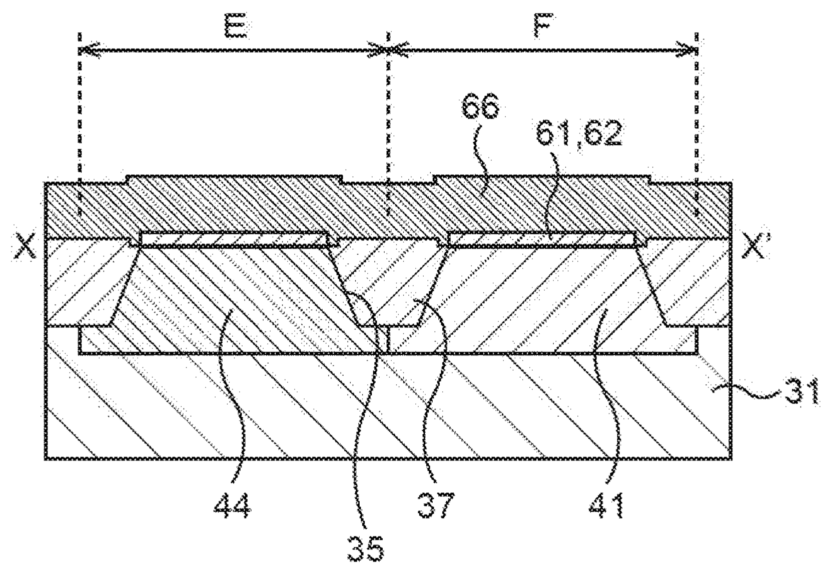
Figure 87A:
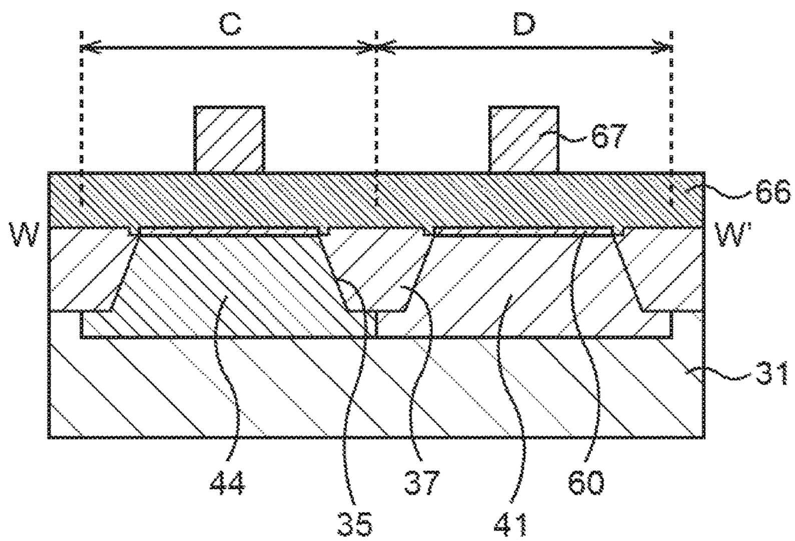
FIGS. 87A and 87B are cross-sectional views (part 87) explaining the manufacturing process of the semiconductor device in the first embodiment.
Figure 87B:
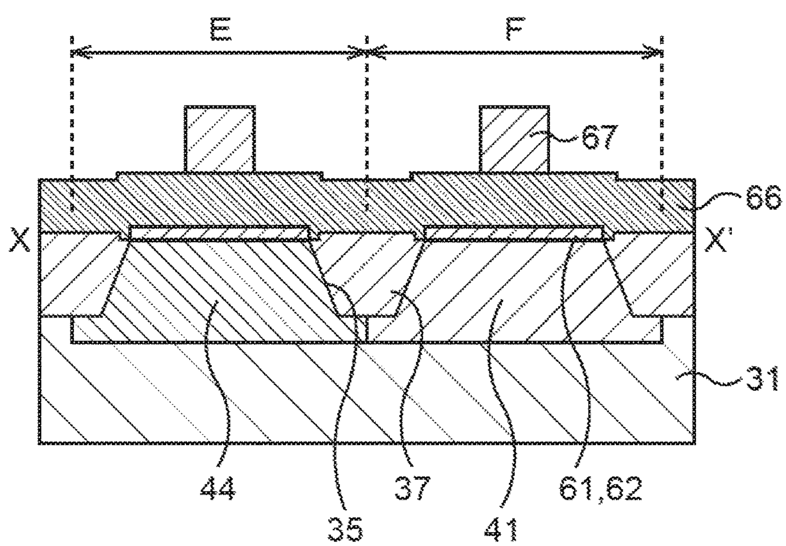
Figure 88A:
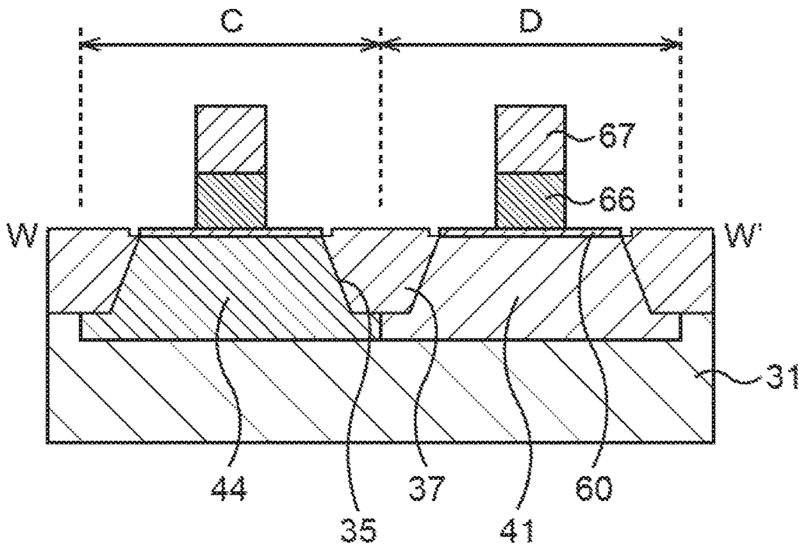
FIGS. 88A and 88B are cross-sectional views (part 88) explaining the manufacturing process of the semiconductor device in the first embodiment.
Figure 88B:
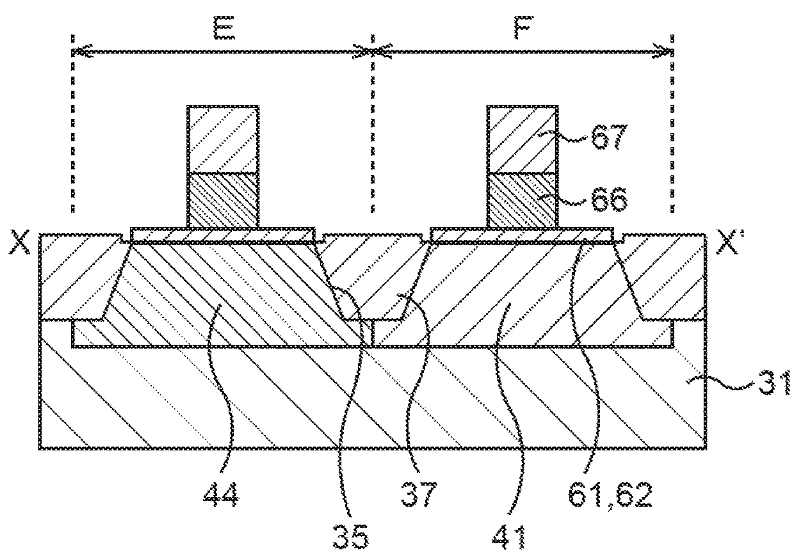
Figure 89A:
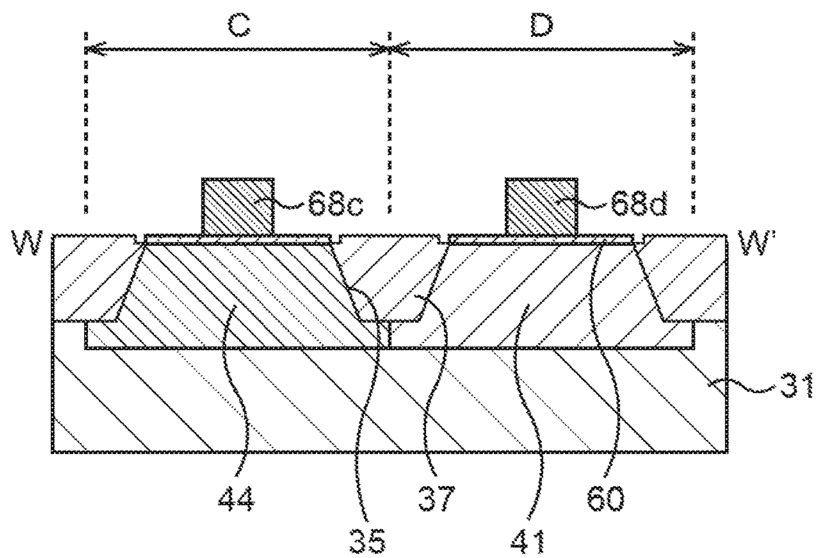
FIGS. 89A and 89B are cross-sectional views (part 89) explaining the manufacturing process of the semiconductor device in the first embodiment.
Figure 89B:
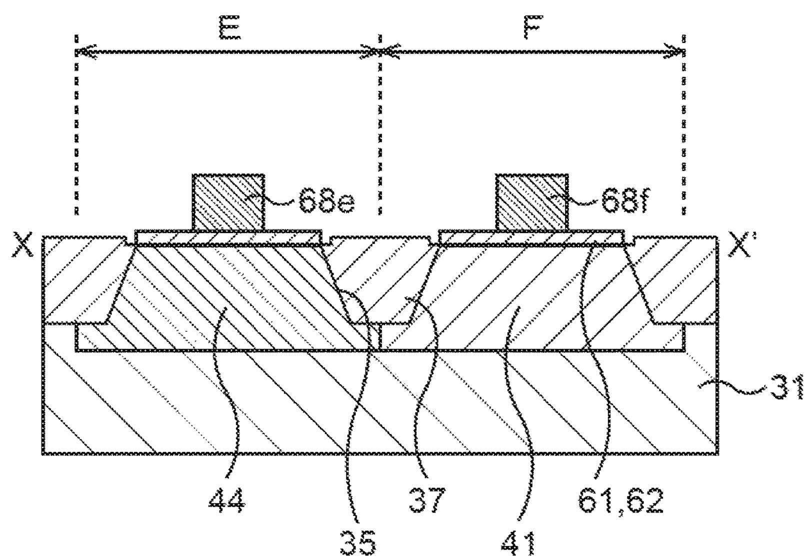
Figure 90A:
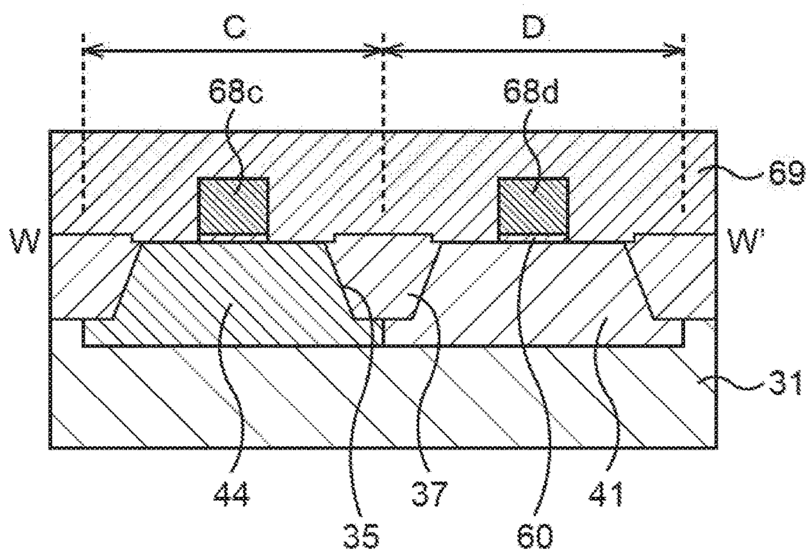
FIGS. 90A and 90B are cross-sectional views (part 90) explaining the manufacturing process of the semiconductor device in the first embodiment.
Figure 90B:
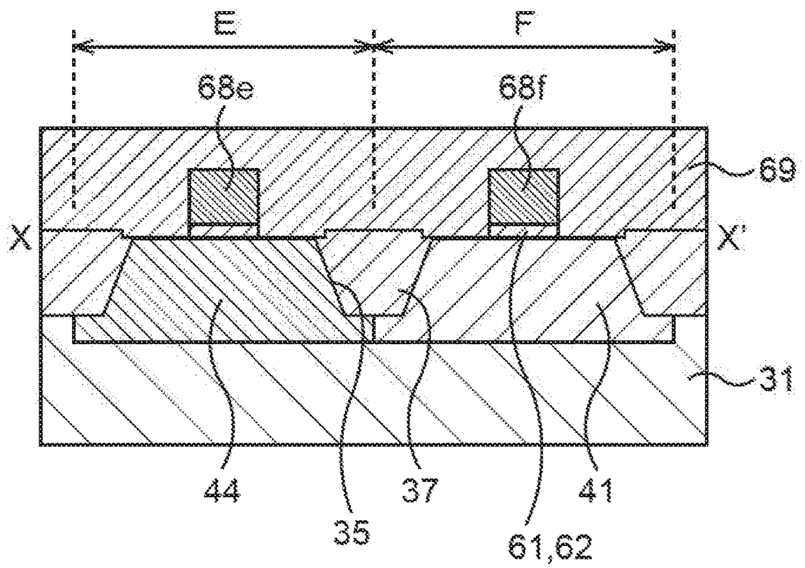
Figure 91A:
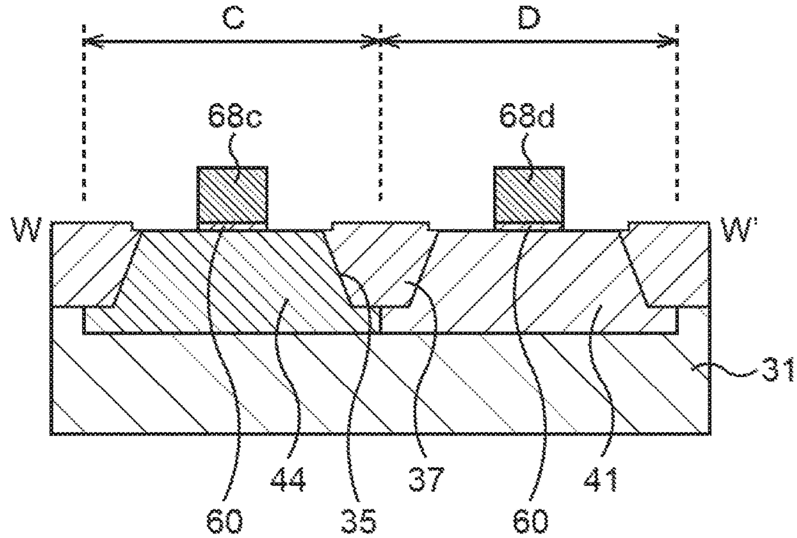
FIGS. 91A and 91B are cross-sectional views (part 91) explaining the manufacturing process of the semiconductor device in the first embodiment.
Figure 91B:
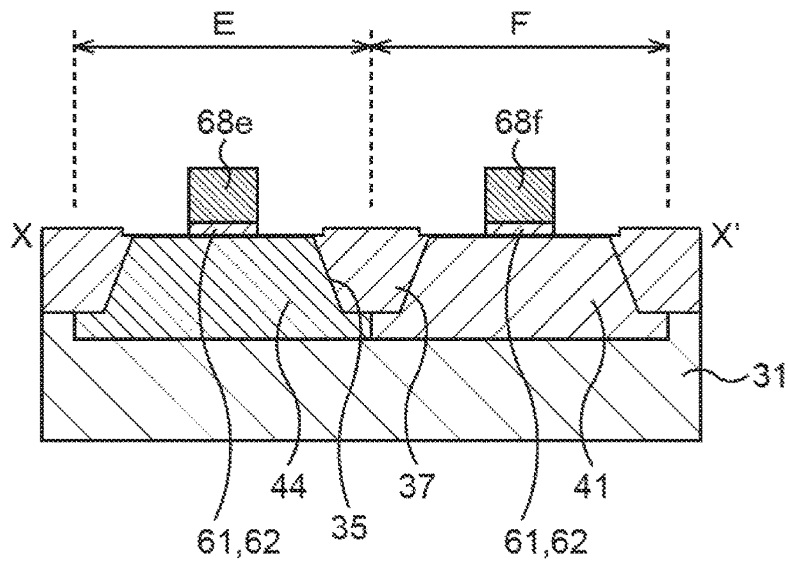
Figure 92A:
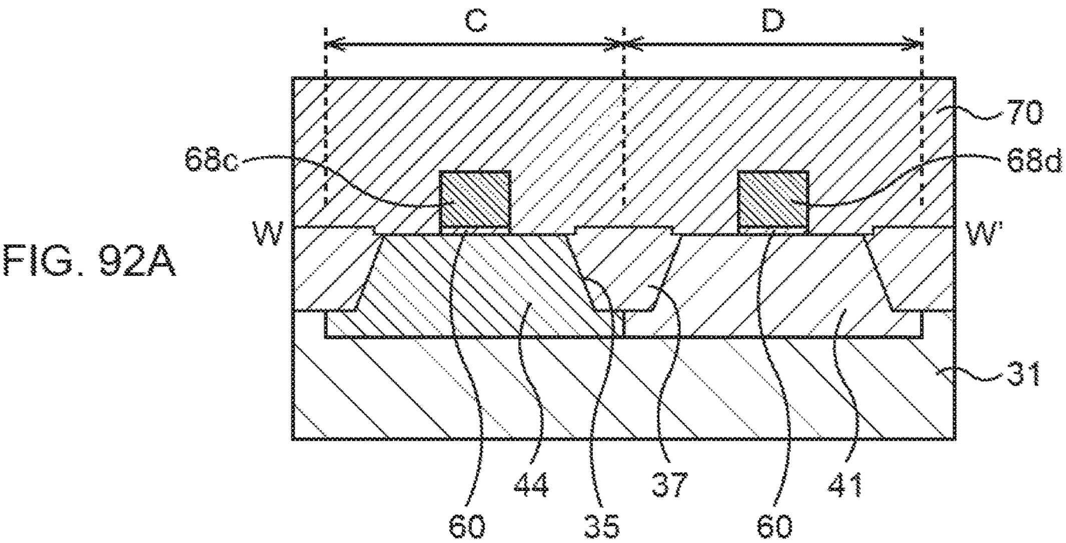
FIGS. 92A and 92B are cross-sectional views (part 92) explaining the manufacturing process of the semiconductor device in the first embodiment.
Figure 92B:
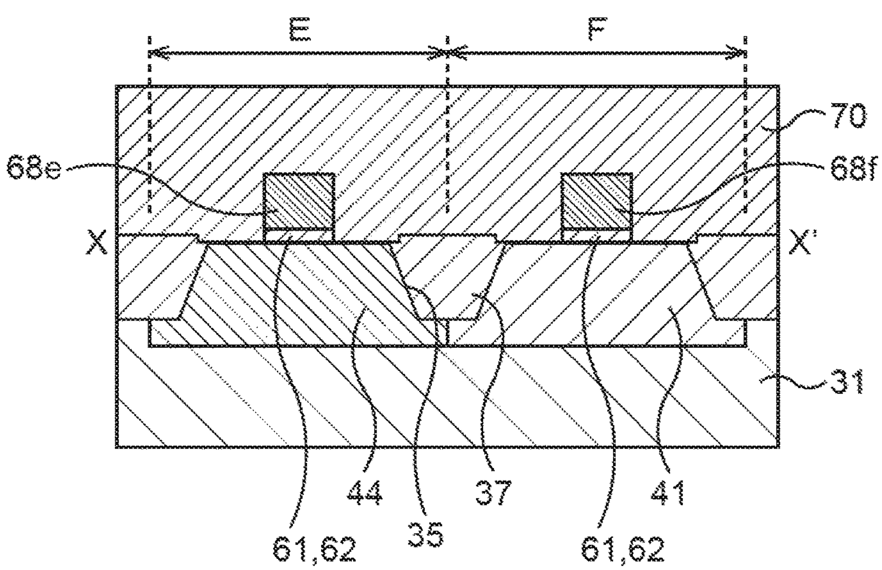
Figure 93A:
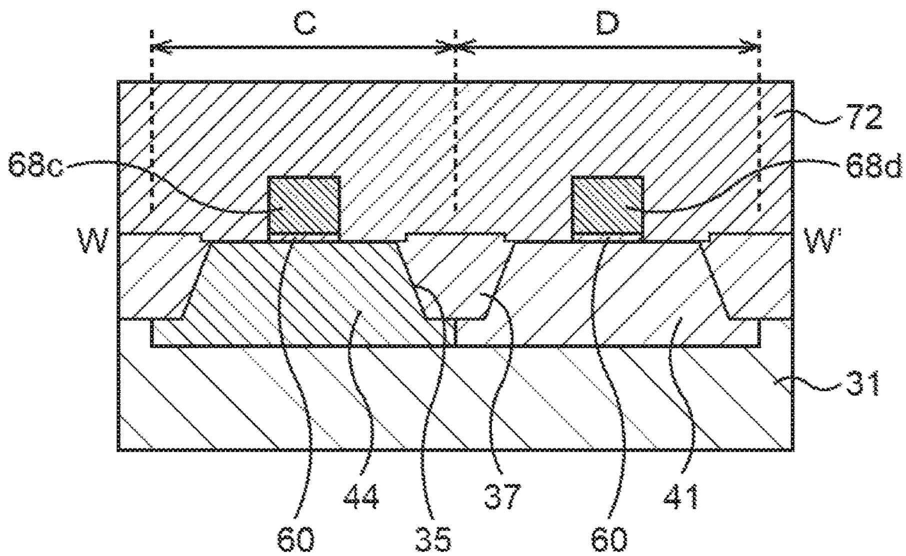
FIGS. 93A and 93B are cross-sectional views (part 93) explaining the manufacturing process of the semiconductor device in the first embodiment.
Figure 93B:
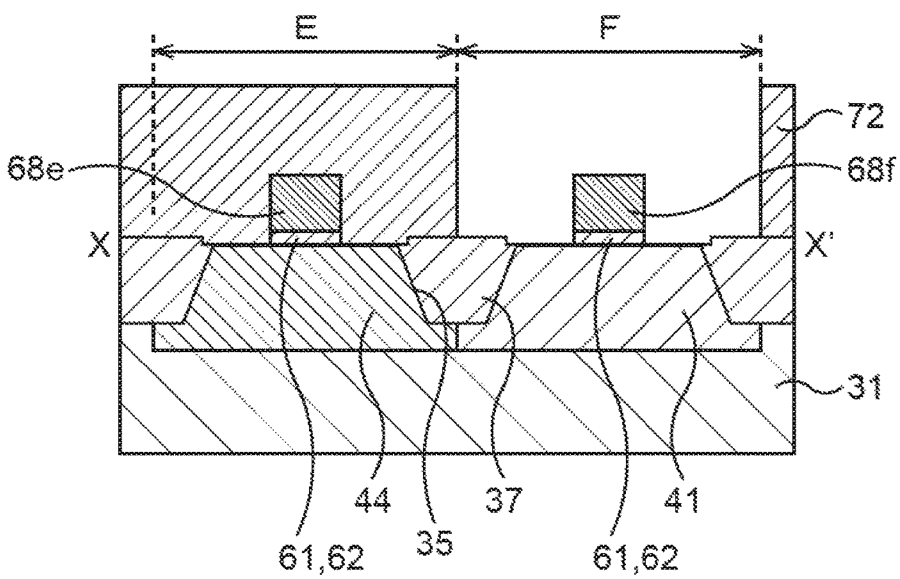
Figure 94A:
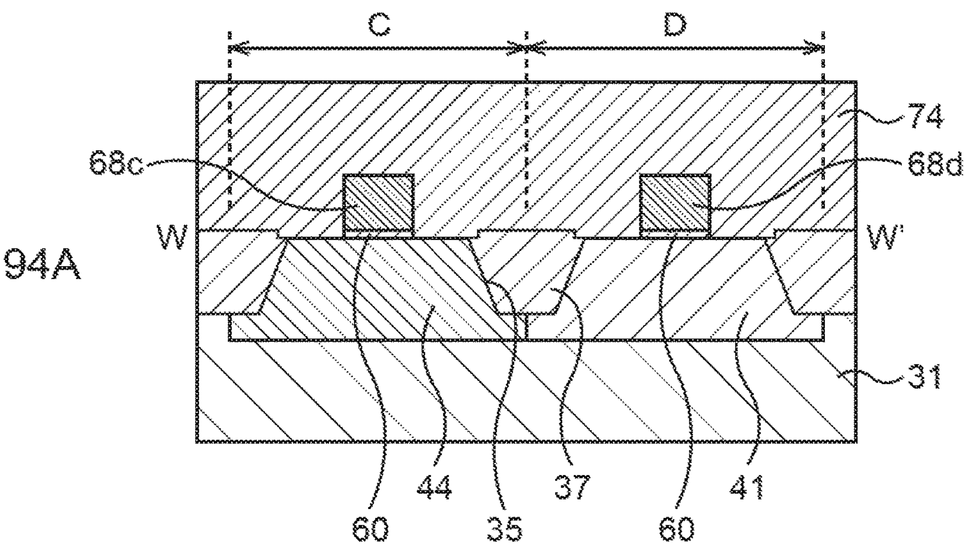
FIGS. 94A and 94B are cross-sectional views (part 94) explaining the manufacturing process of the semiconductor device in the first embodiment.
Figure 94B:
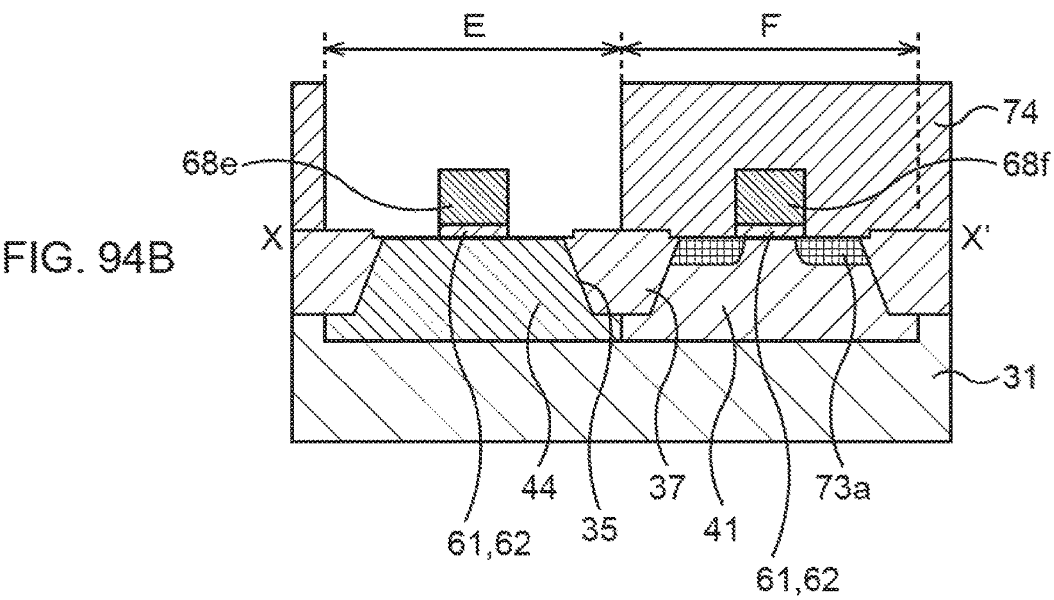
Figure 95A:
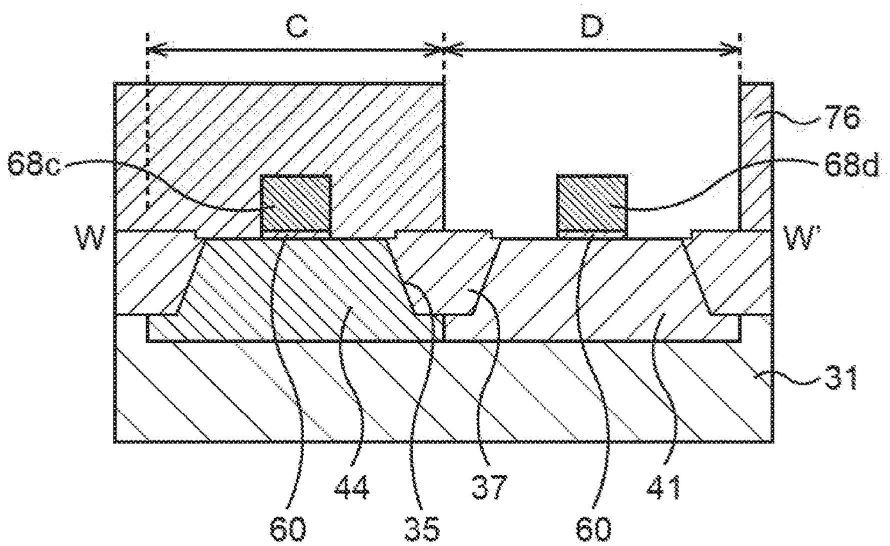
FIGS. 95A and 95B are cross-sectional views (part 95) explaining the manufacturing process of the semiconductor device in the first embodiment.
Figure 95B:
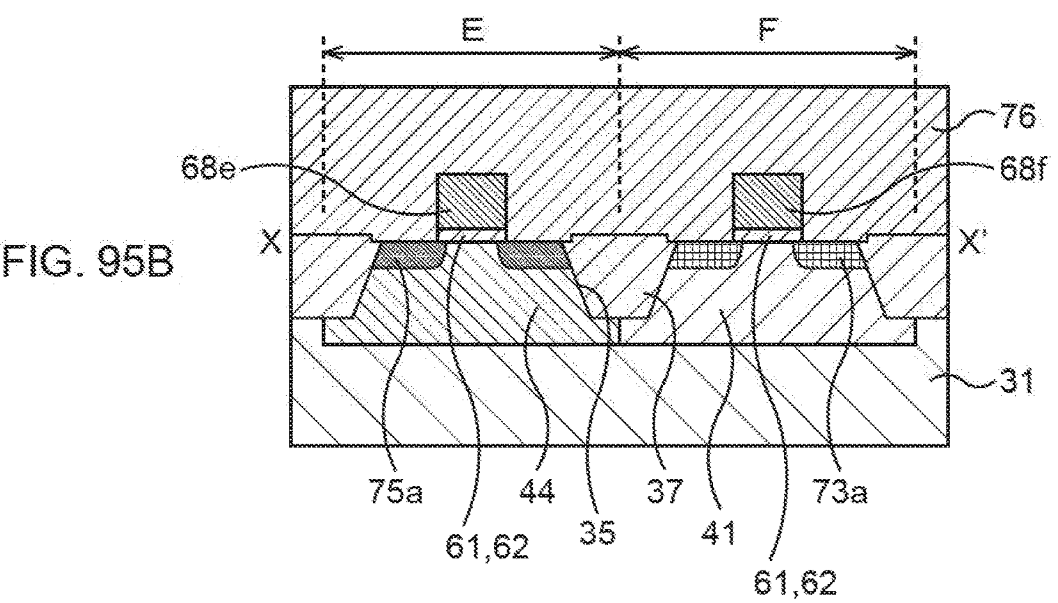
Figure 96A:
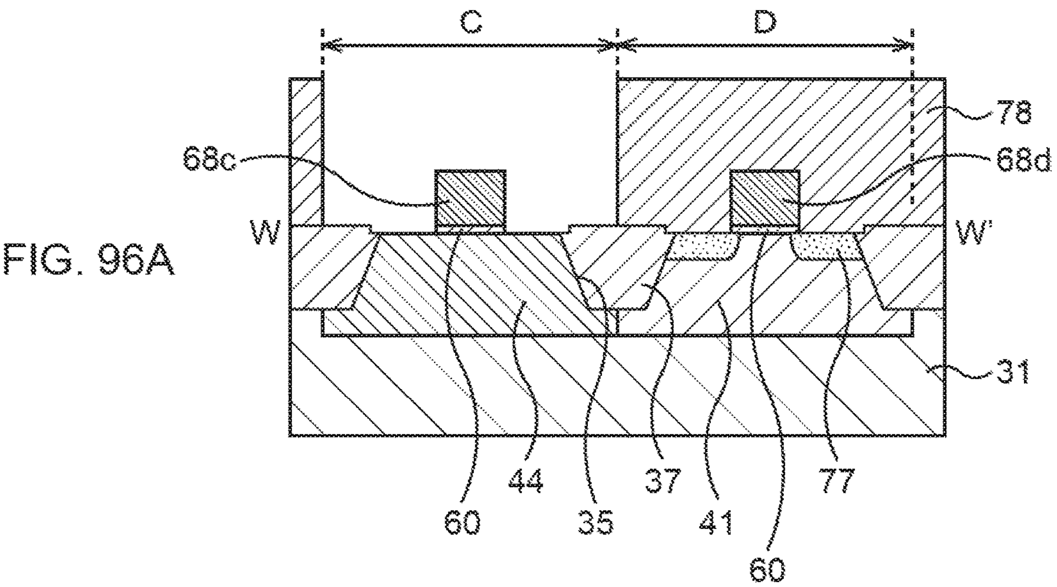
FIGS. 96A and 96B are cross-sectional views (part 96) explaining the manufacturing process of the semiconductor device in the first embodiment.
Figure 96B:
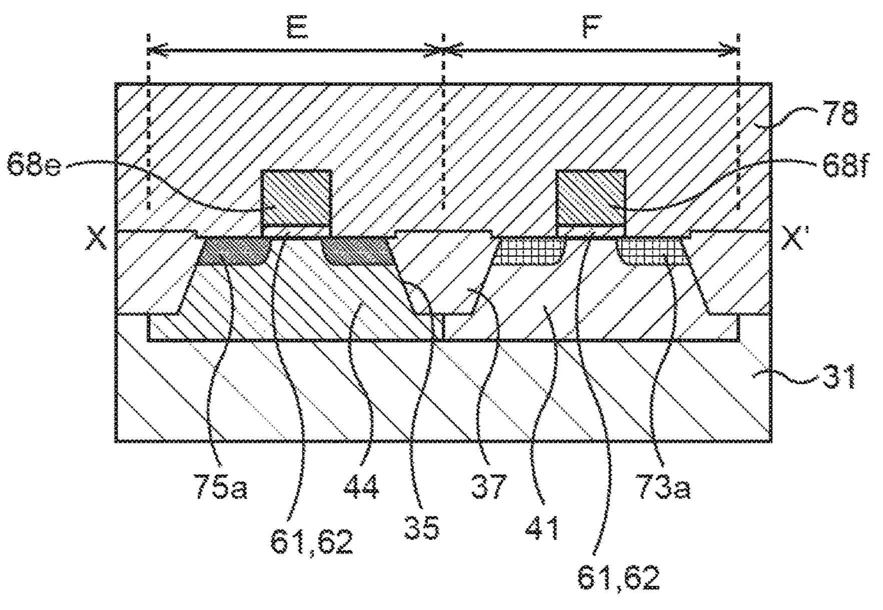
Figure 97A:
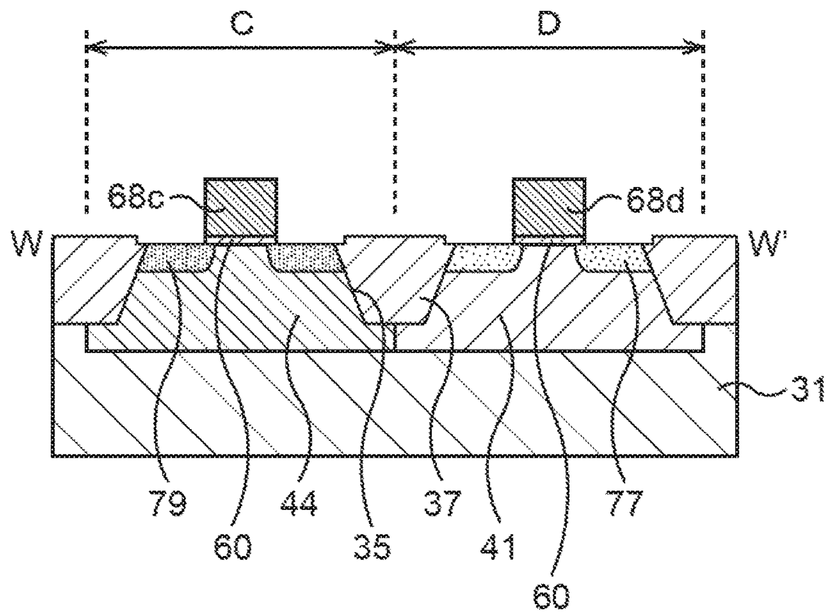
FIGS. 97A and 97B are cross-sectional views (part 97) explaining the manufacturing process of the semiconductor device in the first embodiment.
Figure 97B:
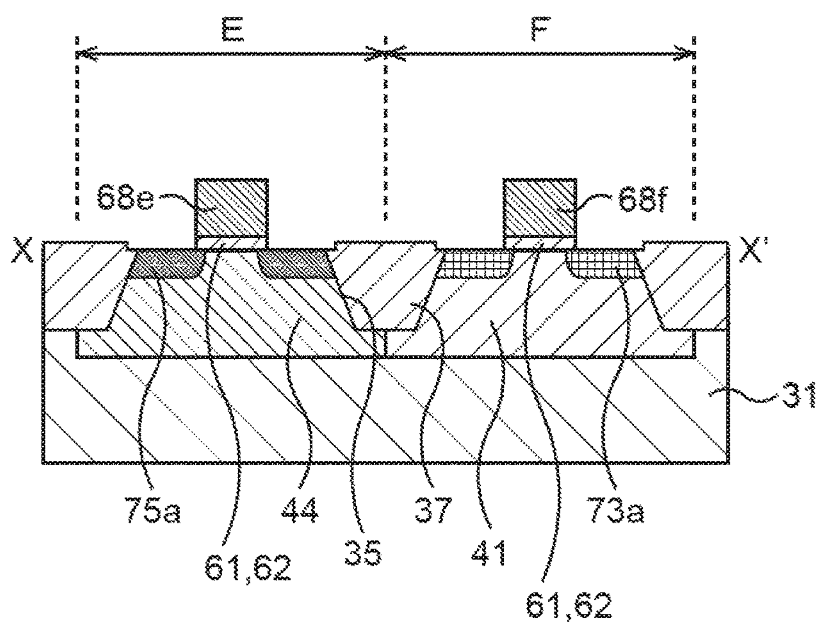
Figure 98A:
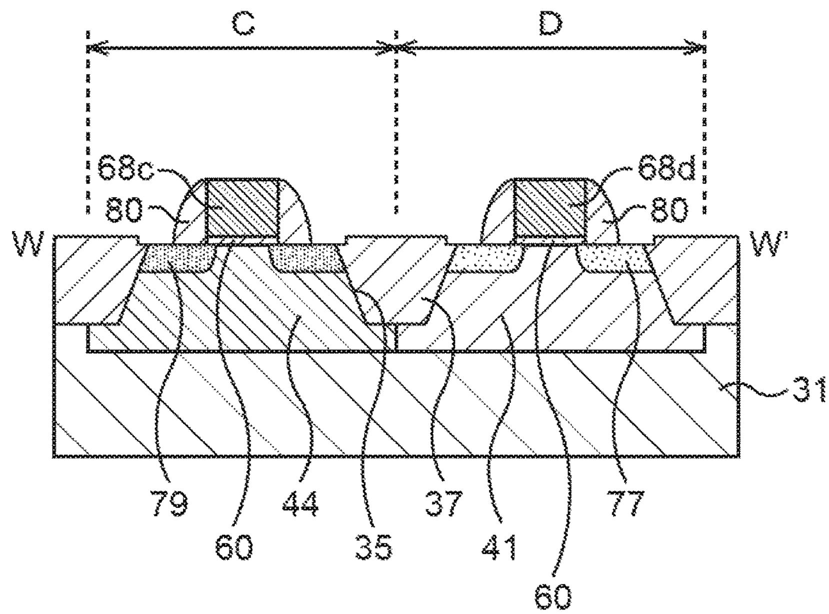
FIGS. 98A and 98B are cross-sectional views (part 98) explaining the manufacturing process of the semiconductor device in the first embodiment.
Figure 98B:
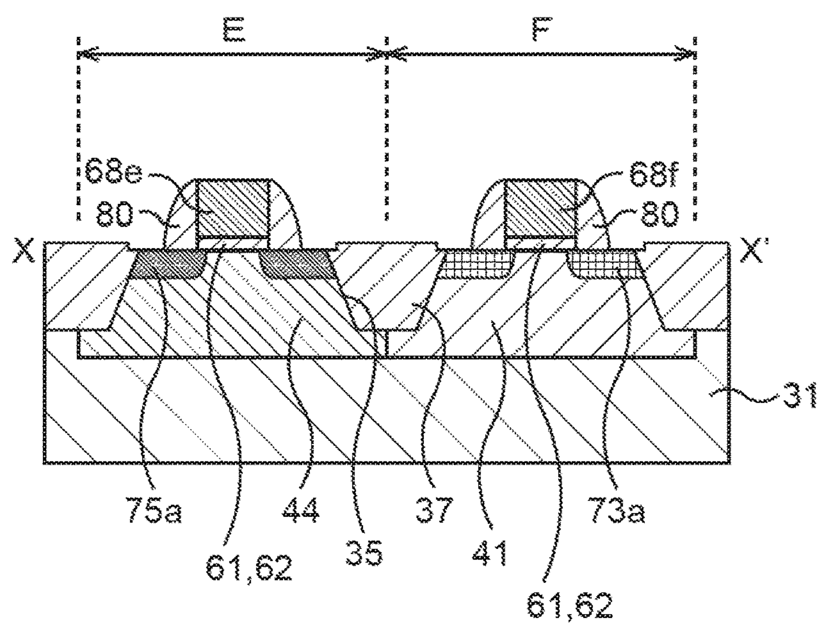
Figure 99A:
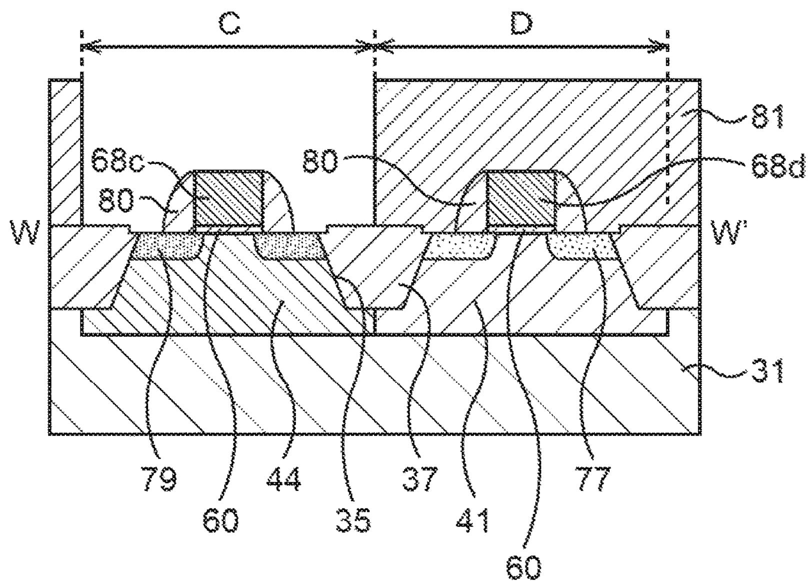
FIGS. 99A and 99B are cross-sectional views (part 99) explaining the manufacturing process of the semiconductor device in the first embodiment.
Figure 99B:
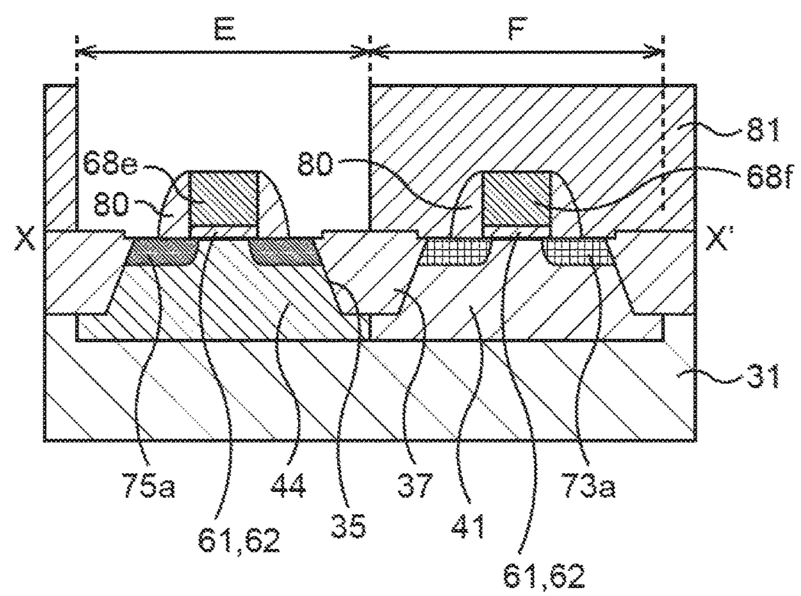
Figure 100A:
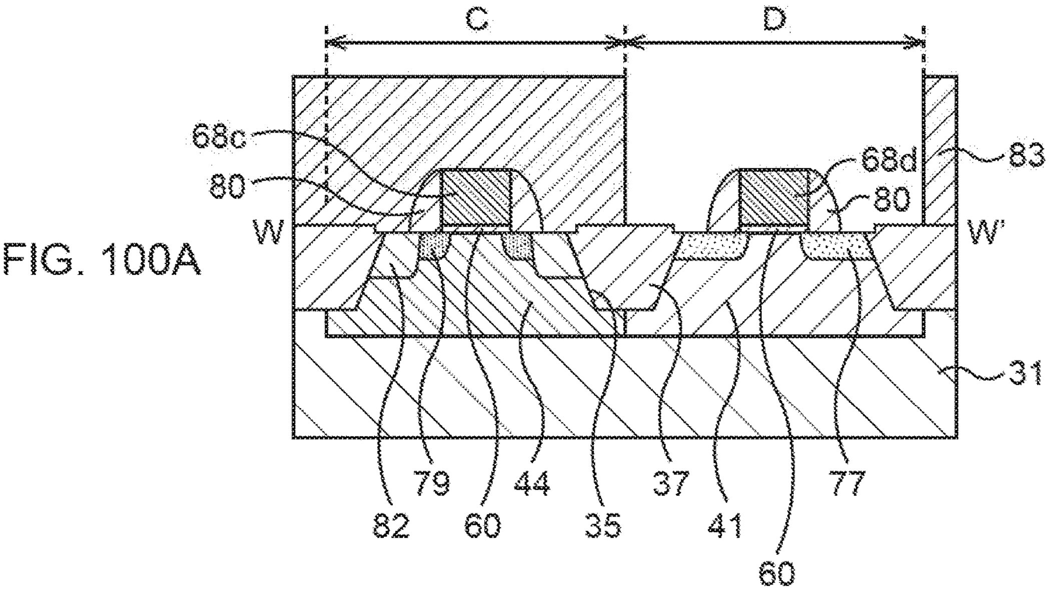
FIGS. 100A and 100B are cross-sectional views (part 100) explaining the manufacturing process of the semiconductor device in the first embodiment.
Figure 100B:
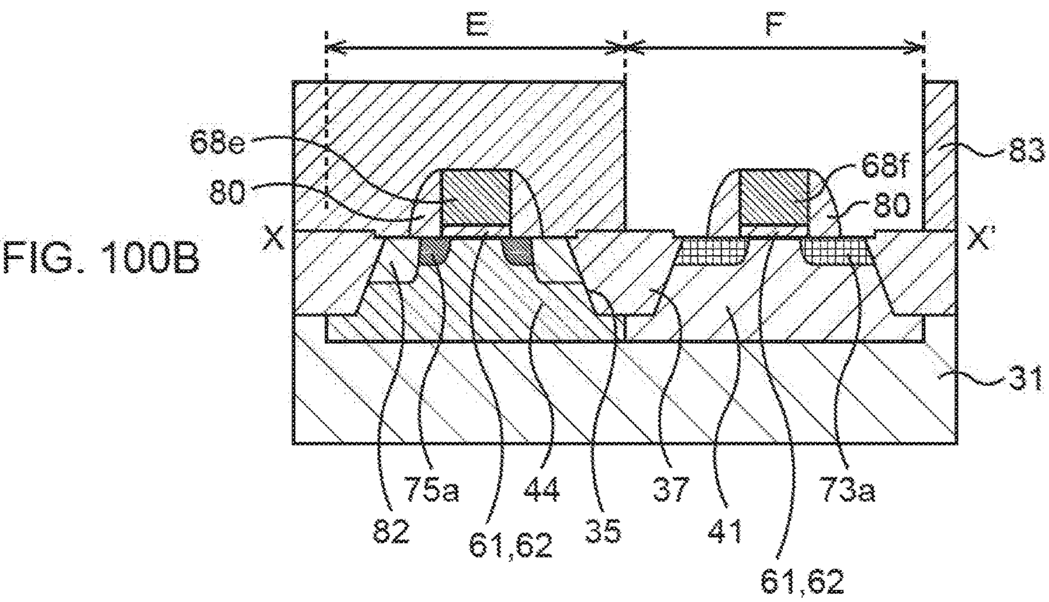
Figure 101A:
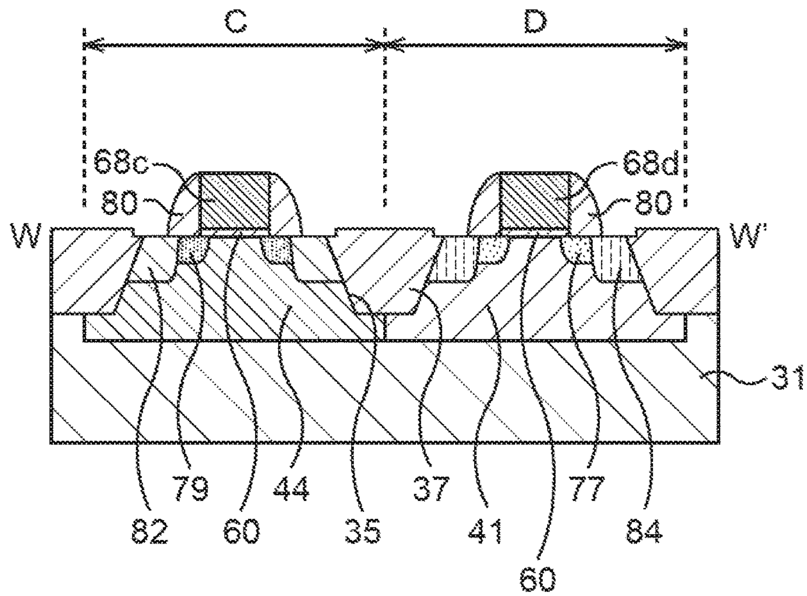
FIGS. 101A and 101B are cross-sectional views (part 101) explaining the manufacturing process of the semiconductor device in the first embodiment.
Figure 101B:
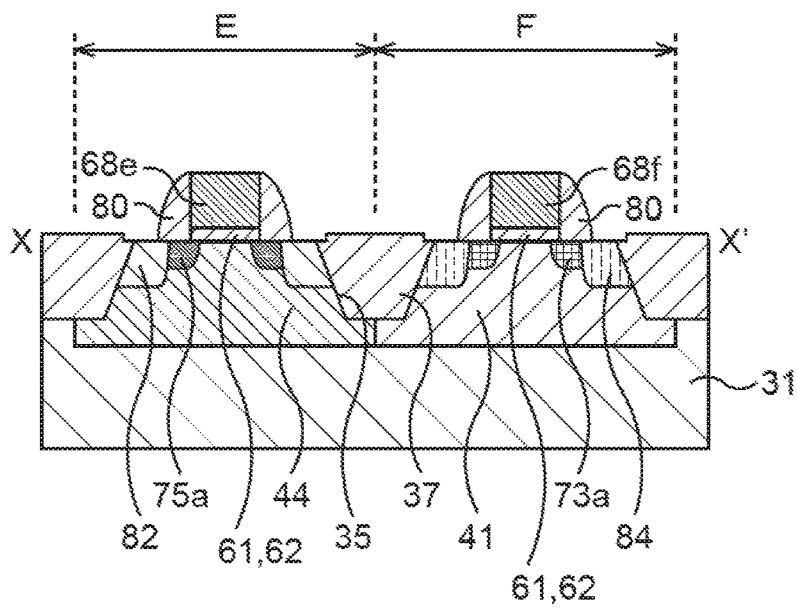

Subsequently, as in the step illustrated in FIGS. 32A-32C and FIG. 134, the resist 59 opening the region C where the p-type low-voltage transistor is formed and the region D where the n-type low-voltage transistor is formed as illustrated in FIGS. 188A and 188B is patterned by performing coating, exposure, and developing treatments. The resist 59 here is the same as that made by transferring the mask pattern 214 for low-voltage transistor gate insulating film formation etching as illustrated in FIGS. 167A and 167B. In the first embodiment, the first thermal oxide film 57 is grown on the surface of the semiconductor substrate 31 as illustrated in FIGS. 83A and 83B. However, the modification example of the first embodiment is different in that the first interface oxide layer 58 is formed along with the CVD oxide film 55.

Subsequently, as in the step illustrated in FIGS. 33A-33C, FIGS. 84A-84B, and FIG. 135, for example, a hydrofluoric acid treatment is performed using the resist 59 as a mask to remove the CVD oxide film 55 and the first interface oxide layer 58. The first thermal oxide film 57 is removed in the first embodiment, but the film to be removed is different in the modification example of the first embodiment. By appropriately changing the time of the hydrofluoric acid treatment, the surface of the semiconductor substrate 31 can be exposed. Then, the resist 59 is removed using, for example, an $O_2$ gas, a mixed gas containing an $O_2$ gas, or the like.

Subsequently, as in the step illustrated in FIGS. 34A-34C, FIGS. 85A-85B, and FIG. 136, the thermal diffusion furnace grows the second thermal oxide film 60.

As the subsequent steps, the same steps as those in the first embodiment can be used to manufacture the semiconductor device.

In the modification example of the first embodiment, it is explained that through use of the mask patterns different from those in the first embodiment, the film formed on the surface of the semiconductor substrate 31 in the regions C, D where the low-voltage transistor is formed is different and the film removed by the hydrofluoric acid treatment is different. More specifically, in the first embodiment, the CVD oxide film 55 formed on the semiconductor substrate 31 in the regions C, D where the low-voltage transistor is formed is removed by the hydrofluoric acid treatment, the first thermal oxide film 57 is grown, the first thermal oxide film 57 is removed by the hydrofluoric acid treatment, and then the second thermal oxide film 60 is grown. On the other hand, in the modification example of the first embodiment, the CVD oxide film 55 formed on the semiconductor substrate 31 in the regions C, D where the low-voltage transistor is formed is not subjected to the hydrofluoric acid treatment but remains, the first interface oxide layer 58 is grown, the CVD oxide film 55 and the first interface oxide layer 58 are removed by the hydrofluoric acid treatment, and then the second thermal oxide film 60 is grown.

Therefore, in the modification example of the first embodiment as compared with the first embodiment, the concrete number of steps is not changed, but the number of times of exposure of the surface of the semiconductor substrate 31 in the regions C, D where the low-voltage transistor is formed to the hydrofluoric acid treatment is smaller. Note that the surface of the semiconductor substrate 31 is the surface implanted with impurities, and is the surface where electrons and holes flow when the transistor operates. The surface of the semiconductor substrate 31 here is preferably made to be reduced in oxidation amount as much as possible and reduced in the number of times of exposure to the chemical solution treatment. The reduction in oxidation amount as much as possible can restrain the implanted impurities from diffusing in the oxide film and the oxide layer to flow out. Further, the reduction in the number of times of exposure to the chemical solution treatment can lower the degree of the surface of the element isolation 37 receding by the chemical solution treatment to expose the side surface of the semiconductor substrate 31. For example, there is a case where the etching rate by the chemical solution treatment is higher at the surface of the element isolation 37 near the interface between the semiconductor substrate 31 and the element isolation 37 than at the flat surface of the element isolation 37. When this phenomenon occurs, local level difference occurs.

For example, when an unnecessary local level difference occurs at a portion where the gate electrodes 68*c*, 68*d*, the semiconductor substrate 31, and the element isolation 37 are close to one another and thereby the thickness of the gate electrode film 66 partially increases at that portion, an etching residue may be generated. Further, for example, when an unnecessary local level difference occurs at a portion where the gate electrodes 68*c*, 68*d*, the semiconductor substrate 31, and the element isolation 37 are close to one another and thereby the level difference remains on the surface of the gate electrode film 66 at that portion, the patterns by the resist for forming the gate electrodes 68*c*, 68*d* may become likely to vary in line width due to the level difference. The etching residue causes an electrical short circuit, and the variation in line width of the gate electrodes 68*c*, 68*d* causes variation in transistor characteristics. Suppressing occurrence of the unnecessary local level difference makes it possible to avoid generation of the etching residue and occurrence of variation in line width of the patterns by the resist.

Therefore, as compared with the first embodiment, the modification example of the first embodiment is preferable to obtain excellent transistor characteristics because the oxidation amount of the surface of the semiconductor substrate 31 is smaller and the hydrofluoric acid treatment can be reduced. Further, the modification example of the first embodiment can manufacture a preferable semiconductor device without increasing the manufacturing process.

Second Embodiment

FIG. 190 to FIG. 198 and FIG. 199 to FIG. 203 are cross-sectional views and plan views explaining a second embodiment, respectively. The second embodiment is to further improve the ON characteristics of the high withstand voltage transistor through the same steps as those in the first embodiment. To improve the characteristics, change of some of the mask patterns and change of the processed shape of the sidewall shape are performed.

Hereinafter, the step where the mask pattern is changed and different points of the manufacturing process will be described. Note that the description is made with the same components as those in the first embodiment denoted by the same signs and different components denoted with different signs as needed.

FIG. 190 to FIG. 198 are cross-sectional views (part 1 to part 9) explaining the manufacturing process of the semiconductor device in the second embodiment. FIG. 199 to FIG. 203 are plan views (part 1 to part 5) illustrating mask patterns of a high withstand voltage transistor part in the manufacturing process of the semiconductor device in the second embodiment.

As described in the first embodiment, an STI structure is formed as in the steps in FIG. 103 to FIG. 109. Note that a resist 34 is different from that in the first embodiment in that a mask pattern 224 for element isolation illustrated in FIG. 199 is transferred thereto. Then, a sacrificial oxide film 38 is grown as in the steps in FIG. 110 to FIG. 112. The state through the steps so far is illustrated in FIG. 190 for comparison with FIG. 112.

Regions K to N illustrated in FIG. 190 are regions indicating a high withstand voltage transistor part. The high withstand voltage transistor part includes the region K where a second p-type high withstand voltage transistor is formed, the region L where a third tap is formed, the region M where a second n-type high withstand voltage transistor is formed, and the region N where a fourth tap is formed. FIG. 190 is a cross-sectional view illustrating a Z-Z' line part illustrated in FIG. 199.

Figure 112:
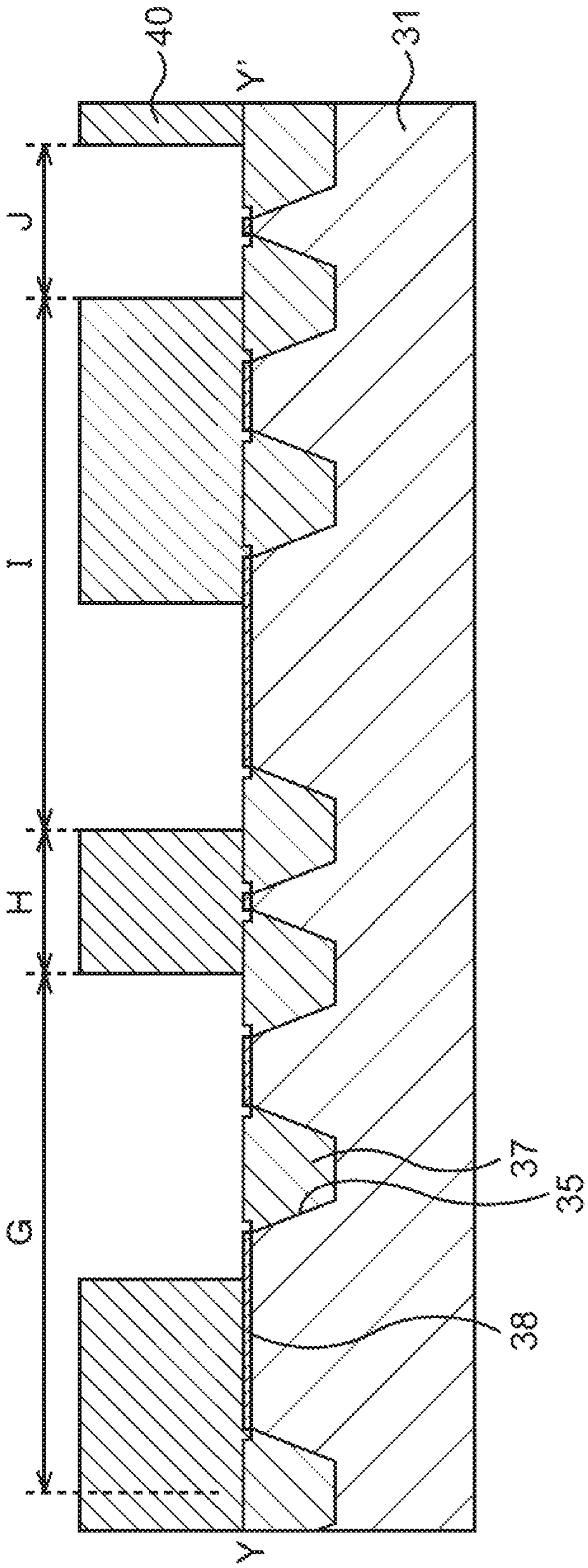
FIG. 112 is a cross-sectional view (part 112) explaining the manufacturing process of the semiconductor device in the first embodiment.

Subsequently, as in the step illustrated in FIG. 112, a resist 40 opening the region M where the second n-type high withstand voltage transistor is formed and the region N where the fourth tap as illustrated in FIG. 190 is formed, is patterned by performing coating, exposure, and developing treatments. The resist 40 here is the one made by transferring a mask pattern 225 for P-well implantation illustrated in FIG. 199. Note that the region K where the second p-type high withstand voltage transistor is formed is not opened unlike the region G in FIG. 112 where the first p-type high withstand voltage transistor is formed. As in the step in FIG. 112, a P-well 41 is formed.

Figure 113:
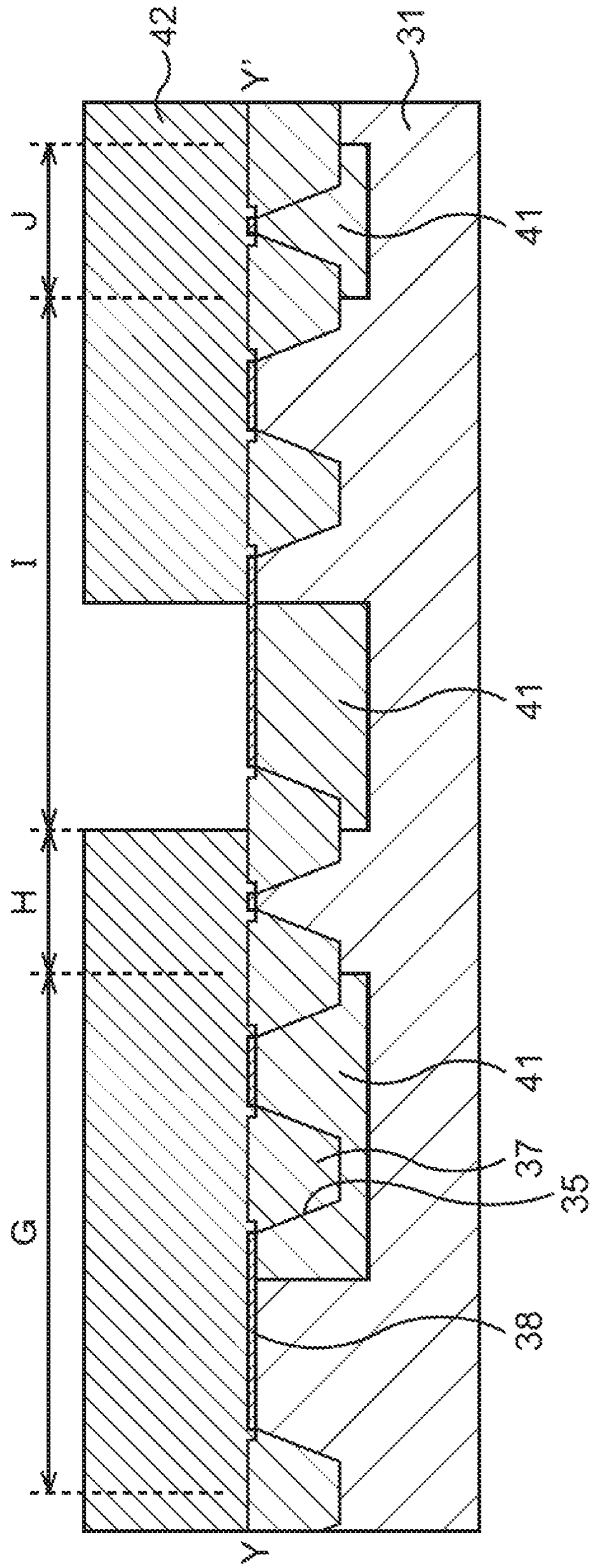
FIG. 113 is a cross-sectional view (part 113) explaining the manufacturing process of the semiconductor device in the first embodiment.

Subsequently, as in the step in FIG. 113, a channel (not illustrated) is formed at a part of the second p-type high withstand voltage transistor. The state through the steps so far is illustrated in FIG. 191 for comparison with FIG. 114.

Figure 114:
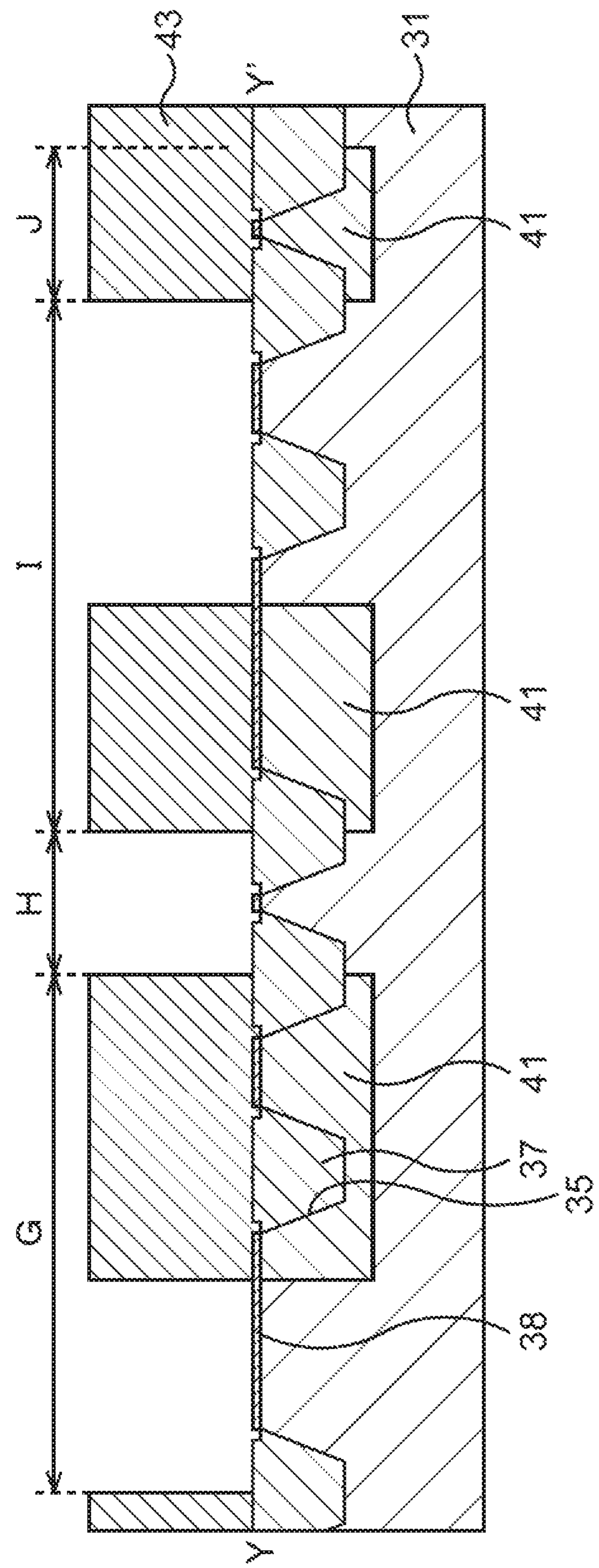
FIG. 114 is a cross-sectional view (part 114) explaining the manufacturing process of the semiconductor device in the first embodiment.
Figure 115:
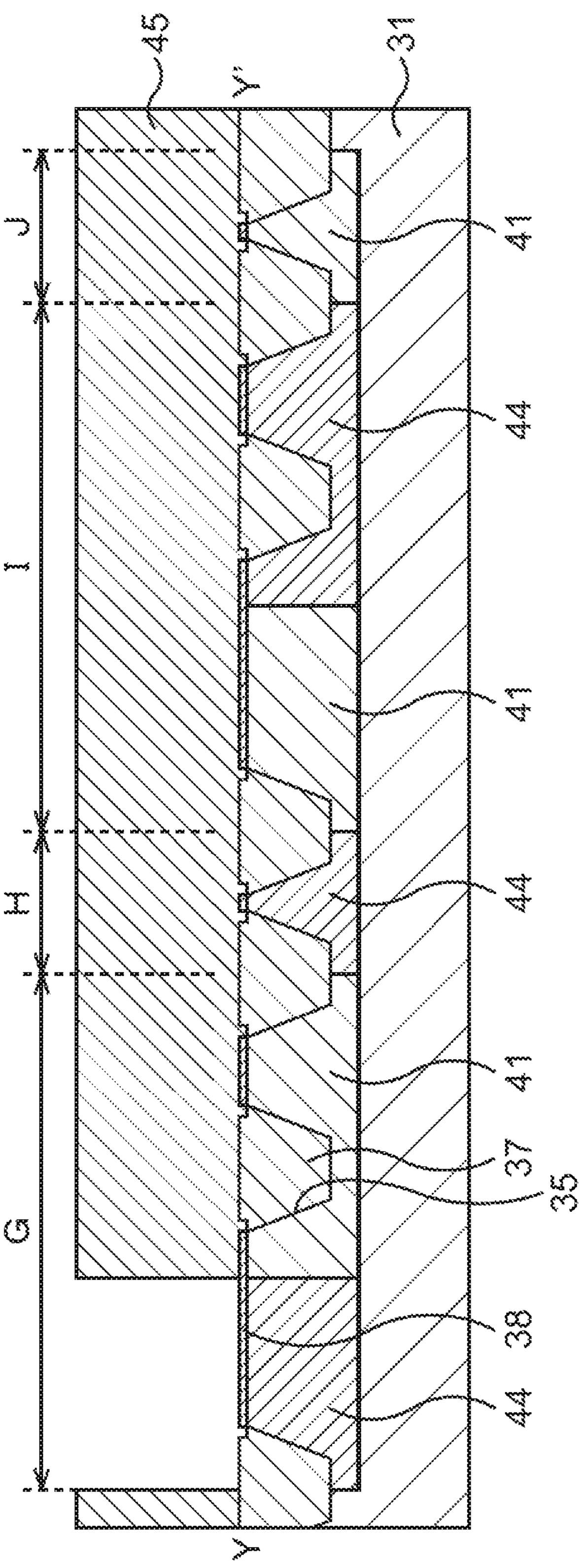
FIG. 115 is a cross-sectional view (part 115) explaining the manufacturing process of the semiconductor device in the first embodiment.
Figure 116:
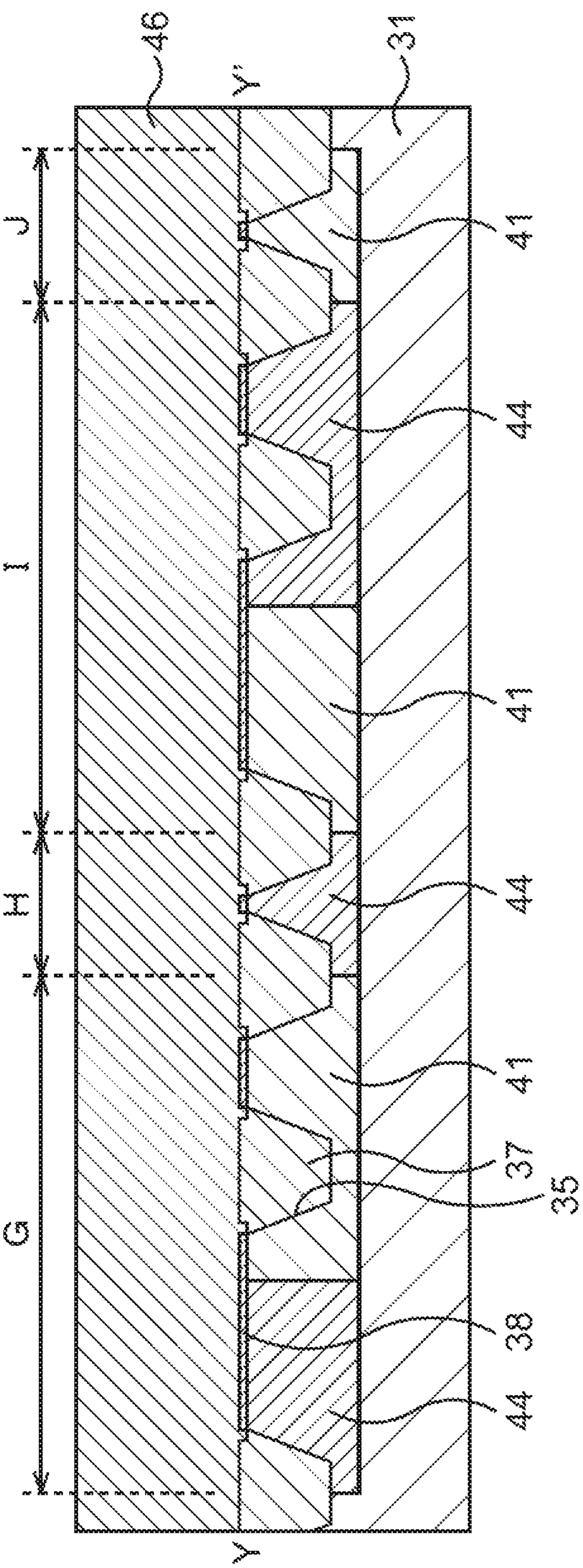
FIG. 116 is a cross-sectional view (part 116) explaining the manufacturing process of the semiconductor device in the first embodiment.
Figure 117:
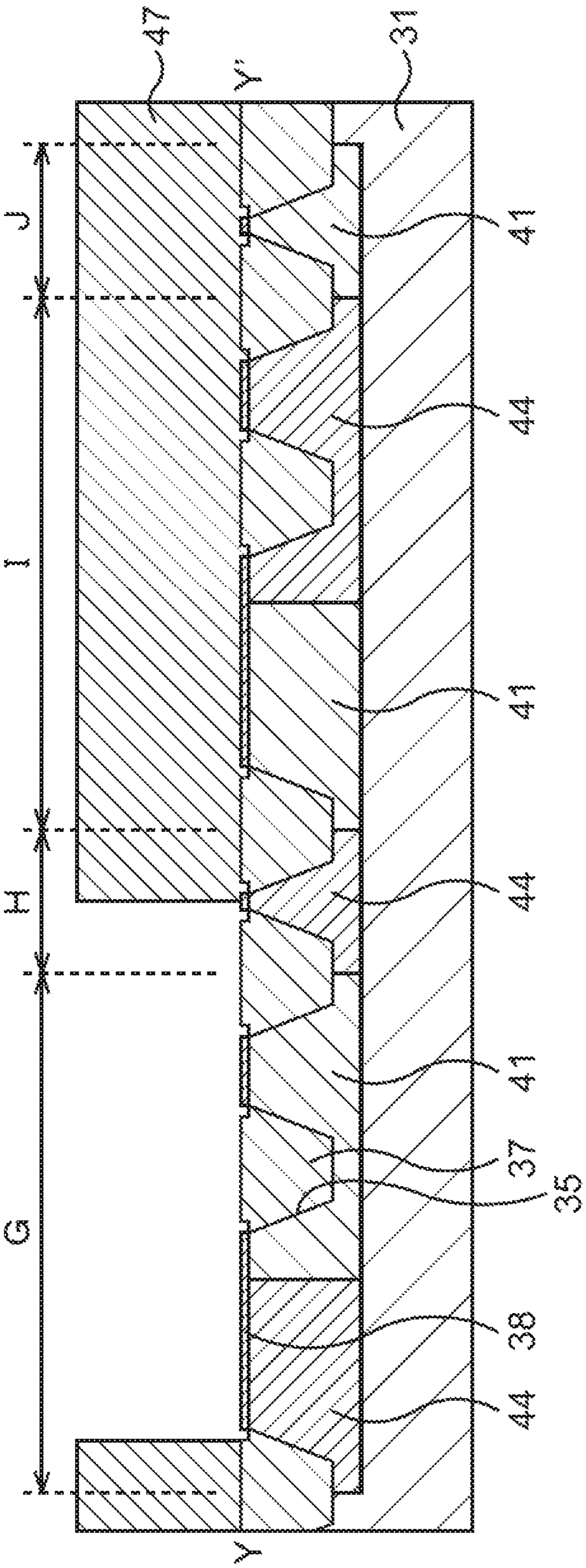
FIG. 117 is a cross-sectional view (part 117) explaining the manufacturing process of the semiconductor device in the first embodiment.
Figure 118:
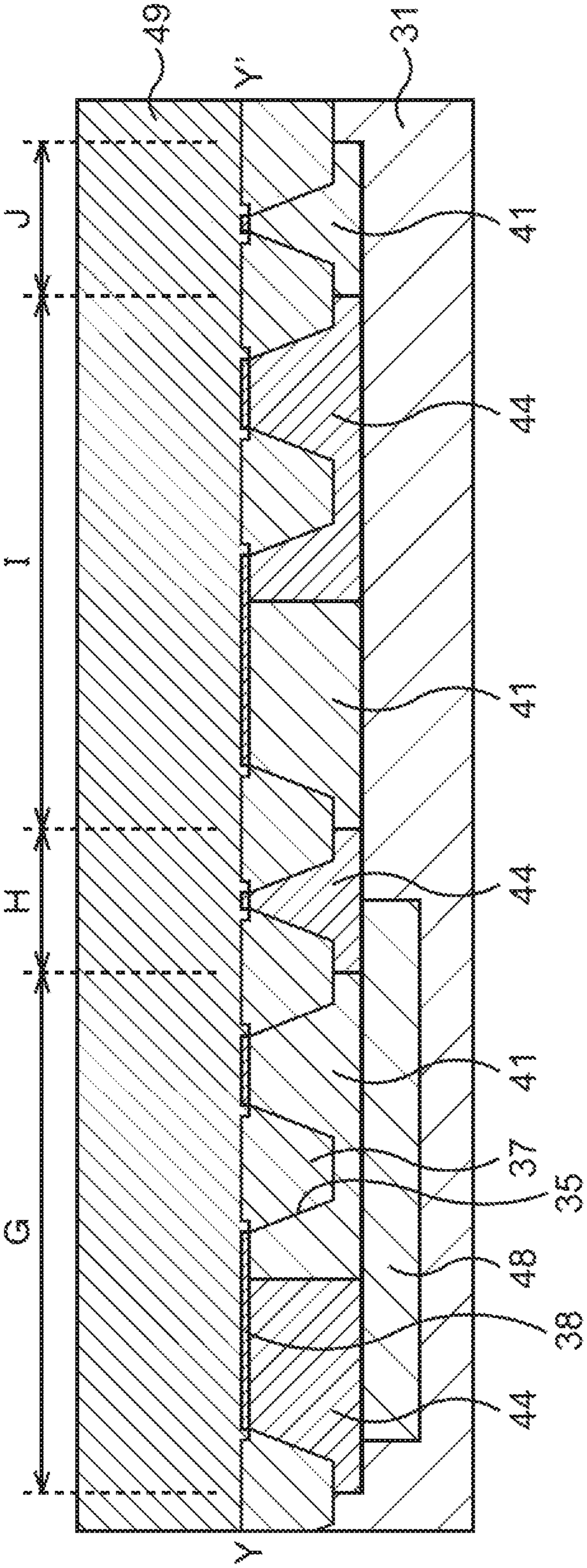
FIG. 118 is a cross-sectional view (part 118) explaining the manufacturing process of the semiconductor device in the first embodiment.
Figure 119:
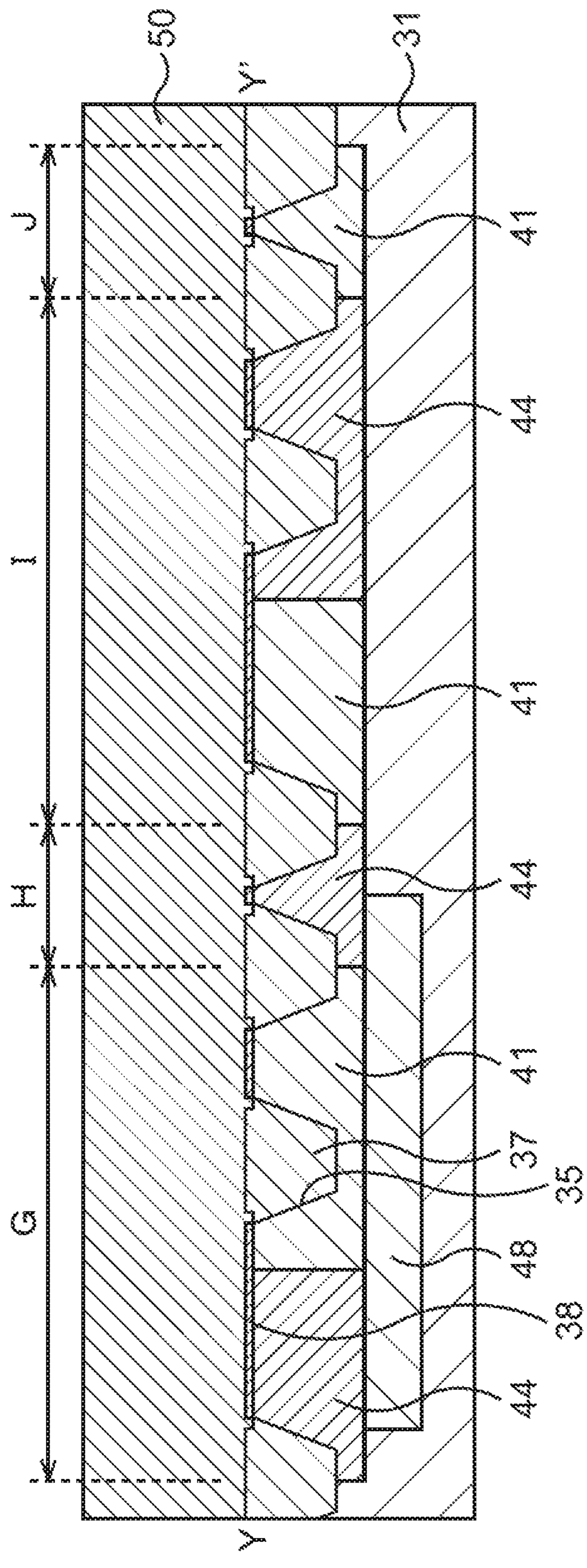
FIG. 119 is a cross-sectional view (part 119) explaining the manufacturing process of the semiconductor device in the first embodiment.
Figure 120:
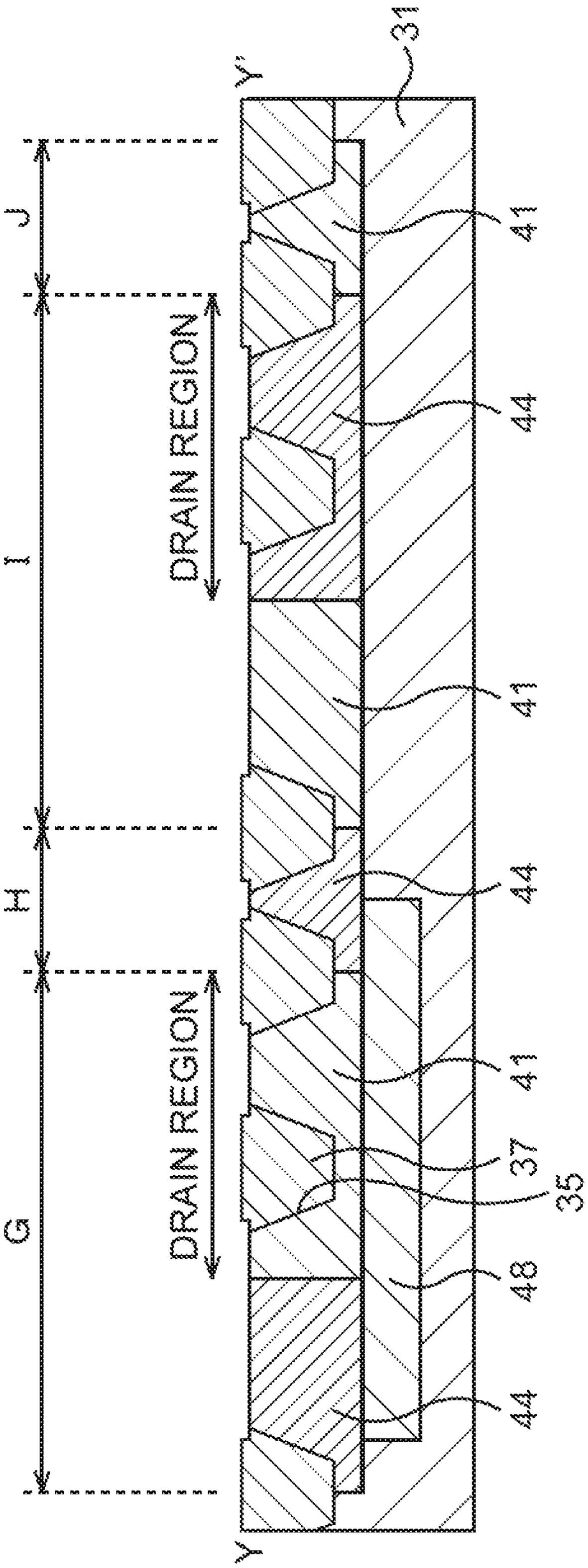
Figure 121:
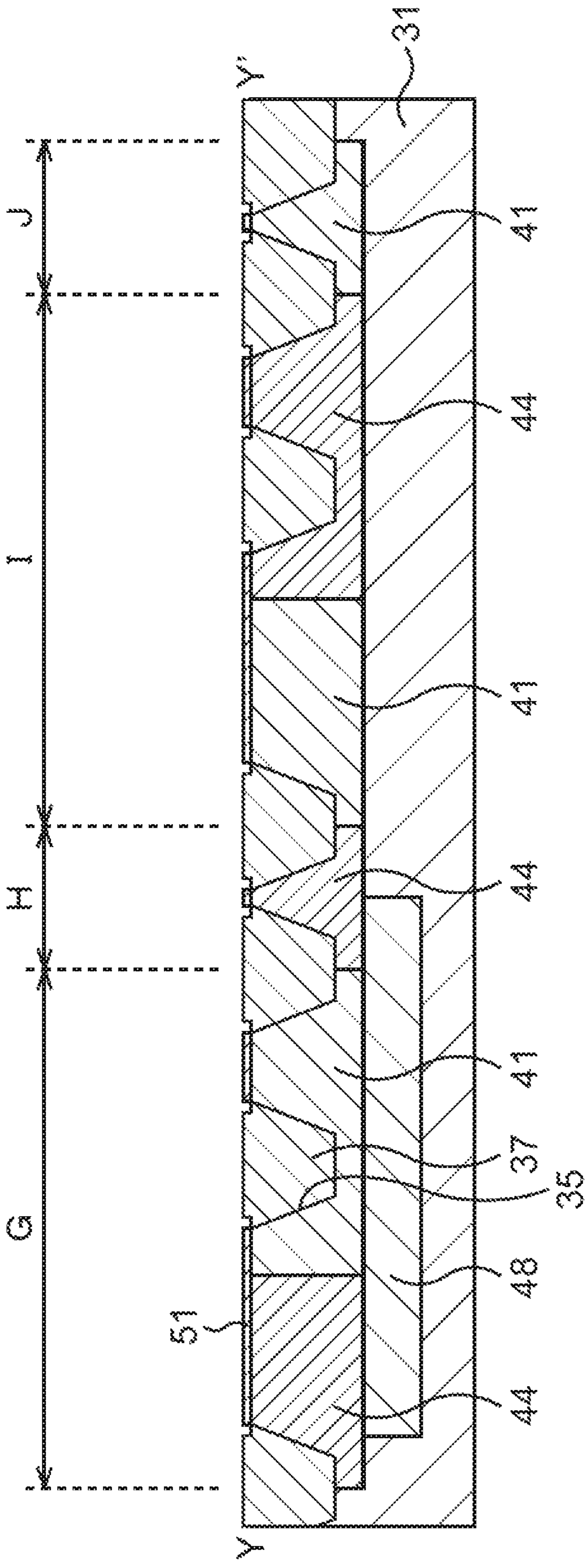
Figure 122:
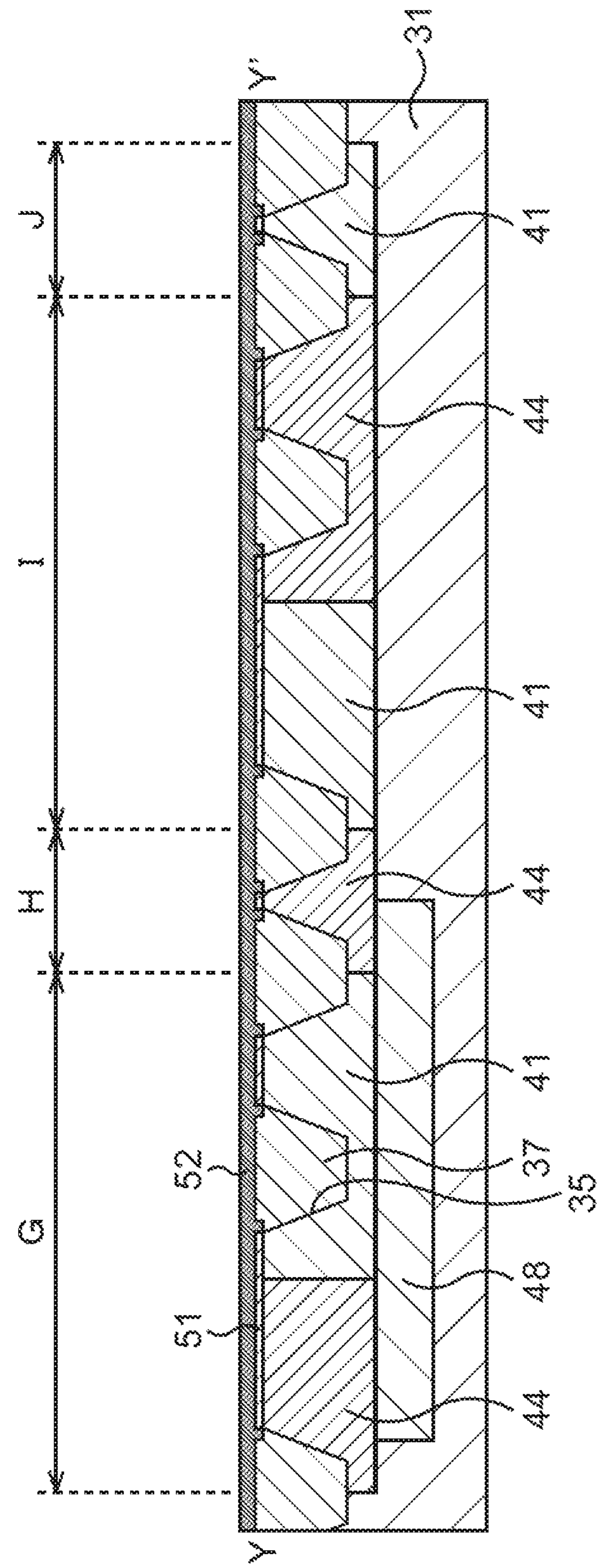
Figure 123:
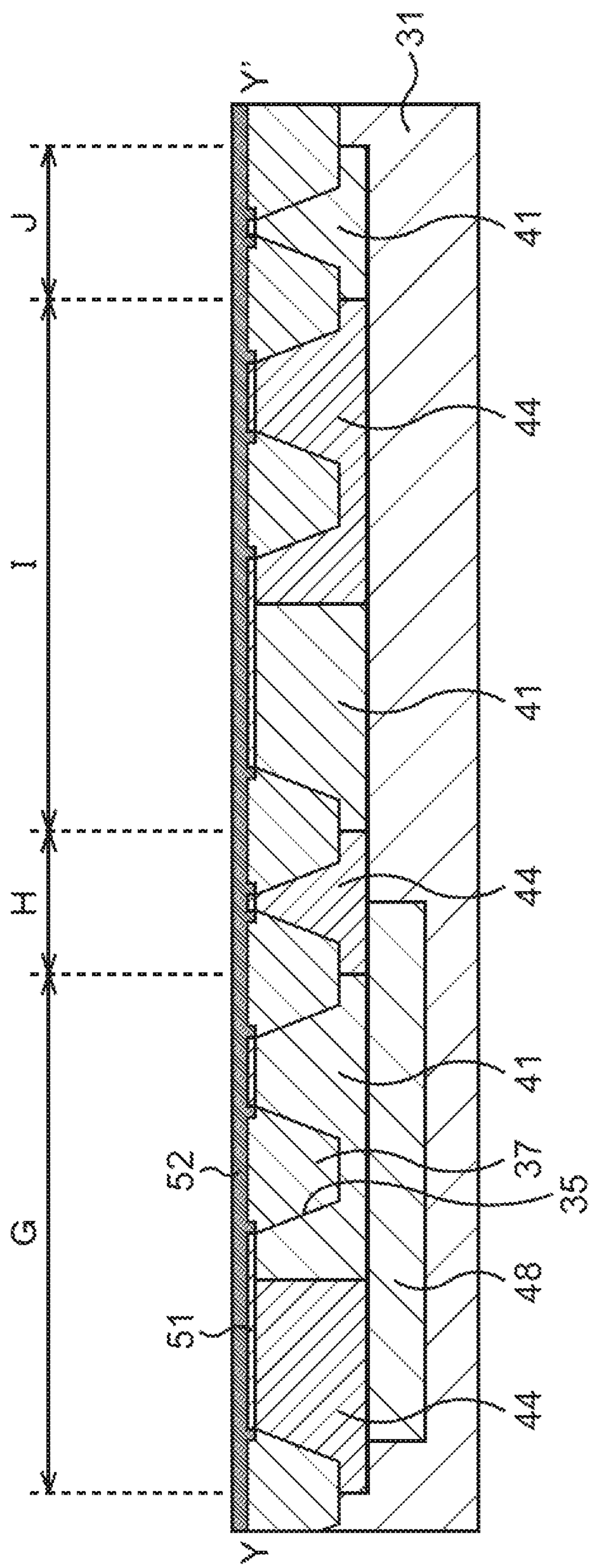
Figure 124:
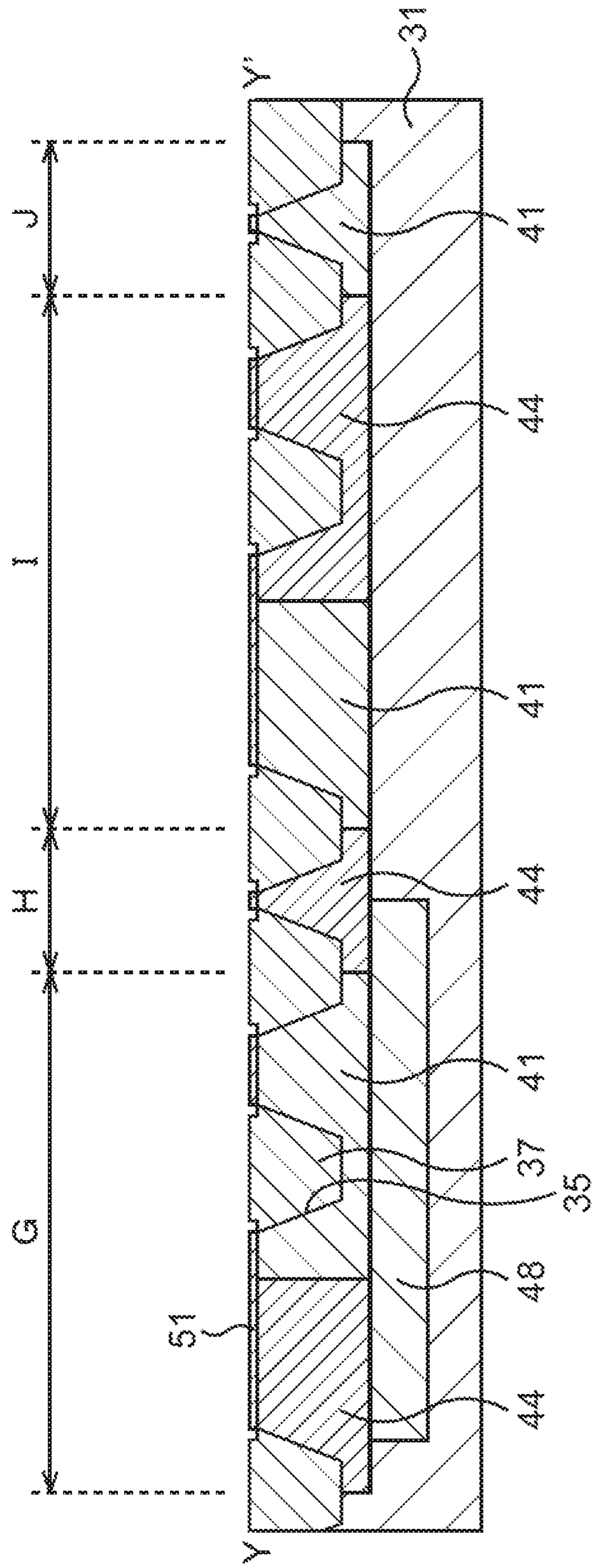
Figure 125:
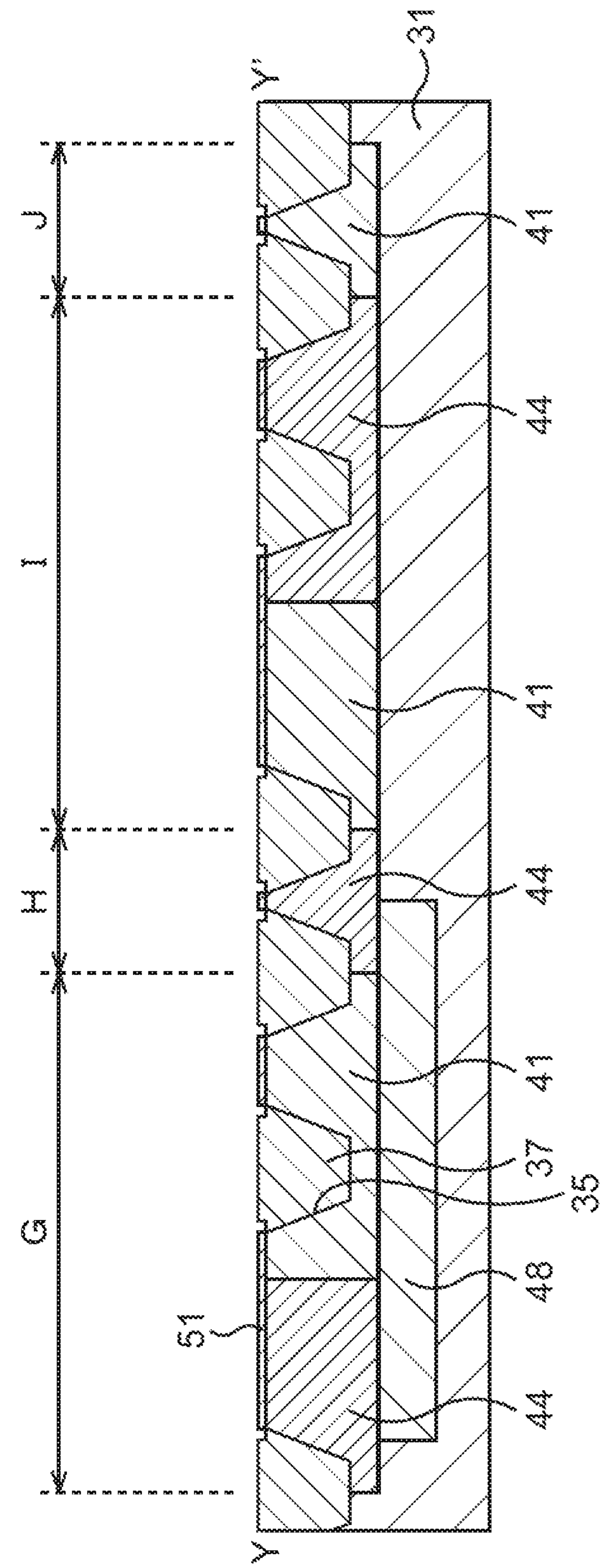
Figure 126:
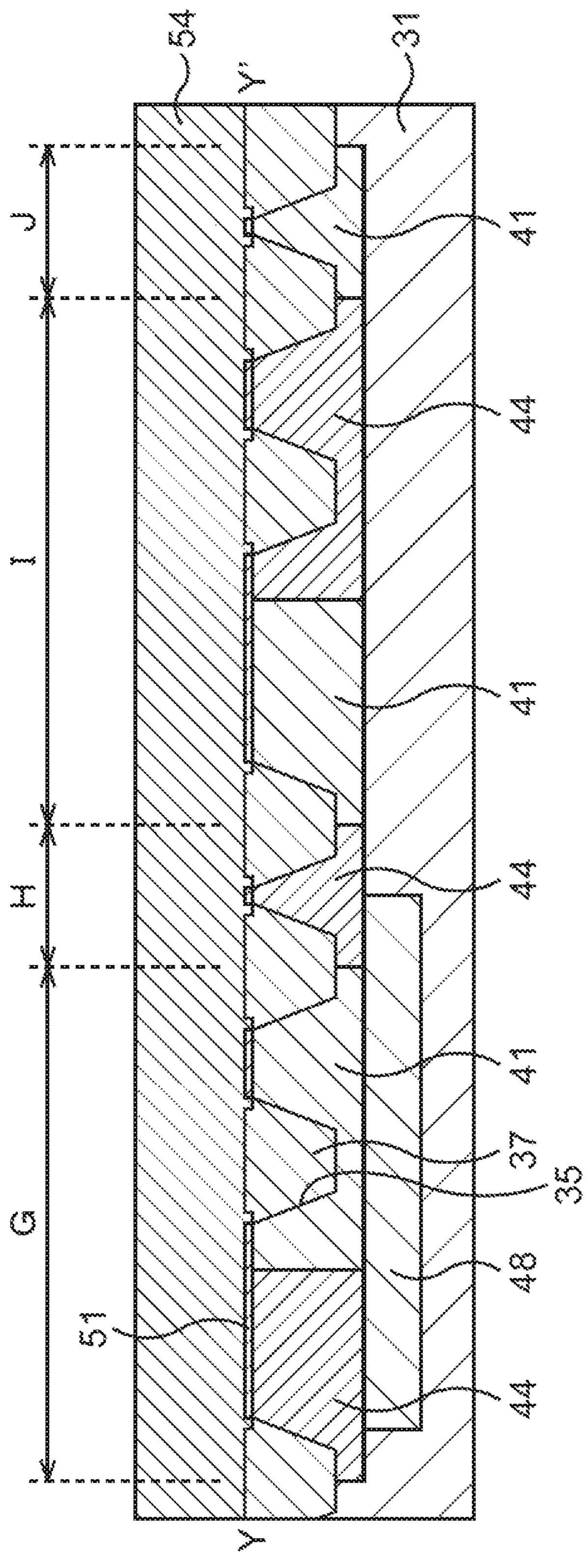
Figure 127:
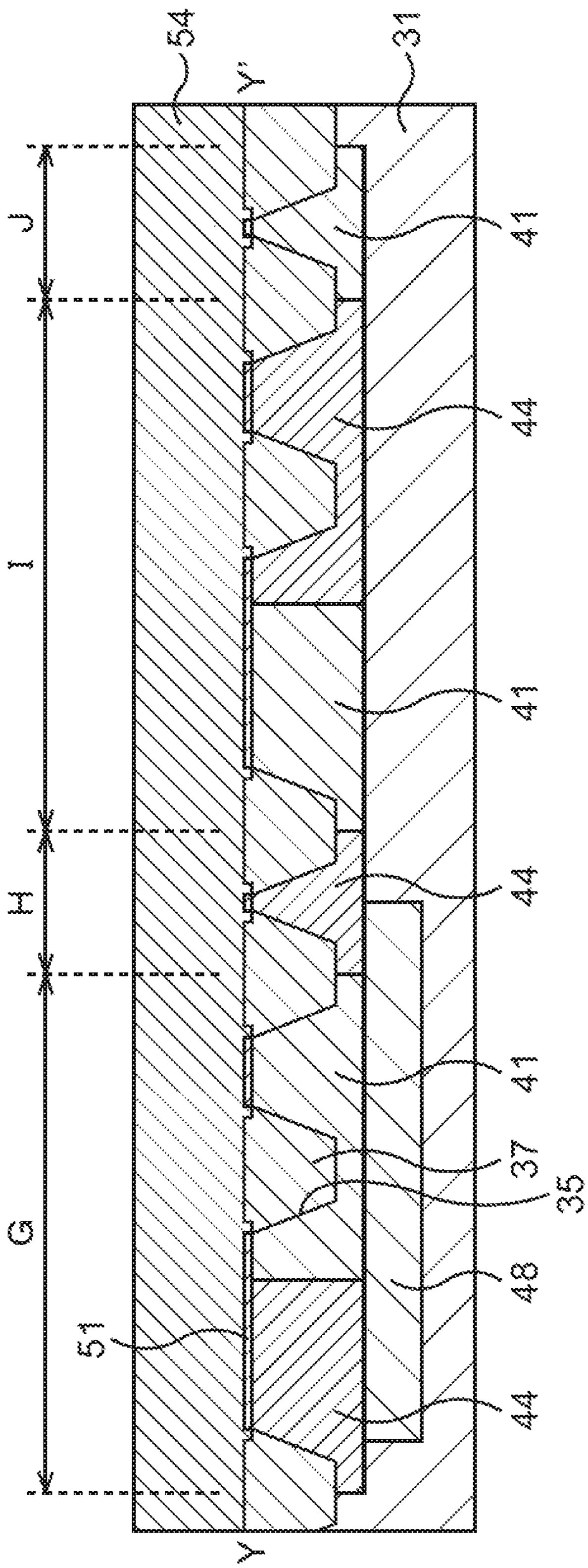
Figure 128:
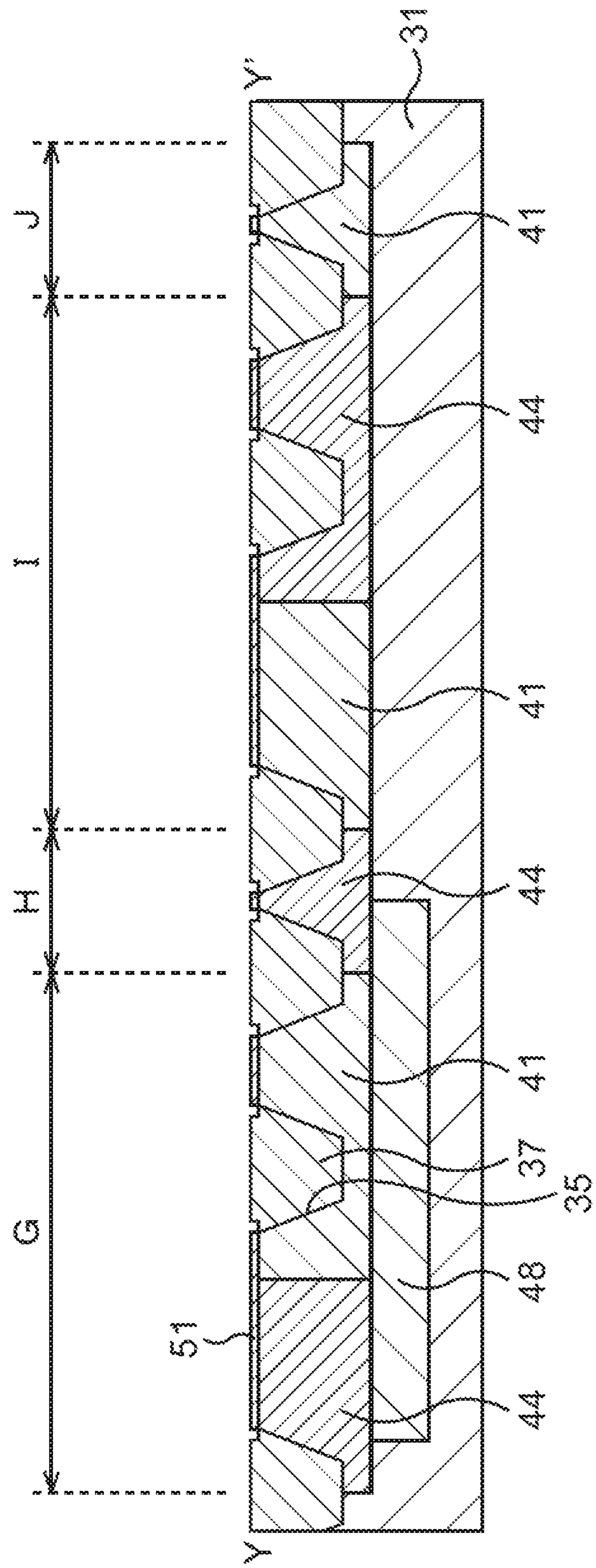
Figure 129:
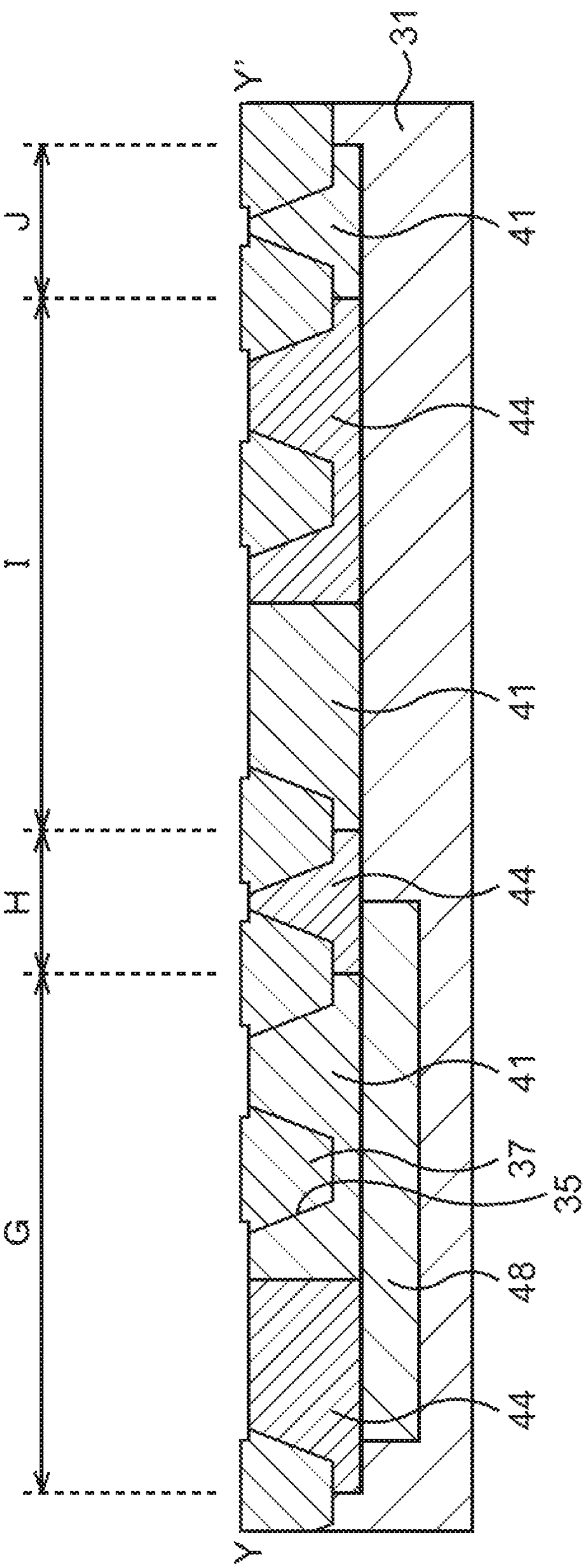
Figure 130:
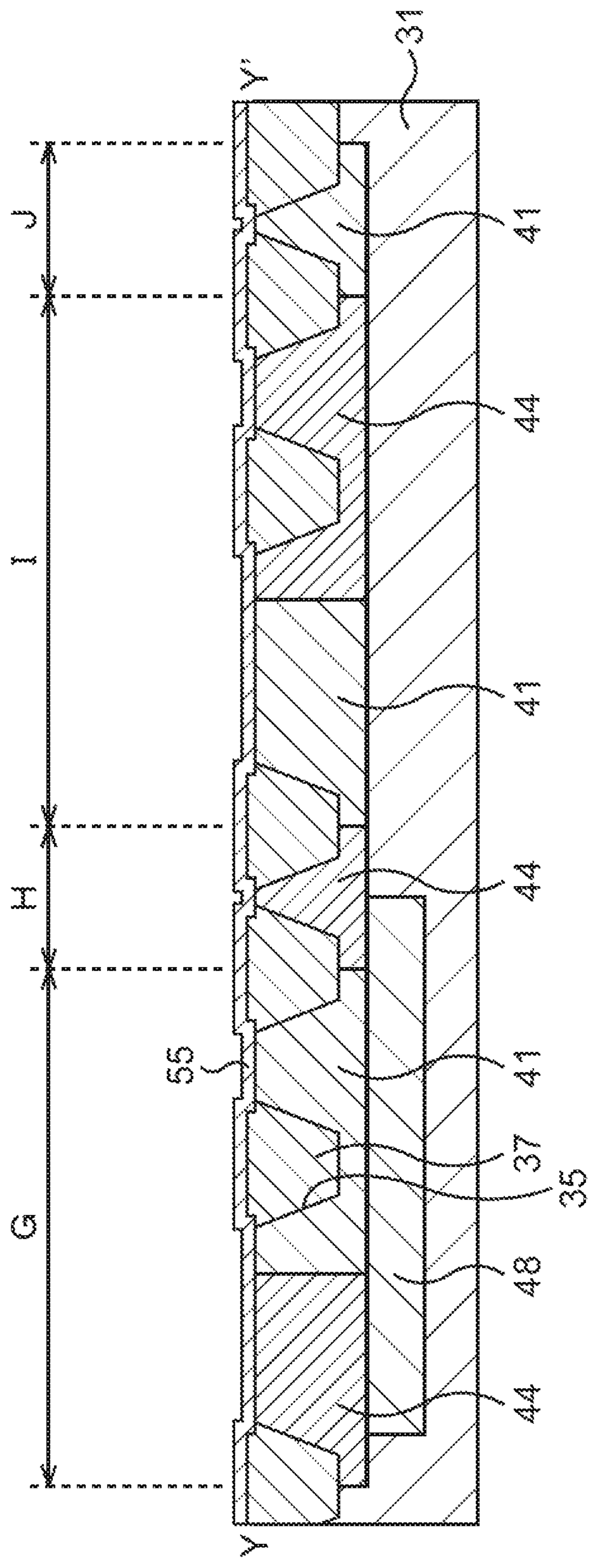
Figure 131:
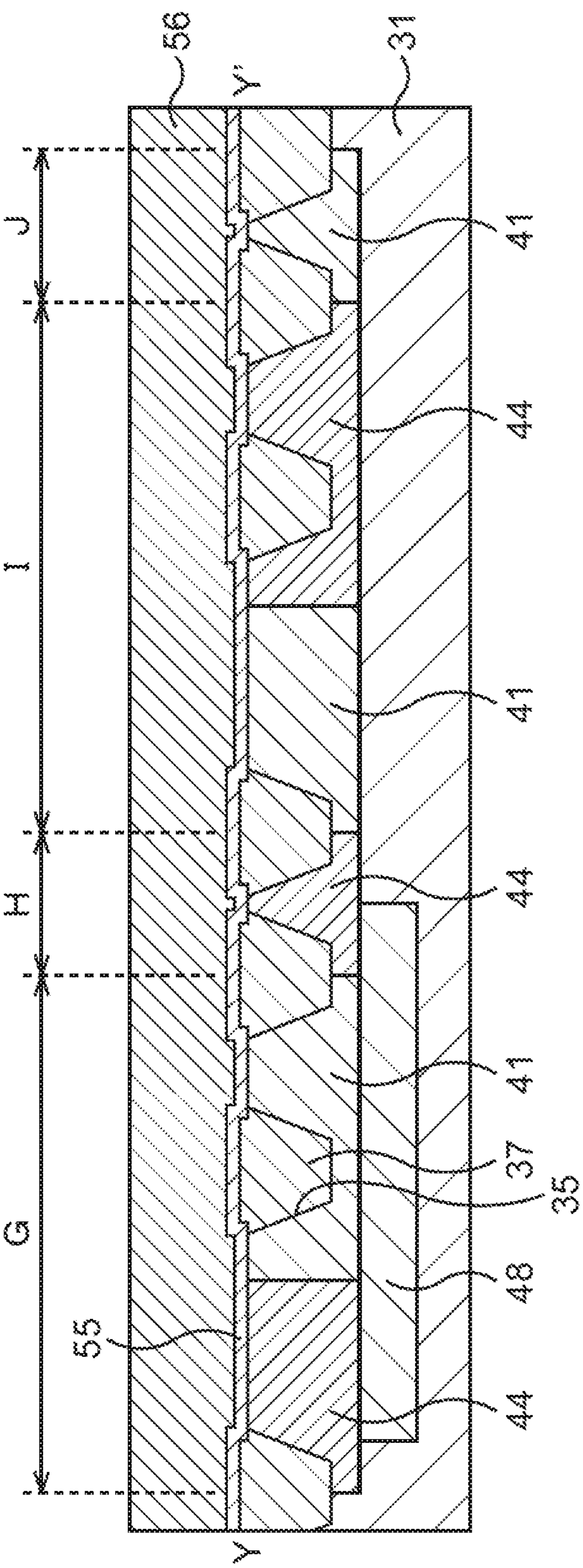

Subsequently, as in the step in FIG. 114, a resist 43 opening the region K where the second p-type high withstand voltage transistor is formed and the L where the third tap is formed as illustrated in FIG. 191 is patterned by performing coating, exposure, and developing treatments. The resist 43 here is the one made by transferring a mask pattern 226 for N-well implantation illustrated in FIG. 200. Note that the region M where the second n-type high withstand voltage transistor is formed is not opened unlike the region I in FIG. 114 where the first n-type high withstand voltage transistor is formed. As in the step in FIG. 114, an N-well 44 is formed.

Subsequently, as described in the first embodiment, as in the steps in FIG. 115 to FIG. 120, a channel (not illustrated) is formed at a part of the second p-type high withstand voltage transistor, a deep N-well 48 is formed in the second p-type high withstand voltage transistor, and the sacrificial oxide film 38 is removed.

Subsequently, as described in the first embodiment, as in the steps in FIG. 121 to FIG. 136, an oxide film 65 having the largest film thickness formed by layering a CVD oxide film 55 and a fourth thermal oxide film 64 is left in the regions K to N where the high withstand voltage transistor is formed.

Subsequently, as described in the first embodiment, as in the steps in FIG. 137 to FIG. 143, gate electrodes 68*i*, 68*j* are formed in a gate electrode film 66 using a resist 67 made by a mask pattern 227 for gate electrode etching illustrated in FIG. 201. The state through the steps so far is illustrated in FIG. 192 for comparison with FIG. 144.

Subsequently, as in the step in FIG. 144, a resist 72 opening the region M where the second n-type high withstand voltage transistor is formed as illustrated in FIG. 192 is patterned by performing coating, exposure, and developing treatments. The resist 72 here is the one made by transferring a mask pattern 228 for n-type middle withstand voltage transistor LDD implantation illustrated in FIG. 201. Note that the region M where the second n-type high withstand voltage transistor is formed has a large range of the opening unlike the region I in FIG. 144 where the first n-type high withstand voltage transistor is formed. As in the step in FIG. 144, a second n-type high withstand voltage transistor LDD layer 73*b* is formed. The state through the steps so far is illustrated in FIG. 193 for comparison with FIG. 145.

Subsequently, as in the step in FIG. 145, a resist 74 opening the region K where the second p-type high withstand voltage transistor is formed as illustrated in FIG. 193 is patterned by performing coating, exposure, and developing treatments. The resist 74 here is the one made by transferring a mask pattern 229 for p-type middle withstand voltage transistor LDD implantation illustrated in FIG. 202. Note that the region K where the second p-type high withstand voltage transistor is formed has a large range of the opening unlike the region G in FIG. 145 where the first p-type high withstand voltage transistor is formed. As in the step in FIG. 145, a p-type high withstand voltage transistor LDD layer 75*c* is formed as in the step in FIG. 145.

Subsequently, as described in the first embodiment, as in the steps in FIG. 146 to FIG. 148, LDD layers of other transistors are formed and the resists are removed.

Subsequently, though illustration is omitted in the first embodiment, in the process of forming the sidewall structure illustrated in FIGS. 47A-47C, FIGS. 98A-98B, and FIG. 149, a sidewall oxide film 80 is formed first as illustrated in FIG. 194. Though etching back is performed on the entire surface in plasma with the sidewall oxide film 80 exposed to the entire surface in the first embodiment, the second embodiment uses a different method, which will be described below.

Subsequently, as illustrated in FIG. 194, after the sidewall oxide film 80 is formed, a resist 86 remaining in a manner to cover parts of the gate electrodes 68*i*, 68*j* is patterned by performing coating, exposure, and developing treatments. The resist 86 here is the one made by transferring a mask pattern 230 for sidewall offset illustrated in FIG. 203.

Subsequently, as illustrated in FIG. 195, etching back is performed on the entire surface of the sidewall oxide film 80 in plasma using the resist 86 as a mask and using, for example, a $CF_4$ gas, a mixed gas containing a $CHF_3$ gas, or the like as in the first embodiment. The sidewall oxide film 80 in the region where the sidewall oxide film 80 is covered by the resist 86 here remains. Though not illustrated, in a region where other transistors are formed, the sidewall structure is formed as in the first embodiment.

Subsequently, as illustrated in FIG. 196, the resist 86 is removed using, for example, an $O_2$ gas, a mixed gas containing an $O_2$ gas, or the like. Sidewall oxide films 80*a*, 80*b* remain in a manner to cover parts of the surfaces and the sidewalls of the gate electrodes 68*i*, 68*j*, and parts of the surface of the semiconductor substrate 31. FIG. 149 in the first embodiment and FIG. 196 are different in the remaining shape of the sidewall oxide film 80.

Subsequently, as described in the first embodiment, as in the steps in FIG. 150 to FIG. 152, a PSD layer 82 and an NSD layer 84 are formed as illustrated in FIG. 197.

Subsequently, as described in the first embodiment, as in the step in FIG. 153, a cobalt silicide film 85 is formed as illustrated in FIG. 198. In the second embodiment, since the sidewall oxide films 80*a*, 80*b* are left, the cobalt silicide film 85 is not formed at parts of the gate electrodes 68*i*, 68*j* and parts of the surface of the semiconductor substrate 31.

As illustrated in FIG. 198, a second p-type high withstand voltage transistor 9 functions as a switching element by a gate 126 of the second p-type high withstand voltage transistor, a source 127 of the second p-type high withstand voltage transistor, a drain 128 of the second p-type high withstand voltage transistor, a third tap 129, the N-well 44, and the deep N-well 48. In the semiconductor substrate 31 on the lower side of the gate 126 of the second p-type high withstand voltage transistor, the N-well 44 is arranged on the side of the source 127 of the second p-type high withstand voltage transistor. On the other hand, the semiconductor substrate 31 on the lower side of the gate 126 of the second p-type high withstand voltage transistor has a portion 87 where additional implantation is not performed and the element isolation 37 is not arranged. Further, the portion 87 where additional implantation is not performed is surrounded by the N-well 44 and the deep N-well 48. The above structure is called an LDMOS as in the first p-type high withstand voltage transistor 7. The second p-type high withstand voltage transistor 9 is different from the first p-type high withstand voltage transistor 7 in that the element isolation 37 is not arranged, that the P-well 41 is not arranged, and that offset is provided in the drain region by the sidewall oxide film 80*a*. With this structure, the drain region can be separated from the gate electrode to keep the drain withstand voltage high. Further, at the time when passing current from the source 127 of the second p-type high withstand voltage transistor to the drain 128 of the second p-type high withstand voltage transistor by switching, the current does not flow bypassing the element isolation 37 as in the first p-type high withstand voltage transistor 7. Therefore, it is possible to reduce the on-resistance being the parasitic resistance when the transistor operates. In short, the LDMOS structure as in the second p-type high withstand voltage transistor 9 enables reduction in on-resistance while suitably improving the drain withstand voltage, and is therefore applicable to a circuit required to have excellent on-characteristics at higher voltage.

As illustrated in FIG. 198, a second n-type high withstand voltage transistor 10 functions as a switching element by a gate 130 of the second n-type high withstand voltage transistor, a source 131 of the second n-type high withstand voltage transistor, a drain 132 of the second n-type high withstand voltage transistor, a fourth tap 133, and the P-well 41. In the semiconductor substrate 31 on the lower side of the gate 130 of the second n-type high withstand voltage transistor, the P-well 41 is arranged on the side of the source 131 of the second n-type high withstand voltage transistor. On the other hand, the semiconductor substrate 31 on the lower side of the gate 130 of the second n-type high withstand voltage transistor has a portion 88 where additional implantation is not performed and the element isolation 37 is not arranged. The above structure is called an LDMOS as in the first n-type high withstand voltage transistor 8. The second n-type high withstand voltage transistor 10 is different from the first n-type high withstand voltage transistor 8 in that the element isolation is not arranged, that the N-well 44 is not arranged, and that offset is provided in the drain region by the sidewall oxide film 80*b*. With this structure, the drain region can be separated from the gate electrode to keep the drain withstand voltage high. Further, at the time when passing current from the source 131 of the second n-type high withstand voltage transistor to the drain 132 of the second n-type high withstand voltage transistor by switching, the current does not flow bypassing the element isolation 37 as in the first n-type high withstand voltage transistor 8. Therefore, it is possible to reduce the on-resistance being the parasitic resistance when the transistor operates. In short, the LDMOS structure as in the second n-type high withstand voltage transistor 10 enables reduction in on-resistance while suitably improving the drain withstand voltage, and is therefore applicable to a circuit required to have excellent on-characteristics at higher voltage.

Third Embodiment

FIG. 204 is a view explaining a third embodiment. More specifically, the semiconductor device manufactured by a manufacturing method including the manufacturing methods explained in the first embodiment and the second embodiment is exemplified.

In a semiconductor device 20, a MOS transistor and so on are formed as illustrated in FIG. 204. For example, a semiconductor substrate 301 such as a silicon substrate has a plurality of element isolation regions demarcated by an element isolation 302. On the semiconductor substrate 301, a gate insulating film 303*a* and a gate electrode 303*b* are layered. At a side portion of the gate insulating film 303*a* and the gate electrode 303*b*, a sidewall insulating film 303*c* is formed. At a portion where there is no element isolation 302 at the surface of the semiconductor substrate 301, a source/drain diffusion layer 303*d* is formed to hold the gate insulating film 303*a* and the gate electrode 303*b* intervening therein in plan view. An example of the source/drain diffusion layer 303*d* including an LDD (Lightly doped drain) is exemplified.

Subsequently, for example, a silicon nitride film 304*a* and a silicon oxide film 304*b* are further layered on the entire surface, and a contact hole 305 reaching the source/drain diffusion layer 303*d* is formed in the silicon nitride film 304*a* and the silicon oxide film 304*b*. Besides, though not illustrated, the contact hole 305 is formed to reach also the gate electrode 303*b*. The diameter of the contact hole 305 is, for example, about 0.08 μm to 0.12 μm. In a manner to follow the side surface and the bottom surface of the contact hole 305, for example, a glue layer 305*a* (for example, a TiN film) is formed, and a metal layer 305*b* (for example, a tungsten film) is embedded therein.

Subsequently, for example, a silicon nitride film 306*a* and a silicon oxide film 306*b* are further layered on the entire surface, and a groove 307 reaching the glue layer 305*a* and the metal layer 305*b* or the silicon oxide film 304*b* is formed in the silicon nitride film 306*a* and the silicon oxide film 306*b*. In a manner to follow the side surface and the bottom surface of the groove 307, for example, a barrier metal film 307*a* (for example, a Ta film) is formed, and a metal layer 307*b* (for example, Cu) is embedded therein to form wiring.

Subsequently, for example, a silicon nitride film 308*a* and a silicon oxide film 308*b* are further layered on the entire surface, and a contact hole 309 reaching lower wiring, here, the metal layer 307*b* is formed in the silicon nitride film 308*a* and the silicon oxide film 308*b*. The diameter of the contact hole 309 is, for example, about 0.08 μm to 0.12 μm.

Subsequently, for example, a silicon nitride film 310*a* and a silicon oxide film 310*b* are layered on the entire surface, and a groove 311 connecting to the contact hole 309 formed in the silicon nitride film 308*a* and the silicon oxide film 308*b* or reaching the silicon oxide film 308*b* is formed in the silicon nitride film 310*a* and the silicon oxide film 310*b*. In a manner to follow the side surfaces and the bottom surfaces of the contact hole 309 and the groove 311, for example, a barrier metal film 311*a* (for example, a Ta film) is formed, and a metal layer 311*b* (for example, Cu) is embedded therein to form wiring.

Subsequently, for example, a silicon nitride film 312*a* and a silicon oxide film 312*b* are further layered on the entire surface, and a contact hole 313 reaching lower wiring, here, the metal layer 311*b* is formed in the silicon nitride film 312*a* and the silicon oxide film 312*b*. The diameter of the contact hole 313 is, for example, about 0.08 μm to 0.12 μm.

Subsequently, for example, a silicon nitride film 314*a* and a silicon oxide film 314*b* are layered on the entire surface, and a groove 315 connecting to the contact hole 313 formed in the silicon nitride film 312*a* and the silicon oxide film 312*b* or reaching the silicon oxide film 312*b* is formed in the silicon nitride film 314*a* and the silicon oxide film 314*b*. In a manner to follow the side surfaces and the bottom surfaces of the contact hole 313 and the groove 315, for example, a barrier metal film 315*a* (for example, a Ta film) is formed, and a metal layer 315*b* (for example, Cu) is embedded therein to form wiring.

Subsequently, for example, a silicon nitride film 316*a* and a silicon oxide film 316*b* are further layered on the entire surface, and a contact hole 317 reaching lower wiring, here, the metal layer 315*b* is formed in the silicon nitride film 316*a* and the silicon oxide film 316*b*. The diameter of the contact hole 317 is, for example, about 0.30 μm to 0.50 μm.

Subsequently, for example, a silicon nitride film 318*a* and a silicon oxide film 318*b* are layered on the entire surface, and a groove 319 connecting to the contact hole 317 formed in the silicon nitride film 316*a* and the silicon oxide film 316*b* or reaching the silicon oxide film 316*b* is formed in the silicon nitride film 318*a* and the silicon oxide film 318*b*. In a manner to follow the side surfaces and the bottom surfaces of the contact hole 317 and the groove 319, for example, a barrier metal film 319*a* (for example, a Ta film) is formed, and a metal layer 319*b* (for example, Cu) is embedded therein to form wiring.

Subsequently, for example, a silicon nitride film 320*a* and a silicon oxide film 320*b* are layered on the entire surface, and a contact hole 321 reaching the metal layer 319*b* is formed in the silicon nitride film 320*a* and the silicon oxide film 320*b*. The diameter of the contact hole is, for example, about 0.38 μm to 0.62 μm. Further, in a manner to follow the side surface and the bottom surface of the contact hole, for example, a glue layer 321*a* (for example, a TiN film) is formed, and a metal layer 321*b* (for example, a tungsten film) is embedded therein.

Subsequently, a barrier metal film 322*a* is formed in a manner to cover, for example, a part of the surface of the silicon oxide film 320*b*, the glue layer 321*a*, and the metal layer 321*b*, and a metal layer 322*b* (for example, an Al or Al alloy film) and a barrier metal film 322*c* are layered on the barrier metal film 322*a* to form wiring 322. Further, a silicon oxide film 323*a* is formed on the entire surface in a manner to cover, for example, the barrier metal film 322*a*, the metal layer 322_b_, and the barrier metal film 322_c_, and, for example, a silicon nitride film 323_b_ is formed as a covering film on the silicon oxide film 323_a_. Further, for example, an opening 323_o_ reaching lower wiring, here, the metal layer 322_b_ is formed in the barrier metal film 322_c_, the silicon oxide film 323_a_, and the silicon nitride film 323_b_. The opening 323_o_ is for ensuring the function of electrical connection at the pad for communicating electrical electric signals with an external part.

Note that in the above embodiment, the semiconductor device 20 is presented and the manufacturing process of the semiconductor device is described.

It should be understood by the person skilled in the art that the MOS transistor and so on described in the above embodiment can be replaced with the various transistors such as the memory transistor, the selection transistor, the low-voltage transistor, the middle withstand voltage transistor, and the high withstand voltage transistor described in the first embodiment, the modification example of the first embodiment, and the second embodiment.

The contact pattern 223 described in the first embodiment and the second embodiment can be used as a pattern used for processing the contact hole 305 described in the above embodiment.

Combination of the manufacturing process described in the above embodiment and the manufacturing process of the various transistors described in the first embodiment, the modification example of the first embodiment, and the second embodiment should make it possible to cause the various transistors in the first embodiment, the modification example of the first embodiment, and the second embodiment to operate as a semiconductor device.

The flash memory element made by combining the flash memory transistor and the selection transistor is exemplified as a preferable example in the first embodiment, but the flash memory element is not limited to that and, for example, a flash memory element using only the flash memory transistor can also be embodied as a matter of course.

The manufacturing method of the semiconductor device of the present invention is described in the illustrated embodiments, but the embodiments are merely examples for explaining the technical scope of the present invention. The present invention is not limited to the examples, but the configurations of the components can be replaced with arbitrary configurations having similar functions. Further, other arbitrary components and steps may be added to the present invention.

In one aspect, it is possible to manufacture a semiconductor device including a transistor, a flash memory element, and a high withstand voltage transistor having stable characteristics without increasing the number of steps.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method of a semiconductor device comprising a first transistor, a second transistor, a third transistor, and a flash memory transistor on a semiconductor substrate, the manufacturing method comprising:

forming an element isolation that demarcates each of regions of the first transistor, the second transistor, the third transistor, and the flash memory transistor;

forming a well and a channel in each of the regions of the first transistor, the second transistor, the third transistor, and the flash memory transistor;

forming a tunnel oxide layer and a charge-storage layer in the region of the flash memory transistor;

forming a first oxide film in each of the regions of the first transistor, the second transistor, the third transistor, and the flash memory transistor;

removing the first oxide film in the regions of the first transistor and the second transistor;

forming a third oxide film by adding a first oxide layer between the first oxide film and the semiconductor substrate in the region of the third transistor while forming a second oxide film in the regions of the first transistor and the second transistor by oxidizing the semiconductor substrate;

removing the second oxide film in the region of the first transistor;

forming a fifth oxide film by adding a second oxide layer between the second oxide film and the semiconductor substrate in the region of the second transistor while forming a fourth oxide film in the region of the first transistor by oxidizing the semiconductor substrate, and forming a sixth oxide film by adding a third oxide layer between the first oxide layer and the semiconductor substrate in the region of the third transistor;

forming a gate electrode in each of the regions of the first transistor, the second transistor, the third transistor, and the flash memory transistor;

forming a sidewall film on sidewalls on both sides of the gate electrode; and forming a source region and a drain region in the semiconductor substrate at side portions on both sides of the gate electrode.

2. A manufacturing method of a semiconductor device comprising a first transistor, a second transistor, a third transistor, and a flash memory transistor on a semiconductor substrate, the manufacturing method comprising:

forming an element isolation that demarcates each of regions of the first transistor, the second transistor, the third transistor, and the flash memory transistor;

forming a well and a channel in each of the regions of the first transistor, the second transistor, the third transistor, and the flash memory transistor;

forming a tunnel oxide layer and a charge-storage layer in the region of the flash memory transistor;

forming a first oxide film in each of the regions of the first transistor, the second transistor, the third transistor, and the flash memory transistor;

removing the first oxide film in the region of the second transistor;

forming a third oxide film by adding a first oxide layer between the first oxide film and the semiconductor substrate in the regions of the first transistor and the third transistor while forming a second oxide film in the region of the second transistor by oxidizing the semiconductor substrate;

removing the third oxide film in the region of the first transistor;

forming a fifth oxide film by adding a second oxide layer between the second oxide film and the semiconductor substrate in the region of the second transistor while forming a fourth oxide film in the region of the first transistor by oxidizing the semiconductor substrate, and forming a sixth oxide film by adding a third oxide layer between the first oxide layer and the semiconductor substrate in the region of the third transistor;

forming a gate electrode in each of the regions of the first transistor, the second transistor, the third transistor, and the flash memory transistor;

forming a sidewall film on sidewalls on both sides of the gate electrode; and forming a source region and a drain region in the semiconductor substrate at side portions on both sides of the gate electrode.

3. The manufacturing method of the semiconductor device according to claim 1, wherein the fourth oxide film is used as a gate insulating film of the first transistor, the fifth oxide film is used as a gate insulating film of the second transistor, and the sixth oxide film is used as a gate insulating film of the third transistor, between the gate electrode and the semiconductor substrate.

4. The manufacturing method of the semiconductor device according to claim 1, wherein:

a fourth transistor is further provided on the semiconductor substrate;

the forming the element isolation comprises demarcating a region of the fourth transistor;

the forming the well and the channel comprises forming the well and the channel in the region of the fourth transistor;

the forming the first oxide film comprises forming the first oxide film in the region of the fourth transistor;

the removing the first oxide film comprises removing the first oxide film in the region of the fourth transistor;

the forming the third oxide film comprises forming the second oxide film in the region of the fourth transistor;

the forming the sixth oxide film comprises forming the fifth oxide film in the region of the fourth transistor;

the forming the gate electrode comprises forming the gate electrode in the region of the fourth transistor;

the forming the sidewall film comprises forming the sidewall film in the region of the fourth transistor;

the forming the source region and the drain region comprises forming the source region and the drain region in the region of the fourth transistor; and the fourth transistor is combined with the flash memory transistor to become a flash memory cell.

5. The manufacturing method of the semiconductor device according to claim 4, wherein the fifth oxide film is used, as a gate insulating film of the fourth transistor, between the gate electrode and the semiconductor substrate.

6. The manufacturing method of the semiconductor device according to claim 1, wherein the removing the first oxide film comprises removing the first oxide film to leave the first oxide film while encapsulating the charge-storage layer in plan view in the region of the flash memory transistor.

7. The manufacturing method of the semiconductor device according to claim 1, wherein the third transistor is a laterally diffused transistor.

8. The manufacturing method of the semiconductor device according to claim 7, wherein the forming the element isolation comprises providing the element isolation in the drain region formed in the semiconductor substrate to overlap with a part of the gate electrode in plan view, in the region of the third transistor.

9. The manufacturing method of the semiconductor device according to claim 7, wherein the forming the sidewall film comprises forming the sidewall film to overlap with a part of the gate electrode in plan view, in the region of the third transistor.

10. The manufacturing method of the semiconductor device according to claim 9, wherein the forming the sidewall film comprises forming a mask pattern overlapping with a part of the gate electrode in plan view in the region of the third transistor before forming the sidewall film on the sidewalls on both sides of the gate electrode.

11. The manufacturing method of the semiconductor device according to claim 1, wherein:

the well and the channel for the flash memory transistor are formed before the tunnel oxide layer and the charge-storage layer are formed; and the well and the channel for the first transistor, the well and the channel for the second transistor, and the well and the channel for the third transistor are formed after the tunnel oxide layer and the charge-storage layer are formed.

* * * * *